(12) United States Patent
Arimoto et al.

(10) Patent No.: US 7,139,208 B2
(45) Date of Patent: Nov. 21, 2006

(54) REFRESH-FREE DYNAMIC SEMICONDUCTOR MEMORY DEVICE

(75) Inventors: Kazutami Arimoto, Hyogo (JP); Hiroki Shimano, Hyogo (JP); Takeshi Fujino, Hyogo (JP); Takeshi Hashizume, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/165,273

(22) Filed: Jun. 24, 2005

(65) Prior Publication Data

US 2006/0013030 A1 Jan. 19, 2006

Related U.S. Application Data

(62) Division of application No. 10/229,035, filed on Aug. 28, 2002, now Pat. No. 6,925,022, which is a division of application No. 09/817,177, filed on Mar. 27, 2001, now Pat. No. 6,449,204.

(30) Foreign Application Priority Data

| Mar. 30, 2000 | (JP) | ............................. 2000-094388 |
| Jul. 4, 2000 | (JP) | ............................. 2000-202001 |
| Sep. 25, 2000 | (JP) | ............................. 2000-290145 |
| Feb. 2, 2001 | (JP) | ............................. 2001-026769 |

(51) Int. Cl.
*G11C 7/20* (2006.01)
*G11C 5/14* (2006.01)

(52) U.S. Cl. .................. 365/222; 365/189.05; 365/227; 365/230.06

(58) Field of Classification Search ........... 365/189.05, 365/227, 226, 230.06, 222
See application file for complete search history.

(56) References Cited

U.S. PATENT DOCUMENTS

| 5,581,508 A | * | 12/1996 | Sasaki et al. ................ 365/200 |
| 5,661,678 A | | 8/1997 | Yoshida et al. ............. 365/149 |
| 6,272,054 B1 | | 8/2001 | Barth, Jr. et al. ........ 365/189.06 |
| 6,344,990 B1 | | 2/2002 | Matsumiya et al. .......... 365/63 |
| 6,449,204 B1 | * | 9/2002 | Arimoto et al. ............. 365/222 |
| 6,549,483 B1 | * | 4/2003 | Kurjanowicz et al. . 365/230.03 |
| 6,925,022 B1 | * | 8/2005 | Arimoto et al. ............. 365/222 |
| 2005/0152200 A1 | * | 7/2005 | Lee et al. .................... 365/222 |

FOREIGN PATENT DOCUMENTS

| GB | 1502334 | 3/1978 |
| JP | 55-157194 | 12/1980 |
| JP | 61-34790 | 2/1986 |
| JP | 04-098679 | 3/1992 |
| JP | 8-222708 | 8/1996 |

* cited by examiner

*Primary Examiner*—Andrew Q. Tran
(74) *Attorney, Agent, or Firm*—McDermott Will & Emery LLP

(57) ABSTRACT

In a data holding mode, data storage in a one bit/one cell scheme in a normal operating mode are rearranged into data storage in a twin-cell mode in which data are stored in a one bit/two cell scheme. In the twin-cell mode, two sub word lines are simultaneously driven into a selected state, and storage data of memory cells are read out on both of bit lines in a pair, to perform a sense operation. Thus, the read-out voltage can be increased to improve the data retention characteristics for lengthening a refresh interval, resulting in a reduced power consumption in the data holding mode.

6 Claims, 58 Drawing Sheets

HOLD DATA STORAGE REGION RA<0>=0

READ PERIOD FOR HOLD DATA WRITTEN CELLS

WRITE INTO ONE BIT/ TWO CELL UNIT CELLS

| | | <11> | <10> | <9> RA |
|---|---|---|---|---|
| RA<11>=0 DATA HOLDING REGION | MEMORY CELL ARRAY MA0 | 0 | 0 | 0 |
| | MA1 | 0 | 0 | 1 |
| | MA2 | 0 | 1 | 0 |
| | MA3 | 0 | 1 | 1 |
| | MA4 | 1 | 0 | 0 |
| | MA5 | 1 | 0 | 1 |
| | MA6 | 1 | 1 | 0 |
| | MA7 | 1 | 1 | 1 |

BIT LINE PAIR EQUALIZE PERIOD

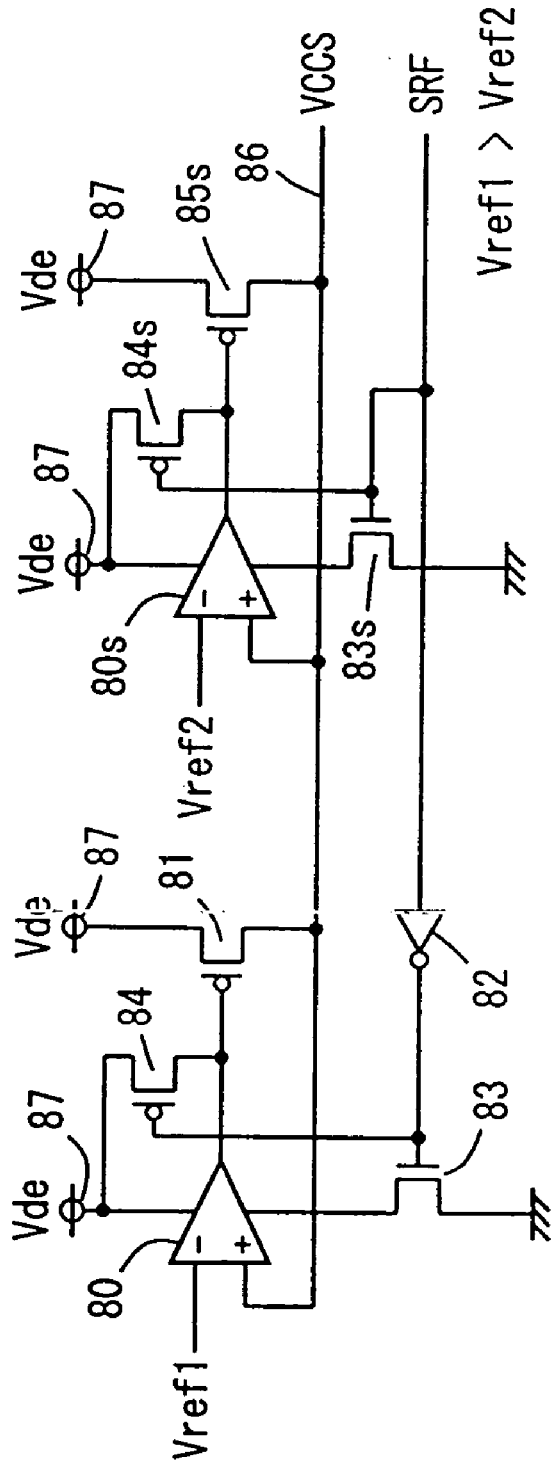
F I G. 45A
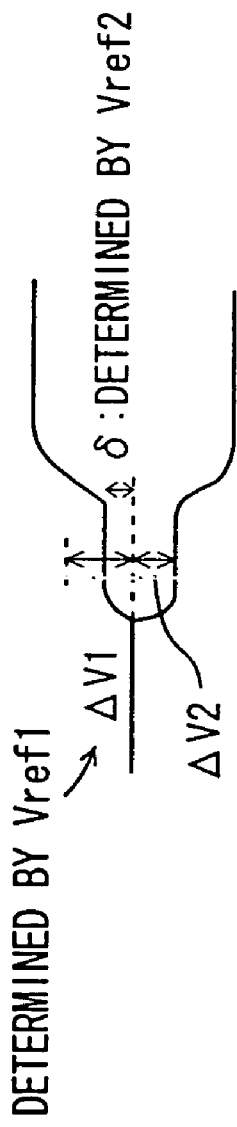
F I G. 45B (CORRESPONDS TO FIG. 30)

THE OTHER MEMORY CELL BLOCKS : φRGE="0"

REFRESH-FREE DYNAMIC SEMICONDUCTOR MEMORY DEVICE

RELATED APPLICATION

This application is a divisional of application Ser. No. 10/229,035 filed Aug. 28, 2002, now U.S. Pat. No. 6,925,022, which is a divisional of application Ser. No. 09/817,177 filed Mar. 27, 2001, now U.S. Pat. No. 6,449,204.

BACKGROUND OF THE INVENTION

1. Field of the Invention

The present invention relates to a semiconductor memory device and particularly, to a configuration for reducing power consumption of a semiconductor memory device. More particularly, the present invention relates to a configuration for reducing power consumption of an embedded type DRAM (dynamic random access memory) used in a system LSI.

2. Description of the Background Art

In a system LSI constituted of DRAM and a logic such as a processor, ASIC (application specific integrated circuit) or the like in a merged manner, DRAM and the logic are interconnected to each other using an internal data bus of multiple bits such as 128 bits to 512 bits. This internal data bus is on-chip interconnection lines, and a parasitic capacitance and a parasitic resistance thereof are small as compared with those of on-board interconnection lines. Therefore, such a system LSI can achieve a high data transfer speed as compared with a general-purpose high speed DRAM. Furthermore, as compared with a configuration in which a general-purpose DRAM is mounted external to a logic and both are interconnected through on-board interconnection lines, the number of external data input/output pin terminals of the logic can be decreased and a load capacitance of a data bus line between the logic and DRAM can also be reduced by more than one order of magnitude. Therefore, this system LSI can decrease a consumed current greatly. Owing to these advantages, a system LSI has largely contributed to improvement of a performance of information equipment handling a great amount of data such as those in three-dimensional graphic processing, image and speech processing and others.

FIG. 96 is a diagram schematically showing a configuration of a whole of a conventional embedded DRAM used in a system LSI. In FIG. 96, the embedded DRAM includes: a plurality of memory cell arrays MA0 to MAn; sense amplifier bands SB1 to SBn each arranged between the memory cell arrays MA0 to MAn; and sense amplifier bands SB0 and SBn+1 arranged outside the respective memory cell arrays MA0 and MAn. Each of the memory cell arrays MA0 to MAn is divided into a plurality of memory cell sub arrays MSA by sub word driver bands SWDB.

In a memory cell sub array MSA, memory cells are arranged in rows and columns, and sub word lines SWL are provided corresponding to respective rows. A main word line MWL is commonly provided to memory cell sub arrays MSA divided by the sub word driver bands SWDB A in a memory sub array MA. Main word lines MWL are each provided corresponding to a prescribed number of sub word lines in a memory cell sub array MSA.

In a sub word driver band SWDB, sub word drivers are provided corresponding to the sub word lines SWL. Each sub word driver drives a corresponding sub word line to a selected state according to a signal on a corresponding main word line MWL and a sub decode signal, not shown.

In each of the sense amplifier bands SB0 to SBn+1, sense amplifier circuits are provided corresponding to the columns of a corresponding memory cell array. Each sense amplifier circuit of the sense amplifier bands SB1 to SBn is shared between adjacent memory cell arrays. Row decoders each selecting a main word line according to a row address signal are provided corresponding to the respective memory cell arrays MA0 to Man, and column decoders transmitting a column select signal for selecting a column in a memory cell array according to a column address signal onto a column select line CSL are provided in alignment with the row decoders. Column select lines CSL are provided in respective sense amplifier bands and each connect a prescribed number of sense amplifier circuits to a group of internal data bus line pairs GIOP when selected.

The internal data bus line pairs GIOP are arranged extending over the memory arrays MA0-Man in a column direction. A prescribed number of internal data line pairs GIOP are coupled with selected sense amplifier circuits through local data lines LIO. Row decoders and column decoders are arranged in alignment in a row/column decoder band RCDB, and a propagation distance of a column select signal on a column select line CSL is decreased to achieve high speed column selection.

Internal data line pairs GIOP are provided by 128 bits to 512 bits or more and coupled with a data path band DPB including preamplifiers and write drivers. In the data path band DPB, the preamplifiers and the write drivers are provided corresponding to respective global data line pairs GIOP. A global data line pair GIOP may be a data line pair transmitting both of write data and read data, or may include a bus line pair transmitting read data and a write data line pair transmitting write data may be used independently of each other.

The embedded DRAM further includes: a row address circuit/refresh counter RAFK, a column address input circuit CAK receiving an external address A0 to A12 of, for example, 13 bits applied from a logic; a command decoder/control circuit CDC receiving external control signals applied from the logic to generate internal control signals specifying various operations; and a data input/output controller DIOK for performing transfer of data between the data path band DPB and the logic.

The command decoder/control circuit CDC receives a clock signal CLK, a clock enable signal CKE, a row address strobe signal /RAS a column address strobe signal /CAS, a write enable signal /WE and a data mask signal DM, and determines an instructed operating mode according to logical states of the control signals CKE, /RAS, /CAS, /WE and DM at a rising edge of the clock signal CLK. The term "command" indicates a combination of logical states of the plurality of control signals CKE, /RAS, /CAS and /WE at a rising edge of the clock signal CLK. The data mask signal DM instructs write masking, with a byte being a unit, for data applied to the data input/output controller DIOK. The command decoder/control circuit CDC decodes a command applied from the logic to generate an operating mode instructing signal instructing an operating mode specified by the command and furthermore generates various internal control signals for performing the specified operating mode. Commands include: a row active command for setting a row to a selected state; a read command instructing data reading; a write command instructing data writing; a precharge command for placing a selected row in a non-selected state; an auto-refresh command for performing a refresh operation; and a self refresh command for performing self refresh of storage data.

The row address input circuit/refresh counter RAFK takes in external address bits A0 to A12 as a row address under control of the command decoder/control circuit CDC, when a row active command is supplied, to generate an internal row address. The row address input circuit/refresh counter RAFK includes: an address buffer for buffering received address bits; and an address latch for latching an output signal of the buffer circuit. A refresh counter included in the row address input circuit/refresh counter RAFK generates a refresh address specifying a refresh row when an auto-refresh command or a self-refresh command is supplied. A count value of the refresh counter is incremented or decremented each time the refresh operation is completed. The column address input circuit CAK takes in, for example, lower external address bits A0 to A4 to generate an internal column address signal under control of the command decoder/control circuit CDC when a read command or a write command is supplied. The column address input circuit CAK also includes an address buffer and an address latch.

An internal row address signal from the row address input circuit/refresh counter RAFK is applied to a row predecoder RPD, while an internal column address signal from the column address input circuit CAK is applied to a column predecoder CPD. The row predecoder RPD predecodes the received row address signal to apply the predecoded signal to a row decoder included in the row/column decoder band RCDB. The column predecoder CPD predecodes the internal column address from the column address input circuit CAK to apply the predecoded signal to a column decoder included in the row/column decoder band RCDB.

The command decoder/control circuit CDC generates internal control signals for controlling the operations of data input/output controller DIOK and a preamplifier or a write driver included in the data path band DPB. The clock signal CLK is used as a reference signal determining timings of internal operations of the embedded DRAM.

The data input/output controller DIOK performs data inputting/outputting operation in synchronization with the clock signal CLK, and a row address input circuit in the row address input circuit/refresh counter RAFK and the column address input circuit CAK takes in and latch applied address bits in synchronization with the clock signal CLK.

The embedded DRAM further includes: a block PHK including an internal voltage generating circuit for generating internal voltages VPP, VCCS, VCCP, VBL and VCP; and a self-refresh timer activating a refresh request signal FAY at prescribed intervals when a self-refresh mode is specified (a self-refresh command is supplied). The internal voltage VPP is a voltage transmitted onto a selected sub word line SWL, and is normally higher than an operating power supply voltage. The voltage VCCS is an operating power supply voltage of a sense amplifier circuit included in the sense amplifier bands SB0 to SBn+1, and is generated by an internal voltage down converter, not shown. The voltage VCCP is a peripheral power supply voltage or an operating power supply voltage applied to peripheral circuits such as row decoders and column decoders included in the row/column decoder band RCDB, and to preamplifiers and write drivers included in the data path band DPB. The voltage VBL is a bit line precharge voltage described later. The voltage VCP is a cell plate voltage applied to a cell plate of a memory cell, and is at an intermediate level between an H level voltage and an L level voltage of memory cell data. The voltages VBL and VCP each are an intermediate voltage, which is normally at half a level of the array power supply voltage (a sense power supply voltage) VCCS.

A self-refresh timer of the block PHK is activated after entry into the self-refresh mode, to issue refresh request signals at prescribed intervals with a maximum refresh time tREFmax such that refresh of all the rows of the memory cell arrays MA0 to MAn is completed once in the refresh time. When the number of refreshes required for all the rows of the memory arrays MA0 to MAn is represented by Nref, the refresh request signals are issued in a cycle of tREFmax/Nref. For example, in a 4K refresh mode with Nref=4096, the refresh request signal FAY is repeatedly issued every 16 μsec if the maximum refresh time tREFmax is set to 64 ms.

In the self-refresh mode, refresh of memory cell data is performed in a memory cell array at a prescribed period, for holding stored data in memory cells. The self-refresh mode is normally set in a sleep mode, or while the system LSI is in a standby state over a long period. Hence, in the sleep mode, what is required is only to hold storage data of memory cells; and therefore, a refresh interval is preferably set as long as possible from the viewpoint of low power consumption.

FIG. 97 is a diagram representing a configuration of a sense amplifier circuit included in a sense amplifier band and a peripheral section thereof. In FIG. 97, a sense amplifier SAK is coupled with bit lines BLL and ZBLL through a bit line isolation gate BIGL and also coupled with bit lines BLR and ZBLR of another memory block through a bit line isolation gate BIGR. The bit line isolation gates BIGL and BIGR become conductive/non-conductive in response to bit line isolation instructing signals BLIL and BLRR, respectively.

The sense amplifier SAK differentially amplifies a potential on a common bit line CBL coupled with the bit lines BLL and BLR through the bit line isolation gates BIGL and BIGR and a potential on a common bit line ZCBL coupled with the bit lines ZBLL and ZBLR through the bit line isolation gates BIGL and BIGR. The sense amplifier SAK includes: a pair of cross-coupled P channel MOS transistors P1 and P2, and a pair of cross-coupled N channel MOS transistors N1 and N2. There are provided, as a sense amplifier drive circuit, a P channel MOS transistor P3 for sense amplifier activation that is rendered conductive in response to activation of a sense amplifier activating signal ZSOP to transmit the sense power supply voltage VCCS to a sense power supply node S2P of the sense amplifier SAK, and an N channel MOS transistor N3 for sense amplifier activation that is rendered conductive in response to a sense activating signal SON to couple a sense ground node S2N to a ground node. The common bit lines CBL and ZCBL are further coupled with a pair of local data lines LIO through a column select gate CSG. The pair of local data lines LIO is coupled with global data lines GIO and ZGIO.

Furthermore, the bit lines BLL and ZBLL are provided with a bit line precharge/equalize circuit BEQL activated in response to activation of a bit line equalize instructing signal BLEQL, to transmit the bit line precharge voltage VBL onto the bit lines BLL and ZBLL. The bit lines BLR and ZBLR are provided with a bit line precharge/equalize circuit BEQR activated in response to activation of a bit line equalize instructing signal BLEQR, to transmit the bit line precharge voltage VBL onto the bit lines BLR and ZBLR.

Sub word lines are provided crossing the bit lines BLL and ZBLL, and the bit lines BLR and ZBLR, and memory cells MC are placed corresponding to the crossings. In FIG. 88, a sub word line SWL crossing the bit lines BLL and ZBLL and a memory cell MC placed at a location corresponding to a crossing between the sub word line SWL and the bit line ZBLL are representatively shown. A memory cell MC includes: a memory capacitor MQ for storing information; and an access transistor MT constituted of an N channel MOS transistor and made conductive in response to a potential of the sub word line, to couple the memory capacitor MQ with the bit line ZBLL. A potential on a storage node SN of the memory capacitor MQ is determined according to the stored information, while a cell plate arranged facing to the storage node is supplied with the cell plate voltage VCP.

In the standby state, the bit line isolation instructing signals BLIL and BLIR are at H level of, for example, the boosted voltage VPP level. Thus, the bit line isolation gates BIGL and BIGR are in a conductive state, and the bit lines BLL, CBL and BLR are coupled with each other, and the complementary bit lines ZBLL, ZCBL and ZBLR are coupled with each other. In this state, the bit line equalize instructing signal BLEQL and BLEQR are also in an active state, and the bit lines BLL, CBL and BLR and the complementary bit lines ZBLL, ZCBL and ZBLR are precharged and equalized at the precharge voltage VBL by the bit line precharge/equalize circuits BEQL and BEQR.

When a row active command is applied and a row access is to be made, a bit line isolation gate of a memory cell block including a selected row (sub word line) stays in a conductive state, while a bit line isolation gate for a non-selected memory cell array sharing a sense amplifier with the selected memory cell array (the memory cell array including the selected sub word line) enters a non-conductive state. Now, consider a case where the sub word line shown in FIG. 97 is selected. In this case, the bit line equalize signal BLEQL is in an inactive state at L level, and the bit line precharge/equalize circuit BEQL is deactivated. Furthermore, the bit line isolation instructing signal BLIR is driven to L level, the bit line isolation gate BIGR enters a non-conductive state and the bit lines BLR and ZBLR are disconnected from the common bit lines CBL and ZCBL. In this state, the bit lines BLL and ZBLL of a selected memory cell array enter a floating state at the precharge voltage VBL. The bit line equalize instructing signal BLEQR is in an active state at H level, and the bit lines BLR and ZBLR are held at the bit line precharge voltage VBL level by the bit line precharge/equalize circuit BEQR.

Then, a row select operation is performed and a potential of a selected sub word line rises. When a level of the sub word line SWL rises, the memory access transistor MT of a memory cell MC is made conductive to couple the storage node SN of the memory capacitor MQ with a corresponding bit line (ZBLL). Accordingly, an electric charge accumulated in the capacitor MQ of the memory cell is read onto the associated bit line ZBLL. Since the selected memory cell is not connected to the bit line BLL, the bit line BLL is held at the bit line precharge voltage VBL of the intermediate level. Now, when parasitic capacitance values of the bit lines BLL and ZBLL are represented by CB, a capacitance value of the memory capacitor MQ by CS and a potential on the storage node SN by V(SN), a potential difference ΔV between the bit lines BLL and ZBLL is expressed by the following formula:

$$\Delta V = 0.5 \cdot V(SN) \cdot CS/(CS+CB).$$

Then, the sense amplifier activating signals ZSP and SON are activated, the MOS transistors P3 and N3 for sense amplifier activation are made conductive, and the sense power supply voltage VCCS and the sense ground voltage are transmitted to sense power source nodes S2P and S2N. When the sense power supply voltage VCCS and the sense ground voltage are transmitted to the sense power source nodes S2P and S2N, the sense amplifier SAK is activated to start a sense operation. Generally, since threshold voltages of the N channel MOS transistors N1 and N2 are smaller in absolute value than threshold voltages of the P channel MOS transistors P1 and P2, an N sense amplifier constituted of the MOS transistors N1 and N2 starts a sense operation first to amplify a potential difference transmitted from the bit lines BLL and ZBLL to the common bit lines CBL and ZCBL. That is, a common bit line of a lower potential level of the common bit lines CBL and ZCBL is driven to the ground voltage level by the MOS transistors N1 and N2. A little later, another common bit line of a higher potential level of the common bit lines CBL and ZCBL is driven to the sense power supply voltage VCCS by the P channel MOS transistors P1 and P2.

When L level data is transmitted onto the common bit lines CBL and ZCBL, a voltage on a common bit line receiving the data of L level is lower than the precharge voltage VBL. On the other hand, when H level data is read out, a voltage of a common bit line receiving the data of H level is higher than the precharge voltage VBL. Hence, since a gate to source voltage of the MOS transistors N1 and N2 is lower when data of L level is read out as compared to the case where data of H level is read out, a sense operation of the N channel MOS transistors N1 and N2 is slower when the data of L level is read out as compared to the case where the data of H level is read out.

A magnitude of the voltage that the sense amplifier SAK senses is proportional to the voltage V(SN) on the storage node SN of the memory cell MC. Hence, in order to increase a sense margin to operate the sense amplifier SAK correctly, it is needed to increase an amount of electric charges read out from the memory cell as much as possible. A potential level on the storage node SN when data of L level is stored is the ground voltage VSS level, and a voltage V(SN) on the storage node SN is the sense power supply voltage VCCS level when data of H level is stored. In order to raise a voltage level on the storage node SN to the possible maximum when data of H level is stored, the boosted voltage VPP is transmitted onto the sub word line SWL. The boosted voltage VPP is a voltage sufficiently higher than the sum of the sense power supply voltage VCCS and a threshold voltage of the access transistor MT. By transmitting the boosted voltage VPP onto the sub word line SWL, the sense power supply voltage VCCS can be transmitted onto the storage node SN without a loss due to the threshold voltage of the memory access transistor MT.

When the sense operation by the sense amplifier SAK is completed, the bit lines BLL and ZBLL are driven to the sense power supply voltage VCCS and the ground voltage level. Thereafter, a read command or a write command (a column access command) is supplied, a column select operation is performed, and a column select signal on the column select line CSL is activated. Responsively, the column select gate CSG for the selected column is made conductive, and the common bit lines CBL and ZCBL are coupled with the global data lines GIO and ZGIO through the local lines LIO, and data writing or reading is performed.

FIG. 98 is a diagram schematically showing a cross sectional structure of a memory cell. In FIG. 98, N type impurity regions 901*a* and 901*b* are formed spaced from each other on a surface of a P type substrate region 900. A first conductive layer 902 serving as a word line is formed above a channel region between the impurity regions 901*a* and 901*b* with a gate insulating film, not shown, interposed therebetween. The impurity region 901*a* is connected to a second conductive layer 903 serving as a bit line, while the impurity region 901b is connected to a third conductive layer 904 serving as a storage node SN. The third conductive layer 904 has a leg region connected to the impurity region 901b and a hollow cylindrical region on the leg region. A fourth conductive layer 906 serving as a cell plate electrode is formed on the cylindrical region with a capacitor insulating film 905 interposed therebetween. The fourth conductive layer 906 serving as the cell plate extends across a corresponding to memory cell sub array with a memory cell sub array being a unit, and memory cells in the corresponding memory sub array on the cell plate commonly receive the cell plate voltage VCP at the cell plate nodes. The cylindrical region in an upper portion of the third conductive layer 904 and an facing region of the fourth conductive layer 906 through the capacitor insulating film 905 function as a memory capacitor.

The memory access transistor MT is constructed of the impurity regions 901a and 901b, and the first conductive layer 902. The substrate region 900 functions as a back gate of the memory access transistor MT and receives a negative voltage Vbb. A potential of the third layer 904 is determined according to stored data. However, as shown with a broken line in FIG. 98, electric charge accumulated in the memory capacitor decreases by various leakage currents such as a leakage current through a junction capacitance of the storage node SN (a capacitance of a PN junction between the impurity region 901b and the substrate region 900), a leakage current in a channel region beneath the second conductive layer 902 and a leakage current through the capacitor insulating film 905 and others.

FIG. 99 is a graph representing a change over time in the potential level of the storage node SN. FIG. 99 shows a change in the voltage V(SN) when the precharge voltage VBL (=VCCS/2) is applied on the bit line BL and the ground voltage VSS is applied on the word like WL (the sub word line SWL). The voltage V(SN) on the storage node SN has a time dependency expressed by the following formula due to leakage current:

$$V(SN) \approx Vbb + (VCCS - Vbb) \cdot \exp(-T/\tau a)$$

, where T indicates a time and a coefficient τa is an electric charge holding characteristic value of a memory cell storing data of H level. As the characteristic value τa is larger, an electric charge holding time of a memory cell is longer.

When data of H level has been written onto the storage node SN, a voltage V(SN) of the storage node SN is at a level of the sense power supply voltage VCCS. The storage node voltage V(SN) gradually decreases with time T due to a leakage current through a PN junction. If a memory cell data is read out onto the bit line when the storage node attains a voltage Vcr at time T1, a potential difference between bit lines, at that time, (Vcr−VBL)·Cs/(Cs+Cb) is lower than a sensitivity of the sense amplifier, where Cs and Cb indicate respective capacitance values of the memory cell capacitor and a bit line parasitic capacitance. That is, after the time T1 elapses, the sense amplifier malfunctions, read error for H data arises in which H level data may be amplified into L level data. Hence, refresh need be performed on this memory cell within a time of T1 to rewrite or restore the data. The characteristic value τa of each memory cell is different from others (due to variation in fabrication parameters), and therefore, a refresh time is determined taking the worst case into consideration. That is, the maximal refresh time tREFmax is determined based on the memory cell with the shortest data holding time, in other words, based on the smallest characteristic value τa available.

In a fabrication process for an embedded DRAM, the same process as that for a logic integrated on the same chip is employed. Therefore, in order to obtain full performances of transistors in the logic, a salicidation process or the like applied on source and drain diffusion layers of a transistor, which has been a standard step in a process for the logic, has been introduced into the process for an embedded DRAM. Hence, a thermal budget (a product of time and temperature in an annealing process) in a high temperature processing applied in formation of the memory capacitor is reduced. For this reason, an impurity region and an insulating film cannot be subject to a thermal process at a prescribed temperature for a sufficient time, resulting in an increased junction leakage current and in an increased leakage current through a capacitor insulating film, although by a small amount.

Furthermore, in a case where a stacked capacitor cell structure of a cylindrical shape is adopted as shown in FIG. 98, a high step is caused between a DRAM section and a logic section. Such a step cannot be perfectly eliminated even when an interlayer insulating film between interconnection lines is planarized to some extent by a CMP (a chemical mechanical polishing) process. Accordingly, a pitch of metal interconnection lines cannot be reduced sufficiently because of irregular reflection and others at steps in an exposure process of a photolithographic process. Hence, a metal interconnection line pitch required for a high density library of a logic is difficult to be achieved. Therefore, with a capacitance value of a memory capacitor sacrificed to some extent, a height of a storage node is decreased (a height of a cylindrical section is decreased) to achieve a complete planarization of an interlayer insulating film between interconnection lines, to eliminate a step between the DRAM section and the logic section for increasing a gate density of a logic library. Therefore, a capacitance value of a memory capacitor is smaller than in a general purpose DRAM and thus, an amount of accumulated electric charges is accordingly reduced.

Furthermore, an embedded DRAM is integrated together with a logic section operating at high speed on the same semiconductor chip. Therefore, temperature of the embedded DRAM section tends to be higher as compared with that of a general purpose DRAM due to heat conduction from the logic. In addition, a power supply line of the embedded DRAM section and the substrate are apt to be affected by noise due to a high speed operation of the logic section. Refresh characteristics of the embedded DRAM are deteriorated as compared with a general purpose DRAM by these various factors in the fabrication process or a chip operation. Moreover, during operation, a refresh time of an embedded DRAM is required to be short as compared with a general purpose DRAM, thereby increasing a current consumed for data holding.

Furthermore, in a case where a logic section ceases its operation as in the sleep mode or the like, a self-refresh is required to be periodically performed in order to hold stored data in the embedded DRAM. In this case as well, a refresh time in the self-refresh mode becomes short as compared with a general purpose DRAM. Therefore, a consumed current in the sleep mode increases. Especially, in a case where a system LSI with an embedded DRAM is applied in products such as a portable information equipment and digital camera driven by a battery, a power consumption is a more predominant factor than increase in storage capacity. Accordingly, increase in consumed current associated with poor refresh characteristics is a serious problem against application to a battery driven equipment.

SUMMARY OF THE INVENTION

It is an object of the present invention to provide a semiconductor memory device capable of achieving low power consumption.

It is another object of the present invention is to provide a semiconductor memory device capable of holding data stably with a low power dissipation.

It is still another object of the present invention is to provide an embedded DRAM having improved refresh characteristics.

A semiconductor memory device according to a first aspect of the present invention includes: a plurality of memory cells arranged in rows and columns; a plurality of word lines provided corresponding to respective rows and each having the memory cells on a corresponding row connected; and a plurality of bit lines provided corresponding to respective columns and each the memory cells on a corresponding column connected. The plurality of bit lines are arranged in pairs. Each bit line pair includes first and second bit lines.

The semiconductor memory device of the first aspect of the present invention further includes: row select circuitry for generating a select signal selecting a word line among the plurality of word lines according to an address signal and an operating mode instructing signal. The row select circuitry includes a mode switch circuit for selecting a word line corresponding to a row addressed according to an address signal when the operating mode instructing signal designates a first operating mode, while selecting the addressed row and a row associated therewith simultaneously when the operating mode instructing signal designates a second operating mode. The addressed row and the row associated therewith are selected such that memory cells are located corresponding at an intersection between one of first and second bit lines of each bit line pair and a word line corresponding to the addressed row and at an intersection between the other of the first and second bit lines of the each bit line pair and a word line corresponding to the associated row.

A semiconductor memory device according to a second aspect of the present invention includes: a memory cell array having a plurality of memory cells arranged in rows and columns; an internal data bus for transmitting data with a selected memory cell in the memory cell array; and a row select circuit activated in response to an array activation instructing signal to select a row from the rows in the memory cell array. The row select circuit selects a first row in the memory cell array according to a first address and selects a second row in the memory cell array according to a second address.

The semiconductor memory device according to the second aspect of the present invention further includes: a rearrangement column select circuit for selecting a column to couple the selected column with a rearrangement data bus; a preamplifier having a function of latching output data of the rearrangement column select circuit, for amplifying data on the internal data bus when activated; and a data buffer transferring an output signal of the preamplifier onto the rearrangement data bus in a data rearrangement mode.

A semiconductor memory device according to a third aspect of the present invention includes: a memory cell array having a plurality of memory cells arranged in rows and columns; an internal data bus for transferring data with a selected memory cell of the memory cell array; and a row select circuit activated in response to activation of an array activation instructing signal to select a row in the memory cell array. The row select circuit selects a first row of the memory cell array according to a first address and selects a second row of the memory cell array according to a second address.

The semiconductor memory device according to the third aspect of the present invention further includes: a plurality of sense amplifiers provided corresponding to the columns, and activated in response to activation of the array activation instructing signal to sense, amplify and latch data on a corresponding column; an internal data bus; a column select circuit, activated when a data rearrangement write instructing signal is deactivated, and for selecting a column of the memory cell array on which a memory cell on the first row is located according to a column address signal to couple the selected column with the internal data bus; a rearrangement column select circuit activated when the data rearrangement write instructing signal is activated, and for selecting a column of the memory cell array on which a memory cell on the second row is located according the column address signal to couple the selected column with the internal data bus; a rearrangement control circuit activated when the data rearrangement write operating mode instructing signal is activated, for counting the number of times of column select operations of the rearrangement column select circuit, for ceasing a drive operation on a row corresponding to the second address to a select state by the row select circuit till the count value reaches a prescribed count, and for activating the drive operation of the row according to the second address to a selected state by the row select circuit when the count reaches the prescribed value; a preamplifier for amplifying and latching data on the internal data bus; and a transfer buffer activating when the data rearrangement write instructing signal is activated, for transferring data outputted by the preamplifier onto the internal data bus. The preamplifier latches an output data thereof when activated.

Furthermore, the prescribed count value of the rearrangement control circuit preferably corresponds to the number of columns in the memory cell array.

A semiconductor memory device according to a fourth aspect of the present invention includes: a memory cell array having a plurality of memory cells arranged in rows and columns; an internal data bus for transferring data with a selected memory cell of the memory cell array; and a row select circuit for selecting a row in the memory cell array. The row select circuit selects a first row of the memory cell array according to a first address and selects a second row of the memory cell array according to a second address.

The semiconductor memory device according to the fourth aspect of the present invention further includes: a preamplifier for amplifying data from a selected memory cell read out onto the internal data bus; a column select circuit activated in response to a column select instruction when a data rearrangement write instructing signal is deactivated, to select a column of the memory cell array on which a memory cell on the first row is located according to a column address signal and couple the selected column with the internal data bus; a rearrangement column select circuit activated a prescribed number of times after activation of the column select circuit in response to the column select instruction when the data rearrangement write instructing signal is activated, to select a column of the memory cell array on which a memory cell on the second row is located according to the column address signal and couple the selected column with the internal data bus; a preamplifier activated in response to a preamplifier activating signal activated in response to the column select instruction, for amplifying and latching data on the internal data bus; and a data buffer activated in response to activation of the preamplifier activation signal at a timing later than activation of the preamplifier, to transfer data outputted from the preamplifier onto the internal data bus.

A semiconductor memory device according to a fifth aspect of the present invention includes: a memory cell array having a plurality of memory cells arranged in rows and columns; a row select circuit for selecting a row in the memory cell array in response to an array activation instructing signal; an internal data bus for transferring internal data; a column select circuit for selecting a column in the memory cell array in response to a column select instruction to couple the selected column with the internal data bus; and a transfer circuit transferring data to a second row selected by the row select circuit from a first row selected by the row select circuit through the column select circuit and the internal data bus in response to a data rearrangement instruction.

A semiconductor memory device according to a sixth aspect of the present invention includes: a plurality of memory cells arranged in rows and columns; a row select circuit for driving an addressed row to a selected state in response to an array activating signal; a column select circuit for selecting an addressed column in response to a column select instruction; an internal data bus; a preamplifier amplifying and latching data on the internal data bus in response to a preamplifier activating signal; and a transfer buffer transferring output data of the preamplifier onto the internal data bus in response to a data rearrangement write instructing signal. The preamplifier is activated in response to the column select instruction and deactivated in response to deactivation of the rearrangement write instructing signal.

A semiconductor memory device according to a seventh aspect of the present invention includes: a memory cell array having a plurality of memory cell blocks each having a plurality of memory cells; a block select signal generating circuit generating a block select signal for selecting a memory sell block specified according to a block select address in the plurality of memory cell blocks; and a block changing circuit for changing a correspondence between a block select signal and a memory cell block with one memory cell block being a unit in a first operating mode different from a normal operating mode in which data access is made.

In the first operating mode, a word line of an addressed row is selected to store one bit information into each respective memory cell. In the second operating mode, a plurality of word lines are simultaneously selected to read out memory cell data onto bit lines of a pair. That is, one bit information is stored by two memory cells. Accordingly, in the second operating mode, read-out voltages from memory cells in which complementary data are stored are transmitted at all times and therefore, a voltage difference on bit lines prior to a sense operation can be made large and a refresh interval can be accordingly be made longer. Thereby, a current consumed for refresh can be reduced, which enables power consumption to decrease.

Furthermore, in the first operating mode, one bit data is stored by one memory cell and in this first mode, a storage capacity of a semiconductor memory device can be made sufficiently large to store necessary data and therefore in the first operating mode, the semiconductor memory device can be utilized, for example, as a main memory. Thereby, power consumption can be reduced without decreasing a storage capacity of the semiconductor memory device.

In the second operating mode, by decreasing a current drive ability of the precharge circuit, an average consumed current is reduced. In addition, in this operating mode, by isolating a precharge voltage generating circuit from a power source node, a consumed current for generating the precharge voltage can be reduced, thereby enabling a consumed current in the second operating mode to decrease.

In data rearrangement, memory cell data is transferred internally without reading out to an outside, thereby enabling high speed data rearrangement, and upon transition to the sleep mode, the memory device can enter a twin cell mode at high speed. In addition, there is no need to provide a memory for data saving for use in the data rearrangement outside the semiconductor memory device, thereby enabling a size of a whole system to decrease.

Furthermore, replacement can be performed with one memory cell block being a unit by changing a correspondence between a block select signal and a memory cell block in the first operating mode which is preferably a twin-cell mode. Thus, for example, when many micro-shorts exist between bit lines and subword lines and a standby current increasingly flows, a current consumed in the first operating mode can be reduced by replacing a standby-defective memory cell block with a normal memory cell block.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 45A is a diagram representing a configuration of the internal power supply circuit according to the sixth embodiment, and FIG. 45B is a diagram representing bit line read-out voltages when the internal power supply circuit of FIG. 45A is used;

DESCRIPTION OF THE PREFERRED EMBODIMENTS

First Embodiment

Figure 1:
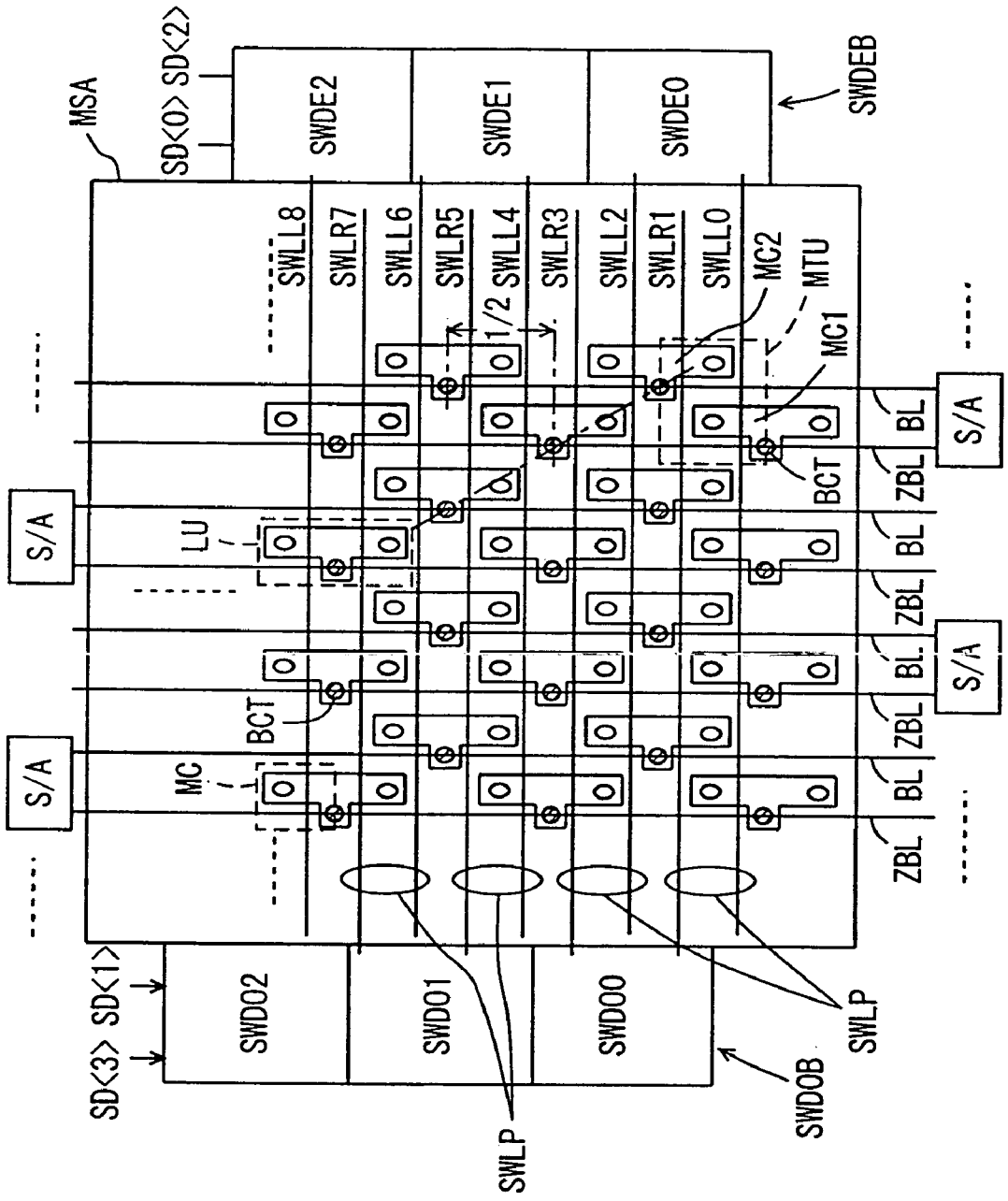
FIG. 1 is a diagram schematically showing an array section of a semiconductor memory device according to a first embodiment of the present invention.

FIG. 1 is a diagram schematically showing an array section of a semiconductor memory device according to a first embodiment of the present invention. In FIG. 1, memory cells MC are arranged such that memory cells adjacent in the column direction share a bit line contact BCT. One layout unit LU is constituted of two memory cells MC sharing the bit line contact BCT. The layout units LU are placed such that in the column direction arrangement, layout units are laid out every second column, while in the row direction arrangement, layout units are laid out every third row. With respect to bit line contacts BCT, accordingly, the bit line contacts BCT are laid out every fifth row in alignment along the column direction, while the bit line contacts BCT are laid out every second column in alignment along the row direction. In the row direction, the layout units LU are arranged being sifted by one column. A length of a projection of a minimum pitch of memory cells MC on an oblique line interconnecting the memory cells MC on a bit line is ½ times a pitch of memory cells arranged in the column direction. Such a memory cell arrangement shown in FIG. 1 is called a "half-pitch cell" arrangement.

Bit lines BL and ZBL are alternately arranged corresponding to respective columns of memory cells MC (layout units LU). The bit lines BL and ZBL are arranged in pairs and a sense amplifier circuit S/A is provided for each bit line pair.

Sub word lines SWL are provided corresponding to respective rows of memory cells MC, and the memory cells MC on corresponding rows are connected to the respective sub word lines SWL. Sub word lines SWL are driven by sub word drivers included in sub word driver bands SWDEB and SWDOB placed on opposite sides of a memory cell sub array MSA. Sub word drivers SWDE0, SWDE1 and SWDE2 included in the sub word driver band SWDEB drive even-numbered sub word lines SWLL0, SWLL2, SWLL4, SWLL6 and SWLL8 according to a signal on a corresponding main word line, not shown, and sub decode signals SD <0> and SD <2>. The sub word line drivers SWDE0, SWDE1 and SWDE2 each drive one of corresponding two sub word lines to a selected state according to the sub decode signals SD <0> and SD <2> if the sub decode signals are both in a selected state when a corresponding main word line is in a selected state.

In the sub word driver band SWDOB, sub word drivers SWDO0, SWDO1 and SWDO2 are provided to odd-numbered sub word lines SWLR1, SWLR3, SWLR5 and SWLR7. Two sub word lines are provided corresponding to each of the sub word drivers SWDO0, SWDO1 and SWDO2, and the sub word line drivers SWDO0, SWDO1 and SWDO2 each drive one of corresponding sub word lines to a selected state according to a signal on a not shown main word line and sub decode signals SD <3> and SD <1>.

One main word line is provided to each set of 4 sub word lines. That is, one main word line is provided to a set of the sub word lines SWLL0, SWLR1, SWLL2 and SWLR3, and one main word line is also provided to a set of the sub word lines SWLL4, SWLR5, SWLL6 and SWLR7.

In row selection, adjacent sub word lines are simultaneously selected. That is, a pair SWLP of an addressed sub word line and a word line adjacent thereto is simultaneously selected according to an address signal. For example, as shown in FIG. 1, the sub word lines SWLL0 and SWLR1 are simultaneously selected. Memory cells MC1 and MC2 store one bit information as a memory unit (hereinafter referred to as twin-cell mode unit cell) MTU in a one bit/two cell mode or a twin-cell mode. That is, an H level data is written onto one of the memory cells MC1 and MC2, while an L level data is written onto the other memory cell. A sense amplifier circuit S/A differentially amplifies potentials on the bit lines BL and ZBL. Hence, complementary memory cell data are read out onto the bit lines BL and ZBL at all times and therefore, and the H level data and the L level data are transmitted onto the bit lines BL and ZBL to be differentially amplified by the sense amplifier circuit S/A.

Two sub word lines placed between the closest bit line contacts to each other in the column direction are simultaneously selected. Since a half-pitch cell arrangement is employed, two sub word lines placed between bit line contacts are simultaneously driven into a selected state. Thus, memory cells MC closest to each other in the layout units LU adjacent to each other in the row and column directions are coupled with the respective bit lines BL and ZBL. Thereby, an H level data and an L level data are written onto two memory cells of a unit cell MTU in the twin-cell mode.

Figure 2:
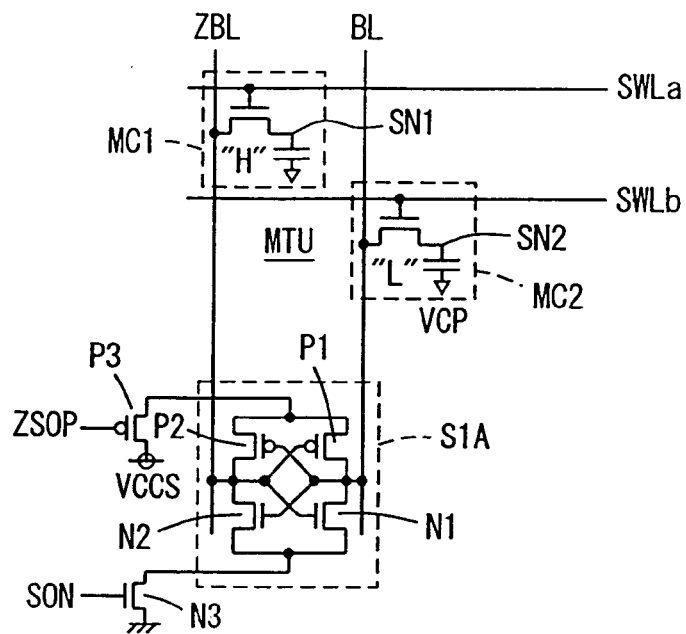
FIG. 2 is a diagram schematically showing a configuration of a memory cell and a sense amplifier circuit of a memory cell array shown in FIG. 1.

As shown in FIG. 2, for example, memory cells MC1 and MC2 are placed at intersections of the adjacent sub word lines SWLa and SWLb, and the bit lines BL and ZBL. The two memory cells MC1 and MC2 are used as a unit cell MTU for storing one bit information in the one bit/two cell mode (hereinafter referred to as twin-cell mode). The bit lines BL and ZBL are coupled with the sense amplifier circuit S/A and potentials on the bit lines are differentially amplified. Hence, complementary data are stored on the respective memory cells MC1 and MC2 at all times.

Figure 3:
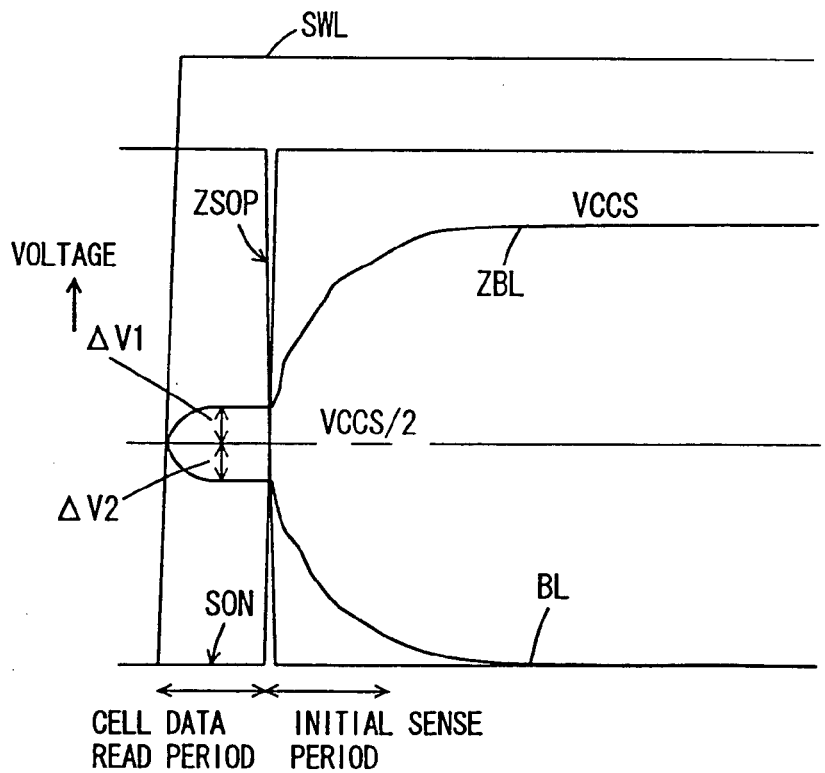
FIG. 3 is a diagram of signal waveforms representing operation of the configuration shown in FIG. 2.

FIG. 3 is a diagram of signal waveforms representing a change in potentials on bit lines when storage information of one bit "0" of a twin-cell mode unit cell MTU shown in FIG. 2 is read out. In a standby state, or when the sub word lines SWLa and SWLb are both in a non-selected state, the bit lines BL and ZBL are precharged and equalized at a voltage level of an intermediate voltage VCCS/2. When a row active command is supplied to perform a row select operation and the sub word lines SWLa and SWLb are driven into a selected state, the sub word lines SWLa and SWLb are both driven up to a boosted voltage VPP level. When the sub word lines SWLa and SWLb are both driven to a selected state, an H level data is read out from the memory cell MC1 onto the bit line ZBL and an L level data is read out from the memory cell MC2 onto the bit line BL. Hence, a voltage level of the bit line ZBL is raised from the intermediate voltage VCCS/2 by a read-out voltage $\Delta V1$ and a voltage level of the bit line BL is lowered from the intermediate voltage VCCS/2 by a read-out voltage $\Delta V2$. This period is a cell data read period.

When the cell data read period is completed, a sense amplifier activation signals SON and ZSOP are activated to activate the sense amplifier circuit S/A. The sense amplifier circuit S/A differentially amplifies a potential difference ($\Delta V1+\Delta V2$) between the bit lines BL and ZBL. Hence, when one of N channel MOS transistors N1 and N2 included in the sense amplifier circuit S/A becomes conductive to drive the bit line of a low level to the ground voltage level immediately after the sense amplifier activating signal SON is activated. Read-out voltages of H level and L level are transmitted onto the sense amplifier circuit S/A at all times regardless of "1" and "0" of storage data of a twin-cell mode unit cell MTU. Therefore, the N channel MOS transistors N1 and N2 of the sense amplifier circuit S/A perform a sense operation at high speed when the sense amplifier activation SON is activated. Thus, a high speed sense can be effected as compared with a conventional one bit/one cell operating mode. In addition, a potential difference between the bit lines BL and ZBL is ($\Delta V1+\Delta V2$) and a sufficient sense margin can be ensured since a read-out voltage is larger as compared with that in the one bit/one cell operating mode.

Figure 4:
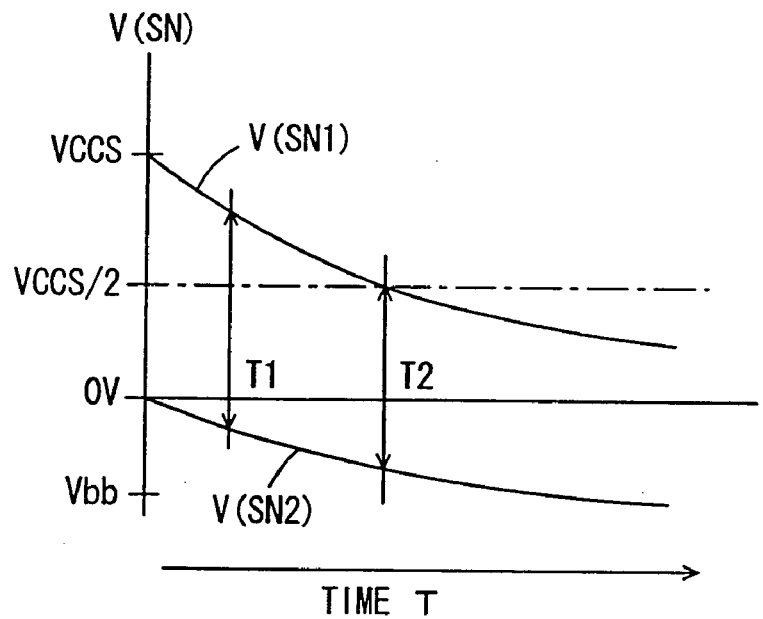
FIG. 4 is a graph representing the change of bit line read-out voltages over time in the first embodiment of the present invention.

FIG. 4 is a graph representing a change over time of each of accumulated electric charges in the memory cells MC1 and MC2 of the twin-cell mode unit cell MTU shown in FIG. 2. A voltage V(SN1) of a storage node SN1 of the memory cell MC1 is at the array power supply voltage VCCS level at an initial time since H level data is written therein. On the other hand, the storage node of the memory cell MC2 is at the ground voltage VSS (=0V) at the initial time since the memory cell MC2 stores L level data. A standby state is entered in this state, the sub word lines SWLa and SWLb are set at the ground level, and the bit lines BL and ZBL are both set at the intermediate voltage VCCS/2. A negative voltage Vbb is applied to the substrate region of the memory transistors. In this case, a change in voltages of the storage nodes SN1 and SN2 are expressed by the following formulae:

$$V(SN1) \approx Vbb + (VCCS - Vbb) \cdot \exp(-T/\tau a),$$

$$V(SN2) \approx Vbb \cdot \{1 - \exp(-T/\tau b)\}$$

In this case, a read-out potential difference of the bit lines BL and ZBL is expressed by the following formula:

$$\Delta VBL = (V(SN1) - V(SN2)) \cdot Cs/(Cs + Cb)$$

A time T1 is the time at which a sense margin becomes inadequate to cause a read error in a conventional DRAM of a one bit/one cell configuration. In the one bit/two cell operating mode, however, a difference between the voltages V(SN1) and V(SN2) on the storage modes is sufficiently large even at the time T1. Even when the voltage V(SN1) of the storage node SN1 decreases down to a voltage level of the intermediate voltage VCCS/2, the voltage V(SN2) of the storage node SN2 decreases similar to that of the storage node SN1 and therefore, there remains a sufficient large potential difference between the voltages V(SN1) and V(SN2).

When data reading is performed at a time T2, the intermediate voltage VCCS/2 is transmitted onto the bit line ZBL and the voltage level does not change, while a read-out voltage ($-\Delta V2$) is transmitted onto the bit line BL.

Figure 5:
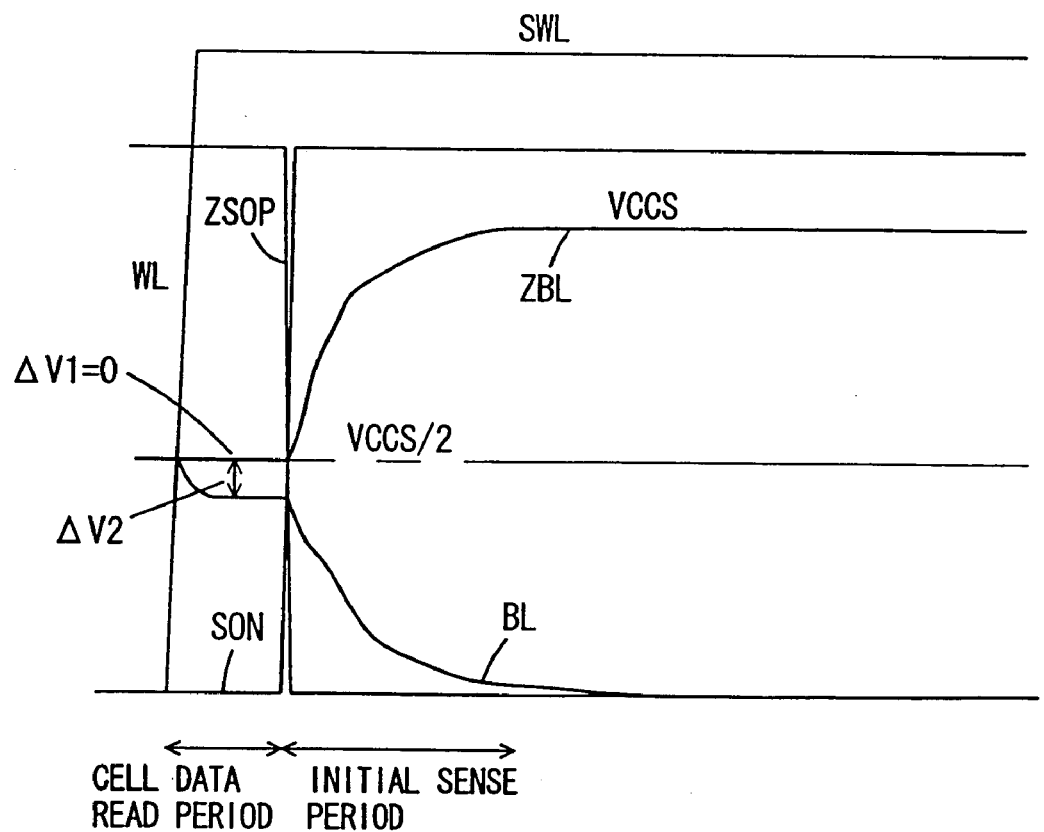
FIG. 5 is a diagram representing signal waveforms in a sense operation at a time T2 of FIG. 4.

FIG. 5 is a diagram of signal waveforms representing a sense operation on memory cell data at the time T2 shown in FIG. 4. As shown in FIG. 5, when a memory cell data is read out at the time T2 shown in FIG. 4, a read-out voltage $\Delta V1$ onto the bit line ZBL is equal to 0 V. A read-out voltage $-\Delta V2$ corresponding to the voltage level on the storage node SN2 is transmitted onto the bit line BL. That is, A read-out voltage of the same magnitude as that in reading out of L level data on a conventional DRAM of a one bit/one cell configuration is read out onto the bit line BL. Hence, signal waveforms similar to those in a sense operation for reading out of L level data in a conventional DRAM of a one bit/one cell configuration is provided. Therefore, a sense operation can be performed normally at a similar sense speed to that of a conventional DRAM.

Returning again to FIG. 4, if a potential difference between the bit lines BL and ZBL is more than a sensing sensitivity of a sense amplifier circuit when a time elapses over the time T2 and the voltage V(SN1) on the storage node SN1 becomes lower than the bit line precharge voltage VCCS/2, a sense operation becomes slower (a transition speed to an on state of the N channel MOS transistors decreases), but memory cell data can be correctly sensed and amplified.

Accordingly, a long refresh mode having a larger value of a maximum refresh time tREFmax can be set. In the long refresh mode, a cycle of the refresh request signal FAY shown in FIG. 87 can be larger substantially by one order, allowing a reduced current consumed for data holding.

Furthermore, since complementary data are read out onto the bit lines BL and ZBL, even when a read-out voltage $\Delta V1$ of H level data is small, a correct sense operation can be achieved if a read-out voltage $-\Delta V2$ of L level data is sufficiently large. Hence, the full VCCS voltage need not be transmitted onto the storage node SN. This means that such a restriction is alleviated that a voltage level necessary for driving a word line (a main/sub word line) has to be sufficiently higher than the sum of the array power supply voltage (a sense power supply voltage) VCCS and a threshold voltage (Vthc) of an access transistor of a memory cell. That is, a voltage level of the boosted voltage VPP can be appropriately lowered. A consumed current in a boosted voltage generating circuit (which is generally constituted of a charge pump circuit) generating the boosted voltage VPP can be reduced and accordingly, a current consumed in the semiconductor memory device in the normal operation can also be made smaller.

Figure 6:
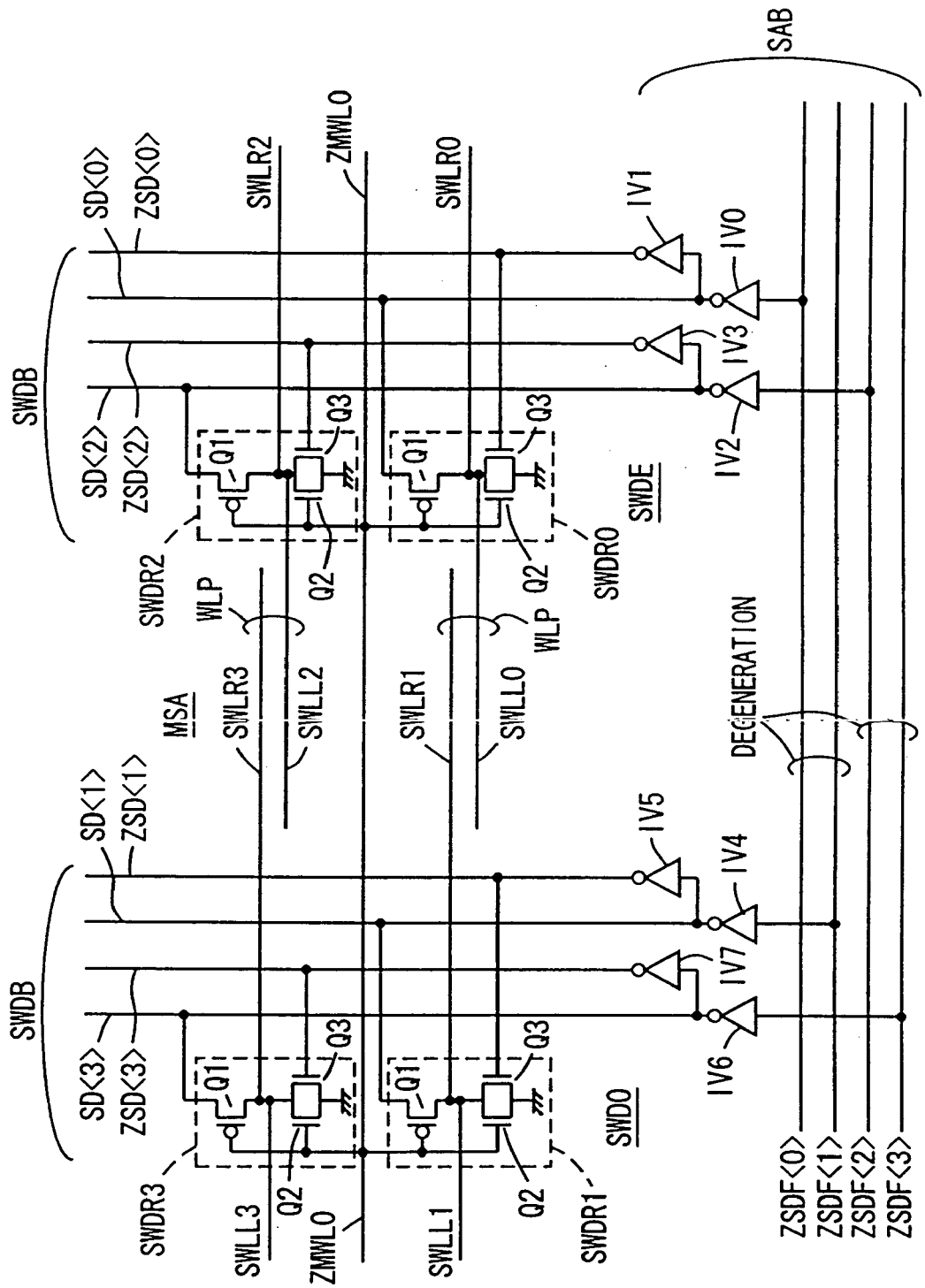
FIG. 6 is a diagram representing a configuration of a sub word line driver of the memory cell array shown in FIG. 1.

FIG. 6 is a diagram representing a configuration of a sub word line driver. In FIG. 6, a configuration of a part associated with a main word line ZMWL0 is shown.

In the memory cell sub array MSA, the four sub word lines SWLL0, SWLR1, SWLL2 and SWLR3 are arranged.

For the main word line ZMWL0, the odd-numbered sub word drivers SWDO are placed in one of the sub word driver bands and furthermore, the even-numbered sub word drivers SWDE are placed in the other sub word driver band SWDB. The even-numbered sub word drivers SWDE includes: a sub word drive circuit SWDR0 driving the sub word line SWLR0 according to a signal on the main word line ZMWL0 and sub decode signals SD <0> and ZSD <0>; and a sub word drive circuit SWDR2 driving the sub word lines SWLR2 and SWLL2 according to the signal on the main word line ZMWL0 and sub decode signals SD <2> and ZSD <2>. Sub word lines in two memory cell sub arrays are driven by one sub word drive circuit SWDR, thereby reducing an occupation area of sub word driver bands.

The sub word driver SWDO includes: a sub word drive circuit SWDR1 driving the sub word lines SWLR1 and SWLL1 according to the signal on the main word line ZMWL0 and sub decode signals SD <1> and ZSD <1>; and a sub word drive circuit SWDR3 driving the sub word lines SWLR3 and SWLL3 according to the signal on the main word line ZMWL0 and sub decode signals SD <3> and ZSD <3>. The sub word drive circuits SWDR1 and SWDR3 each drive simultaneously sub word lines in two memory cell sub arrays.

The sub decode signals SD <0> to SD <3>, and ZSD <0> to SD <3> are generated from sub decode fast signals ZSDF <0> to ZSDF <3> transmitted on a signal line extending in a sense amplifier band SAB. More specifically, the sub decode signal SD <0> is generated from an inverter IV0 receiving the sub decode fast signal ZSDF <0> and the complementary sub decode signal ZSD <0> is generated from an inverter IV1 receiving an output signal of the inverter IV0. The sub decode signal SD <2> is generated from an inverter IV2 receiving the sub decode fast signal ZSDF <2> and the complementary sub decode signal ZSD <2> is generated from an inverter IV3 receiving an output signal of the inverter IV2.

The sub decode signal SD <1> is generated from an inverter IV4 receiving the sub decode fast signal ZSDF <1> and the complementary sub decode signal ZSD <1> is generated from an inverter IV5 receiving an output signal of the inverter IV4. The sub decode signal SD <3> is generated from an inverter IV6 receiving the sub decode fast signal ZSDF <3>. The complementary sub decode signal ZSD <3> is generated from an inverter IV7 receiving an output signal of the inverter IV6. Output signal lines of the inverters IV0 to IV7 extend only within the memory sub array MSA. The inverters IV0 to IV7 are placed in intersections between the sense amplifier band SAB and the sub word driver bands SWDB.

The sub word drive circuits SWDR0 to SWDR3 are of the same configuration. More specifically, a sub word drive circuit SWDRi (i=0 to 3) includes: a P channel MOS transistor Q1 that is turned on, when a signal on the main word line ZMWL0 is at L level, to transmit a sub decode signal SD <i>; an N channel MOS transistor Q2 that is made conductive, when the signal on the main word line ZMWL0 is at H level, to hold corresponding sub word lines SWLRi and SWLLi at the ground potential level; and an N channel MOS transistor Q3 that is made conductive, when a sub word decode signal ZSD <i> is at H level, to hold corresponding sub word lines SWLRi and SWLLi at the ground potential level.

The main word line ZMWL0 is driven to the ground potential level when selected. At this time, the MOS transistor Q2 is in an off state. The P channel MOS transistor Q1 is made conductive, when the sub decode signal SD <i> is at H level, to transmit the sub decode signal SD <i> onto the corresponding sub word line SWLRi. At this time, the complementary sub decode signal ZSD <i> is at L level and the N channel MOS transistor Q3 is in an off state.

When the sub decode signal SD <i> is at L level, the P channel MOS transistor Q1 has the source and gate at the same potential, to enter an off state. At this time, the sub decode signal ZSD <i> is at H level and the N channel MOS transistor Q3 enters an on state to hold the corresponding sub word lines SWLRi and SWLLi both at the ground potential level. Thereby, a non-selected sub word line is prevented from entering a floating state. The sub decode signals SD <0> to SD <3> are generated by decoding prescribed row address bits. In a 4 way hierarchical word line configuration in which the 4 sub word lines SWLL0, SWLR1, SWLL2 and SWLR3 are provided corresponding to one main word line ZMWL, sub word lines simultaneously driven into a selected state in the twin cell mode are a set of SWLL0 and SWLR1, or a set of SWLL2 and SWLR3. Therefore, the sub decode signals SD <1> and SD <0> are simultaneously set in a selected state or the sub decode signals SD <2> and SD <3> are simultaneously set in a selected state.

Figure 7:
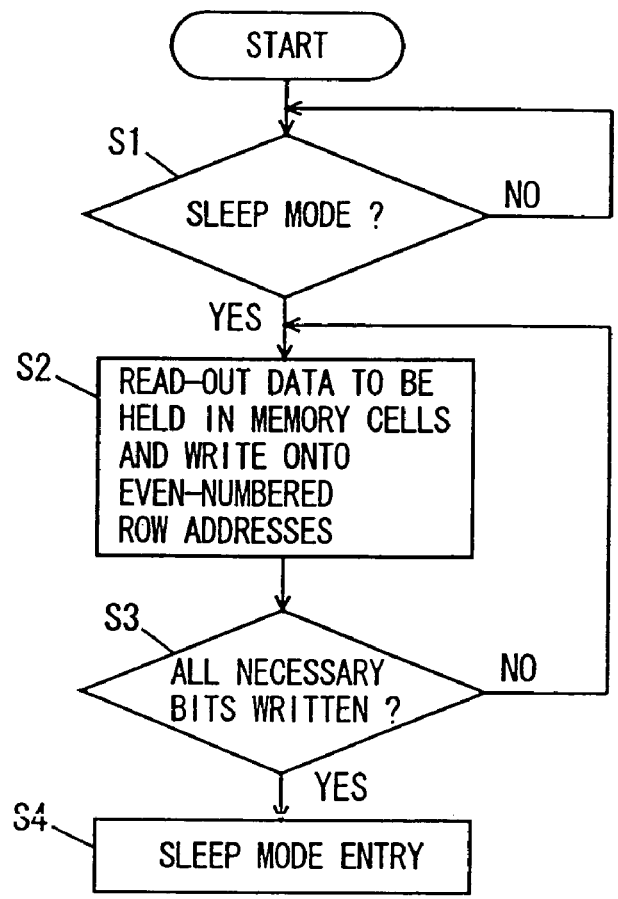
FIG. 7 is a flow chart representing a preprocessing in transition to a sleep mode in the first embodiment of the present invention.

FIG. 7 is a flow chart representing an operation of a memory controller (a logic) in transition to the sleep mode. Description will be given of a data rearrangement operation in transition to the sleep mode below, with reference to FIG. 7.

The logic monitors whether or not an access ceases for a period longer than a prescribed time and according to a monitoring result, determines whether or not the sleep mode should be set (step S1). If it is decided that the sleep mode should be set, then a memory controller (the logic) reads out data to be held in a memory (an embedded DRAM) and writes the read-out data onto even-numbered addresses. In writing of data onto the even-numbered addresses, writing of the data is performed with the least significant row address bit RA <0> fixed at "0" (step S2). In step S3, it is determined whether or not data bits required to be held are all written onto even-numbered row addresses and the process of the step S2 is performed repeatedly till all data (bits) required to be held are rearranged. When all the data (bits) required to be held are rewritten into the embedded DRAM, the memory controller (the logic) supplies a sleep mode instructing signal to the embedded DRAM (step S4). When the sleep mode is set, the embedded DRAM enters the twin-cell mode in which one bit data is stored by two memory cells, and performs refresh on the held data written on the even-numbered row addresses in a self-refresh mode.

Figure 8:
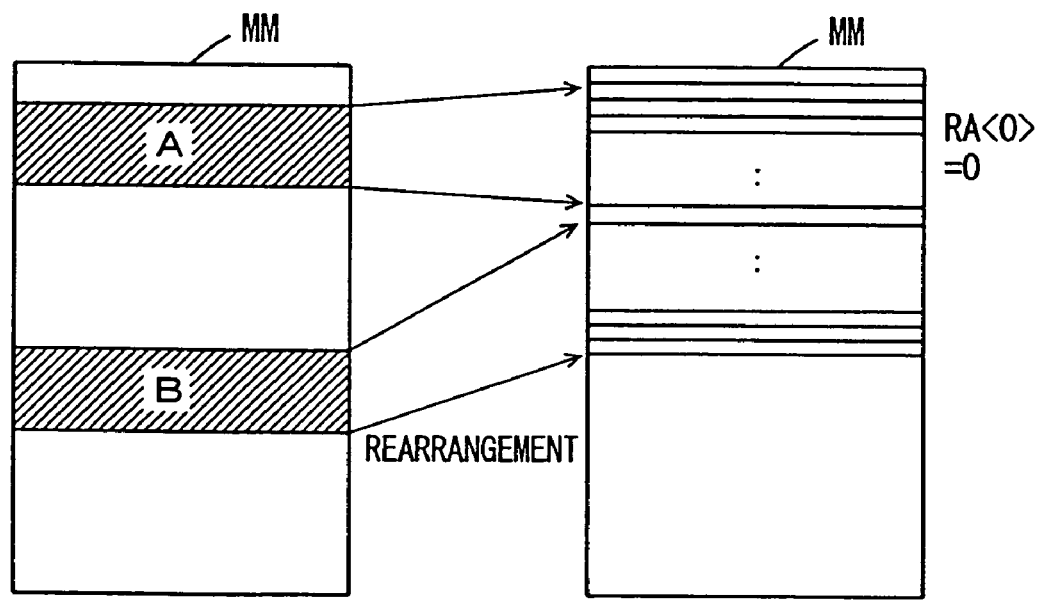
FIG. 8 is a diagram schematically showing a distribution of hold data in the first embodiment of the present invention.

FIG. 8 is a diagram schematically showing a manner of data rearrangement in transition to the sleep mode. In FIG. 8, address regions A and B of a memory mat MM are the regions in which data required of holding are stored. When the sleep mode is entered, data of the address regions A and B are rearranged in the address region of even-numbered row addresses (RA <0>=0) in the memory mat MM, while data are not rewritten in the region of odd-numbered row addresses (RA <0>=1). Generally, in a portable information terminal, a memory space required for holding data in the sleep mode is, in many cases, only a part of a whole memory space required in a normal operating mode. In a portable personal computer, for example, processed data are stored only in a part of a memory space. Hence, in regard to data to be required of holding, the data of ½ times the storage capacity of the memory mat can be held at the maximum in the twin-cell mode.

Figure 9:
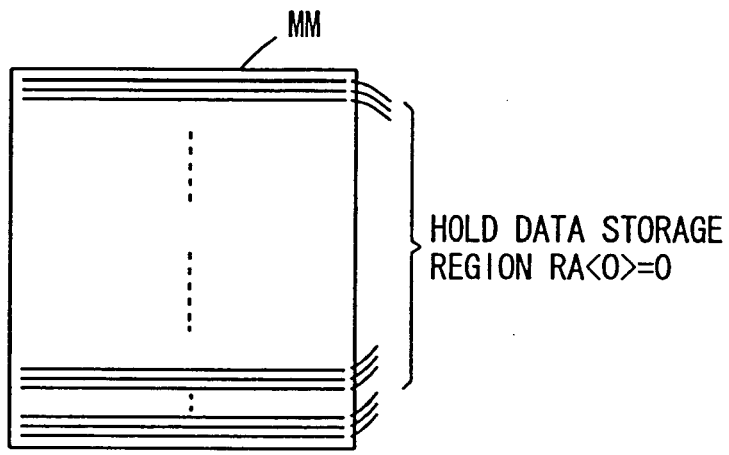
FIG. 9 is a diagram representing a modification of a hold data storage region in the first embodiment of the present invention.

FIG. 9 is a diagram representing another configuration for data storage in the embedded DRAM. In FIG. 9, the region of even-numbered row addresses (RA <0>=0) is fixedly determined in advance as a data holding region of the memory mat MM. In this case, data to be held (data to be processed) are held on even-numbered addresses in the normal operating mode. In this case, there is no need to perform data rearrangement in transition to the sleep mode. Fixing the hold data storage region to the even-numbered row address region is easily realized by only replacing one bit of a block address specifying a memory cell array with the lowest row address bit. A memory cell array constituted of successive row addresses are simply distributed over a memory block consisting of even numbered row addresses.

In an embedded DRAM, when the sleep mode is set, one bit data stored in the even-numbered row address region is stored by one memory cell. Then, a data stored in an even-numbered row address is written onto a unit cell of a one bit/two cell configuration in the twin-cell mode using a self-refresh timer and a refresh address counter provided internally. When data writing onto all the twin-cell mode unit cells MTU has been completed, refresh is started on the twin-cell mode unit cells MTU.

Figure 10:
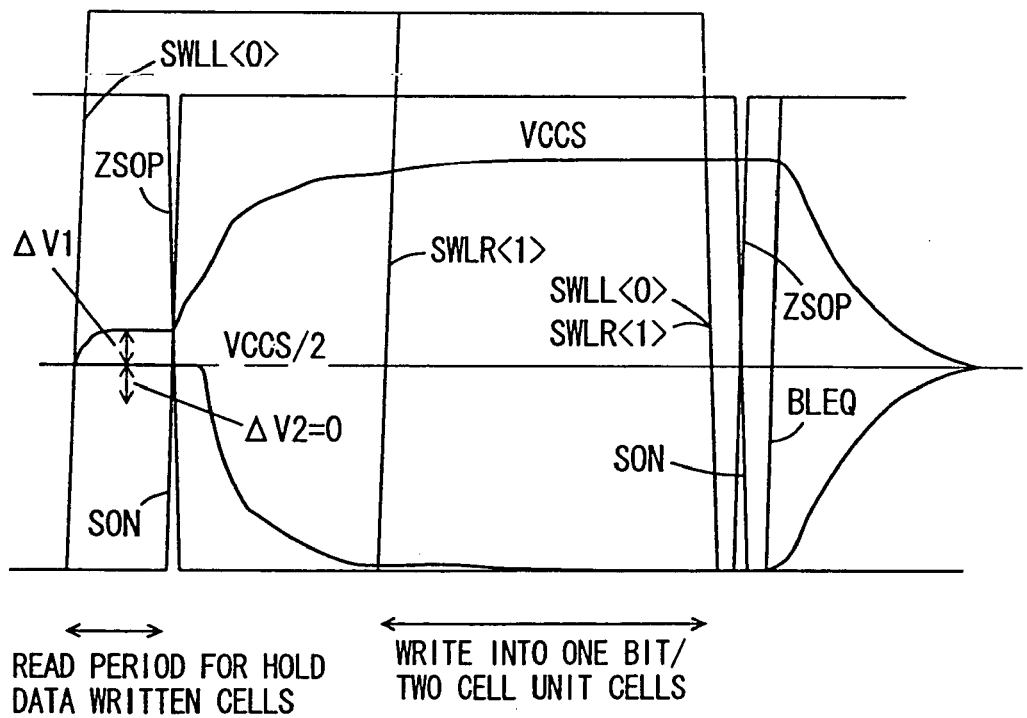
FIG. 10 is a diagram of signal waveforms representing operation in transition to the sleep mode in the first embodiment of the present invention.

FIG. 10 is a diagram of signal waveforms representing a sequence of operations in writing a hold data onto a twin-cell mode unit cell MTU in transition to the sleep mode. Description will be given of a data write operation onto a twin-cell mode unit cell in the transition to the sleep mode below, with reference to FIG. 10.

A hold data is stored on an even-numbered row address as described above. Now, the case is considered in which data is written into memory cells connected to the sub word lines SWLL <0> and SWLR <1>.

The sub word line SWLL <0> corresponding to an even-numbered row address is first driven into a selected state. A data of a memory cell connected to the selected sub word line SWLL <0> is read out onto a corresponding bit line. In FIG. 10, waveforms are shown for a case where H level data is read out. Since no memory cell is connected to the other bit line, a read-out voltage $\Delta V2=0$, and the precharge voltage level of the other bit line is maintained.

Then, the sense amplifier activating signals SON and ZSOP are activated and a data stored by one memory cell is sensed, amplified and latched by a sense amplifier.

After the sense operation is completed and the bit line potentials are driven to the array power supply voltage VCCS level and the ground voltage level, respectively, the sub word line SWLR <1> forming a pair is driven into a selected state. Data amplified and latched by the sense amplifier is stored into a memory cell connected to the sub word line SWLR <1>. That is, memory cells connected to the sub word lines SWLL <0> and SWLR <1> store data bits complementary to each other.

After a prescribed time elapses, the sub word lines SWLL <0> and SWLR <1> are driven into a non-selected state and the sense amplifier activating signals SON and ZSOP are deactivated. Thereby, data writing onto a twin-cell mode unit cell is completed. Then, the bit line equalize instructing signal BLEQ is activated to precharge the bit lines BL and ZBL to an intermediate level of the intermediate voltage VCCS/2. This operation is repeated on all the even-numbered row addresses, and the data writing in the twin-cell mode unit cells is completed on all the memory cells at all the even-numbered row addresses. Thereafter, a refresh operation in the twin-cell mode is performed according to output signals from the self-refresh timer and the refresh counter provided internally.

Figure 11:
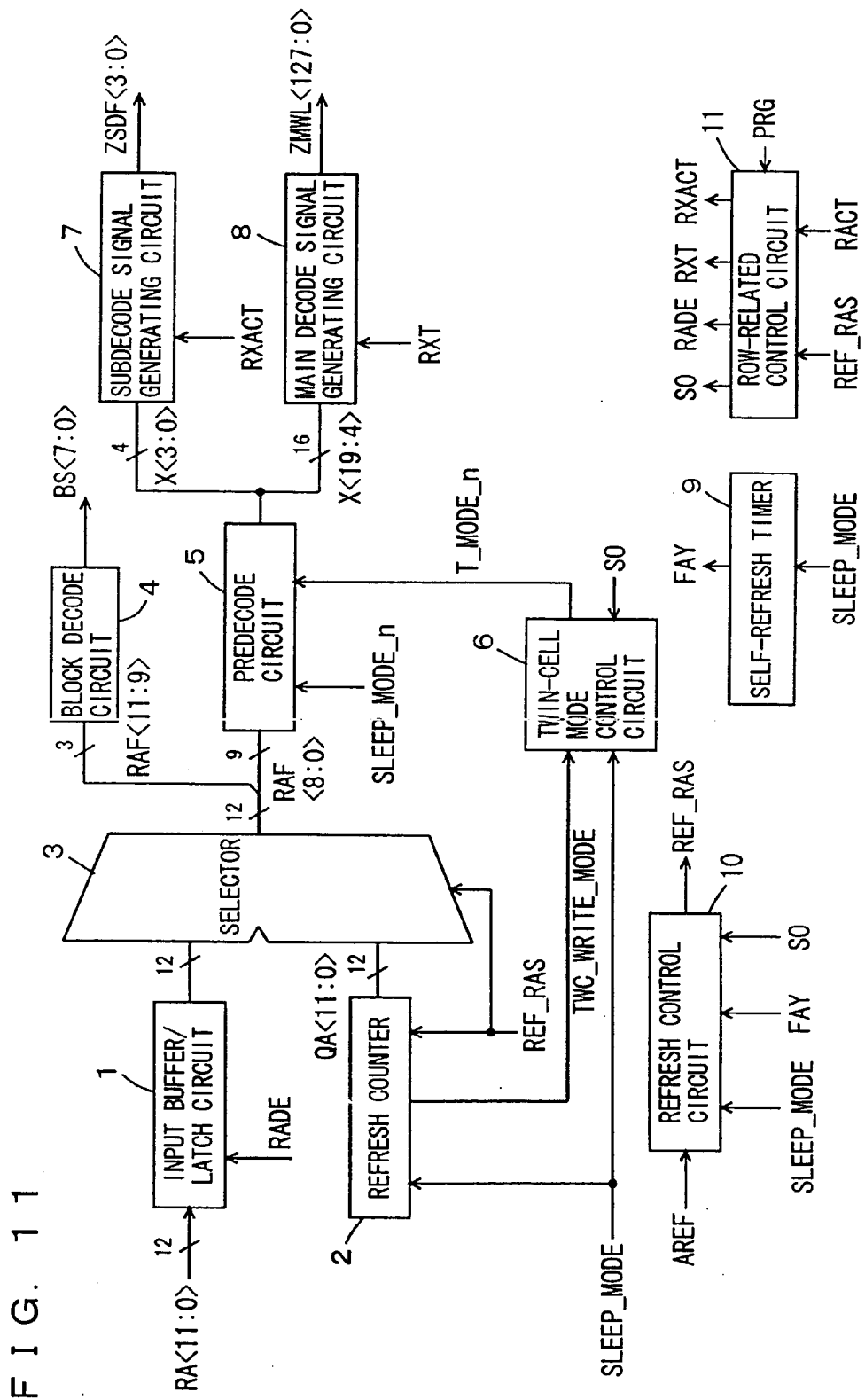
FIG. 11 is a diagram schematically showing a configuration of a row-related control signal generating section according to the first embodiment of the present invention.

FIG. 11 is a diagram schematically showing a configuration of a part related to row selection of the semiconductor memory device (an embedded DRAM) according to the first embodiment of the present invention. A configuration of a memory mat is the same as the conventional embedded DRAM shown in FIG. 87. In the configuration shown in FIG. 11, 8 memory cell arrays MA0 to MA7 are provided, and 512 word lines (sub word lines) are provided in each of the memory cell arrays MA0 to MA7.

In FIG. 11, row selection-related circuitry includes: an input buffer/latch circuit 1 capturing a row address of 12 bits RA <11:0> supplied from an outside in response to activation of a row address enable signal RADE; a refresh counter 2 updating a count value thereof by one in response to deactivation of a refresh activating signal REF_RAS when the sleep mode or the auto-refresh mode is specified; a selector 3 selecting output bits of the input buffer/latch circuit 1 and the refresh counter 2 according to the refresh activating signal REF_RAS; a block decode circuit 4 decoding an internal row address of the upper 3 bits RAF <11:9> among the row address of 12 bits from the selector 3, to generate block selecting signals BS <7:0> to specify a memory array; and a predecode circuit 5 predecoding a row address RAF <8:0> of the lower 9 bits from the selector 3.

The refresh counter 2 is started when an auto-refresh instructing signal AREF or a sleep mode instructing signal SLEEP_MODE is activated, and maintains, in transition to the sleep mode, a twin-cell write mode instructing signal TWC_WRITE_MODE in an active state during a period when all the even-numbered row addresses are specified. When the twin-cell write mode instructing signal TWC_WRITE_MODE is activated, data stored in the one bit/one cell mode is rewritten into a twin-cell mode unit cell. When rewriting of data into all twin-cell mode unit cells is completed according to address bits from the refresh counter 2, the twin-cell write mode instructing signal TWC_WRITE_MODE is deactivated. The refresh activating signal REF_RAS is set in an active state for a prescribed period when an auto-refresh command or a self-refresh request is supplied, and in that active period, selection of a refresh row and refresh on memory cell data are performed in a memory mat.

The selector 3 selects output bits QA <11:0> of the refresh counter 2 when the refresh activating signal REF_RAS is activated, and selects output bits of the input buffer/latch circuit 1 when the refresh activating signal REF_RAS is deactivated.

The refresh counter 2 increments a value of address bits one at a time within the range of the address bits QA <11:0> in an auto-refresh operation in the normal one bit/one cell mode. During the sleep mode, however, the refresh counter 2 fixes the lowest refresh address bit QA <0> at 0 and a refresh address QA <11:1> of the upper 11 bits other than the lowest refresh address bit is incremented one at a time. By fixing the lowest bit QA <0> at "0," only even-numbered rows are specified as refresh rows. When all addresses specified by the address bits QA <11:1> are selected once, rewriting of data into all twin-cell mode unit cells MTU is completed and the twin-cell write mode is completed, and subsequently refresh on stored data is periodically performed.

The block decode circuit 4 and the predecode circuit 5 may be provided commonly to the memory cell arrays MA0 to MA7 of the memory mat. Alternatively, the block decode circuit 4 and the predecode circuit 5 may be provided corresponding to each of the memory cell arrays MA0 to MA7. When the predecode circuits 5 are provided corresponding to the respective memory cell arrays, the predecode circuits 5 are selectively activated according to the block selecting signals BS <7:0> from the block decode circuit 4 and a predecode circuit 5 provided corresponding to a selected (or specified) memory cell array performs a predecode operation.

The row selection related circuitry further includes a twin-cell mode control circuit 6 for generating a twin-cell mode instructing signal T_MODE_n according to the sleep mode instructing signal SLEEP_MODE, the twin-cell mode write instructing signal TWC_WRITE_MODE and a main sense amplifier activating signal SO. The twin-cell mode control circuit 6 generates a twin-cell mode instructing signal T_MODE_n to be kept in an active state for a prescribed period in response to the main sense amplifier activating signal SO during a period when the twin-cell write mode instructing signal TWC_WRITE_MODE is in an active state while the sleep mode instructing signal SLEEP_MODE is activated. When the twin-cell mode instructing signal T_MODE_n is in an active state, the predecode circuit 5 sets paired predecode signals X <3:2> or X <1:0> both into a selected state among the predecode signals X <3:0> of 4 bits. Thereby, Of 4 sub word lines connected to a selected main word line, a pair of sub word lines connected to a twin-cell mode unit cell are simultaneously driven into a selected state.

The predecode signals X <3:0> of 4 bits from the predecode circuit are supplied to the sub decode signal generating circuit 7 and a predecode signals X <19:4> of 16 bits are supplied to a main decode signal generating circuit 8. A sub decode signal generating circuit 7 generates a sub decode fast signals ZSDF <3:0> according to the predecode signals X <3:0> in response to a word line activating signal RXACT. The main decode signal generating circuit 8 decodes the predecode signals X <19:4> of 16 bits in response to activation of a main word line drive timing signal RXT to drive one bit of main word line select signals ZMWL <127:0> of 128 bits into a selected state. The main decode signal generating circuit 8 is activated according a block selecting signal from the block decode circuit 4 and only a main decode signal generating circuit 8 provided to a memory cell array specified by the block select signals BS <7:0> may be activated. Alternatively, such a configuration may be employed that the main decode signal generating circuit 8 is provided commonly to the memory cell arrays MA0 to MA7 and a main word line drive circuit for a memory cell array specified by a block select signal drives a corresponding main word line to a selected state according to the main word line select signals ZMWL <127:0> and a block select signal.

As for the predecode signals X <3:0>, the higher two bits or the lower two bits thereof are set simultaneously into a selected state in the twin-cell mode and in response, the higher two bits or the lower two bits of the sub decode fast signals ZSDF <3:0> can also be simultaneously set into an active state and two sub word lines connected to a twin-cell mode unit cell can be driven simultaneously into a selected state.

The row selection-related circuitry further includes: a self-refresh timer 9 activated when the sleep mode instructing signal SLEEP_MODE is activated to issue self-refresh request signals FAY at prescribed intervals; a refresh control circuit 10 for generating a refresh activating signal REF_RAS kept in an active state for a prescribed period each time receiving the self-refresh request signals FAY issued from the refresh timer 9 while the sleep mode instructing signal SLEEP_MODE is activated, or the auto-refresh mode instructing signal (a command) AREF; and a row-related control circuit 11 generating control signals in a prescribed sequence when one of the refresh activating signal REF_RAS and a row active command or the array activation instructing signal RACT is in an active state.

The row-related control circuit 11 sets internal control signals all into an inactive state and sets a selected memory cell array into a standby state when a precharge instructing signal (or a precharge command) PRG is supplied or the refresh activating signal REF_RAS is deactivated.

The refresh control circuit 10 activates the refresh activating signal REF_RAS when a self-refresh request signal FAY is supplied in the sleep mode. After the row-related control circuit 11 generates control signals in a prescribed sequence according to the refresh activating signal REF_RAS, the refresh control circuit 10 drives the refresh activating signal REF_RAS into an inactive state when a prescribed period elapses after activation of the main sense amplifier activating signal SO. Through such a series of operations, one self refresh operation is completed. When the refresh activating signal REF_RAS attains an inactive state, the refresh counter 2 increments the refresh address QA <11:1> by one.

Figure 12:
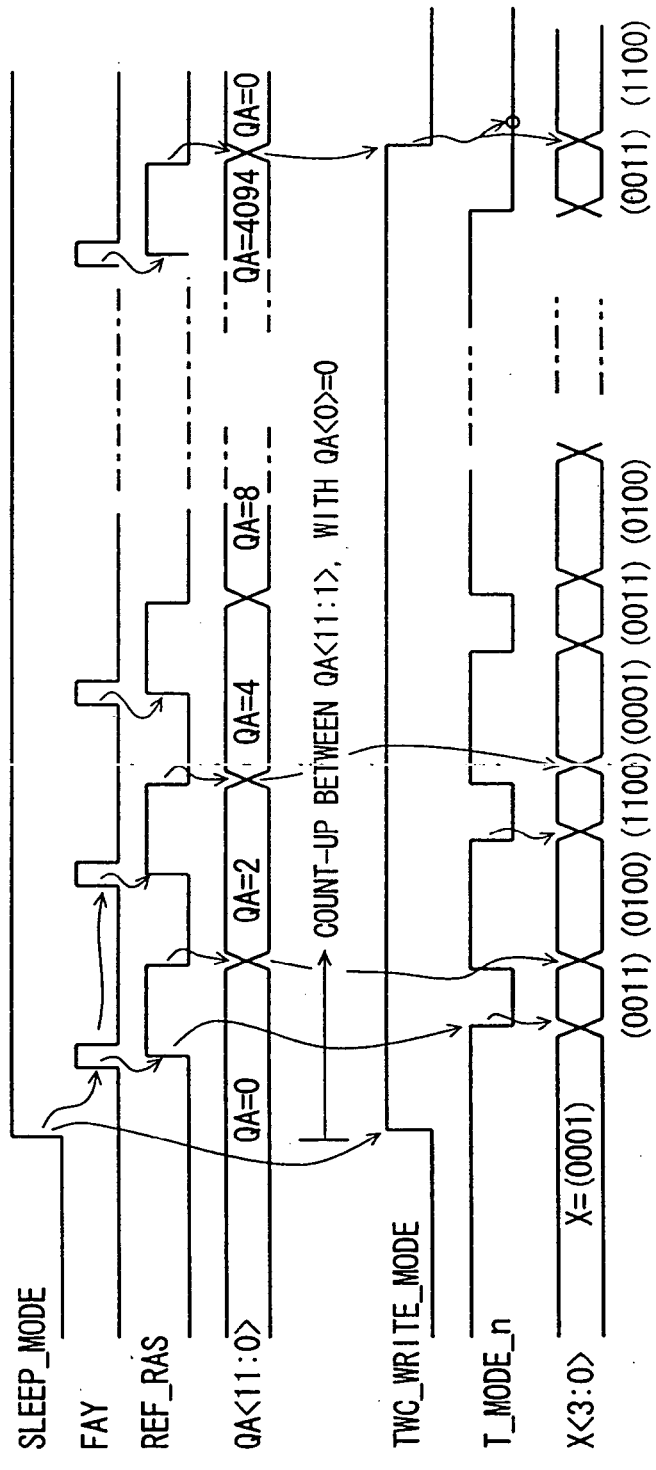
FIG. 12 is a timing chart representing operation of the circuit shown in FIG. 11.

FIG. 12 is a timing chart representing operation in a sleep mode entry of the row selection-related circuitry shown in FIG. 11. Description will be given of operation in the sleep mode entry with reference to FIGS. 11 and 12.

Upon entry into the sleep mode, the sleep mode instructing signal SLEEP_MODE is first driven into an active state. At this time, the complementary sleep mode instructing signal SLEEP_MODE_n attains an active state at L level. When the sleep mode instructing signal SLEEP_MODE is supplied, the refresh counter 2 fixes the lowest bit QA <0> thereof at 0 and starts a count-up operation within the range of the bits QA <11:1>. Furthermore, the refresh counter 2 drives and keeps the twin-cell write mode instructing signal TWC_WRITE_MODE to and at H level till all the count values are counted (till the process is performed for all the refresh addresses) when the sleep mode instructing signal SLEEP_MODE is supplied.

When the sleep mode instructing signal SLEEP_MODE is supplied, the self-refresh timer 9 issues refresh request signals FAY at prescribed intervals. The refresh request signals FAY are generated at an interval of tREFmax/(RN/2), with a maximum refresh cycle in the one bit/two cell mode (the twin-cell mode) represented by tREFmax. Where, RN indicates the number of times of refreshes in one refresh cycle in the normal one bit/one cell operating mode. When a refresh address is of 12 bits, RN=4K (=4096).

The refresh control circuit 10 drives the refresh activating signal REF_RAS into an active state in response to activation of the refresh request signal FAY. Responsively, the row-related control circuit 11 drives the word line drive timing signal RXT, the word line activating signal RXACT and the main sense amplifier activating signal SO sequentially into an active state. Furthermore, in response, the block decode circuit 4 and the predecode circuit 5 decodes and predecodes, respectively, output count bits QA <11:0> of the refresh counter 2 supplied through the selector 3 to generate the block select signals BS <7:0> and the predecode signals X <19:0>.

Then, the sub decode signal generating circuit 7 and the main decode signal generating circuit 8 decode the predecode signals supplied thereto to generate the sub decode fast signals ZSDF <3:0> and the main word drive signals ZMWL <127:0>, respectively. When the twin-cell mode instructing signal T_MODE_n is in an active state, the predecode circuit 5 performs a two stage operation. At the first stage, a predecode signal X <0> of predecode signals X <3:0> is in an selected state. Hence, the sub word line SWLL0 is first driven into a selected state. When the sense amplifier activating signal SO is driven into an active state, the twin-cell mode instructing signal T_MODE_n is responsively driven into an active state, and the predecode circuit 5 drives the predecode signals X <1:0> into a degenerated state or both signals into a selected state. Hence, the sub word lines SWLL0 and SWLR1 both enter a selected state and a unit cell in the twin-cell mode is selected to perform data writing thereon. When one write operation is completed, the refresh activating signal REF_RAS is deactivated after a prescribed time since the sense amplifier activating signal SO is activated. Responsively, a count value QA <11:1> of the refresh counter 2 is counted up by one and the refresh address is incremented by two as a whole. This state corresponds to a state in which a predecode signal X <2> among the predecode signals X <3:0> is driven into a selected state.

Then, when the prescribed time elapses and the refresh request signal FAY is activated, the refresh activating signal REF_RAS is activated to perform a row select operation. In this case, the predecode signal X <2> is in a selected state and the sub word line SWLL2 is first driven into a selected state. In this state, a sense operation is performed and sensing, amplifying and latching data of a memory cell connected to the sub word line SWLL2 are performed. Then, when the twin-cell mode instructing signal T_MODE_n attains an active state at L level, the predecode circuit 5 performs a degenerating operation of the address bit RAF <0> and predecode signals X <3:2> attain a selected state in accordance with the address bit RAF <0>, and the sub word line SWLR3 is driven into a selected state. Thereby, a twin-cell mode unit cell is selected to perform data writing.

After a count value of the refresh counter 2 is incremented by two at a time and a sense operation is completed in the predecode circuit 5, a degenerating operation on the address bit RA <0> is performed to select sub word lines constituting a pair. More specifically, a sub word line corresponding to a row with an even-numbered address is first driven into a selected state to perform a sense operation. Then, through degeneration of the address bit RA <0>, a sub word line corresponding to a row with an odd numbered address, constituting a pair with a sub word line with an even-numbered address in the selected state, is driven into a selected state. Responsively, a unit cell in the twin-cell mode is selected to perform data writing. Thereafter, such a series of operations are repeated till a count value in the sleep mode entry (for example m) is attained, while updating the count value of the refresh counter.

When a count value QA of the refresh counter 2 returns back to a start address, m, and data rewriting on an address (m-2) in the twin-cell mode is completed, the twin-cell write mode instructing signal TWC_WRITE_MODE attains an inactive state. Subsequently, the twin-cell mode instructing signal T_MODE_n stays in an active state at L level. Since, in the predecode circuit 5, the twin-cell mode instructing signal T_MODE_n is fixed to an actives state at L level while the sleep mode instructing signal SLEEP_MODE_n is in an active state at L level, degenerating operation is performed at all times, and two sub word lines constituting a pair are simultaneously driven into a selected state according to output count bits QA <11:0> of the refresh counter 2.

Figure 13:
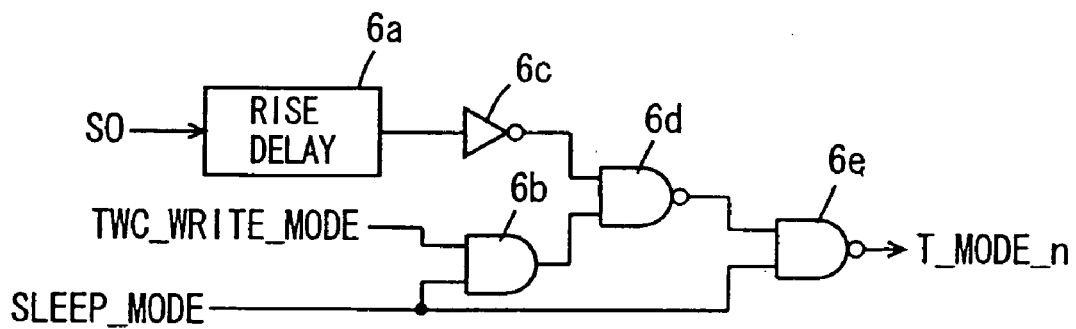
FIG. 13 is a diagram representing a configuration of a twin-cell mode control circuit shown in FIG. 11.
Figure 14:
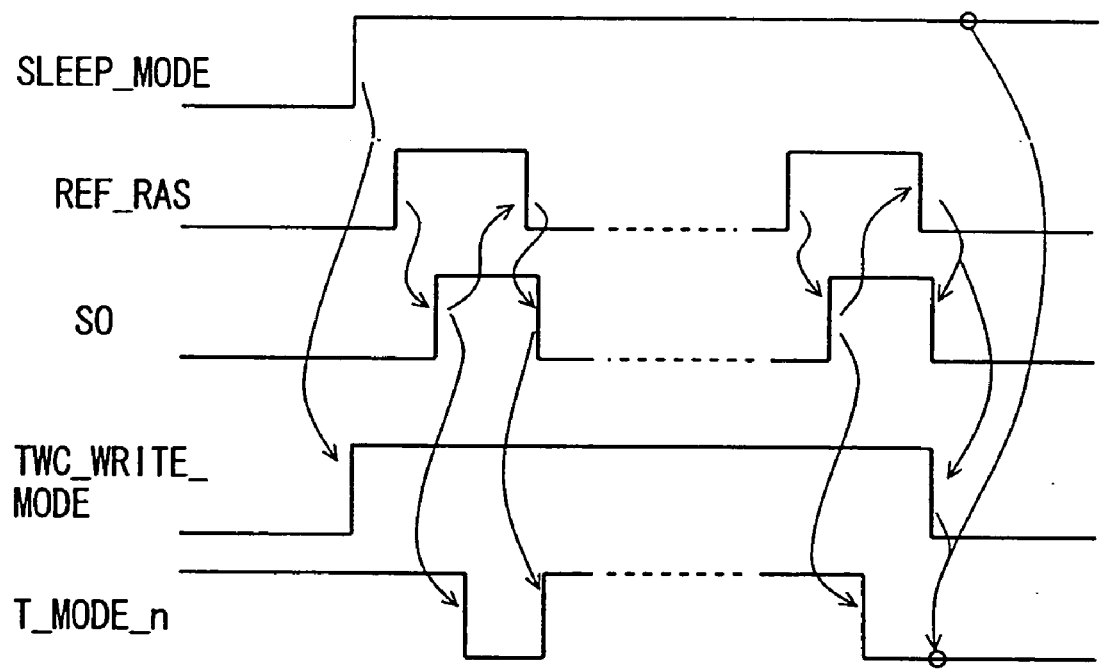
FIG. 14 is a diagram of signal waveforms representing operation of the twin-cell mode control circuit shown in FIG. 13.

FIG. 13 is a diagram representing an example configuration of the twin-cell mode control circuit 6 shown in FIG. 11. In FIG. 13, the twin-cell mode control circuit 6 includes: a rise delay circuit 6a delaying the rise (activation) of the main sense amplifier activating signal SO by a prescribed time; an AND circuit 6b receiving the twin-cell write mode instructing signal TWC_WRITE_MODE and the sleep mode instructing signal SLEEP_MODE; an inverter circuit 6c inverting an output signal of the rise delay circuit 6a; a NAND circuit 6d receiving output signals of the inverter 6c and the AND circuit 6b; and a NAND circuit 6e receiving an output signal of the NAND circuit 6d and the sleep mode instructing signal SLEEP_MODE to output the twin-cell mode instructing signal T_MODE_n. Now, description will be given of operation of the twin-cell mode control circuit shown in FIG. 13 with reference to the diagram of signal waveforms shown in FIG. 14.

When the sleep mode instructing signal SLEEP_MODE is in an inactive state at L level, the twin-cell mode instructing signal T_MODE_n from the NAND circuit 6e is at H level.

When the sleep mode is set and the sleep mode instructing signal SLEEP_MODE rises to H level, the NAND circuit 6e operates as an inverter. At this time, the twin-cell write mode instructing signal TWC_WRITE_MODE is kept at an H level while data are written into all twin-cell mode unit cells. Hence, an output signal of the AND circuit 6b attains an H level, and the NAND circuit 6d operates as an inverter. In this state, the NAND circuits 6d and 6e both operate as inverters, and the twin-cell mode instructing signal T_MODE_n is an inverted version of the output signal of the rise delay circuit 6a.

The rise delay circuit 6a delays the rise (activation) of the main sense amplifier activating signal SO by a prescribed time. Hence, when the refresh activating signal REF_RAS is activated and the main sense amplifier activating signal SO is activated at a prescribed timing, the twin-cell mode instructing signal T_MODE_n attains an active state later than the activation of the main sense amplifier activating signal SO. When a prescribed time elapses after activation of the main sense amplifier activating signal SO, the refresh activating signal REF_RAS is deactivated, the main sense amplifier activating signal SO attains an inactive state and the twin-cell mode instructing signal T_MODE_n attains an H level. Such a series of operations are repeated till data are written into all twin cell mode unit cells.

When data rewriting into all the unit cells is completed, the twin-cell write mode instructing signal TWC_WRITE_MODE is set at L level. In response, the output signal of the AND circuit 6b attains an L level and the output signal of the NAND circuit 6d attains an H level regardless of a logical level of the output signal of the rise delay circuit 6a. The NAND circuit 6e receives signals of H level at both inputs thereof and therefore, the twin-cell mode instructing signal T_MODE_n is fixed at L level while the sleep mode instructing signal SLEEP_MODE stays in an active state at H level.

Therefore, in the twin-cell write mode, sub word lines constituting a pair are sequentially activated and in the subsequent self-refresh mode, sub word lines constituting a pair are simultaneously driven into a selected state.

Figure 15:
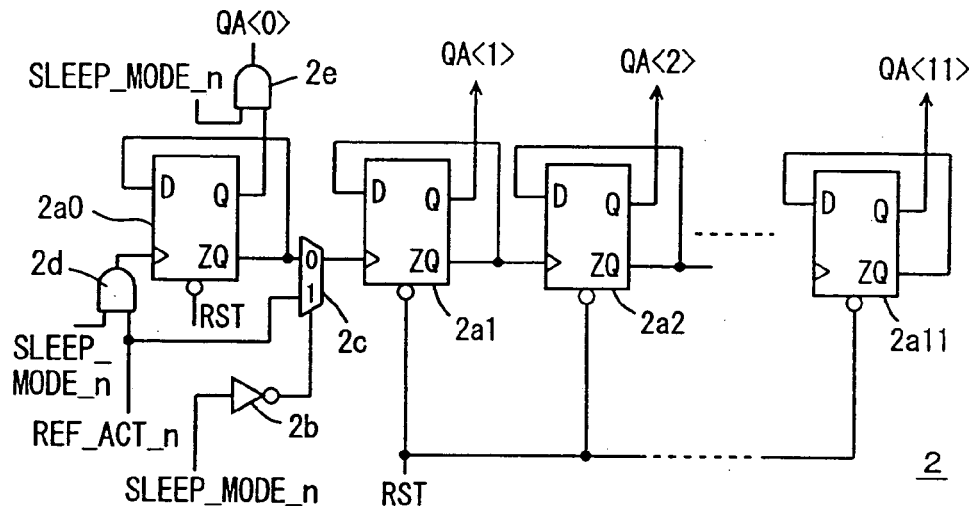
FIG. 15 is a diagram representing a configuration of a refresh counter shown in FIG. 11.

FIG. 15 is a diagram representing a configuration of the refresh counter 2 shown in FIG. 11. In FIG. 15, the refresh counter 2 includes: D flip flops 2a0 to 2a11 of 12 stages; an inverter 2b inverting the sleep mode instructing signal SLEEP_MODE; a multiplexer 2c selecting one of a signal from the output ZQ of the D flip flop 2a0 at the first stage and the complementary refresh activation instructing signal REF_ACT_n according to an output signal of the inverter 2b for application to the clock input of the D flip flop 2a1; an AND circuit 2d receiving the complementary refresh activation instructing signal REF_ACT_n and a complementary sleep mode instructing signal SLEEP_MODE_n to supply an output signal thereof to the clock input of the D flip flop 2a0; and an AND circuit 2e receiving a signal from the output Q of the D flip flop 2a0 and the complementary sleep mode instructing signal SLEEP_MODE_n to output a refresh address bit QA <0>.

The D flip flops 2a1 to 2a11 each receive an output ZQ of a D flip flop at the preceding stage at the clock input thereof. Refresh address bits QA <1> to QA <11> are outputted from the respective outputs Q of the flip flops 2a1 to 2a11.

The refresh counter shown in FIG. 15 is based on a ripple counter. In the normal one bit/one cell operating mode, the complementary sleep mode instructing signal SLEEP_MODE_n is at H level and the AND circuits 2d and 2e each operate as a buffer circuit. The multiplexer 2c selects an output signal from the output ZQ of the D flip flop 2a0. Hence, in this case, when the refresh activation instructing signal REF_ACT is deactivated and responsively the complementary refresh activation instructing signal REF_ACT_n is activated, a state of the output ZQ of the D flip flop 2a0 is altered.

Each of the D flip flops 2a1 to 2a11 alters a signal state from the output ZQ thereof when an output signal from the output ZQ of a D flip flop at the preceding stage rises from "0" (L level) to "1" (H level). That is, when a bit QA <i> returns back to 0, the next bit QA <i+1> rises to 1. Hence, the 12 address bits QA <11> to QA <0> are incremented by one at a stage. When in the one bit/one cell mode, an auto-refresh command is supplied, the refresh counter 2 performs a count operation to increment the refresh address thereof by one at a time.

In the sleep mode, the sleep mode instructing signal SLEEP_MODE attains an H level, and the complementary sleep mode instructing signal SLEEP_MODE_n is set at L level. Accordingly, the lowest bit QA <0> of the refresh address is fixed at "0", the output signal of the AND circuit 2d is at L level, and the D flip flop 2a0 stays in a reset state. Here, in the sleep mode entry, all the bit values of the refresh address counter may be once reset to "0" by a reset signal RST.

The multiplexer 2c selects the complementary refresh activating signal REF_ACT_n for application to the clock input of the D flip flop 2a1. Hence, each time one refresh operation cycle is completed, the bit QA <1> from the output Q of the D flip flop 2a1 is altered and the refresh address bits QA <11> to QA <0> are incremented by two at a time as a whole. Thereby, in the one bit/two cell mode (twin-cell mode), a refresh address is incremented by two at a time, to select a word line of an even-numbered row address and a word line of an odd-numbered row address constituting a pair therewith are simultaneously selected.

Figure 16:
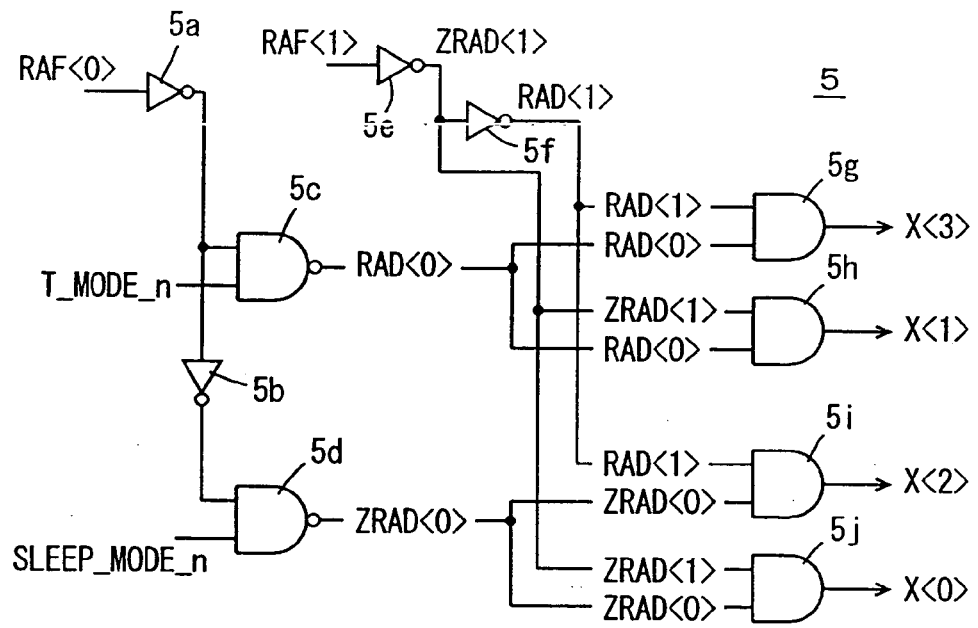
FIG. 16 is a diagram representing a configuration of a predecode circuit shown in FIG. 11.

FIG. 16 is a diagram representing a configuration of the predecode circuit 5 shown in FIG. 11. In FIG. 10, the predecode circuit 5 includes: an inverter 5a inverting an internal address bit RAF <0>; a NAND circuit 5c receiving an output signal of the inverter 5a and the twin-cell mode instructing signal T_MODE_n to generate a row address bit RAD <0>; an inverter 5b receiving an output signal of the inverter 5a; an NAND circuit 5d receiving an output signal of the inverter 5b and a complementary sleep mode instructing signal SLEEP_MODE_n to generate a complementary internal row address bit ZRAD <0>; an inverter 5e inverting an address bit RAF <1>; an inverter 5f inverting an output signal of the inverter 5e; an AND circuit 5g receiving an output bit RAD <1> of the inverter 5f and a row address bit RAD <0> from the NAND circuit 5c to generate a predecode signal X <3>; an AND circuit 5h receiving an address bit ZRAD <1> from the inverter 5e and the row address bit RAD <0> from the NAND circuit 5c to generate a predecode signal X <1>; an AND circuit 5i receiving the row address bit RAD <1> and the complementary internal row address bit ZRAD <0> to generate a predecode signal X <2>; and an AND circuit 5j receiving the address bit ZRAD <1> and the ZRAD <0> to generate a predecode signal X <0>.

When the sleep mode is entered, the complementary sleep mode instructing signal SLEEP_MODE_n attains an L level and responsively, the address bit ZRAD <0> from the NAND circuit 5d attains an H level. Hence, one of the predecode signals X <0> and X <2> attains an H level according to a value of the address bit RAD <1>. If the value of the address bit RAD <1> is "0," the predecode signal X <0> attains "1". In this state, when the twin-cell mode instructing signal T_MODE_n is set to an L level, the address bit RAD <0> from the NAND circuit 5c attains "1".

In the sleep mode, the refresh bit address QA <0> is fixed at 0 and the address bit RAF <0> is "0". Therefore, when the twin-cell mode instructing signal T_MODE_n is set at L level, one of the predecode signals X <3> and X <1> is driven into an active state according to a value of the address bit RAD <1>. If the address bit RAD <1> is "0", the predecode signal X <1> is driven into a selected state. Hence, in the twin-cell write mode, for example, after a sub word line selected by the predecode signal X <0> is driven into a selected state, a sub word line selected by the predecode signal X <1> is driven into a selected state. Hence, in the twin-cell write mode, the predecode signals X <3:0> are altered, for example, in a sequence, <0001>→<0011>→<0100>→<1100>→<0001>→ when a start address of the address bits QA <1:0> of the refresh counter in the self-refresh mode entry is (00). In the twin-cell write mode, a sub word line with an even numbered address and a sub word line with an odd numbered address constituting a pair therewith are both driven into a selected state with an appropriate timing difference.

When the twin-cell write mode is completed, refresh in the twin cell mode is performed in the sleep mode. In this case, the twin-cell mode instructing signal T_MODE_n is fixed at L level, the address bits RAD <0> and ZRAD <0> are both "1", the address bit RAF <0> is set in a degenerated state, and one of set of the predecode signals X <0> and X <1> and a set of the predecode signals X <2> and X <3> is simultaneously driven into a selected state.

Figure 17:
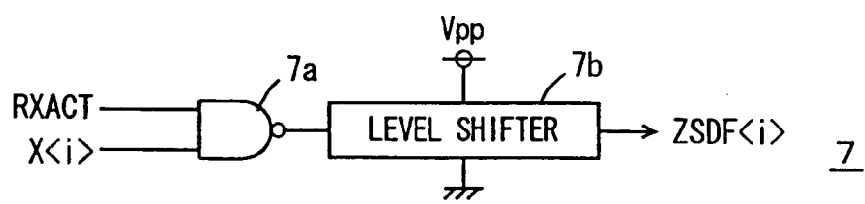
FIG. 17 is a diagram schematically showing a configuration of a sub decode signal generating circuit shown in FIG. 11.

FIG. 17 is a diagram schematically showing a configuration of a sub decode signal generating circuit 7 shown in FIG. 11. In FIG. 17, the sub decode signal generating circuit 7 includes: a NAND circuit 7a receiving a word line activating signal RXACT and a predecode signal X <i> to generate a sub decode fast signal ZSDF <i>; and a level shifter 7b shifting a signal at the peripheral power supply voltage Vccp level from the NAND circuit 7a to a signal of the boosted voltage Vpp level, where i=0 to 3.

When the word line activating signal RXACT attains an active state at H level, the sub decode fast signal ZSDF <i> is driven into an active state at L level when the predecode signal X <i> is in a selected state at H level. Hence, a predecode fast signals ZSDF <3:0> are generated according to predecode signals X <3:0>, and two predecode signals in a set are simultaneously driven into a selected state, and thereby, two sub decode fast signals are also simultaneously driven into a selected state. Responsively, sub word lines with even numbered and odd numbered row addresses are simultaneously driven into a selected state. Hence, in the self-refresh mode, data refresh and data writing can be performed in the twin-cell mode.

Figure 18A:
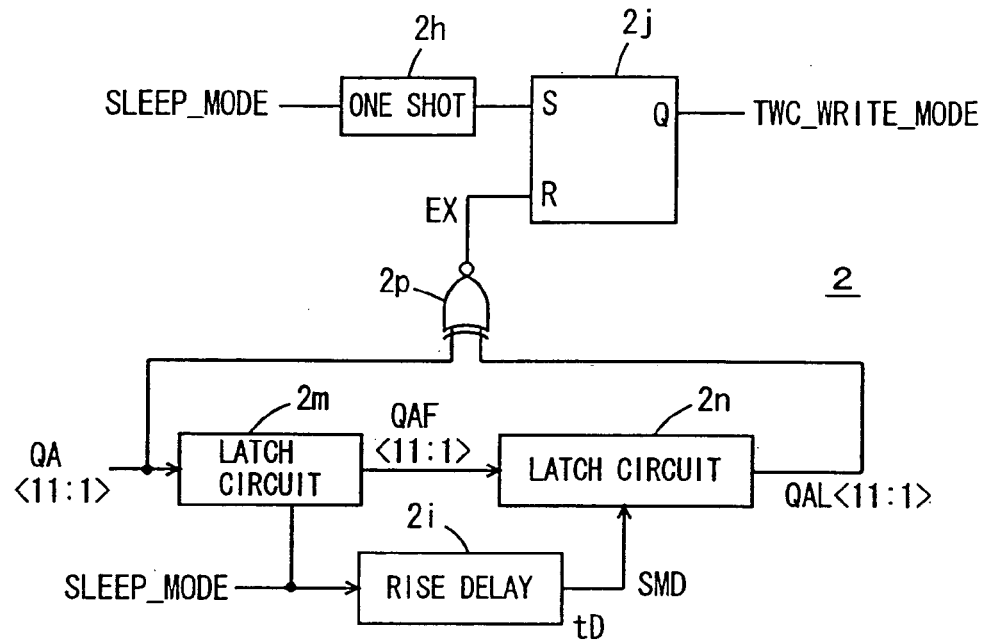
FIG. 18A is a diagram schematically showing a twin-cell write mode instructing signal generating section of a refresh counter shown in FIG. 11

FIG. 18A is a diagram schematically showing a twin-cell write mode instructing signal generating section included in the refresh counter 2. In FIG. 18A, the twin-cell write mode instructing signal generating section includes: a one-shot pulse generating circuit 2h generating a one-shot pulse in response to activation of the sleep mode instructing signal SLEEP_MODE; and a set/reset flip flop 2j set in response to the rise of an output pulse signal of the one-shot pulse generating circuit 2h. A twin-cell write mode instructing signal TWC_WRITE_MODE is outputted from the output Q of the set/reset flip flop 2j.

Figure 18B:
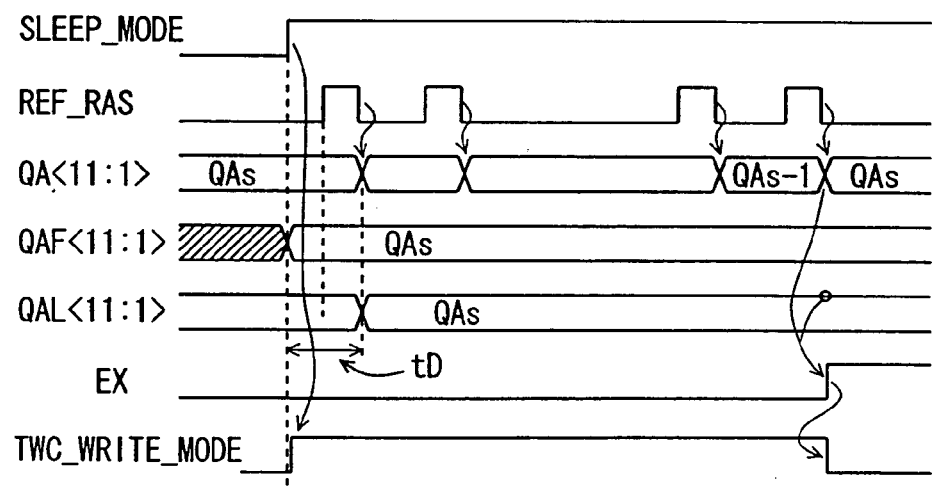
FIG. 18B is a diagram of signal waveforms representing operation of the circuit of FIG. 18A.

The twin-cell write mode instructing signal generating section further includes: a latch circuit 2m capturing address bits QA <11:1> to latch and output the address bits when the sleep mode instructing signal SLEEP_MODE is at an H level; a rise delay circuit 2i delaying the rise of the sleep mode instructing signal SLEEP_MODE by a prescribed time tD; a latch circuit 2n capturing address bits QAF <11:1> to latch and output the address bits received from the latch circuit 2m in response to the rise of a delayed sleep mode instructing signal SMD from the rise delay circuit 2i; and a coincidence detecting circuit 2p identifying coincidence/noncoincidence between the address bits QA <11:1> and latch address bits QAL <11:1> from the latch circuit 2n. When an output signal EX from the coincidence detecting circuit 2p attains an H level, the set/reset flip flop 2j is reset. The coincidence detecting circuit 2p compares the address bits QA <11:1> and QAL <11:1> bit by bit, and sets the output signal EX thereof at H level indicating a coincidence detection state when coincidence for all the bits is detected. Now, description will be given of operation of the twin-cell write mode instructing signal generating section shown in FIG. 18A, with reference to signal waveforms shown in FIG. 18B.

When the sleep mode instructing signal SLEEP_MODE is at L level, the latch circuits 2m and 2n are both in a through state. Since the one-shot pulse generating circuit 2h generates no pulse, the twin-cell write mode instructing signal TWC_WRITE_MODE is kept at L level. When a sleep mode entry command is supplied and the sleep mode instructing signal SLEEP_MODE rises to H level, then a one-shot pulse is generated from the one-shot pulse generating circuit 2h, the set/reset flip flop 2j is set and accordingly the twin-cell write mode instructing signal TWC_WRITE_MODE rises to H level.

When the sleep mode instructing signal SLEEP_MODE rises, the latch circuit 2m enters a latch state, and captures and latches the address bits QA <11:1> supplied at that time and outputs the address bits, which the latch circuit 2m has captured, as the address bits QAF <11:1>. Hence, the address bits QAF <11:1> from the latch circuit 2m enter a latch state in response to the rise of the sleep mode instructing signal SLEEP_MODE.

A refresh activating signal REF_RAS is generated in response to activation of the sleep mode instructing signal SLEEP_MODE to perform a refresh operation (a twin cell write mode operation). When the refresh activating signal REF_RAS attains an L level, a value of the address bits QA <11:1> is updated by 1. A delay time tD of the rise delay circuit 2i has a length equal to or more than a time length required till a refresh operation is performed according to the first refresh activating signal REF_RAS after entry into the sleep mode. Hence, after the refresh is performed and a value of the address bits Q <11:1> is updated, the latch circuit 2n captures and latches address bits QAF <11:1> received from the latch circuit 2m according to the delayed sleep mode instructing signal SMD from the rise delay circuit 2i to output the address bits as latch address bits QAL <11:1>.

The latch circuits 2m and 2n, thereafter, stay in a latch state and values of the address bits QAF <11:1> and QAL <11:1> do not alter even when a value of the address bits QA <11:1> is updated, and an address at which refresh is first performed (at which twin-cell mode writing was performed) in the sleep mode entry is specified. The refresh activating signal REF_RAS is thereafter activated at prescribed interval and the address bits QA <11:1> are updated by 1 each time one refresh operation cycle is completed. When the address bits QA <11:1> return finally back to the start address QAs, the output signal EX from the coincidence detecting circuit 2p is driven to an H level, the set/reset flip flop 2j is reset and the twin-cell write mode instructing signal TWC_WRITE_MODE is deactivated. Thereby, data writing in the twin-cell mode through the addresses (even numbered addresses) from the start address QAs to the preceding address QAs–1 is completed. The delay time tD of the rise delay circuit 2i needs only to be determined so as to be of an appropriate length. This is because the latch address bits QAL <11:1> from the latch circuit 2n have only to be set to a count value indicating the start address till the refresh address counter has counted all the count values available.

The latch circuits 2m and 2n may be constituted of a rising edge trigger latch circuit. Furthermore, the latch circuit 2m may be constituted of a latch circuit including a transfer gate, which enters a latch state when the sleep mode instructing signal SLEEP_MODE is at H level, and enters a through state when the sleep mode instructing signal SLEEP_MODE is at L level. In this case, alternatively, the latch circuit 2n may be constituted of a latch circuit including a transfer gate, which enters a latch state when the delayed sleep mode instructing signal SMD attains an H level, and enters a through state when the delayed sleep mode instructing signal SMD attains an L level.

By providing the latch circuits 2m and 2n, the twin-cell write mode instructing signal TWC_WRITE_MODE can be deactivated after data rewriting is performed at all even-numbered addresses in the twin-cell write mode.

Figures 19, 20:
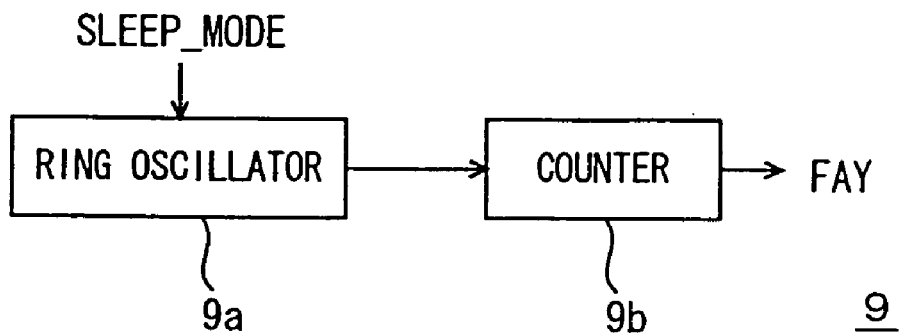
FIG. 19 is a diagram schematically showing a configuration of a self-refresh timer shown in FIG. 11.
FIG. 20 is a diagram representing address assignment in a hold data storage region in a modification of the first embodiment of the present invention.

FIG. 19 is a diagram schematically showing a configuration of the self-refresh timer 9 shown in FIG. 11. In FIG. 19, the self-refresh timer 9 includes: a ring oscillator 9a started, when the sleep mode instructing signal SLEEP_MODE is activated, to oscillate at a prescribed cycle; and a counter 9b counting output pulses of the ring oscillator 9a to generate a refresh request signal FAY each time a count value reaches a prescribed value. The ring oscillator 9a is constructed of, for example, inverters of even number of stages, and a NAND circuit receiving the sleep mode instructing signal SLEEP_MODE at one input thereof and inserted as an inverter stage. In the sleep mode, the counter 9b generates a count-up signal each time the counter 9b counts the prescribed value and thereby, refresh request signals FAY can be issued at prescribed intervals.

Modification

FIG. 20 is a diagram schematically showing a modification of the first embodiment of the present invention. In FIG. 20, a memory mat includes 8 memory cell arrays MA0 to MA7. The memory cell arrays MA0 to MA7 are specified by the higher 3 bit address RA <11:9>. The memory cell arrays MA0 to MA3 are specified when an address bit RA <11> is 0. The region of the memory cell arrays MA4 to MA7 is specified when the address bit RA <11> is "1". Two memory cell arrays are specified by address bits RA <10:9>. Therefore, when the address bit RA <11> is fixed at "0" in the sleep mode, the region of the memory cell arrays MA0 to MA3 can be utilized as a data holding region.

In this case, a refresh time can be longer by a factor of 2 as compared with a case where all the memory arrays MA0 to MA7 are utilized and accordingly, a consumed current can be reduced more. In this case, a count value of the refresh address counter 2 is once reset to an initial value (0, 0 . . . 0).

Figure 21:
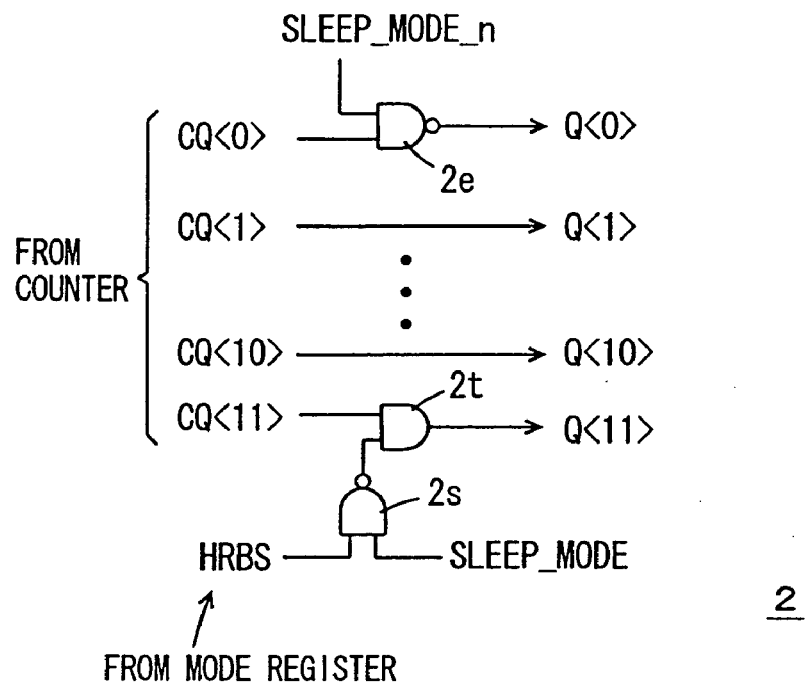
FIG. 21 is a diagram representing a configuration of a refresh counter of the modification of the first embodiment of the present invention.

FIG. 21 is a diagram schematically showing a configuration of the refresh counter 2 in the modification. An address bit Q <0> is generated from an AND gate 2ea receiving a complementary sleep mode instructing signal SLEEP_MODE_n and the lowest output bit CQ <0> of the counter. The AND gate 2ea corresponds to the NAND circuit 2e of the configuration shown in FIG. 15. The upper output bits CQ <1> to CQ <10> of the counter are utilized as the refresh address bits Q <1> to Q <10>. For a refresh address Q <11>, there are provided a NAND circuit 2s receiving a half refresh block size instructing signal HRBS and a sleep mode instructing signal SLEEP_MODE; and an AND circuit 2t receiving an output signal of the NAND circuit 2s and a count bit CQ <11> from the counter. The highest address bit Q <11> is generated from the AND circuit 2t.

The half refresh block size instructing signal HRBS is set to H level when 4 memory cell arrays of the memory cell arrays MA0 to MA3 are used. Hence, when the sleep mode instructing signal SLEEP_MODE attains an H level and the sleep mode is set, then an output signal of the NAND circuit 2s attains an L level. Responsively, the refresh address bit Q <11> is fixed to 0. A count operation is performed with the refresh address bits Q <10:1> (a circuit configuration of the counter is the same as in FIG. 15). Thereby, data holding can be performed in the memory cell arrays MA0 to MA3 of FIG. 20.

Note that if this configuration is extended, a data holding region can be set in a unit of 4 memory cell arrays MA0 to MA3, 2 memory cell arrays MA0 and MA1 or one memory cell array MA0. A set of the AND circuit 2t and the NAND circuit 2s is provided for each of the bits CQ <11> to CQ <9> and a logic level of a signal applied to the NAND circuit 2s is set according to each refresh block size. By setting refresh block size data in a mode register, for example, a configuration for a case where only the memory cell array MA0 is utilized as a data holding region, for a case where the memory cell arrays MA0 and MA1 are utilized as a data holding region, and for a case where the memory cell arrays MA0 to MA3 are utilized as a data holding region can be readily implemented.

Figure 22:
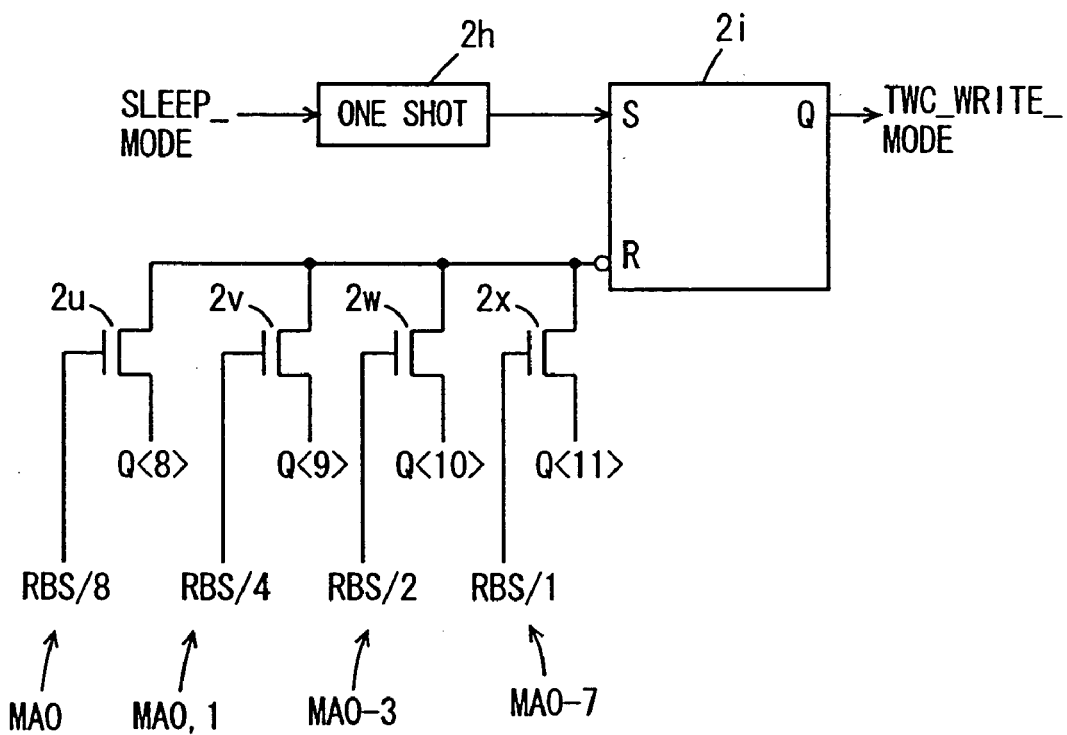
FIG. 22 is a diagram schematically showing a configuration of a twin-cell write mode instructing signal generating section of the refresh counter of the modification of the first embodiment of the present invention.

FIG. 22 is a diagram schematically showing a configuration of a twin-cell write mode instructing signal generating section in a case where a refresh data storage region is set with a memory cell array being a unit. In FIG. 22, the twin-cell write mode instructing signal generating section includes: a one-shot pulse generating section 2h generating a one-shot pulse signal in response to activation of the sleep mode instructing signal SLEEP_MODE; a set/reset flip flop 2i set in response to an output pulse of the one-shot pule generating circuit 2h; a transfer gate 2u made conductive, when a ⅛ refresh block size instructing signal RBS/8 is activated, to couple the refresh address bit Q <8> with the reset input R; a transfer gate 2v rendered conductive, when a ¼ refresh block size instructing signal RBS/4 is activated, to couple the refresh address bit Q <9> with the reset input R; and a transfer gate 2w rendered conductive, when a ½ refresh block size instructing signal RBS/2 is activated, to couple the refresh address bit Q <10> with the reset input R. The set/reset flip flop 2i is reset in response to the fall of a signal received at the reset input R. A twin-cell write mode instructing signal TWC_WRITE_MODE is outputted from the output Q of the set/reset flip flop 2i.

When the ⅛ refresh block size instructing signal RBS/8 is activated, the single memory cell array MA0 is utilized as a data holding region. When the ¼ refresh block size instructing signal RBS/4 is activated, a ¼ block, that is, the memory cell arrays MA0 and MA1 are utilized as a data holding region. When the ½ refresh block size instructing signal RBS/2 is activated, the memory cell arrays MA0 to MA3 are utilized as a data holding region. When only the memory cell array MA0 is utilized as a data holding region, a count operation is performed between the refresh address bits Q <8> and Q <1>, and the higher refresh address bits Q <11:9> are set to (000). Hence, when the highest count address bit Q <8> falls from H level to L level, data writing in the memory cell array MA0 in the twin-cell mode is completed.

When the ¼ refresh block size instructing signal RBS/4 is activated, the memory cell arrays MA0 and MA1 are utilized as a data holding region. In this case, a count operation is performed in the range of the refresh address bits Q <9:1> and the refresh address bits Q <11:10> are fixed at "00." Hence, when the refresh address bit Q <9> transitions from "1" to "0," it is detected, by the transition, that data writing to even numbered row addresses in the memory cell arrays MA0 and MA1 in the twin-cell mode is completed. When the ½ refresh block size instructing signal RBS/2 is activated, the memory cell arrays MA0 to MA3 are utilized as a data holding region. In this state the refresh address bit Q <11> is fixed at "0" and a count operation is performed in the range of the refresh address bits Q <10:1>. Hence, when the highest refresh address bit Q <10> transitions from "1" to "0," it is detected, by the transition, that data writing to even numbered row addresses in the memory cell arrays MA0 to MA3 in the twin-cell mode is completed.

When the refresh address bits Q <9>, Q <10>, and Q <11> are selectively fixed at "0" in response to the refresh block size instructing signals RBS/8, RBS/4 and RBS/2, the range in which the refresh address bits are variable can be set. In this configuration, an issuance cycle of the refresh request signal FAY in the twin-cell mode can be reduced to prevent data destruction before data rewriting in the twin-cell mode.

Alternatively, determination may also be performed on whether or not rewriting to all the addresses is completed with count bits according to a block size upon the self-refresh entry being a start address.

Figure 23:
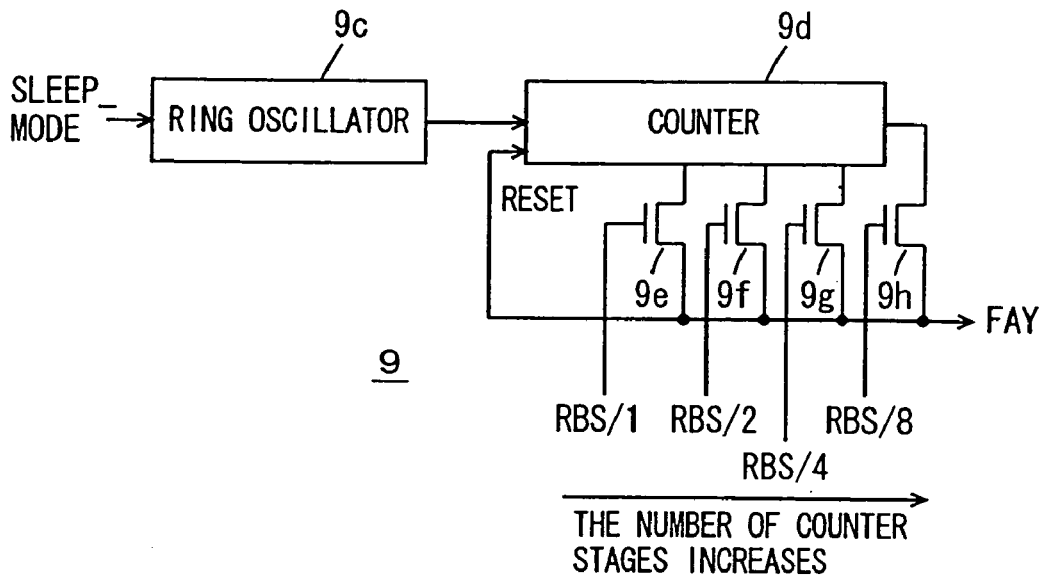
FIG. 23 is a diagram representing a configuration of the self-refresh timer of the modification of the first embodiment of the present invention.

FIG. 23 is a diagram schematically showing a configuration of the self-refresh timer 9 in a variable refresh block size configuration. Referring to FIG. 23, the refresh timer 9 includes: a ring oscillator 9c activated, when the sleep mode instructing signal SLEEP_MODE is activated, to generate an oscillating signal of a prescribed cycle; a counter 9d counting oscillating signals of the ring oscillator 9c; a transfer gate 9e rendered conductive, when the refresh block size instructing signal RBS/1 is activated, to select a prescribed count bit of the counter 9d and generate a refresh request signal FAY; a transfer gate 9f rendered conductive, when the refresh block size instructing signal RBS/2 is activated, to select a prescribed bit of the counter 9d and generate a refresh request signal FAY; a transfer gate 9g rendered conductive, when the refresh block size instructing signal RBS/4 is activated, to select a prescribed bit of the counter 9d and generate a refresh request signal FAY; and a transfer gate 9h rendered conductive, when the refresh block size instructing signal RBS/8 is activated, to select the highest count bit of the counter 9d and generate a refresh request signal FAY. The counter 9d is reset when the refresh request signal FAY is activated to start a count operation from an initial value thereof. Count bits of the counter 9d that the transfer gates 9e to 9h select are shifted by one digit between adjacent gates. Hence, as a refresh block size decreases, an interval at which refresh request signals FAY are issued increases. Thereby, a refresh time can be changed according to a refresh block size.

Figure 24:
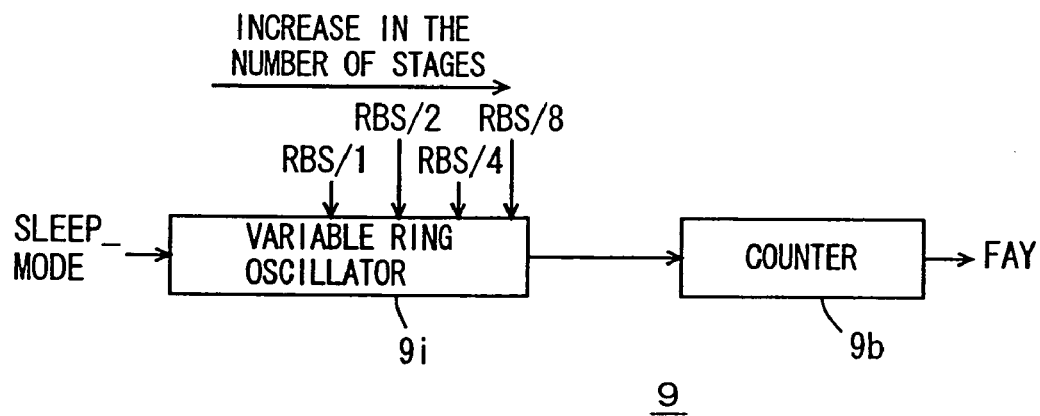
FIG. 24 is a diagram of a modification of the self-refresh timer of the example modification of the first embodiment of the present invention.

FIG. 24 is a diagram of a configuration of a modification of the self-refresh timer 9. In FIG. 24, the refresh timer 9 includes: a variable ring oscillator 9i started in response to activation of the sleep mode instructing signal SLEEP_MODE; and a counter 9b counting output signals of the variable ring oscillator 9i and generating a refresh request signal FAY when a count value reaches a prescribed value. The variable ring oscillator 9i is adapted to increase the number of ring stages according to the refresh block size instructing signals RBS/1, RBS/2, RBS/4 and RBS/8 in this order. Hence, when a refresh block size is all the memory cell arrays MA0 to MA7, an oscillating cycle of the variable ring oscillator 9i is the shortest. When the refresh block size instructing signal RBS/8 is in an active state and refresh is performed on the memory cell array MA0 only, an oscillating cycle is the longest. Hence, an issuance interval of the refresh request signal FAY generated from the counter 9b is longer as a refresh block size decreases from a case where refresh is performed for all the memory cell arrays MA0 to MA7. Thereby, the number of times of refreshes in the sleep mode can be reduced, thus a consumed current can be reduced.

Second Modification

Figure 25:
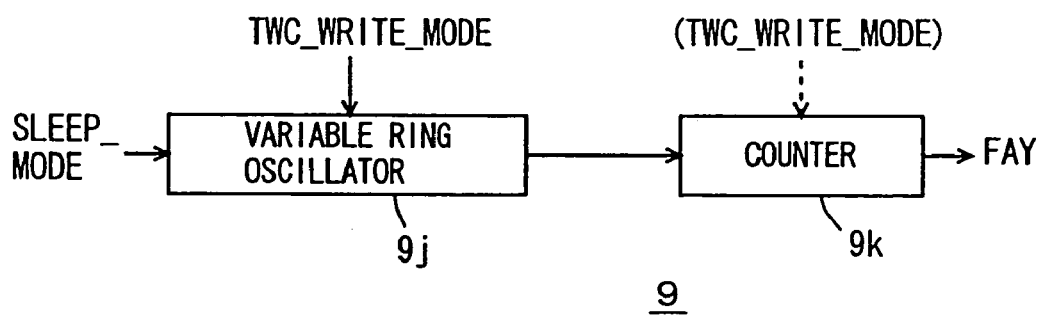
FIG. 25 is a diagram of another modification of the self-refresh timer of the modification of the first embodiment of the present invention.

FIG. 25 is a diagram schematically showing a configuration of the self-refresh timer 9 according to a second modification of the first embodiment of the present invention. In FIG. 25, the refresh timer 9 includes: a variable ring oscillator 9j started, when the sleep mode instructing signal SLEEP_MODE is activated, to perform an oscillating operation; and a counter 9k counting output signals of the variable ring oscillator 9j and issuing a refresh request signal FAY when a count value reaches a prescribe value. The number of stages of the variable ring oscillator 9j is made smaller to shorten an oscillating cycle when the twin-cell write mode instructing signal TWC_WRITE_MODE is activated. In the twin-cell write mode, there is a need to write data stored once in the one bit/one cell mode into one bit/two cell mode unit cells. Therefore, a data hold time in the twin-cell write mode is determined by a refresh time for memory cells in the one bit/one cell mode.

For example, in the twin-cell write mode, a count value of the refresh counter 2 is reset to (0, 0 . . . 0), there is a possibility that data written in unit cells of one bit/one cell mode are lost. Therefore, an oscillating cycle of the variable ring oscillator 9j is made shorter in the twin-cell write mode and writing into twin-cell mode unit cells is performed with a refresh time (an issuance interval for an auto-refresh command) of the one bit/one cell mode. Thereby, a period of a twin-cell write mode operation can be reduced and in addition, data written in unit cells of one bit/one cell mode can be reliably rewritten into the one bit/two cell mode unit cells (twin-cell mode) without data destruction.

Note that in the second modification, the counter 9k, as shown in the parentheses in FIG. 25, may be configured to have a count-up value thereof changed in the twin-cell write mode. In the twin-cell write mode, a count range of the counter 9k is made smaller to reduce an interval at which refresh request signals FAY are successively issued.

As described above, according to the first embodiment of the present invention, data are stored in the one bit/two cell mode (twin-cell mode) in the operating mode for holding data. Therefore, a refresh interval can be made longer and accordingly, the number of times of refreshes can be reduced, thereby allowing reduction of power consumption to a great extent in the data holding mode.

Second Embodiment

Figure 26:
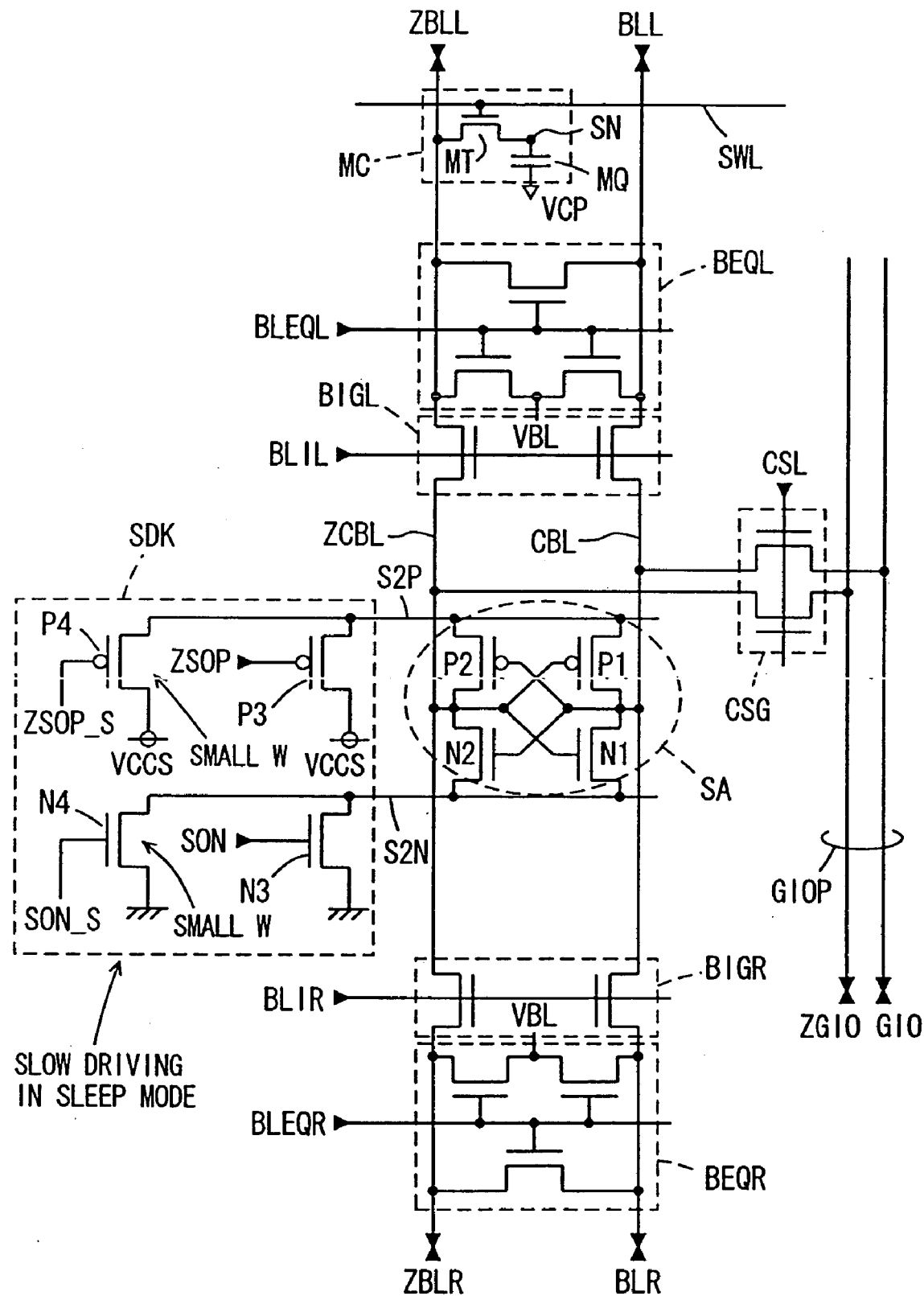
FIG. 26 is a diagram representing a configuration of a main part of a semiconductor memory device according to a second embodiment of the present invention.

FIG. 26 is a diagram representing a configuration of a main part of a semiconductor memory device according to a second embodiment of the present invention. In FIG. 26, a configuration of a part associated with one sense amplifier SA is shown. The sense amplifier SA is coupled with bit lines BLL and ZBLL of one memory cell sub array through a bit line isolation gate BIGL, and is coupled with bit lines BLR and ZBLR of another memory cell sub array through a bit line isolation gate BIGR. The sense amplifier SA includes: a pair of cross-coupled P channel MOS transistors P1 and P2; and a pair of cross-coupled N channel MOS transistors N1 and N2. The P channel MOS transistors P1 and P2 drive a bit line at a higher potential of common bit lines CBL and ZCBL to the array power supply voltage VCCS level. The N channel MOS transistors N1 and N2 drive a bit line at a lower potential of the common bit lines CBL and ZCBL to the ground voltage level.

Sense drive circuits SDK are provided for the sense amplifiers SA with one sense drive circuit SDK for a prescribed number of sense amplifiers SA. The sense drive circuit SDK includes: a P channel MOS transistor P3 rendered conductive, when the sense amplifier activating signal ZSOP is activated, to transmit the array power supply voltage VCCS onto a sense common power supply line S2P; a P channel MOS transistor P4 rendered conductive, when a sense amplifier activating signal ZSOP_S which is activated in the sleep mode, is activated, to transmit the array power supply voltage VCCS onto the sense common power supply line S2P; an N channel MOS transistor N3 made conductive, when a sense amplifier activating signal SON is activated, to transmit the ground voltage onto a sense common ground line S2N; and an N channel MOS transistor N4 rendered conductive, when a sense amplifier activating signal SON_S is activated in the sleep mode, to transmit the ground voltage onto the sense common ground line S2N. Current drive capabilities (a ratio of a channel width to a channel length) of the MOS transistors P4 and N4 are both set to values smaller than those of the respective MOS transistors P3 and N3.

As a sense peripheral circuit, a bit line equalize circuit BEQL activated, when a bit line equalize instructing signal BLEQL is activated, to transmit a precharge voltage VBL onto the bit lines BLL and ZBLL and equalize potentials on the bit lines BLL and ZBLL is provided to the bit lines BLL and ZBLL. The bit lines BLR and ZBLR are provided with a bit line equalize circuit BEQR activated, when a bit line equalize instructing signal BLEQR is activated, to electrically short the bit lines BLR and ZBLR and transmit the precharge voltage VBL onto the bit lines BLR and ZBLR.

Furthermore, the common bit lines CBL and ZCBL are provided with a column select gate CGS made conductive in response to a column select signal on a column select line CSL to couple the common bit lines CBL and ZCBL with global data lines GIO and ZGIO. The global data lines GIO and ZGIO constitute a global data line pair GIOP and are placed over a memory mat extending in the column direction.

In the configuration of the sense drive circuit SDK shown in FIG. 26, in the normal operating mode, the sense amplifier activating signals ZSOP and SON are activated, and the sense common power supply line S2P and the sense common ground line S2N are driven by the MOS transistors P3 and N3 each with a relatively large current drive capability. On the other hand, in the sleep mode, the sense amplifier activating signals ZSOP_S and SON_S are activated, and the sense common power supply line S2P and the sense common ground line S2N are relatively gradually driven by the MOS transistors P4 and N4 each with a relatively small current drive capability.

In the sleep mode, a high speed operation is not required (no data access is performed). Hence, there arise no problem even if current drive capabilities of the MOS transistors P4 and N4 used for sense driving are reduced and the sense amplifier SA drives the common bit lines CBL and ZCBL gradually according to a change in voltage on the sense common power supply line S2P and the sense common ground line S2N. A peak current in a sense operation is reduced and an average consumed current can be decreased accordingly.

Figure 27:
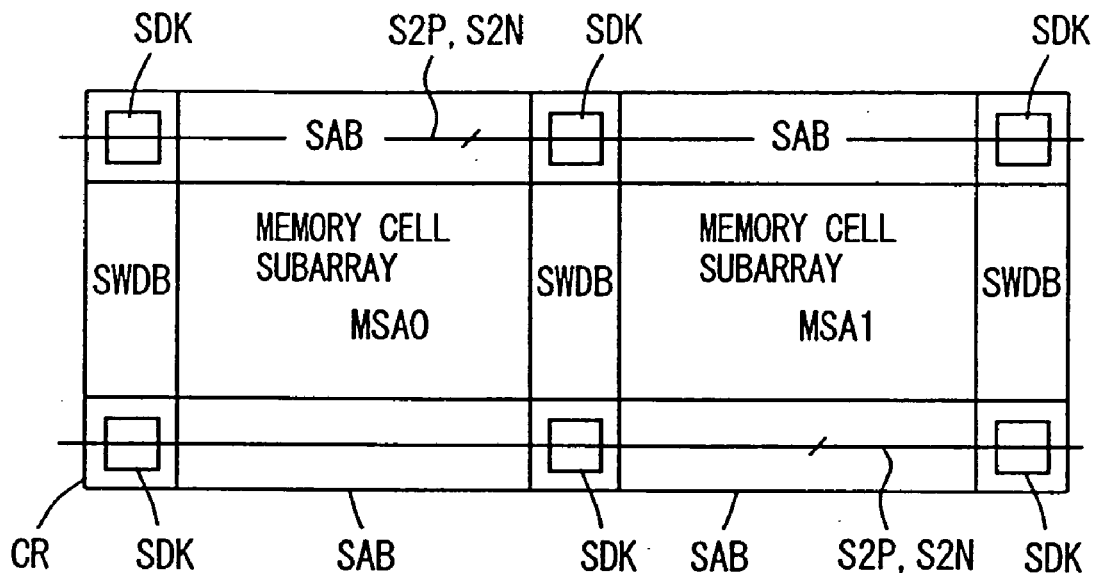
FIG. 27 is a diagram schematically snowing placement of sense drive circuits of the semiconductor memory device according to a second embodiment of the present invention.

FIG. 27 is a diagram schematically showing arrangement of the sense drive circuit SDK. In FIG. 27, a configuration for two memory cell sub arrays in one memory cell array is schematically shown. Sense amplifier bands SAB are arranged on respective sides of memory cell sub arrays MSA0 and MSA1 in the column direction. In the sense amplifier bands SAB, sense amplifiers SA are arranged corresponding to the bit line pairs in the memory cell sub arrays MSA0 and MSA1. Sub word driver bands SWDB are arranged in regions adjacent to the memory sub arrays MSA0 and MSA1 in the row direction. In the sub word drive band SWDB, sub word drivers for driving sub word lines in the memory cell sub arrays MSA0 and MSA1 are arranged. Sense drive circuits SDK are placed in respective intersecting regions CR between the sub word driver bands SWDB and the sense amplifier bands SAB. The sense common power supply lines S2P and the sense common ground lines S2N are placed extending through the sense amplifier bands SAB aligned in the row direction. Sense drive circuits SDK are placed at prescribed intervals on the sense common power supply lines S2P and the sense ground lines S2N. Accordingly a voltage distribution on the sense common power supply lines S2P and on the sense ground lines S2N can be suppressed to achieve a correct sense operation.

Figure 28:
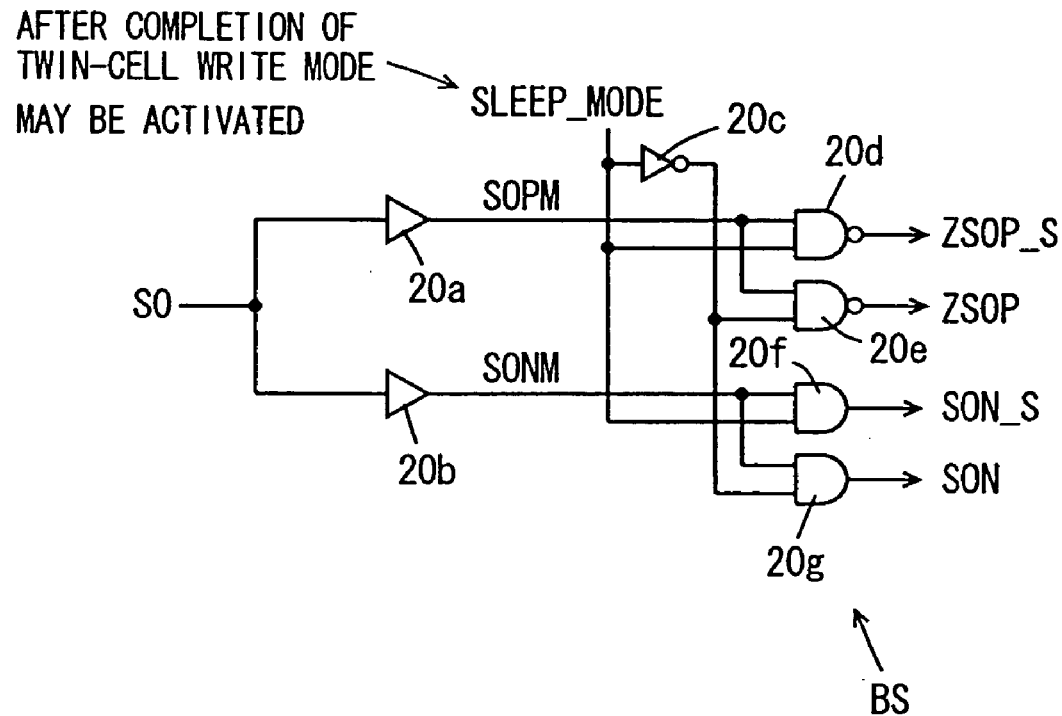
FIG. 28 is a diagram representing a configuration of a sense amplifier activating signal generating section in the second embodiment of the present invention.

FIG. 28 is a diagram schematically showing a configuration of a sense control circuit. Referring to FIG. 28, the sense control circuit includes: buffer circuits 20*a* and 20*b* for buffering the main sense amplifier activating signal SO to generate main sense activating signals SOPM and SONM; an inverter 20*c* inverting the sleep mode instructing signal SLEEP_MODE; a NAND circuit 20*d* receiving the output signal SOPM of the buffer circuit 20*a* and the sleep mode instructing signal SLEEP_MODE to generate the sense amplifier activating signal ZSOP_S in the sleep mode; a NAND circuit 20*e* receiving an output signal of the inverter circuit 20*c* and the main sense activating signal SOPM to generate the sense amplifier activating signal ZSOP in the normal operating mode; an AND circuit 20*f* receiving the sleep mode instructing signal SLEEP_MODE and the main sense activating signal SONM from the buffer circuit 20*b* to generate the sense amplifier activating signal SON_S in the sleep mode; and an AND circuit 20*g* receiving the main sense activating signal SONM and an output signal of the inverter circuit 20*c* to generate the sense amplifier activating signal SON in the normal operating mode. The sense amplifier activating signals outputted from the NAND circuits 20*d* and 20*e* and the AND circuits 20*f* and 20*g* are finally activated selectively by corresponding block select signals BS. When one of memory cell arrays sharing a sense amplifier band enters a selected state, a sense amplifier activating signal for the sense amplifier band is activated.

In the sleep mode, the sleep mode instructing signal SLEEP_MODE is set to H level and the output signal of the inverter 20*c* is fixed at L level. Therefore, the sense amplifier activating signal ZSOP from the AND circuit 20*e* is held at H level and the sense amplifier activating signal SON from the AND circuit 20*g* is fixed at L level. On the other hand, the NAND circuit 20*d* operates as an inverter to generate the sense amplifier activating signal ZSOP_S according to the main sense activating signal SOPM. Furthermore, the AND circuit 20*f* operates as a buffer circuit to generate the sense amplifier activating signal SON_S according to the main sense activating signal SONM.

In the normal operating mode, the sleep mode instructing signal SLEEP_MODE is at L level and the output signal of the inverter 20*c* attains an H level. In this state, the sense amplifier activating signal ZSOP_S is fixed at H level and the sense amplifier activating signal SON_S is fixed at L level. The NAND circuit 20*e* operates as an inverter to invert the main sense activating signal SOPM, and generates the sense amplifier activating signal ZSOP. The AND circuit 20*g* operates as a buffer circuit to generate the sense signal SON according to the sense activating signal SONM.

By driving the sense drive circuit SDK shown in FIG. 26 through the configuration shown in FIG. 28, a sense current (direct current) in the sleep mode can be reduced, allowing reduction of direct current (DC) power consumption in the sleep mode.

Note that the sense amplifier activating signals ZSOP_S and SON_S may be activated only in a refresh period (self-refresh mode) after the twin-cell write mode is completed.

Third Embodiment

Figure 29:
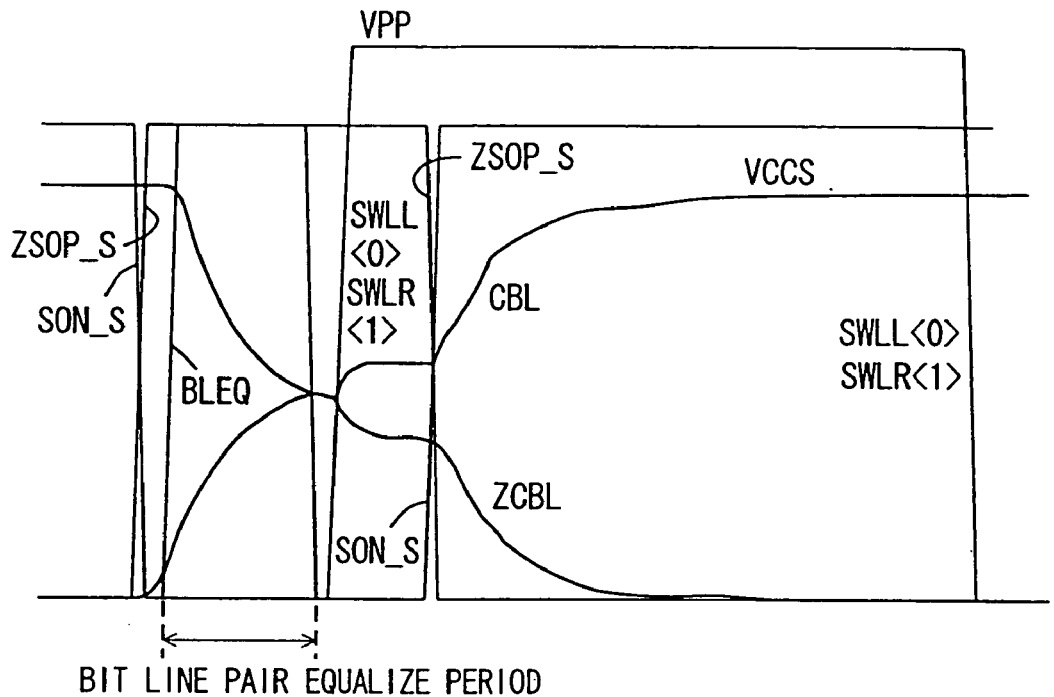
FIG. 29 is a diagram representing operation of a semiconductor memory device according to a third embodiment of the present invention.

FIG. 29 is a diagram of signal waveforms representing operation of an embedded DRAM according to a third embodiment of the present invention. In FIG. 29, a VBL generating circuit for generating the bit line precharge voltage VBL ceases operation in the sleep mode. What is used as sense amplifier activating signals is the sense amplifier activating signals ZSOP_S and SON_S in the sleep mode shown in FIG. 26.

For word lines, the sub word lines SWLL <0> and SWLR <1> are taken as an example. The sense amplifier activating signals SON_S and ZSOP_S are both driven into an inactive state prior to a sub word line select operation. A bit line equalize instructing signal BLEQ in a one shot pulse form is generated in response to deactivation of the sense amplifier activating signals SON_S and ZSOP_S. Thereby, voltages of H and L levels latched by the sense amplifier SA (see FIG. 26) are transmitted onto corresponding bit lines BL and ZBL via the common bit lines CBL and ZCBL. After equalization of the bit lines BL and ZBL is completed, the sub word lines SWLL <0> and SWLR <1> are both driven into a selected state.

After the sub word lines SWLL <0> and SWLR <1> are both driven into a selected state, the sense amplifier activating signals SON_S and ZSOP_S are both again driven into an active state at prescribed timing to differentially amplify the potentials on the bit lines BL and ZBL for latching the amplified potentials. After a prescribed time period elapses, the sub word lines SWLL <0> and SWLR <1> are both driven into a non-selected state. At this time, the sense amplifier activating signals SON_S and ZSOP_S both stay in an active state till a next refresh request is supplied. In a latch state of the sense amplifier SA, the MOS transistors P4 and N4 shown in FIG. 26 drive the sense amplifier SA and a latching ability of the sense amplifier SA is small.

In the sleep mode, a voltage difference (ΔV1–ΔV2) between an H level read-out voltage ΔV1 ($\geq$0) and an L level read-out voltage ΔV2 ($\leq$0) is sensed by the sense amplifier SA. The voltage difference is sufficiently large. Even if the bit line precharge voltage is deviated a little from the intermediate voltage VCCS/2 level prior to the rise of a voltage on a sub word line, such deviated bit line precharge voltage exerts no adverse influence on a sense operation. A sense amplifier is brought into an inactive state prior to a word line select operation. Then, the bit line equalize instructing signal BLEQ is maintained in an active state for a prescribed period to electrically short the bit lines for precharging the bit lines substantially to the intermediate voltage level by transfer of electric charges of H and L level data.

The reason why voltage levels of the bit line equalize instructing signal BLEQ and the sense amplifier activating signals SON_S and ZSOP_S are set higher than the array power supply voltage VCCS is that the peripheral power supply voltage VCCP is utilized for generating these activating signals to achieve high speed driving. The boosted voltage VPP higher than the peripheral power supply voltage VCCP and the array power supply voltage VCCS is transmitted onto the selected sub word lines SWLL <0> and SWLR <1>.

Figure 30:
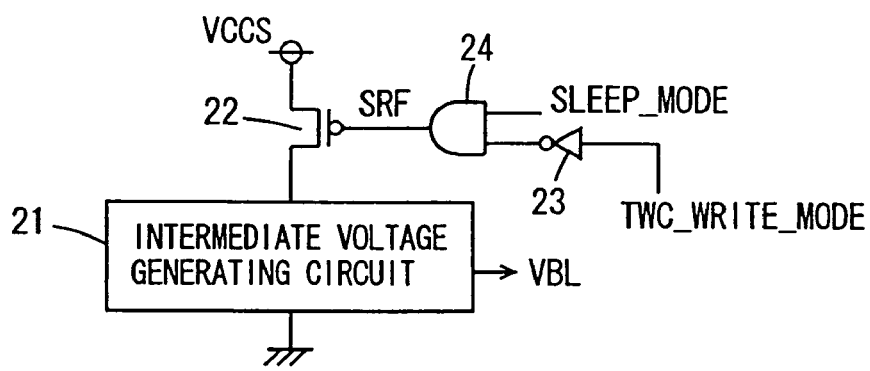
FIG. 30 is a diagram schematically showing a configuration of a bit line precharge voltage generating section in the third embodiment of the present invention.

FIG. 30 is a diagram schematically showing a configuration of a VBL generating circuit in the third embodiment of the present invention. In FIG. 30, the VBL generating circuit includes: an intermediate voltage generating circuit 21 for generating the intermediate voltage VCCS/2 when activated; a P channel MOS transistor 22 transmitting the array power supply voltage VCCS to the intermediate voltage generating circuit 21 when made conductive; an inverter 23 inverting the twin-cell write mode instructing signal TWC_WRITE_MODE; and an AND circuit 24 receiving an output signal of the inverter 23 and the sleep mode instructing signal SLEEP_MODE to control conduction and non-conduction of the power source transistor (P channel MOS transistor) 22.

In the normal operating mode, a self-refresh mode instructing signal SRF from the AND circuit 24 is at L level, and the power source transistor 22 is in a conductive state to supply the array power supply voltage to the intermediate voltage generating circuit. The intermediate voltage generating circuit 21 generates the intermediate voltage VCCS/2 based on the array power supply voltage VCCS to produce the bit line precharge voltage VBL.

In the sleep mode, the self-refresh mode instructing signal SRF is at L level in the twin-cell write mode, the power source transistor 22 is in a conductive state and the intermediate voltage generating circuit 21 generates the voltage of the intermediate voltage VCCS/2 level. When the twin-cell write mode of operation is completed, an output signal SRF of the AND circuit 24 is set to an H level and the power source transistor 22 is rendered non-conductive. Responsively, the intermediate voltage generating circuit 21 is disconnected from a power source node and ceases an intermediate voltage generating operation, and the bit line precharge voltage VBL is brought into a floating state and may fall gradually towards the ground voltage level.

Note that in the configuration shown in FIG. 30, a current source transistor may be also provided on the ground node side of the intermediate voltage generating circuit 21, which is rendered non-conductive when the self-refresh instructing signal SRF is in an active state. That is, the intermediate voltage generating circuit 21 may be disconnected from not only the power source node but also the ground node.

Figure 31:
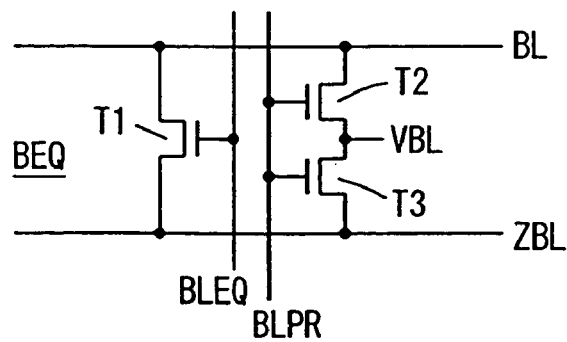
FIG. 31 is a diagram representing a configuration of a bit line equalize circuit of the semiconductor memory device according to the third embodiment of the present invention.

FIG. 31 is a diagram representing a configuration of a bit line equalize circuit. In FIG. 31, the bit line equalize circuit BEQ includes: an equalizing N channel MOS transistor T1 made conductive, when the bit line equalize instructing signal BLEQ is activated, to electrically short the bit lines BL and ZBL; and a precharging N channel MOS transistors T2 and T3 made conductive, when a bit line precharge instructing signal BLPR is activated, to transmit the bit line precharge voltage VBL onto the bit lines BL and ZBL.

In the normal operating mode, the bit line equalize instructing signal BLEQ and the bit line precharge instructing signal BLPR change substantially at the same timing. After the twin-cell write mode is completed in the sleep mode, the bit line precharge instructing signal BLPR is maintained in an inactive state and the precharging MOS transistors T2 and T3 stay in a non-conductive state. In the self-refresh operating mode after the twin-cell write mode is completed and the signal SRF is at H level, the bit line equalize instructing signal BLEQ is set into an active state at H level for a prescribed period to electrically short the bit lines BL and ZBL each time a self-refresh request is supplied. By providing the bit line equalize instructing signal BLEQ and the bit line precharge instructing signal BLPR separately, such a situation is prevented from occurring that when the bit lines are electrically shorted in the self-refresh mode, an unstable voltage from the intermediate voltage generating circuit 21 set in a rest state or the ground voltage is transmitted onto the bit lines BL and ZBL to adversely affect an equalize operation on the bit lines BL and ZBL.

Figure 32:
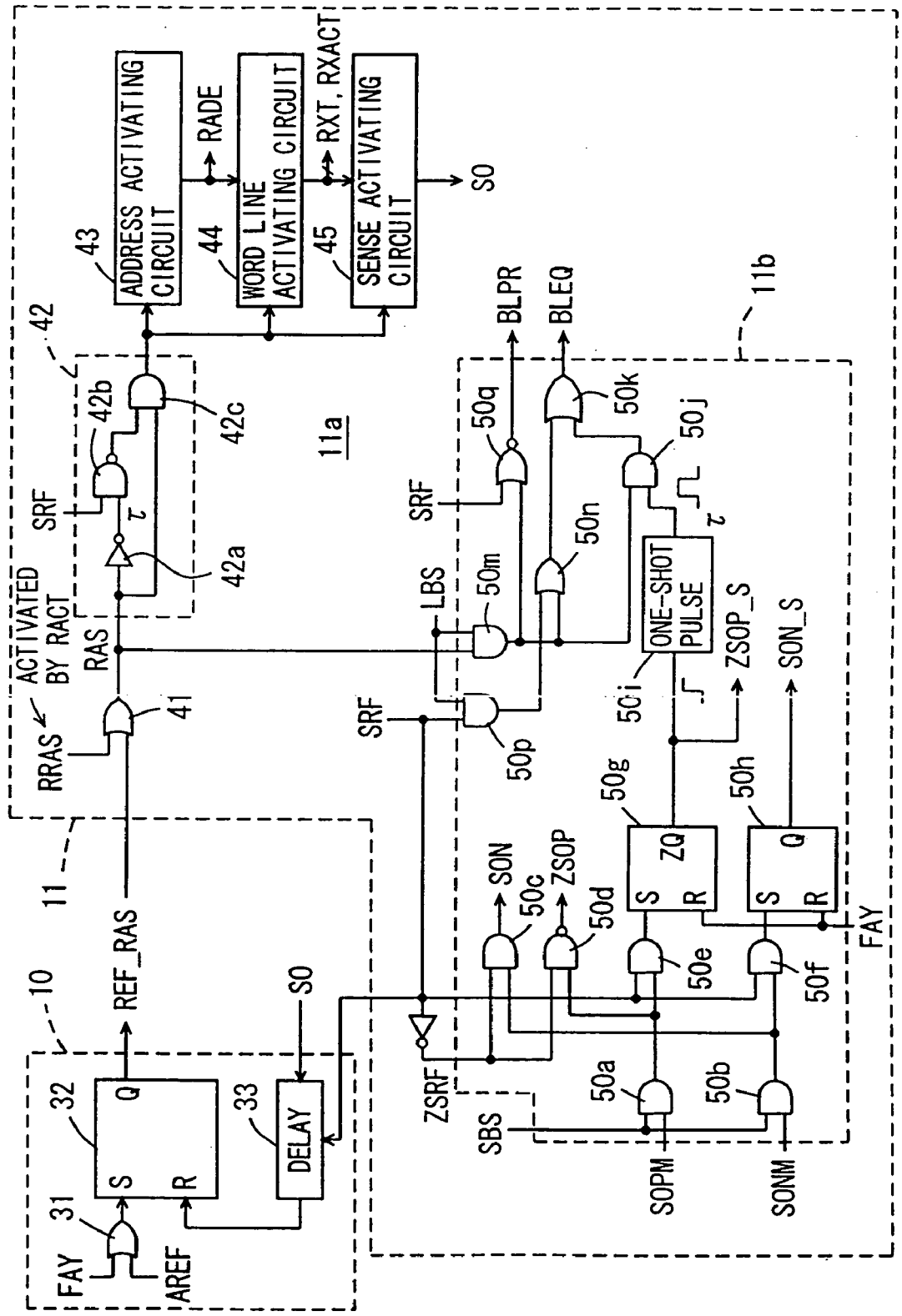
FIG. 32 is a diagram schematically showing a configuration of a row-related control signal generating section of the semiconductor memory device according to the third embodiment of the present invention.

FIG. 32 is a diagram representing a configuration of a row-related control signal generating section. In FIG. 32, there are provided: a refresh control circuit 10 for generating a refresh activating instructing signal REF_RAS according to the auto-refresh command AREF and the refresh request signal FAY; and a row-related control circuit 11 for generating row-related control signals according to the refresh activating instructing signal REF_RAS and the row access (active) command RACT.

The refresh control circuit 10 includes: an OR circuit 31 receiving the refresh request signal FAY and the auto-refresh command AREF; a set/reset flip flop 32 set when an output signal of the OR circuit 31 is activated, to generate the refresh activating instructing signal REF_RAS; and a delay circuit 33 for resetting the set/reset flip flop 32 after a prescribed time since activation of the main sense amplifier activating signal SO. The delay circuit 33 increases a delay time in the self-refresh mode by a time τ. This is because the timing of array activation in the self-refresh mode is delayed by the time τ as described later, and the delay is compensated for to make an array activating period in the self-refresh mode coincident with that in the auto-refresh mode.

The refresh control circuit 10 activates the refresh activating signal REF_RAS when a refresh request signal FAY or an auto-refresh command AREF is supplied, and then, a sense operation is performed. After the delay time that the delay circuit 33 has elapses, the refresh activating signal REF_RAS is deactivated. More specifically, when the refresh request signal FAY or the auto-refresh command AREF is supplied, the refresh activating signal REF_RAS is kept active for a prescribed time period, and a refresh operation or a twin-cell write mode operation is performed according to a refresh address from the refresh address counter.

The row-related circuit 11 includes: a main control circuit 11a provided commonly to the memory cell arrays (MA0 to MA7) of a memory mat; and local control circuits 11b provided to the respective memory cell arrays. The main control circiut 11a includes: an OR circiut 41 receiving a row select activating signal RRAS activated when a row active command RACT is supplied and a refresh activating signal REF_RAS; a variable delay circuit 42 transmitting an output signal (the array activating signal) RAS from the OR circuit 41 with a delay of a prescribed time in the self-refresh mode; an address activating circuit 43 for generating a row address enable signal RADE according to an output signal of the variable delay circuit 42; a word line activating circuit 44 for generating the signals RXT and RXACT for activating a word line in response to an output signal of the address activating circuit 43; and a sense activating circuit 45 for generating a main sense amplifier activating signal SO according to an output signal of the word line activating circuit 44.

The address activating curcuit 43, the word line activating circuit 44 and the sense activating circuit 45 are each substantially constituted of a delay circuit, and the control signals RADE, TXT, RXACT and SO from these circuits are activated in a prescribed sequence in response to the output signal of the variable delay circuit 42. Furthermore, the address activatind circuit 43, the word line activating circuit 44 and the sense activating circuit 45 deactivate respective output signals in response to seactivation of the output signal of the variable delay circuit 42.

The variable delay circuit 42 can vary a rise delay time to delay activation of tha array activating signal RAS in the self-refresh mode (a sleep mode after the twin-cell write mode is completed). The variable delay circuit 42 includes: an inverter 42a receiving an array activating signal RAS; a NAND circuit 42b receiving an output signal of the inverter 42a and a self-refresh mode instructing signal SRF; and an AND circuit 42c receiving an output signal of the NAND circuit 42b and the array activating signal RAS. The self-refresh mode instructing signal SRF is activated when the sleep mode instructing signal SLEEP_MODE is in an active state and the twin-cell write mode instructing signal TWC_WRITE_MODE attains an inactive state.

In the variable delay circuit 42, in the self-refresh mode, the NAND circuit 42b operates as an inverter and the variable delay circuit 42 delays activation of the array activating signal RAS by the delay time τ that the inverter 42a and the NAND circuit 42b have. When the self-refresh mode instructing signal SRF is in an inactive state, an output signal of the NAND circuit 42b is at H level and an output signal of the AND circuit 42c rises to H level in response to activation of the array activating signal RAS. Therefore, in the twin-cell write mode and in the normal operating mode, a row select operation and a sense operation are performed according to activation of the array activating signal RAS. In the self-refresh mode, the array activating signal RAS is activated and after a prescribed time or the delay time τ that the inverter 42a and the NAND circuit 42b have elapses, a row selection and a sense operation are performed.

The local control circuit 11b includes: an AND circuit 50a receiving a sense amplifier band select signal SBS and a main sense activating signal SOPM; an AND circuit 50b receiving the sense amplifier band select signal SBS and a main sense activating signal SONM; an AND circuit 50c receiving an inverted signal ZSRF of the self-refresh mode instructing signal SRF and an output signal of the AND circuit 50c to generate a sense amplifier activating signal SON; a NAND circuit 50d receiving a complementary self-refresh mode instructing signal ZSRF and an output signal of the AND circuit 50a to generate a sense amplifier activating signal ZSOP; an AND circuit 50e receiving a self-refresh mode instructing signal SRF and an output signal of the AND circuit 50a; an AND circuit 50f receiving the self-refresh mode instructing signal SRF and an output signal of the AND circuit 50b; a set/reset flip flop 50g set when an output signal of the AND circuit 50e is activated and reset in response to issuance of a refresh request signal FAY; a set/reset flip flop 50h set in response to activation of an output signal of the AND circuit 50f and reset in response to issuance of the refresh request signal FAY; a one-shot pulse generating circuit 50i generating a one-shot pulse signal in response to the rise of an output signal from the output ZQ of the set/reset flip flop 50g; an AND circuit 50j receiving an output signal of the one-shot pulse generating circuit 50i at a first input thereof; an AND circuit 50m receiving an array activating signal RAS and a latched block select signal LBS; an AND circuit 50p receiving the latched block select signal LBS and the self-refresh mode instructing signal SRF; a NOR circuit 50q receiving an output signal of the AND circuit 50m and the self-refresh mode instructing signal SRF; a NOR circuit 50n receiving output signals of the AND circuits 50m and 50p; and an OR circuit 50k receiving an output signal of the NOR circuit 50n and an output signal of the AND circuit 50j to generate a bit line equalize instructing signal BLEQ. A bit line precharge instructing signal BLPR is generated from the NOR circuit 50q. An output signal of the AND circuit 50m is also supplied to a second input of the AND circuit 50j.

The sense amplifier band select signal SBS is generated by a logical sum of two block select signals specifying memory cell blocks sharing a corresponding sense amplifier band. The latched block select signal LBS is generated according to the block select signal BS (=BS <7:0>) to specify a corresponding memory cell array.

In the normal operating mode and the twin-cell write mode, the self-refresh mode instructing signal SRF is at L level and the complementary self-refresh mode instructing signal ZSRF is at H level. Hence, in this state, a sense amplifier is driven according to the sense amplifier activating signals SON and ZSOP from the AND circuit 50c and the NAND circuit 50d. Output signals of the AND circuits 50e and 50f are both at L level, and the sense amplifier activating signal ZSOP_S and SON_S are both in an inactive state and stay at H level and L level, respectively.

Furthermore, the self-refresh mode instructing signal SRF is at L level, the NOR circuit 50n operates as an inverter to invert an output signal of the AND circuit 50m. Therefore, when the array activating signal RAS is activated, the bit line precharge instructing signal BLPR attains an L level in a selected memory cell array specified by the latched block select signal LBS. Furthermore, an output of the AND circuit 50j is at L level (the one-shot pulse generating circuit 50i generates no pulse). An output signal of the AND circuit 50p is at L level, the OR circuit 50k operates as a buffer circuit and the bit line equalize instructing signal BLEQ attains an inactive state at L level according to the output signal of the AND circuit 50m. Hence, the bit line equalize circuit in a selected memory cell array is deactivated to complete a precharge/equalize operation on bit lines.

In the self-refresh mode, the self-refresh mode instructing signal SRF attains an active state at H level, the sense amplifier activating signal SON from the AND circuit 50c is set at L level and the sense amplifier activating signal ZSOP from the NAND circuit 50d is set at H level. On the other hand, the AND circuits 50e and 50f generate signals of an H level according to the main sense activating signals SOPM and SONM and the sense amplifier band select signal SBS. The set/reset flip flops 50g and 50h are set in response to activation of outputs of the AND circuits 50e and 50f and responsively, the sense amplifier activating signal ZSOP_S from the output ZQ of the flip flop 50g attains an L level, while the sense amplifier activating signal SON_S from the output Q of the set/reset flip flop 50h attains an H level.

Furthermore, the self-refresh mode instructing signal SRF is at H level, and an output signal of the NOR circuit 50q is set to an L level to fix the bit line precharge instructing signal BLPR at L level. The bit line precharge instructing signal BLPR is set in an inactive state at L level regardless of a logical level of a block select signal BS and the bit line precharge instructing signals BLPR in all the memory cell arrays of the memory mat are set into an inactive state.

The set/reset flip flops 50g and 50h both are kept in a set state even when the main sense activating signals SOPM and SON both attain an inactive state according to the main sense amplifier activating signal SO (see FIG. 28). Therefore, the sense amplifier activating signals ZSOP_S and SON_S both are kept in an active state even after the word line activating circuit 44 and the sense activating circuit 45 both attain an inactive state.

Then, when the refresh request signal FAY is activated, the set/reset flip flops 50g and 50h are reset and the sense amplifier activating signals ZSOP_S and SON_S are deactivated. The one-shot pulse generating circuit 50i generates a one shot pulse signal in response to deactivation (the rise) of the sense amplifier activating signal ZSOP_S. The latched block select signal LBS is kept corresponding to a block select signal specified in the preceding refresh operation. When the refresh request signal FAY is supplied, the array activating signal RAS is activated in response to the refresh activating signal REF_RAS. Hence, an output signal of the AND circuit 50m for a selected memory cell array in the preceding cycle attains an H level and the AND circuit 50j applies a one-shot pulse from the one-shot pulse generating circuit 50i to the OR circuit 50k passing the pulse therethrough. Responsively, the bit line equalize instructing signal BLEQ is kept in an active state during a period of the one shot pulse from the one-shot pulse generating circuit 50I, to equalize the bit lines BL and ZBL.

The pulse width τ of the pulse signal generated by the one-shot pulse generating circuit 50i is substantially equal to a rise delay time of the variable delay circuit 42 in the self-refresh mode. Hence, after the bit line equalize instructing signal BLEQ attains an inactive state, the address enable signal RADE from the address activating circuit 43 is activated for performing memory cell array selection and row selection. Thus, in the self-refresh mode, potentials on a bit line pair are weakly latched by a sense amplifier till a subsequent self-refresh operation is performed after the current sense operation is completed. Then, a subsequent row select operation can be started after the bit line pair is equalized and precharged substantially to the intermediate voltage prior to performing the subsequent refreshing. In order to prevent reduction of an array activating time period or of an activating period of the refresh activating signal REF_RAS by the delay time τ of the variable delay circuit 42 in the self-refresh mode, a delay time of the delay circuit 33 in the refresh control circuit 10 is increased by a time τ.

Figure 33:
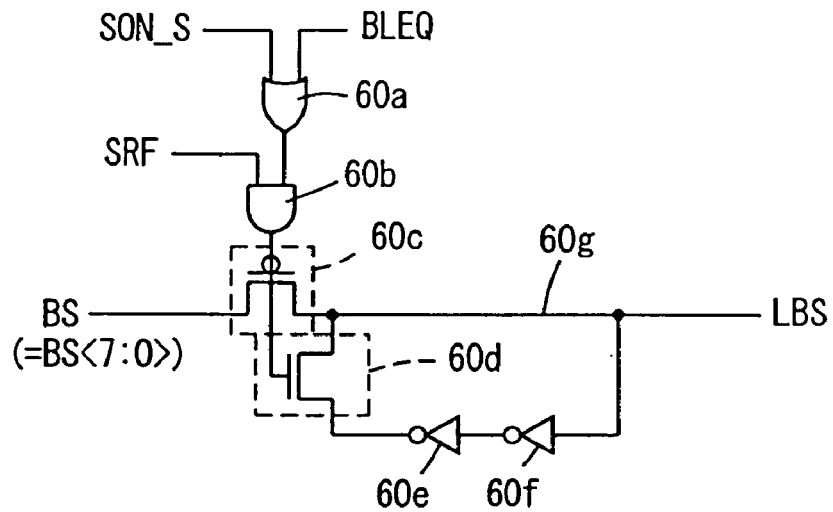
FIG. 33 is a diagram schematically showing a configuration of a latch block select signal generating section shown in FIG. 32.

FIG. 33 is a diagram representing a configuration of a part for generating the latched block select signal LBS shown in FIG. 32. In FIG. 33, the latched block select signal generating circuit includes: an OR circuit 60a receiving a sense amplifier activating signal SON_S and a bit line equalize instructing signal BLEQ; an AND circuit 60b receiving an output signal of the OR circuit 60a and a self-refresh mode instructing signal SRF; a transfer gate 60c rendered conductive, when an output signal of the AND circuit 60b is at L level, to transmit a block select signal BS (=BS <7; 0>) from a block decoder onto a block select line 60g; a transfer gate 60d coupled with the block select line 60g and rendered conductive when an output signal of the AND circuit 60b is at H level; an inverter 60f inverting a signal on the block select line 60g; and an inverter 60e inverting an output signal of the inverter 60f to transmit the inverted output signal to the transfer gate 60d.

When the transfer gate 60d is in a conductive state, a so-called "half latch" is formed by the inverters 60e and 60f, and the transfer gate 60d, to latch a block select signal on the block select line 60g to output the latched block select signal LBS. Now, description will be given of operation of the latched block select signal generating circuit shown in FIG. 33 with reference to a signal waveform diagram shown in FIG. 34.

When the sleep mode is set and the sleep mode instructing signal SLEEP_MODE is activated, the twin-cell write mode is first performed. In this case, when the self refresh request signal FAY is activated, responsively the refresh activating signal REF_ACT is activated, and the array activating signal RAS shown in FIG. 32 is activated. A row select operation is performed in response to the activation of the refresh activating signal REF_RAS, and a block select signal BS for a selected memory cell array is first driven into a selected state. The self-refresh mode instructing signal SRF is at L level, the AND circuit 60b outputs a signal of L level and the transfer gate 60c is in a conductive state. Hence, the latched block select signal LBS alters according to the block select signal BS latched.

Furthermore, the bit line equalize instructing signal BLEQ attains an inactive state in response to activation of the refresh activating signal REF_ACT. Then, the sense amplifier activating signal SON_S is activated. Then, after a prescribed time elapses, the refresh activating signal REF_ACT attains an inactive state, the block select signal BS is deactivated and the sense amplifier activating signal SON_S is also deactivated. Moreover, the bit line equalize instructing signal BLEQ attains an active state. Since the transfer gate 60c is in a conductive state, the latched select signal LBS is also driven into an inactive state in response to deactivation of the select signal BS. Hence, in the twin-cell write mode, a row select operation is performed for a prescribed period in response to the self-refresh request signal FAY in accordance with a refresh address.

When the self-refresh mode is entered, the self-refresh mode instructing signal SRF is driven into an active state. When a self-refresh request signal FAY is issued, then the refresh activating signal REF_ACT is first activated and responsively, the array activating signal RAS is activated. When the array activating signal RAS is activated and an output signal of the variable delay circuit 42 shown in FIG. 32 is activated, a decode operation is performed according to the address enable signal RADE from the address activating circuit 43. A block select signal BS for a selected memory cell array is driven into a selected state according to the result of decoding. When the block select signal BS is activated, an output signal of the AND circuit 50p of FIG. 32 attains an H level. Responsively, an output signal of the NOR circuit 50n attains an L level and the bit line equalize instructing signal BLEQ is driven to be L level. Then, a word line select operation is performed and the sense amplifier activating signal SON_S is activated to perform a sense operation. When the sense amplifier activating signal SON_S is activated, the transfer gate 60c enters a non-conductive state, while the transfer gate 60d enters a conductive state, and the latched block select signal attains a latched state.

In the self-refresh mode, the refresh activating signal REF_ACT and the array activating signal RAS both attain an inactive state. Thus, even when a block select signal BS attains an inactive state, the sense amplifier activating signal SON_S remains in a latch state and responsively, the latched block select signal LBS is also in a latched state. Hence, for a selected block, the bit line equalize instructing signal BLEQ stays at L level.

Then, when a self-refresh request signal FAY is again supplied, the sense amplifier activating signal SON_S is deactivated. In response, a one-shot pulse signal is generated from the one-shot pulse generating circuit 50i of FIG. 32 and in response, the bit line equalize instructing signal BLEQ is kept at an H level for a prescribed time period. The transfer gate 60c of FIG. 33 is in a non-conductive state while the bit line equalize instructing signal BLEQ is at H level, and the latched block select signal LBS remains unchanged. A pulse width of the bit line equalize instructing signal BLEQ is substantially equal to the rise delay time of the variable delay circuit 42 shown in FIG. 32. Therefore, during the bit line equalization, a decode operation is not performed yet. When the bit line equalize instructing signal BLEQ attains an inactive state, an output signal of the AND circuit 60b is driven to an L level, the transfer gate 60c is rendered conductive, and a latched block select signal LBS is coupled with a block select signal BS. Hence, by a block select operation performed after deactivation of the bit line equalize instructing signal BLEQ, the block select signal BS for a selected memory cell array is again driven into an active state, and the sense amplifier activating signal SON_S is activated in the selected memory cell array. At this time, if a corresponding block select signal BS is in a selected state, the bit line equalize instructing signal BLEQ attains an inactive state according to the block select signal BS.

Figure 34:
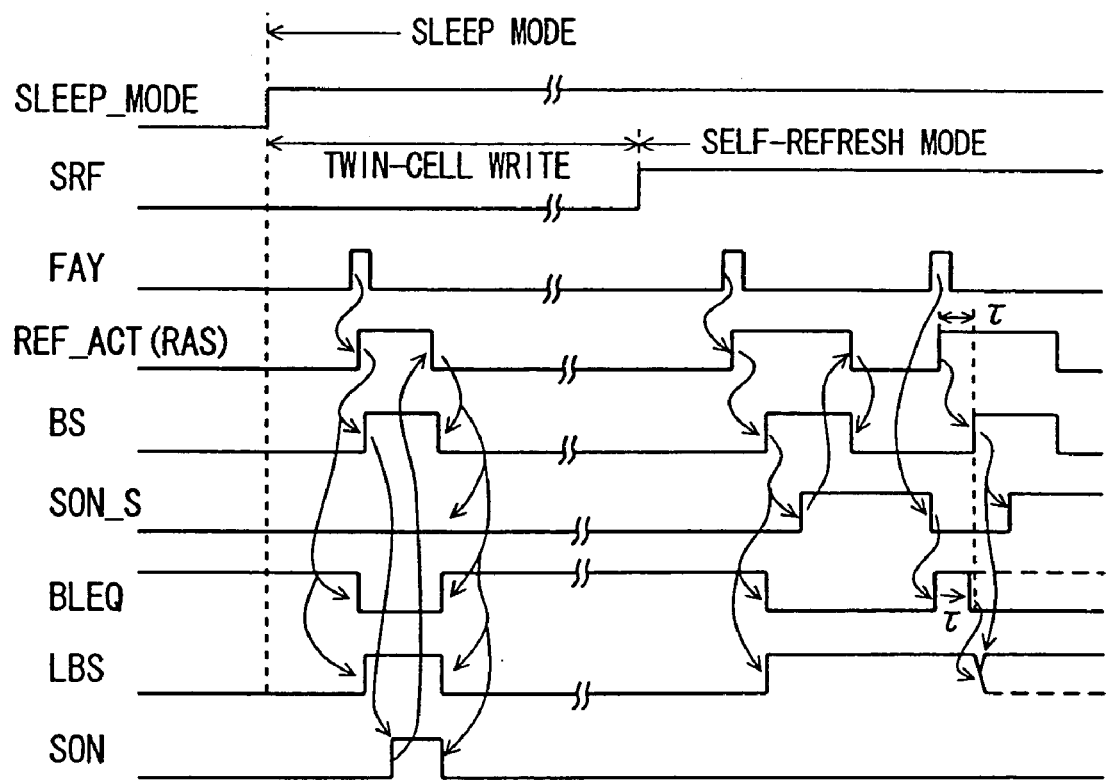
FIG. 34 is a diagram of signal waveforms representing operation of the latch block select signal generating section shown in FIG. 33.

When a corresponding memory cell array is in an inactive state as shown with a broken line in FIG. 34, a latched block select signal LBS is at L level. Responsively, an output signal of the NOR circuit 50n (see FIG. 32) attains an H level to maintain the bit line equalize instructing signal BLEQ at an H level. Therefore, in a non-selected memory cell array, the bit line equalize circuit enters a conductive state to equalize the bit lines. Only in a selected memory cell array, latching of bit line potentials by a sense amplifier and equalization on bit line potentials by the bit line equalize circuit are performed.

Figure 35:
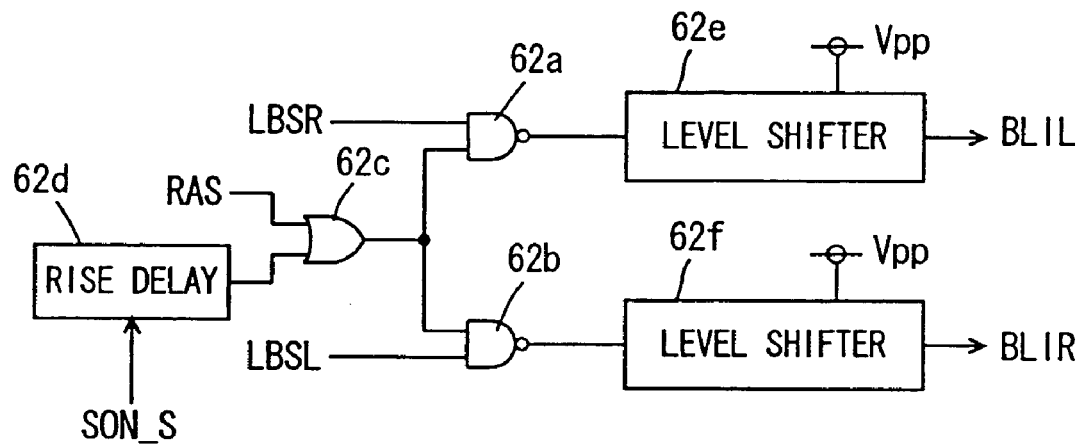
FIG. 35 is a diagram schematically showing a configuration of a bit line isolation instructing signal generating section of the semiconductor memory device according to the third embodiment of the present invention.

FIG. 35 is a diagram schematically showing a configuration of a bit line isolation control circuit. In FIG. 35, there is shown a configuration of part generating bit line isolation instructing signals BLIL and BLIR. In FIG. 35, the bit line isolation control circuit includes: a fall delay circuit 62d delaying the fall of the sense amplifier activating signal SON_S by a prescribed time; an OR circuit 62c receiving an output signal of the fall delay circuit 62d and the array activating signal RAS; a NAND circuit 62a receiving an output signal of the OR circuit 62c and a latched block select signal LBSR to generate the bit line isolating instructing signal BLIL through a level shifter 62e; and a NAND circuit 62b receiving an output signal of the OR circuit 62c and the latched block select signal LBSL to generate the bit line isolation instructing signal BLIR through a level shifter 62f. The level shifters 62e and 62f each level-converts a signal of the peripheral power supply voltage Vccp level to a signal of the boosted voltage Vpp level.

Figure 36:
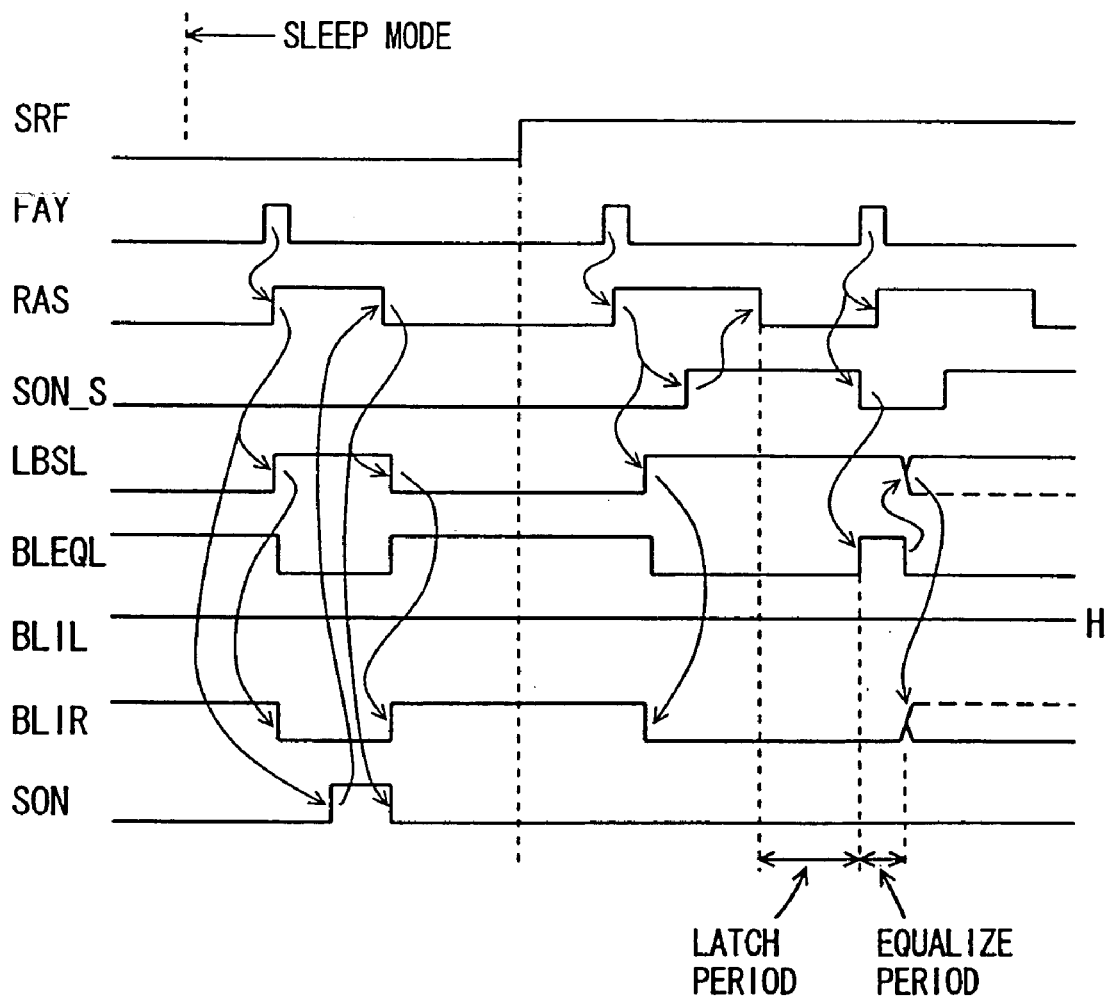
FIG. 36 is a diagram of signal waveforms representing operation of a semiconductor memory device according to the third embodiment of the present invention.

The latched block select signal LBSR specifies a memory cell array MAR, and the latched block select signal LBSL specifies a memory cell array MAL. Now, description will be given of operation of the bit line isolation control circuit shown in FIG. 35 with reference to a signal waveform diagram shown in FIG. 36.

In the twin-cell write mode of the sleep mode, when the self-refresh request signal FAY is activated, the array activating signal RAS is activated. A decode operation is performed in response to activation of the array activating signal RAS, and the latched block select signal LBSL is driven into an active state according to the block select signal BSL. The other block select signal BSR stays in a non-selected state at L level. In this state, the bit line isolation instructing signal BLIL stays at H level, while the bit line isolation instructing signal BLIR is driven to an L level to disconnect the memory cell array MAR from a sense amplifier band.

Then, the sense amplifier activating signal SON is activated to perform a sense operation. Then, the array activating signal RAS is deactivated, and the sense amplifier activating signal SON is responsively deactivated. The latched block select signal LBSL also attains an inactive state in response to the deactivation of the array activating signal RAS in the twin-cell write mode, and the bit line isolation instructing signal BLIR attains an H level. The sense amplifier activating signal SON_S stays in an inactive state.

Upon entry into the self-refresh mode, the self-refresh mode instructing signal SRF is driven into an active state. In this state, when the refresh request signal FAY is issued, the array activating signal RAS is activated.

In the self-refresh mode, since a block decode operation is delayed by a prescribed time (τ) by the variable delay circuit shown in FIG. 32, the decode operation is performed at a timing later than the activation of the array activating signal RAS, and the latched block select signal LBSL is driven into a selected state. Responsively, the bit line isolation instructing signal BLIR is driven to an L level to disconnect the memory cell array MAR from a sense amplifier band. The bit line isolation instruction signal BLIL stay at H level and the memory cell array MAL is coupled with a sense amplifier band. A sense operation is performed in response to activation of the sense amplifier activating signal SON_S to differentially amplify potentials on bit lines of the memory cell array MAL. When a prescribed time has elapsed after the activation of the sense amplifier activating signal SON_S, the array activating signal RAS is deactivated.

In the self-refresh mode, the sense amplifier activating signal SON_S stays in an active state, and the latched block select signal LBSL also stays in a selected state. Therefore, the bit line isolation instructing signal BLIR also stays at L level. The bit line equalize instructing signal BLEQL stays in an inactive state, and potentials on bit lines of the memory cell array MAL are latched by the sense amplifiers. In the memory cell array MAR, the bit line equalize instructing signal BLEQR is in an active state and bit line pairs are each in an equalized state.

Then, when a refresh request signal FAY is supplied, the sense amplifier activating signal SON_S attains an inactive state. Responsively, the bit line equalize instructing signal BLEQL attains an active state and stays in the active state for a prescribed time, to electrically short the bit lines that have been amplified and latched by sense amplifiers for driving the bit lines substantially to the intermediate potential. Even when the sense amplifier activating signal SON_S is deactivated, an output signal of the fall delay circuit 62d stays at H level. Responsively, an output signal of the OR circuit 62c also stays at H level, and the bit line isolation instructing signal BLIR stays at L level during a bit line equalize period. Therefore, bit line potentials of the memory cell array MAR exerts no adverse influence on a bit line equalize operation of the memory cell array MAL.

When the bit line equalize instructing signal BLEQL attains an inactive state, the latched block select signal LBSL is released from a latched state, and a state of the latched block select signal LBSL is determined according to a new block select signal generated by a subsequent decode operation performed. When the latched block select signal LBSL is again driven into a selected state, the bit line isolation instructing signal BLIR is again driven to L level responsively. The bit line isolation instructing signal BLIL stays at H level.

When potentials on bit line pairs of a selected memory cell array are latched by sense amplifiers and thereafter the bit line potentials are equalized by bit line equalize circuits, a bit line equalize operation can be performed only in a selected memory cell array. In a case where a selected memory cell array is different from a memory cell array that is accessed precedingly, bit line potentials can be correctly equalized according to potentials that are latched by sense amplifiers. Here, when the latched block select signal LBSL is in an inactive state as shown with a broken line in FIG. 36, for example, the bit line isolation instructing signal BLIR is driven to an H level to couple the memory cell array MAR to a sense amplifier band, as shown with a broken line in FIG. 36.

Note that a sense amplifier activating signal is reset using the self-refresh request signal FAY and the resetting is used as a trigger for a bit line equalize operation. Such a configuration may be employed, however, that a resetting timing signal from a self-refresh timer is generated at a timing faster than the self-refresh request signal FAY and the self-refresh request signal FAY is then generated after equalization on bit line potentials is completed.

As described above, according to the third embodiment of the present invention, in the self-refresh mode, operation of the bit line precharge voltage generating circuit is ceased, and the potentials on bit line pairs are latched by sense amplifiers in a selected memory cell array. The bit line pairs are once electrically shorted prior to a subsequent self-refresh operation to precharge the bit line potentials substantially to the intermediate potential. Thereafter, the subsequent refresh operation is performed. Accordingly, a consumed current in the data holding mode can be further reduced.

Fourth Embodiment

Figure 37:
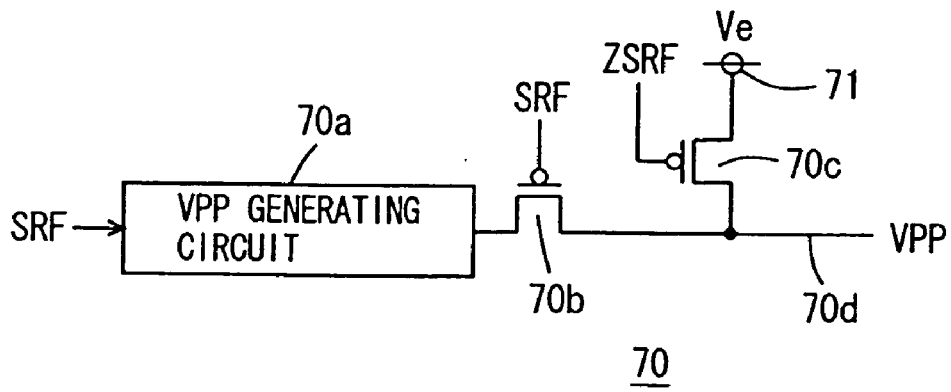
FIG. 37 is a diagram schematically showing a configuration of a boosted voltage generating circuit of the semiconductor memory device according to a fourth embodiment of the present invention.

FIG. 37 is a diagram schematically showing a configuration of a boosted voltage generating circuit according to a fourth embodiment of the present invention. In FIG. 37, the boosted voltage generating circuit 70 includes: a VPP generating circuit 70a operating when a self-refresh mode instructing signal SRF is deactivated, and performing a charge pump operation, for example, to generate a boosted voltage VPP of a prescribed level; a transfer gate 70b rendered conductive when the self-refresh mode instructing signal SRF is deactivated to transmit the boosted voltage VPP generated by the VPP generating circuit 70a onto a boosted voltage power supply line 70d; and a transfer gate 70c rendered conductive when a complementary self-refresh mode instructing signal ZSRF is activated to couple the boosted voltage line 70d with a power supply node 71. The transfer gates 70b and 70c are each constituted of, for example, a P channel MOS transistor.

The external power supply voltage Ve is supplied onto the power supply node 71. The power supply voltage Ve is substantially at the same level as the sum of the array power supply voltage VCCS and a threshold voltage Vth of a memory transistor, and is at a level of 2.5 to 3 V, for example. On the other hand, the boosted voltage generated by the VPP generating circuit 70a is sufficiently higher than the sum of the array power supply voltage VCCS and a threshold voltage of a memory cell transistor, and is at a level of, for example, 3.5V to 4V.

When the twin-cell write mode is completed in the sleep mode, the self-refresh mode instructing signal SRF is activated and the VPP generating circuit 70a ceases a high voltage generating operation. At this time, the transfer gate 70b enters a non-conductive state to disconnect the output node of the VPP generating circuit 70a from the boosted voltage power supply line 70d. Furthermore, by activation of the self-refresh mode instructing signal ZSRF, the transfer gate 70c is rendered conductive to couple the boosted voltage power supply line 70d with the power supply node 71.

Therefore, in the self-refresh mode, the boosted voltage VPP attains a voltage level equal to the external power supply voltage Ve, and the external power supply voltage Ve is transmitted onto a sub word line and a main word line. An influence of a threshold voltage of an access transistor arises in a memory cell. However, even if a voltage level of H level data decreases, an L level data is read out on another bit line in a pair and therefore, a sufficiently large potential difference between bit lines of a pair can be ensured, and refresh on memory cell data is reliably performed. By ceasing a boosted voltage generating operation by the VPP generating circuit 70a in the self-refresh mode, a consumed current in the sleep mode can be further reduced.

Note that the VPP generating circuit 70a is constructed of, for example, a ring oscillator; a charge pump performing a charge pump operation according to an oscillating clock signal from the ring oscillator, and an oscillating operation of the ring oscillator is ceased by the self-refresh mode instructing signal SRF. As such a configuration for VPP generating circuit, a configuration similar to a VBB generating circuit described later can be utilized.

As describe above, according to the fourth embodiment of the present invention, in the self-refresh mode, a boosted voltage generating operation is ceased and the boosted power supply line is coupled with an external power supply node, allowing reduction of a consumed current in the self-refresh mode.

Fifth Embodiment

Figure 38:
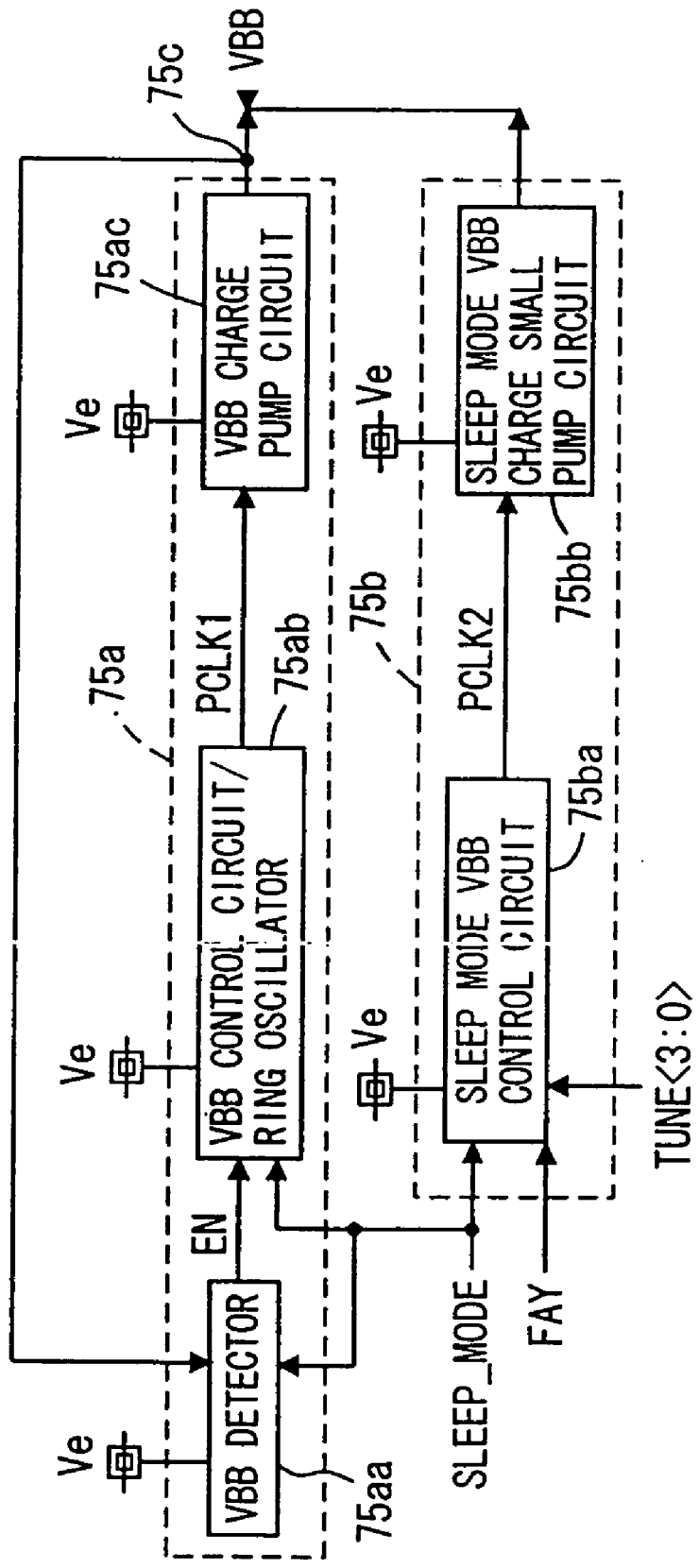
FIG. 38 is a diagram schematically showing a configuration of a substrate bias voltage generating circuit of a semiconductor memory device according to a fifth embodiment of the present invention.

FIG. 38 is a diagram schematically showing a configuration of a substrate bias voltage generating circuit generating a substrate bias voltage VBB according to a fifth embodiment of the present invention. In FIG. 38, the substrate voltage generating circuit includes: a normal VBB generating circuit 75a generating a substrate bias voltage VBB with a relatively large electric charge supply capability in the normal operating mode; and a sleep mode VBB generating circuit 75b activated, in the sleep mode, to generate the substrate bias voltage VBB with a relatively small electric charge supply capability.

The normal VBB generating circuit 75a includes: a VBB detector 75aa detecting a voltage level of a bias voltage VBB on an output node 75c; a VBB control circuit/ring oscillator 75ab activated selectively according a clock enable signal EN from the VBB detector 75aa to perform an oscillating operation in a prescribed cycle for generating a pump drive clock signal PCLK1; and a VBB charge pump circuit 75ac performing a charge pump operation utilizing a capacitor according the pump drive clock signal PCLK1 to supply electric charges to the output node 75c for generating the substrate bias voltage VBB.

The external power supply voltage Ve is supplied as one operating power supply voltage to the VBB detector 75aa, the VBB control circuit/ring oscillator 75ab and the VBB charge pump circuit 75ac. The external power supply voltage Ve is a voltage higher than the peripheral power supply voltage supplied to peripheral circuitry similar to the configuration of FIG. 37, and is used for generating the substrate bias voltage efficiently.

The VBB detector 75aa operates, when the sleep mode instructing signal SLEEP_MODE is deactivated, to detect whether or not a voltage level of the substrate bias voltage VBB on the output node 75c exceeds a prescribed voltage level. The VBB detector 75aa is configured utilizing a phenomenon that when a gate to source voltage of a detecting MOS transistor exceeds a threshold voltage thereof, the detecting MOS transistor becomes conductive, for example. The VBB detector 75aa is deactivated to cease a level detecting operation when the sleep mode instructing signal SLEEP_MODE is activated. A consumed current in the sleep mode is reduced.

When the VBB control circuit/ring oscillator 75ab receives the clock enable signal EN in the enable state from the VBB detector 75aa, the ring oscillator is activated to perform an oscillating operation in a cycle specific to the ring oscillator for generating the pump drive clock signal PCLK1. The VBB control circuit/ring oscillator 75ab ceases an oscillating operation of the ring oscillator when the clock enable signal EN from the VBB detector 75aa is in an inactive state.

The VBB charge pump circuit 75*ac* has a large electric charge supply capability (a capacitance value of a charge pump capacitor is large), and performs a charge pump operation according to the pump drive clock signal PCLK1. Hence, the normal VBB generating circuit 75*a* sets a voltage level of the substrate bias voltage VBB to a voltage level set by the VBB detector 75*aa*.

The sleep mode VBB generating circuit 75*b* includes: a sleep mode VBB control circuit 75*ba* generating a pump drive clock signal PCLK2 when the sleep mode instructing signal SLEEP_MODE is activated and a self-refresh request signal FAY is supplied; and a sleep mode VBB charge small pump circuit 75*bb* performing a charge pump operation with a relatively small electric charge supply capability according to the pump drive clock signal PCLK2 to supply electric charges to the output node 75*c*. The sleep mode VBB control circuit 75*ba* and the sleep mode VBB charge small pump circuit 75*bb* also uses the external power supply voltage Ve as one operation power supply voltage. The sleep mode VBB control circuit 75*ba* is also adjusted by a tuning signal TUNE <3:0> with respect to a pulse width of and a clock cycle of its output clock signal.

In the sleep mode, data path-related circuitry for data writing/reading, column related circuitry performing column selection and a data input/output control circuit are at a rest state, and a row-related control circuit, a word driver, a sense amplifier and a refresh control circuit only operate at refresh intervals. Therefore, a substrate current caused by a circuit operation is very small. Main causes for raising the substrate potential in a positive direction are limited substantially to junction leakage currents of a storage node and a bit line contact in a memory cell array. Hence, when a large amount of electric charges are supplied to a substrate from a substrate voltage generating circuit at a time and a voltage level of a negative bias voltage VBB is lowered more than necessary, the substrate bias voltage that is once lowered is difficult to rise in a positive direction. Therefore, the substrate potential can be reliably sustained merely by driving the sleep mode VBB charge small pump circuit 75*bb* intermittently at refresh intervals.

In the substrate voltage generating circuit, the sleep mode VBB control circuit 75*ba* and the VBB charge small pump circuit 75*bb* operate only at refresh intervals, while the other circuits are at a rest state, allowing more reduction in consumed current in the sleep mode.

Figure 39:
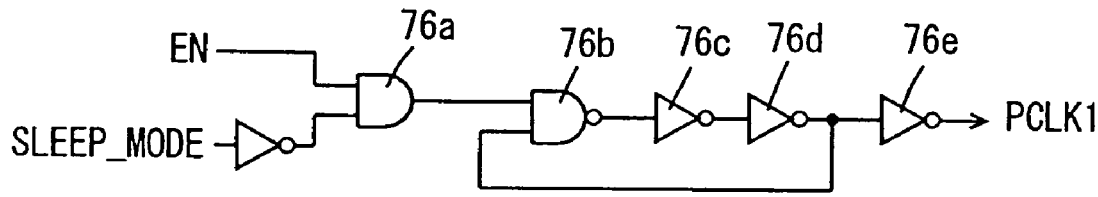
FIG. 39 is a diagram representing a configuration of a VBB control circuit/ring oscillator shown in FIG. 38.

FIG. 39 is a diagram representing a configuration of the VBB control circuit/ring oscillator 75*ab* shown in FIG. 38. In FIG. 39, the VBB control circuit/ring oscillator 75*ab* includes: an AND circuit 76*a* receiving the clock enable signal EN from the VBB detector 75*aa* and an inverted signal of the sleep mode instructing signal SLEEP_MODE; a NAND circuit 76*b* receiving an output signal of the AND 76*a* at a first input thereof; an inverter 76*c* receiving an output signal of the NAND circuit 76*b*; an inverter 76*d* inverting an output signal of the inverter 76*c*; and an inverter 76*e* inverting an output signal of the inverter 76*d* to generate the pump drive clock signal PCLK1. The output signal of the inverter 76*d* is also supplied to a second input of the NAND circuit 76*b*.

In the configuration of the VBB control circuit/ring oscillator 75*ab* shown in FIG. 39, the AND circuit 76*a* and the NAND circuit 76*b* correspond to the VBB control circuit, and the NAND circuits 76*b* to 76*d* correspond to the ring oscillator.

In the VBB control circuit/ring oscillator 75*ab* shown in FIG. 39, when the sleep mode instructing signal SLEEP_MODE is at H level, an output signal of the AND circuit 76*a* is rendered L-level, and an output signal of the NAND 76*b* is fixed at H level. Therefore, the pump clock signal PCLK1 is fixed at the ground voltage level and the VBB charge pump circuit 75*ac* ceases a charge pump operation.

In the normal operating mode, the sleep mode instructing signal SLEEP_MODE is at L level, and the AND circuit 76*a* receives a signal of H level through an inverter at the first input thereof. Therefore, when the clock enable signal EN applied to the second input thereof is at H level, the AND circuit 76*a* outputs a signal of H level. When an output signal of the AND circuit 76*a* is at H level, the NAND circuit 76*b* operates as an inverter, to form a ring oscillator together with the inverters 76*c* and 76*d*, and an oscillating operation is performed in a cycle defined by their gate delays to generate the pump drive signal PCLK1. When the clock enable signal EN is rendered L-level, an output signal of the AND circuit 76*a* attains an L level and the pump drive clock signal PCLK1 is fixed at L level to cease a charge pump operation.

Hence, in the normal operating mode, a voltage level of the substrate bias voltage VBB is set to a voltage level detected by the VBB detector 75*aa*.

The VBB charge pump circuit 75*ac* needs only to be a circuit performing a charge pump operation utilizing a capacitor.

Figure 40:
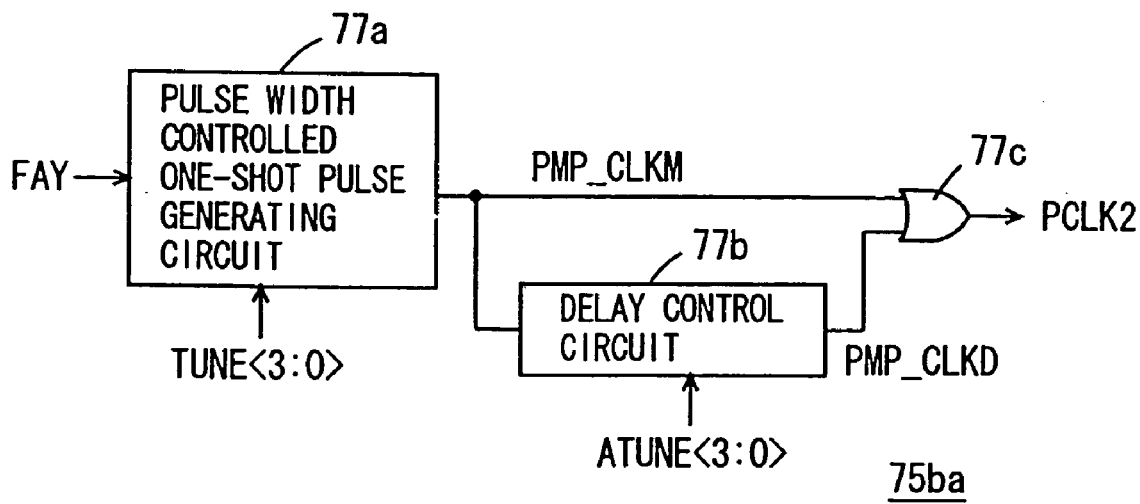
FIG. 40 is a diagram schematically showing a configuration of the sleep mode VBB control circuit shown in FIG. 38.

FIG. 40 is a diagram representing a configuration of the sleep mode VBB control circuit 75*ba* shown in FIG. 38. In FIG. 40, the sleep mode VBB control circuit 75*ba* includes: a pulse width controlled one-shot pulse generating circuit 77*a* generating a one-shot pulse signal PMP_CLKM in response to activation of a refresh request signal FAY; a delay control circuit 77*b* delaying the pulse signal PMP_CLKM; and an OR circuit 77*c* receiving an output pulse signal PMP_CLKD of the delay control circuit 77*b* and an output pulse signal PMP_CLKM of the pulse width controlled one-shot pulse generating circuit 77*a* to generate a pump drive clock signal PCLK2.

A pulse width of the one-shot pulse signal PMP_CLKM can be adjusted by the tuning signal TUNE <3:0>. A delay time of the delay control circuit 77*b* can be adjusted by a tuning signal ATUNE <3:0>. The pump drive clock signal PCLK2 has a pulse width and frequency controlled and is generated twice when the refresh request signal FAY is activated.

A charge pump amount is determined by an H level period of and a frequency of the clock signal PCLK2. Hence, by adjusting the tuning signals TUNE <3:0> and ATUNE <3:0>, a pulse width and frequency of the pump drive clock signal PCLK2 can be adjusted, and supplied electric charge amount can be adjusted.

Figure 41A:
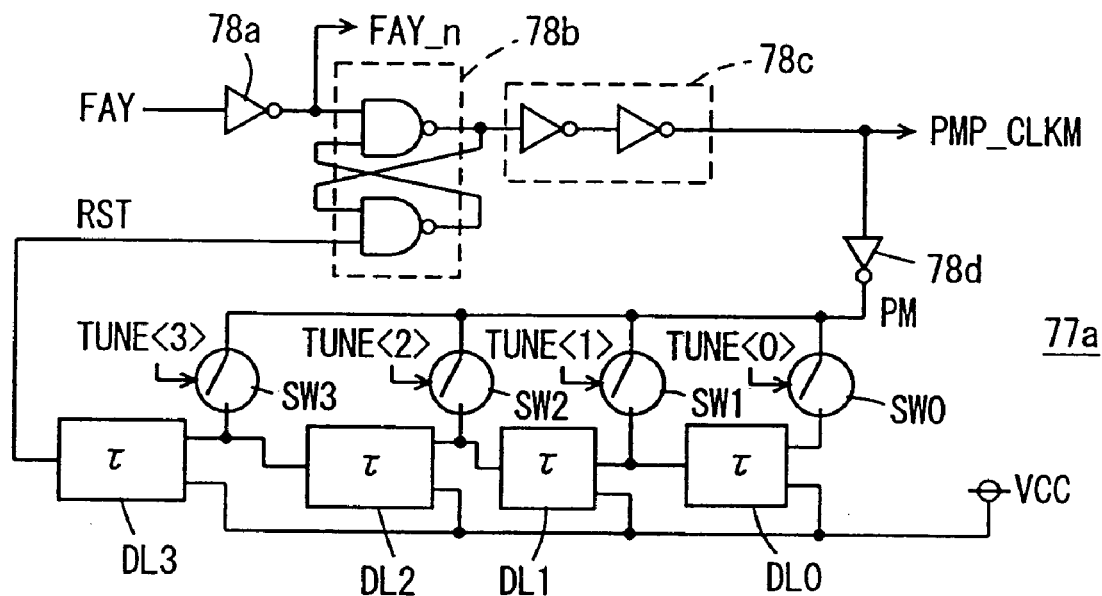
FIG. 41A is a diagram representing a configuration of a pulse width controlled one-shot pulse generating circuit shown in FIG. 40.

FIG. 41A is a diagram representing a configuration of the pulse width controlled one-shot pulse generating circuit 77*a* shown in FIG. 40. In FIG. 41A, the pulse width controlled one-shot pulse generating circuit 77*a* includes: an inverter 78*a* receiving a refresh request signal FAY; a set/reset flip flop 78*b* set when an output signal of the inverter 78*a* is at L level, and reset when the reset signal RST is at L level; a buffer circuit 78*c* buffering an output signal of the set/reset flip flop 78*b* to generate a pulse signal PMP_CLKM; an inverter 78*d* receiving an output signal of the buffer 78*c* to generate an inverted pulse signal PM; switching circuits SW0 to SW3 provided corresponding to respective tuning signals TUNE <0> to TUNE <3> and rendered conductive when a corresponding tuning signal is in an active state; and delay elements DL0 to DL3 receiving the power supply voltage VCC and output signals of corresponding switching circuits. The delay elements DL0 to DL3 each have a delay time τ and transmit an output signal thereof to the input, connected to a switching circuit, of a delay element at a subsequent stage.

An output signal of the delay element DL3 at the final stage is supplied to the set/reset flip flop 78b as the reset signal RST.

Figure 41B:
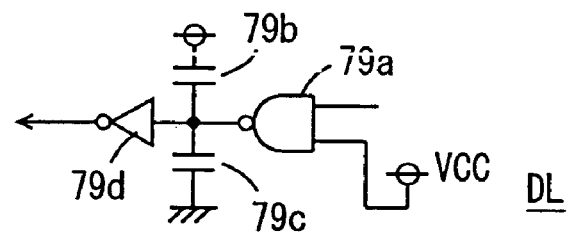
FIG. 41B is a diagram representing a configuration of a delay circuit shown in FIG. 41A.
Figure 41C:
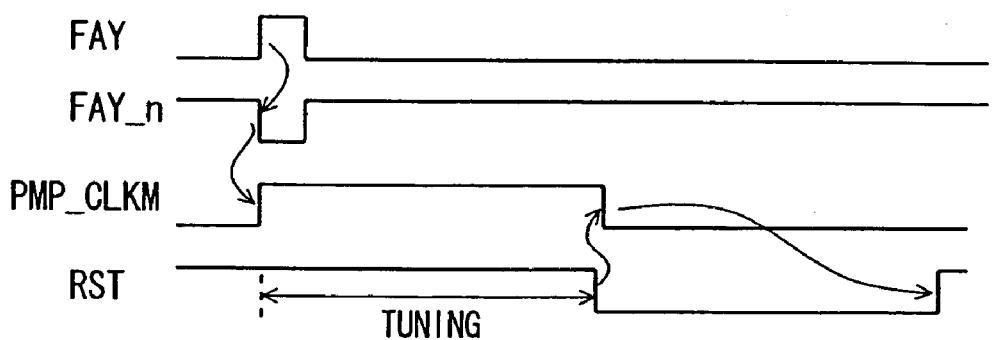
FIG. 41C is a diagram of signal waveforms representing operation of the circuit shown in FIG. 41A.

FIG. 41B is a diagram representing a configuration of the delay elements DL (DL0 to DL3) shown in FIG. 41A. In FIG. 41B, the delay circuit DL includes: a NAND circuit 79a receiving the power supply voltage VCC and an output signal of a corresponding switching circuit or a delay circuit at the preceding stage; capacitance elements 79b and 79c for delaying the rise and fall of an output signal of the NAND circuit 79a; and an inverter 79d inverting an output signal of the NAND circuit 79a. The rise and fall of the NAND circuit 79a are both delayed by the capacitance elements 79b and 79c to achieve a unit delay time τ. A current drive capability of the inverter 79d is made smaller than that of the inverter 78d. Now, description will be given of operation of the pulse width controlled one-shot pule generating circuit 77a shown in FIGS. 41A and 41B with reference to a signal waveform diagram shown in FIG. 41C.

When the refresh request signal FAY is supplied, an output signal of the inverter 78a is rendered L-level, the set/reset flip flop 78b is set and the clock pulse signal PMP_CLKM rises to an H level. One of the switching circuit SW0 to SW3 is in a conductive state according to any one of the tuning signals TUNE <0> to TUNE <3>. When a corresponding switching circuit is in a non-conductive state, an input of the NAND circuit 79a coupled with a corresponding switching circuit enters a floating state and an output signal thereof becomes unstable. A node in the floating state is normally discharged to the ground voltage level. However, by making a drive capability of the inverter 78d larger than those of the inverter 79d at each of the output stages of the delay circuits DL0 to DL3, an output pulse signal PM of the inverter circuit 78d can be transmitted through a delay circuit stage regardless of states of output signals of the delay circuit DL0 to DL2.

For example, when the switching circuit SW1 is in a conductive state, an output signal of the inverter 79d of the delay circuit DL0 is in an unstable state or at H level. However, the switching circuit SW1 is conductive, and therefore, an input of the delay circuit DL1 is driven according to an output signal of the inverter 78d. Hence, when the switching circuit SW1 is in a conductive state, an output pulse signal PM of the inverter 78d is sequentially transmitted through the delay circuits DL1 to DL3. Accordingly, after a delay time 3τ that the delay circuits DL1 to DL3 have elapses, the reset signal RST is rendered L-level, and the set/reset flip flop 78b is reset (an output signal of the inverter 78a returns back to H level). Thereby, a pulse width of the clock pulse signal PMP_CLKM can be adjusted by the tuning signals TUNE <3:0>.

Figure 42:
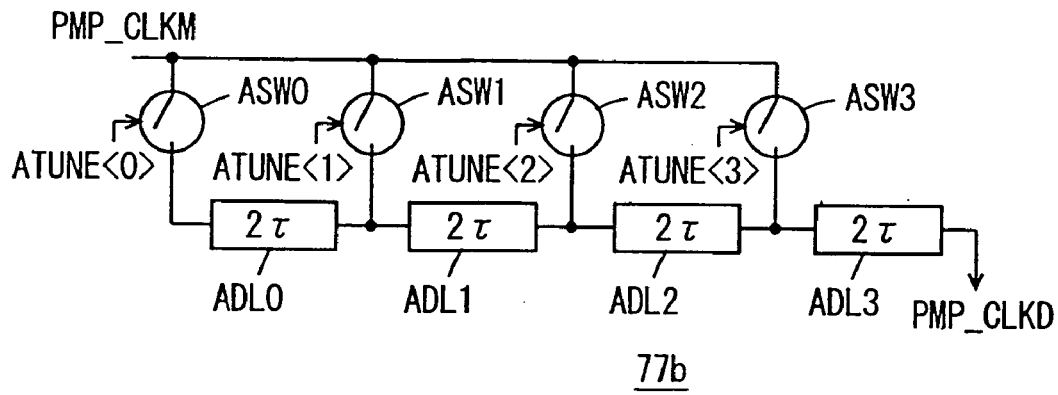
FIG. 42 is a diagram schematically showing a configuration of a delay control circuit shown in FIG. 40.

FIG. 42 is a diagram schematically showing a configuration of the delay control circuit 73b shown in FIG. 40. In FIG. 42, the delay control circuit 77b includes: cascaded delay circuits ADL0 to ADL3; and switch circuits ASW0 to ASW3 provided corresponding to the respective delay circuits ADL0 to ADL3 to pass the clock pulse signal PMP_CLKM from the pulse width controlled one-shot pulse generating circuit 77a therethrough. Each of the delay circuits ADL0 to ADL3 has a delay time of 2·τ, or a delay time of 2 times the delay time τ that each of the delay circuits DL0 to DL3 of the pulse width controlled one-shot pulse generating circuit 77a has.

The tuning signals ATUNE <0> to ATUNE <3> correspond to the respective tuning signals TUNE <0> to TUNE <3> shown in FIG. 41A. The delay circuits ADL0 to ADL3 shown in FIG. 42 each delay a received signal by the prescribed delay time 2·τ. Now, description will be given of operation of the delay control circuit 77b shown in FIG. 42 with reference to a signal waveform diagram shown in FIG. 43.

Figure 43:
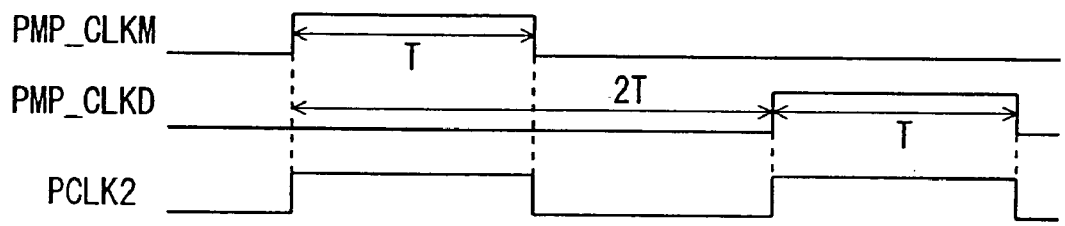
FIG. 43 is a diagram of signal waveforms representing operation of the delay control circuit shown in FIG. 42.

It is now considered a case where the pump clock pulse signal PMP_CLKM has a pulse width T as shown in FIG. 43. This state means that a delay time T is provided by the delay circuits DL0 to DL3 shown in FIG. 41A. In this case, a tuning signal corresponding to the activated tuning signal of the pulse width controlled one-shot pulse generating circuit 77a is also set in an active state in the delay control circuit 77b. Hence, the clock pulse signal PMP_CLKM passes through the same number of delay circuit stages in the delay circuits ADL0 to ADL3. The delayed pump clock pulse signal PMP_CLKD has a delay time 2T of two times that of the pump clock pulse signal PMP_CLKM and the same pulse width T as that of the pump clock pulse signal PMP_CLKM. Hence, the pump drive clock signal PCLK2 from the OR circuit 77c shown in FIG. 40 is a combined signal of the clock pulse signals PMP_CLKM and PMP_CLKD and therefore, the pump drive clock signal PCLK2 has a pulse width T and a cycle 2T. The sleep mode VBB charge small pump circuit 75bb shown in FIG. 38 is driven according to the pump drive clock signal PCLK2. Thereby, a supply electric charge amount in a charge pump operation can be adjusted, and a necessary minimum amount of electric charges can be supplied upon each refresh operation in the self-refresh mode to stably hold the substrate bias voltage VBB at a prescribed voltage level.

Note that a ring oscillator may be configured such that the ring oscillator is activated for a prescribed period when a refresh request signal FAY is supplied and an operating current of the ring oscillator is adjusted by a tuning signal, wherein a current mirror circuit is utilized with a mirror rate adjusted by the tuning signal, and a mirror current is used as an operating current.

As described above, according to the fifth embodiment of the present invention, a circuit for generating the substrate bias voltage VBB applied to a substrate region, in which a memory cell array is formed, is configured so as to be operated intermittently during the sleep mode, allowing decrease in consumed current in the sleep mode. Note that in the twin-cell write mode as well, only a small pump circuit in the substrate bias voltage generating circuit operates. In this case, in the twin-cell write mode as well, only the row-related circuitry operates, only a sense amplifier operates, a circuit operation is the same as in the self-refresh mode and a substrate current is small. Therefore, in the twin-cell write mode, the substrate bias voltage VBB can be stably held at a prescribed voltage level even if the VBB small pump circuit operates intermittently.

The self-refresh mode instructing signal may be used instead of the sleep mode instructing signal SLEEP_MODE. In this case, the normal VBB control circuit 75a of FIG. 38 operates and the sleep mode VBB circuit 75b is deactivated. Hence, in the twin-cell write mode, control of the substrate biase voltage VBB is performed similar to that in the normal operating mode and storage data of the one bit/one cell mode can be stably rewritten into twin-cell mode unit cells.

Sixth Embodiment

Figure 44A:
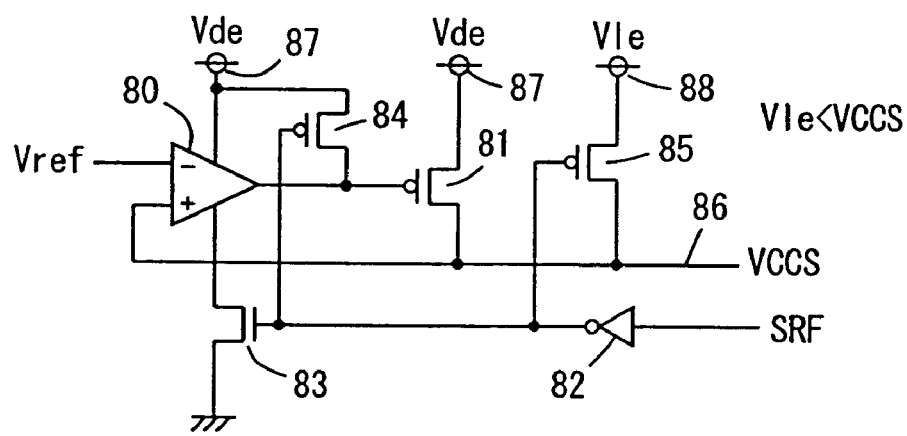
FIG. 44A is a diagram representing a configuration of an internal power supply circuit of a semiconductor memory device according to a sixth embodiment of the present invention.

FIG. 44A is a diagram schematically showing a configuration of an internal power source circuit according to a sixth embodiment of the present invention. In FIG. 44A, the internal power source circuit includes: a comparator 80 for comparing a reference voltage Vref and an array power supply voltage (sense power supply voltage) on an array power supply line 86 when activate; a current drive transistor 81 constituted of a P channel MOS transistor and supplying a current to the array power supply line 86 from a memory power source node 87 receiving an external power supply voltage Vde for a DRAM power source according to an output signal of the comparator 80; an inverter 82 inverting a self-refresh mode instructing signal SRF; a current source transistor 83 rendered conductive, when an output signal of the inverter 82 is at an H level, to activate the comparator 80; a P channel MOS transistor 84 rendered conductive, when an output signal of the inverter 82 is at an L level, to electrically couple an output node of the comparator 80 with the memory power source node 87; and a P channel MOS transistor 85 coupling the array power supply line 86 with a logic power source node 88 receiving a logic power supply voltage Vle when an output signal of the inverter 82 is at an L level.

The logic power supply voltage Vle is a voltage lower than the array power supply voltage VCCS, and is, for example, at level of 1.5 V to 2.0 V. The array power supply voltage VCCS is, for example, 2.5 to 3 V and utilized as a sense amplifier power supply voltage and determines a potential of H level data to be written into a memory cell.

In the internal power source circuit shown in FIG. 44A, when the self-refresh mode instructing signal SRF is at L level, an output signal of the inverter 82 is rendered H-level, the current source transistor 83 is made conductive, and the comparator 80 is activated to compare the reference voltage Vref with the array power supply voltage VCCS. Furthermore, the MOS transistors 84 and 85 both enter a non-conductive state. When the array power supply voltage VCCS is lower than the reference voltage Vref, an output signal of the comparator 80 goes low to increase a conductance of the current drive transistor 81. Accordingly, a current flows from the memory power source node 87 to the array power supply line 86 to raise a voltage level of the array power supply voltage VCCS. When the array power supply voltage VCCS is higher than the reference voltage Vref, an output of the comparator 80 attains an H level to turn the current drive transistor 81 into an off state. Hence, when the comparator 80 is activated, the array power supply voltage VCCS is set to a voltage level of the reference voltage Vref.

In the self-refresh mode, the self-refresh mode instructing signal SRF is rendered H-level and the current source transistor 83 enters a non-conductive state. On the other hand, the P channel MOS transistor 84 is turned into an on state to couple the memory power source node 87 with the output node of the comparator 80 and the gate of the current drive transistor 81. Thereby, the current drive transistor 81 is reliably set into a turned off state. Furthermore, the P channel MOS transistor 85 is rendered conductive in response to a signal of an L level from the inverter 82, and the logic power source node 88 is coupled with the array power supply line 86. In this state, the array power supply voltage VCCS becomes equal to the logic power supply voltage Vle.

Figure 44B:
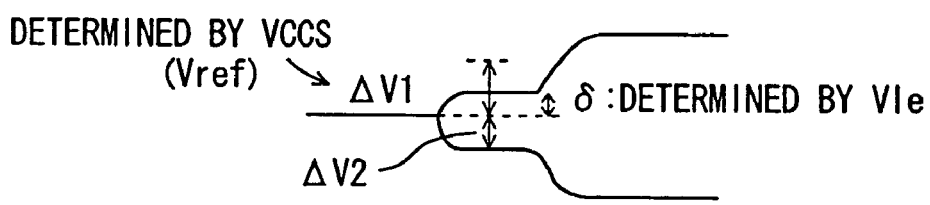
FIG. 44B is a diagram schematically showing bit line voltages in a self-refresh operation in the sixth embodiment of the present invention.

In the self-refresh mode, a self-refresh operation is performed in the twin-cell mode. In the twin-cell mode, complementary data are read out onto a bit line pair. Hence, even when the array power supply voltage VCCS is set to the logic power supply voltage Vle level and a read-out voltage in H level data reading is δ as shown in FIG. 44B, for example, a read-out voltage ΔV2 in L level data reading has a sufficiently large value. Hence, even when the read-out voltage δ in the H level data reading is smaller than a read-out data ΔV1 under the array power supply voltage determined according to the reference voltage Vref, a correct sense operation can be performed with the help of the L data read-out voltage ΔV2.

By ceasing operation of the internal power source circuit in the self-refresh mode, a consumed current in the internal power source circuit can be reduced, allowing reduction in consumed current in the self-refresh mode.

Note that the internal power source circuit is activated in the twin-cell write mode and H level data of the array power supply voltage VCCS level determined by the reference voltage Vref is written into a memory cell. This is because in the twin-cell write mode, one bit/one cell mode data reading is again performed and in succession, a sub word line constituting a pair is driven into a selected state to perform one bit/two cell data storage.

Note that the internal power source circuit may be configured so as to be activated when the array activating signal RAS is activated. A current source transistor receiving the array activating signal RAS at a gate thereof is connected in series to the transistor 83 shown in FIG. 44A. Even with this configuration adopted, a consumed current in a standby cycle in the normal operating mode can be reduced.

FIG. 45A is a diagram representing a modification of the internal power supply circuit according to the sixth embodiment of the present invention. In FIG. 45A, similar to the configuration shown in FIG. 44A described above, the internal power supply circuit includes: an inverter 82 inverting the self-refresh mode instructing signal SRF; a current source transistor 83 rendered conductive according to an output signal of the inverter 82 to activate the comparator 80; a P channel MOS transistor 84 rendered conductive when the self-refresh mode instructing signal SRF is activated to couple an output node of the comparator 80 with the power supply node 87; and a current drive transistor supplying a current from the power supply node 87 to an internal power supply line (array power supply line) according to an output signal of the comparator 80. The reference voltage Vref1 is supplied to the comparator 80.

The internal power supply circuit shown in FIG. 45A further includes: a current source transistor 83s constituted of an N channel MOS transistor and rendered conductive when the self-refresh mode instructing signal SRF is activated; a comparator 80s activated, when the current power supply transistor 83s rendered conductive, for comparing the reference voltage Vref2 with the array power supply voltage VCCS on the array power supply line 86; a current drive transistor 85s constituted of P channel MOS transistor and supplying a current from a memory power supply node 87 to the array power supply line 86 according to an output signal of the comparator 80s; and P channel MOS transistor 84s rendered conductive, when the self-refresh mode instructing signal SRF is deactivated, to connect an output node of the comparator 80s to the memory power supply node 87.

In the configuration shown in FIG. 45A, the reference voltage Vref2 is made lower than the reference voltage Vref1. In an embedded DRAM, two configurations are available: where only a memory power supply voltage Vde is supplied; and where both of the memory power supply voltage Vde and a logic power supply voltage Vle are supplied. The configuration shown in FIG. 45A corresponds to an embedded DRAM of a one power supply configuration using the memory power supply voltage Vde. However, even in the case of a two power supply system, the configuration shown in FIG. 45A can be utilized. This is because a configuration can be conceived in which the logic power supply voltage Vle is cut off and discharged to the ground voltage level.

In the configuration shown in FIG. 45A, when the self-refresh mode instructing signal SRF is in an inactive state at L level, the array power supply voltage VCCS is set to a voltage level of the reference voltage Vref1 by the comparator 80 and the current drive transistor 81. On the other hand, when the self-refresh mode instructing signal SRF is in an active state, the array power supply voltage VCCS is held at a voltage level of the reference voltage Vref2 by the comparator 80s and the current drive transistor 85s. Since the reference voltage Vref2 is lower than the reference voltage Vref1, the array power supply voltage VCCs in the self-refresh mode can be made lower as compared with cases in other operation modes.

More specifically, as shown in FIG. 45B, in operation modes other than the self-refresh mode, a read-out voltage ΔV1 read out onto a corresponding bit line from a memory cell is determined by the reference voltage Vref1. On the other hand, a bit line read-out voltage δ in the self-refresh mode is determined by the reference voltage Vref2. In this case, even if the read-out voltage δ is small similarly to the configuration shown in FIG. 44 described above, a negative read-out data ΔV2 is large. Accordingly, an equivalent read-out voltage (δ+ΔV2) is large enough for the sense amplifier circuit to perform sense operation, and the sensing of the bit line voltages can be correctly performed in the twin-cell mode.

As described above, according to the sixth embodiment, in the self-refresh mode, operation of a circuit generating an array power supply voltage is ceased and the array power supply line is coupled with the logic power supply line, allowing decrease in consumed current in the internal power supply circuit in the data holding mode.

Seventh Embodiment

Figure 46:
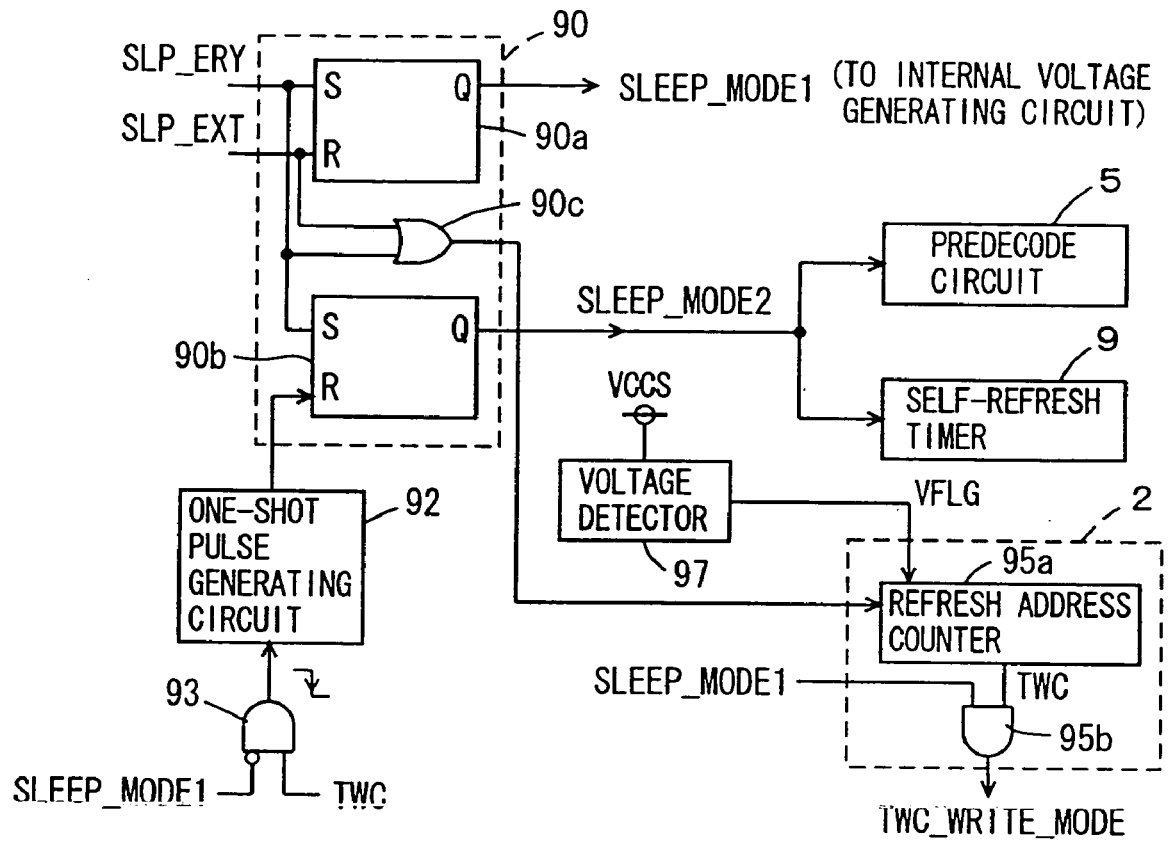
FIG. 46 is a diagram schematically showing a configuration of a main part of a semiconductor memory device according a seventh embodiment of the present invention.

FIG. 46 is a diagram schematically showing a configuration of a main part of an embedded DRAM according a seventh embodiment of the present invention. In FIG. 46, a command control circuit 90 is supplied with a sleep mode entry command SLP_ERY and a sleep mode exit command SLP_EXT. A sleep mode instructing signal SLEEP_MODE1 for controlling operation of an internal voltage generating circuit is generated from the command control circuit 90, and a sleep mode instructing signal SLEEP_MODE2 supplied to the predecode circuit 5 and the self-refresh timer 9 is generated from the command control circuit 90. The internal voltage generating circuit starts an internal voltage generating operation in response to deactivation of the sleep mode instructing signal SLEEP_MODE1 after release of the sleep mode. On the other hand, when the sleep mode exit command SLP_EXT is supplied, the predecode circuit 5 and the self refresh timer 9 are returned to the normal operating mode after a refresh operation is completed on all of the memory cells, utilizing an internal voltage internally generated stably.

A voltage detector 97 is provided for monitoring the voltage level of an internal voltage such as the array power supply voltage VCCS. In the sleep mode exit, the voltage detector 97 generates a voltage recovery flag VFLG indicating that the internal voltage is recovered to a stable state. When the voltage recovery flag VFLG is generated or set, then the twin cell refresh operation is started, or the twin cell refresh mode control signal TWC is activated. The voltage generator 97 may be a construction of a power on reset circuit for initializing internal circuitry in power on. Alternatively, the voltage detector 97 may be formed of a timer started to count a predetermined time period for generating the voltage recovery flag VFLG in response to deactivation of the sleep mode instructing signal SLEEP_MODE1.

The command control circuit 90 includes: a set/reset flip flop 90a set in response to the sleep mode entry command SLP_ERY instructing transition to the sleep mode and reset in response to the sleep mode exit command SLP_EXT instructing sleep mode release to generate the sleep mode instructing signal SLEEP_MODE1; a set/reset flip flop 90b set in response to the sleep mode entry command SLP_ERY to generate the sleep mode instructing signal SLEEP_MODE2; and an OR circuit 90c receiving the commands SLP_ERY and SLP_EXT.

The refresh counter includes: a refresh address counter 95a having a count value thereof incremented after a refresh operation is completed; and an AND circuit 95b receiving a twin-cell write control signal TWC from the refresh address counter 95a and the sleep mode instructing signal SLEEP_MODE1 to generate a twin-cell write mode instructing signal TWC_WRITE_MODE. The refresh address counter 95a includes the configurations shown in FIGS. 15 and 18 described previously. An output signal of the OR circuit 90c is supplied instead of the signal SLEEP_MODE shown in FIG. 18, and a delay circuit is used instead of the rise delay circuit 2i. The twin-cell mode instructing signal TWC is set at H level and stays at the H level till refresh addresses on all of the rows beginning at the start address are designated one time when the sleep mode entry command or the sleep mode exit command is applied.

In order to control the reset of the sleep mode instructing signal SLEEP_MODE2, there is provided a gate circuit 93 receiving the twin-cell write control signal TWC and the sleep mode instructing signal SLEEP_MODE1, and a one-shot pulse generating circuit 92 for generating a one-shot pulse signal to reset the set/reset flip flop 90b in response to a fall of the output signal of the gate circuit 93.

The gate circuit 93 generates an H level signal when the sleep mode instructing signal SLEEP_MODE1 is at an L level and the twin-cell write control signal is at an L level, and generates an L level signal when the sleep mode instructing signal SLEEP_MODE1 is at H level or the twin-cell write control signal TWC is at L level. That is, the gate circuit 93 generates a going-low signal when the sleep mode exit command SLP_EXT is supplied and the twin-cell refresh after sleep mode is completed.

The one-shot pulse generating circuit 92 generates a one shot pulse signal in response to the fall of the output signal of the gate circuit 93. More specifically, the one-shot pulse generating circuit 92 generates a resetting signal when the sleep mode is completed and the refreshing of memory cell data is completed. In the sleep mode entry, the sleep mode instructing signal SLEEP_MODE1 is at an H level when the twin-cell write control signal TWC is activated, and the one-shot pulse generating circuit 93 does not generates a one shot pulse so that the sleep mode instructing signal SLEE_MODE2 is kept activated in the sleep mode.

Figure 47:
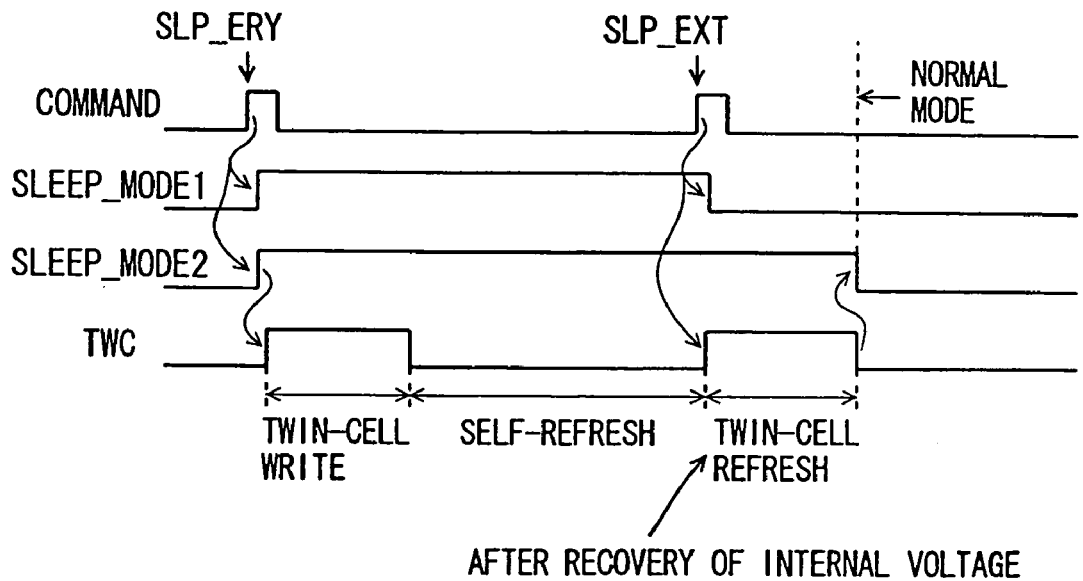
FIG. 47 is a diagram of signal waveforms representing operation of the circuit shown in FIG. 46.

When the twin-cell mode instructing signal TWC attains an inactive state, a one-shot pulse is generated by the one-shot pulse generating circuit 92 and the set/reset flip flop 90b is reset. Now, description will be given of operation of the configuration shown in FIG. 46 with reference to a signal waveform diagram shown in FIG. 47.

When the sleep mode entry command SLP_ERY is supplied, the sleep mode instructing signals SLEEP_MODE1 and SLEEP_MODE 2 are activated and the twin-cell mode instructing signal TWC corresponding to an output signal of the flip flop 2j of FIG. 18 is also activated. The predecode circuit 5 performs an address control in the twin-cell write mode in response to activation of the twin-cell mode instructing signal TWC and data stored in the one bit/one cell mode are written into unit cells of the one bit/two cell mode (twin-cell mode). The refresh address counter 95a retains a count value at the time when the sleep mode entry command SLP_ERY is supplied as a start count value. When the refresh address counter 95a counts the full range beginning at the start count value, and returns back to the start count value, the twin-cell mode instructing signal TWC is rendered L-level and the twin-cell write mode instructing signal TWC_WEITE_MODE is rendered L-level, followed by performing of a self-refresh mode. In the self-refresh mode, the predecode circuit 5 performs degeneration of address bits, and the self-refresh timer 9 issues refresh request signals at prescribed intervals.

In the self-refresh mode, internal voltage generating operations in the internal voltage generating circuits (VCCS, VPP, VBL and VBB) are ceased according to the self-refresh mode instructing mode SRF. The array power supply voltage VCCS is monitored by the voltage detector 97. Alternatively, the voltage detector 97 may be kept inactive in the self-refresh mode.

When the sleep mode exit command SLP_EXT is issued, the set/reset flip flop 90a is set, the sleep mode instructing signal SLEEP_MODE1 attains an inactive state, and the internal voltage generating circuits are again activated to generate internal voltages. When the internal voltages are recovered to the original voltage level or the predetermined voltage levels, the voltage detector 97 sets the voltage recovery flag VFLG. On the other hand, the refresh mode instructing signal SLEEP_MODE2 from the set/reset flip flop 90b stays in an active state and a refresh operation is performed. The sleep mode exit command-SLP_EXT is supplied to the refresh address counter 95a, and a count value of the refresh address counter 95a may be reset to an initial value, and the twin-cell mode instructing signal TWC from the refresh address counter 95a again is set to an active state at H level when the voltage recovery flag VFLG is set to indicate that the internal voltages are recovered. However, the sleep mode instructing signal SLEEP_MODE1 is in an inactive state at L level and the twin-cell write mode instructing signal TWC_WRITE _MODE stays at L level.

Therefore, when the sleep mode exit command SLP_EXT is issued, a refresh operation is again performed on all the memory cells using stable internal voltages, and a voltage level on the storage node of a memory cell storing H level data is set to a adequately high voltage level. When refresh on all the memory cells is completed, the twin-cell mode instructing signal TWC attains an inactive state in response to address coincidence detection. Responsively, the output signal of the gate circuit 93 goes low, and a one-shot pulse is generated from the one-shot pulse generating circuit 92 to reset the set/reset flip flop 90b and the sleep mode instructing signal SLEEP_MODE2 is rendered L-level, and the sleep mode is terminated.

Note that in the twin-cell write mode and the twin-cell refresh mode, a generating interval of refresh request signals of the self-refresh timer 9 may be shorter than that in the self-refresh mode.

Note that when the sleep mode exit command SLP_EXT is issued, a count value of the refresh address counter 95a may be reset to an initial value. In this case, it is considered that a refresh interval for a memory cell may be longer than for another memory cell. However, a refresh cycle is sufficiently long in the one bit/two cell mode, and a correct sense operation can be stably performed satisfactorily even at a long refresh interval. Therefore, even when the refresh address counter 95a is reset to an initial value in the exit of the sleep mode and thereafter a refresh operation is performed again for all the memory cells, a correct refresh operation is reliably assured even in such a case.

After the twin-cell mode instructing signal TWC is set to an inactive state, a voltage level on the storage node storing H level data of a memory cell is at the array power supply voltage level VCCS. Thus, a normal data access is performed in the one bit/one cell mode correctly. At this time, memory cell data saved in a data holding region may also be again distributed back to the original storage locations by an external logic. The external logic (memory controller) need only to rearrange memory cell data with reference to a table indicating a relationship between an address in the one bit/one cell mode and an address in the one bit/two cell mode.

The voltage detector 97 monitors the voltage level of the array power supply voltage to monitor other internal voltage such as the intermediate voltage. These intermediate voltages such as the bit line precharge voltage is generated utilizing the array power supply voltage and the voltage detector 97 reliably monitors the recovery of the internal voltages. When the timer is employed for the voltage detector 97, the time period of recovery of all the internal voltages is programmed in advance, to monitor the recovery of the internal voltages.

As described above, according to the seventh embodiment of the present invention, when the sleep mode is released, the internal voltage generating circuits are operated to perform refreshing on data of all the memory cells and thereafter, the normal operating mode is returned. Accordingly, transition to the one bit/one cell mode can be performed in a state where the potential at a storage node storing H level data of a memory cell is sufficiently high and therefore, destruction of data can be prevented reliably.

Eighth Embodiment

Figure 48:
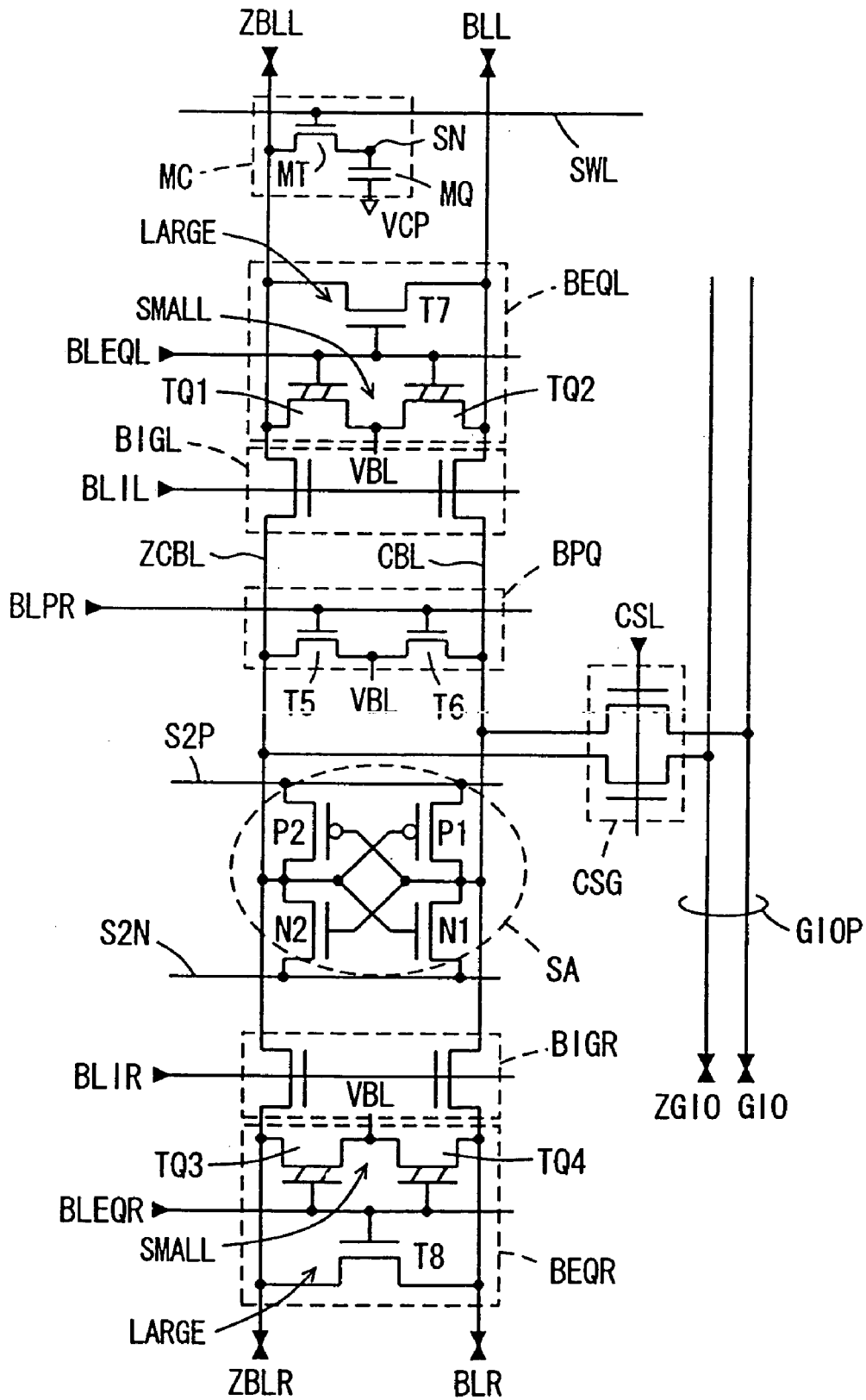
FIG. 48 is a diagram representing a configuration of a main part of a semiconductor memory device according to an eighth embodiment of the present invention.

FIG. 48 is a diagram representing a configuration of a main part of a semiconductor memory device according to an eighth embodiment of the present invention. In FIG. 48, there is shown a configuration of a sense amplifier band shared between two memory cell arrays adjacent to each other in the column direction, similarly to the configuration shown in FIG. 26.

In FIG. 48, for common bit lines CBL and ZCBL, there is provided a bit line precharge circuit BPQ activated, when the bit line precharge instructing signal BLPR is activated, to precharge bit lines. BLL and ZBLL, and BLR and ZBLR to a voltage level of a prescribed intermediate voltage VBL (=VCCS/2) through common bit lines CBL and ZCBL. The bit line precharge circuit BPQ includes: N channel MOS transistors T5 and T6 rendered conductive, when the bit line precharge instructing signal BLPR is activated, to transmit the intermediate voltage VBL onto the common bit lines ZCBL and CBL.

Referring to FIG. 48, for the bit line BLL and ZBLL, there is provided a bit line precharge/equalize circuit BEQL for precharging and equalizing the bit lines BLL and ZBLL to the intermediate voltage VBL when the bit line equalize instructing signal BLEQL is activated. Furthermore, for the bit line BLR and ZBLR, there is provided a bit line precharge/equalize circuit BEQR for precharging and equalizing the bit lines BLR and ZBLR to the intermediate voltage VBL when the bit line equalize instructing signal BLEQR is activated. The bit line precharge/equalize circuit BEQL includes: an equalize transistor T7 rendered conductive, when the bit line equalize instructing signal BLEQL is activated, to electrically short the bit lines BLL and ZBLL; and N channel MOS transistors TQ1 and TQ2 rendered conductive, when the bit line equalize instructing signal BLEQL is activated, to transmit the intermediate voltage VBL onto the bit lines BLL and ZBLL. Current drive capabilities of the N channel MOS transistors TQ1 and TQ2 are set smaller than those of the MOS transistors T5 to T7. In other words, threshold voltages of the N channel MOS transistors TQ1 and TQ2 are made larger than those of the MOS transistors T5 to T7 and sizes thereof (a ratio of a channel width to a channel length) are smaller than those of the MOS transistors T5 to T7.

The bit line precharge/equalize circuit BEQR includes: an N channel MOS transistor T8 rendered conductive, when the bit line equalize instructing signal BLEQR is activated, to electrically short the bit lines BLL and ZBLL; and N channel MOS transistors TQ3 and TQ4 made conductive, when the bit line equalize instructing signal BLEQR is activated, to transmit the intermediate voltage BBL onto the bit lines ZBLR and BLR. Threshold voltages of the MOS transistors TQ3 and TQ4 are made higher than those of the MOS transistors T5 to T8 and furthermore, sizes (a ratio of a channel width to a channel length) thereof are made smaller than those of the MOS transistors T5 to T8.

Figure 49:
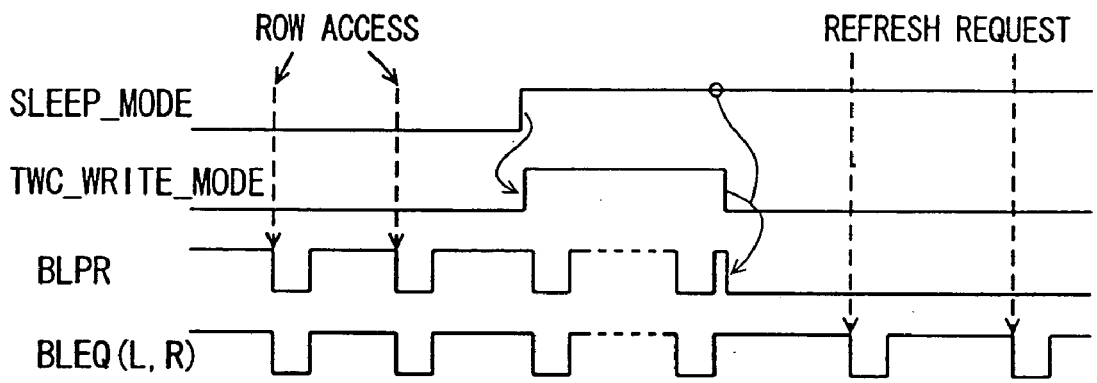
FIG. 49 is a timing chart representing operation of the configuration shown in FIG. 48.

The common bit lines CBL and ZCBL are provided with a sense amplifier circuit SA. Furthermore, the common bit lines CBL and ZCBL are coupled with the respective bit lines BLL and ZBLL through the bit line isolation gate BIGL and with the respective bit lines BLR and ZBLR through the bit line isolation gate BIGR. The common bit lines CBL and ZCBL are coupled with a global data line pair GIOP through a column select gate CSG. Now, description will be given of operation of the circuit shown in FIG. 48 with reference to a timing chart shown in FIG. 49.

In the normal operating mode where a data access is made, the bit line isolation instructing signals BLIL and BLIR are both at H level (high voltage) in the standby state and the bit line isolation gates BIGL and BIGR are both in a conductive state. Thus, the common bit lines CBL and ZCBL are coupled with the bit lines BLL and BLR, and the bit lines ZBLL and ZBLR, respectively. The bit lines BLL, ZBLL, CBL, ZCBL, BLR and ZBLR are all precharged to the intermediate voltage VBL.

When a row access is made, the bit line precharge instructing signal BLPR for the sense amplifier band provided to a selected memory cell array falls to L level, and the bit line precharge circuit BPQ is deactivated. Furthermore, when a memory cell array including the bit lines BLL and ZBLL, or BLR and ZBLR, is selected, a corresponding bit line equalize instructing signal BLEQ (BLEQL or BLEQR) attains an inactive state and a corresponding bit line precharge/equalize circuit BEQL or BEQR is deactivated. When this row access is completed, the bit line precharge instructing signal BLPR and the bit line equalize instructing signal BLEQL and BLEQR are activated to precharge the bit lines to the intermediate voltage VBL.

When the sleep mode is entered and the sleep mode instructing signal SLEEP_MODE is rendered H-level, the twin-cell write mode instructing signal TWC_WRITE_MODE is set to H level for a prescribed time period or till rewriting in memory cell data at even-numbered addresses is completed and the data storage in the twin-cell writing mode is effected. More specifically, data stored in the one bit/one cell mode are held in the memory cells at even-numbered addresses in the one bit/two cell mode (twin-cell mode). In this twin-cell write mode, the bit line precharge instructing signal BLPR and the bit line equalize instructing signals BLEQL and BLEQR are selectively activated/deactivated according to a row access command (and a block select signal).

When the twin-cell write mode is completed in the sleep mode, the bit line precharge instructing signal BLPR is fixed at L level. Therefore, when the operation mode enters the self-refresh mode in this sleep mode, the bit line precharge circuit BPQ is held in an inactive state at all times. In the self-refresh mode or in an operating mode after the twin-cell write mode is completed in the sleep mode, a refresh request is repeatedly issued in a prescribed cycle. The bit line equalize instructing signal BLEQ(L or R), or the bit line equalize instructing signals BLEQL or BLEQR, is selectively deactivated according to the refresh request. Hence, in the self-refresh mode, precharge and equalization on the bit lines BLL and ZBLL, or BLR and ZBLR are performed by the bit line precharge/equalize circuit BEQL or BEQR.

Precharging the bit lines is performed by the MOS transistors TQ1 and TQ2, or TQ3 and TQ4, each of which has a high threshold voltage and a small size (a ratio of a channel width to a channel length). Therefore, in the self-refresh mode, a time required for precharging bit lines increases as compared with those in the normal access and twin-cell write modes. In the self-refresh mode, however, an interval in which refresh requests are issued is as long as, for example 16 μs, and there arises no problem even when the bit line precharging time is lengthened. Furthermore, in the present invention, even if a refresh request is received and a precharge operation is completed when bit line precharge is insufficient and a bit line voltage is lower than the intermediate voltage VBL, data is held in the twin-cell mode in the self-refresh mode and therefore, a read-out voltage difference developed on a bit line pair is sufficiently large, thereby enabling a stable sense operation.

Figure 50:
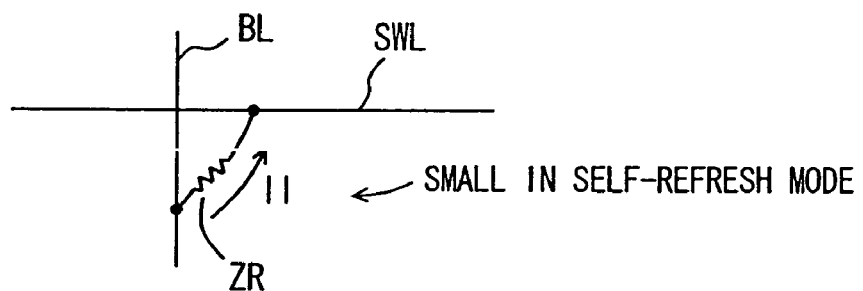
FIG. 50 is a diagram for describing an effect of the configuration shown in FIG. 48.

FIG. 50 is a diagram for describing an advantage of the eighth embodiment of the present invention. As shown in FIG. 50, a state is considered in which micro-short ZR is present between the sub word line SWL and the bit line BL. In the standby state, a leakage current 11 flows from the bit line BL precharged at the intermediate voltage to the sub word line SWL in a non-selected state (at the ground voltage level) through the micro-short ZR. A semiconductor memory device satisfying specifications for a standby current is regarded as a non-defective product even when such micro-short ZR is present. Since the leakage current 11 due to the micro-short ZR is sufficiently small, a selected sub word line SWL is surely driven to a selected state in a sub word line select operation, thus enabling data reading-out normally.

In the self-refresh mode, the bit line precharge instructing signal BLPR is fixed in an inactive state at all times to maintain the bit line precharge circuit BPQ in an inactive state. In other words, the MOS transistors T5 and T6 are set in an inactive state at all times. A precharge operation is performed by the MOS transistors TQ1 to TQ4 each having a small current drive capability. Since the current drive capabilities of the MOS transistors TQ1 to TQ4 are smaller than those of the MOS transistors T5 and T6, the MOS transistors TQ1 to TQ4 serves as a current limiter, and the leakage current I1 flowing through the micro-short ZR can be reduced to restrict increase in consumed current in the self-refresh mode, resulting in reduced current consumption in the data holding mode (sleep mode).

Figure 51:
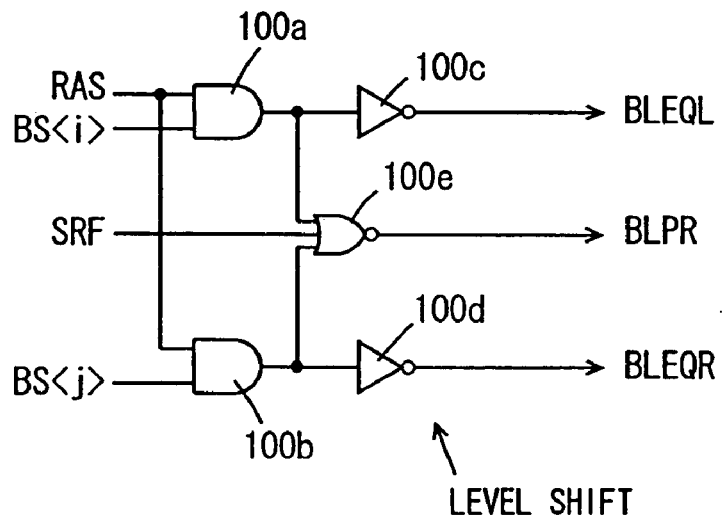
FIG. 51 is a diagram representing a configuration of a part generating a signal controlling equalization and precharge shown in FIG. 48.

FIG. 51 is a diagram representing a configuration of a part for generating a bit line precharge instructing signal and a bit line equalize instructing signal shown in FIG. 48. In FIG. 51, the bit line precharge/equalize control circuit includes: an AND circuit 100a receiving a row select operation activating signal RAS and a block select signal BS <i>; an AND circuit 100b receiving the row select operation activating signal RAS and a block select signal BS <j>; an inverter 100c inverting an output signal of the AND circuit 100a to generate a bit line equalize instructing signal BLEQL; and an inverter 100d inverting an output signal of the AND circuit 100b to generate a bit line equalize instructing signal BLEQR; and a NOR circuit 100e receiving output signals of the AND circuits 100a and 100b, and a self-refresh mode instructing signal SRF to generate a bit line precharge instructing signal BLPR. The inverter circuits 100c and 100d, and the NOR circuit 100e each have a level shifting function of shifting an input signal of the peripheral power supply voltage level into an output signal of a voltage level higher than the high voltage VPP level or the sense power supply voltage VCCS.

The row select operation activating signal RAS is activated when a row select instruction is supplied in the refresh mode or the normal access mode, or when a row active command, an auto-refresh command or a self-refresh request signal is issued. Circuits associated with a row select operation are internally activated in a prescribed sequence in response to activation of the row select operation activating signal RAS. The block select signals BS <i> and BS <j> specify a memory cell array including the bit lines BLL and ZBLL, and a memory cell array including the bit lines BLR and ZBLR, respectively.

According to the configuration shown in FIG. 51, when the block select signal BS <i> is driven into a selected state, the bit line equalize instructing signal BLEQL attains an inactive state to cease an equalize operation on a memory cell array specified by the block select signal BS <i>. When the block select signal BS <j> is driven to a selected state, the bit line equalize instructing signal BLEQR is deactivated to cease a bit line equalize operation on a memory cell array specified by the block select signal BS <j>.

In the normal access operating mode, the self-refresh mode instructing signal SRF is in an inactive state at L level and in the twin-cell write mode in the sleep mode as well, the self-refresh mode instructing signal SRF is in inactive state (see the configuration shown in FIG. 30). Hence, the bit line precharge instructing signal BLPR is activated/deactivated according to output signals of the AND circuits 100a and 100b. When either one of the block select signal BS <i> and BS <j> is driven into a selected state, the bit line precharge instructing signal BLPR from the NOR circuit 100e is deactivated. When the twin-cell write mode is completed in the sleep mode, the self-refresh mode instructing signal SRF is rendered H-level and the bit line precharge instructing signal BLPR is fixed at L level and the bit line precharge circuit BPQ shown in FIG. 48 is kept in an inactive state.

By providing the row-related control circuits as shown in FIG. 51 corresponding to respective memory cell arrays or respective sense amplifier bands, in the self-refresh mode, precharging of bit lines can be performed using MOS transistors with small current drive capabilities. Thus, even when micro-short is present, a leakage current can be reduced, enabling reduction in consumed current in the sleep mode.

Ninth Embodiment

Figure 52:
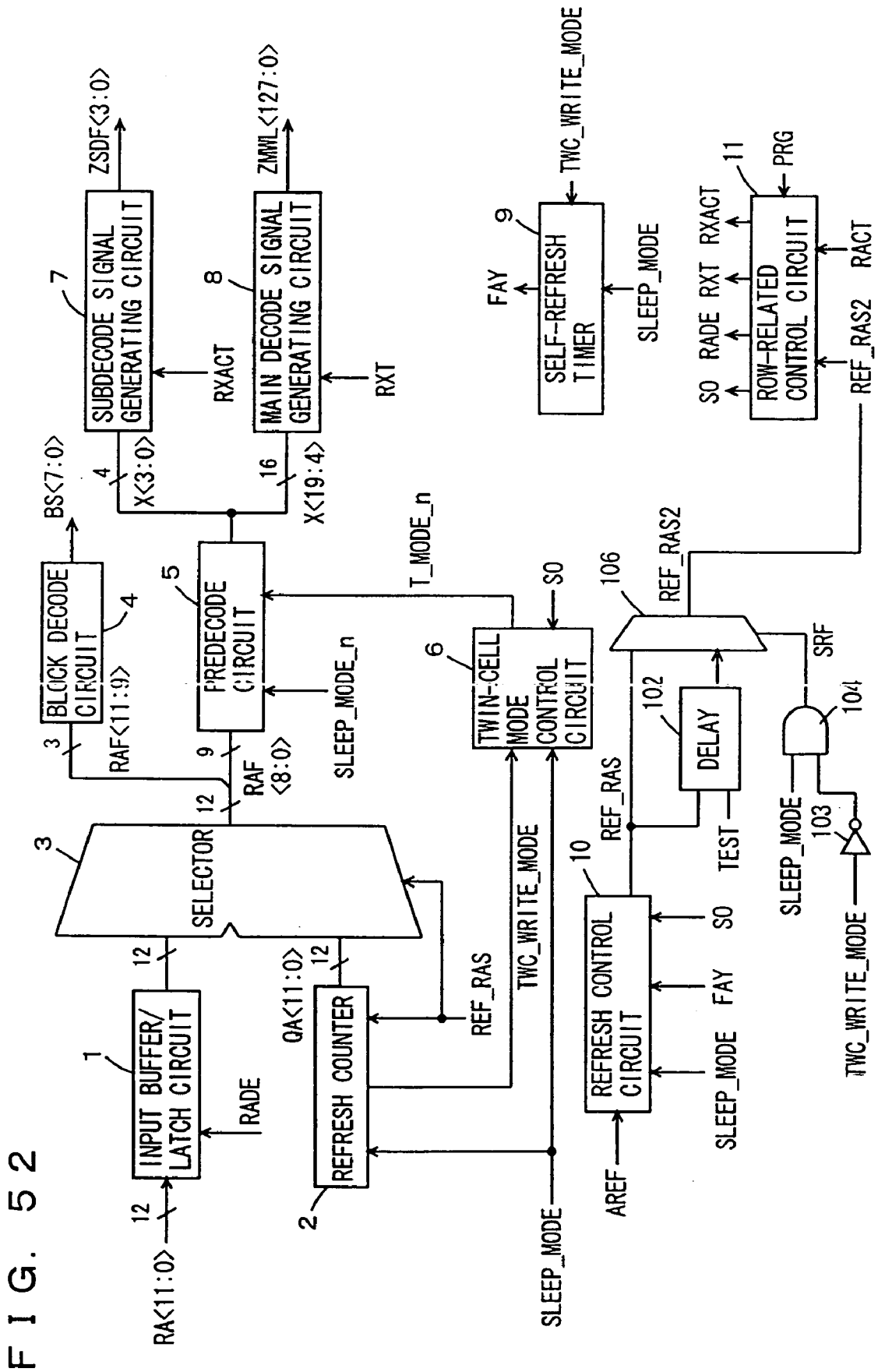
FIG. 52 is a diagram representing a row-related control section of a semiconductor memory device according to a ninth embodiment of the present invention.

FIG. 52 is a diagram schematically showing a configuration of a control circuit for row-related circuitry of a semiconductor memory device according to a ninth embodiment of the present invention. The row-related control circuitry shown in FIG. 52 is different from the row-related control circuitry shown in FIG. 11 in the following points. That is, row-related control circuitry includes: a rise delay circuit 102 for delaying the rise of a refresh activating signal REF_RAS from a refresh control circuit 10 by a prescribed time; an inverter 103 receiving a twin-cell write mode instructing signal TWC_WRITE_MODE; an AND circuit 104 receiving an output signal of the inverter 103 and a sleep mode instructing signal SLEEP_MODE; and a selector 106 for selecting either one of a refresh activating signal REF_RAS from the refresh control circuit 10 and an output signal of the delay circuit 102 according to an output signal of the AND circuit 104 to generate a refresh activating signal REF_RAS2 to a row-related control circuit 11.

The delay circuit 102 delays a rising timing of the refresh activating signal REF_RAS when a test mode instructing signal TEST is activated. The AND circuit 104 outputs a signal of H level when the sleep mode instructing signal SLEEP_MODE is at H level and the twin-cell write mode instructing signal TWC_WRITE_MODE is at L level, that is, in the self-refresh mode. A self-refresh mode instructing signal SRF is outputted from the AND circuit 104. The selector 106 selects the refresh activating signal REF_RAS from the refresh control circuit 10 when the self-refresh mode instructing signal SRF is at L level, while selects an output signal of the delay circuit 102 when the self-refresh mode instructing signal SRF is at H level.

The row-related control circuit 11 generates row-related control signals RADE, RXT, RXACT and SO according to the refresh activating signal REF_RAS2 from the selector 106. The other parts of the configuration are the same as those of the configuration shown in FIG. 11, corresponding components are denoted by the same reference numerals as those of FIG. 11 and descriptions thereof are omitted.

Figure 53:
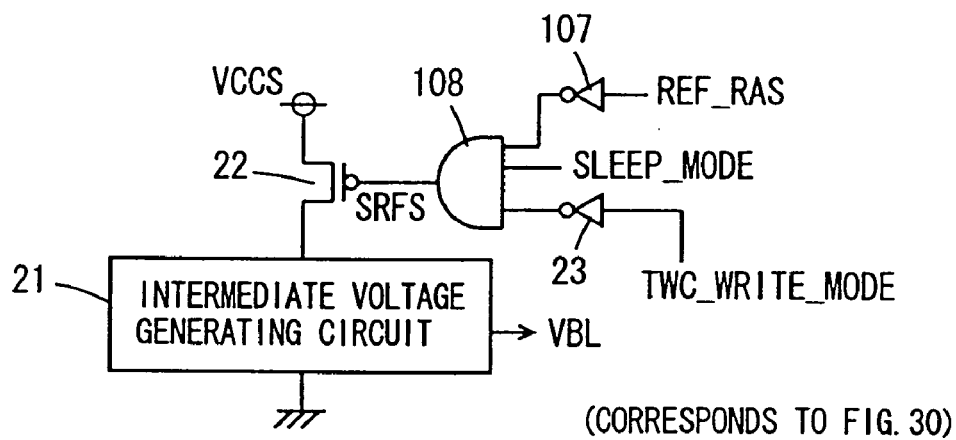
FIG. 53 is a diagram schematically showing a configuration of a main part of the semiconductor memory device according to a ninth embodiment of the present invention.

FIG. 53 is a diagram schematically showing a part for generating the intermediate voltage VBL used for bit line precharge in the ninth embodiment of the present invention. In FIG. 53, an intermediate voltage generating circuit 21 is connected to a power supply node through a P channel MOS transistor 22, similarly to the configuration shown in FIG. 30. The sense power supply voltage (the array power supply voltage) VCCS is supplied to the power supply node. In FIG. 53, in order to control an operation of the MOS transistor 22, there are provided: an inverter 23 receiving a twin-cell write mode instructing signal TWC_WRITE_MODE; an inverter 107 receiving a refresh activating signal REF_RAS from the refresh control circuit 10; and an AND circuit 108 receiving an output signal of the inverters 23 and 107, and a sleep mode instructing signal SLEEP_MODE to generate a self-refresh standby instructing signal SRFS.

The MOS transistor 22 enters a non-conductive state when the self-refresh standby instructing signal SRFS is at H level and the intermediate voltage generating circuit 21 is disconnected from a power supply node thereof. Therefore, in this state, the intermediate voltage generating circuit 21 does not generate intermediate voltage VBL, and the intermediate voltage (the bit line precharge voltage) VBL is in a floating state, similarly to the configuration shown in FIG. 30.

The self-refresh standby instructing signal SRFS is at H level when the sleep mode instructing signal SLEEP_MODE is at H level and the twin-cell write mode instructing signal TWC_WRITE_MODE and the refresh activating signal REF_RAS are both at L level. When a refresh operation is performed, the refresh activating signal REF_RAS is rendered H-level. Responsively, the self-refresh standby instructing signal SRFS is rendered L-level, and the intermediate voltage generating circuit 21 is supplied with the sense power supply voltage VCCS through the MOS transistor 22 in an on state to set the intermediate voltage VBL at a prescribed voltage level. Now, description will be given of the configurations shown in FIGS. 52 and 53 with reference to a signal waveform diagram shown in FIG. 54.

In the normal operating mode in which a data access is made, the sleep mode instructing signal SLEEP_MODE is at L level and the self-refresh mode instructing signal SRF from the AND circuit 104 is responsively at L level. Hence, the selector 106 selects the refresh activating signal REF_RAS from the refresh control circuit 10 to apply the selected signal to the row-related control circuit 11. The row-related control circuit 11 generates row-related control signals according to a row activating signal RACT generated according to a row active command in the normal operating mode in which a data access is made.

On the other hand, when an auto-refresh command is supplied to activate an auto-refresh instructing signal AREF in the normal operating mode, the refresh control circuit 10 sets the refresh activating signal REF_RAS to H level for a prescribed period. In this case as well, the row-related circuit 11 generates row-related control signals according to the refresh activating signal REF_RAS applied through the selector 106.

In the sleep mode, the sleep mode instructing signal SLEEP_MODE is rendered H-level. In the twin-cell data writing performed during an initial period of the sleep mode, the twin-cell write mode instructing signal TWC_WRITE_MODE is at H level. Responsively, the self-refresh instructing signal SRF from the AND circuit 104 is set at L level and the selector 106 selects the refresh activating signal REF_RAS from the refresh control circuit 10 to apply the selected signal to the row-related control circuit 11. Therefore, in the twin-cell write mode, the row-related control circuit 11 generates row-related control signals according to the refresh activating signal REF_RAS. In the normal data access mode, the auto-refresh operation and the twin-cell write mode, an output signal of the AND circuit 108 is at L level, and the MOS transistor 22 in an on state. Thus, the intermediate voltage generating circuit 21 receives the sense power supply voltage VCCS from a power supply node as one operation power supply voltage to generate the intermediate voltage VBL.

Figure 54:
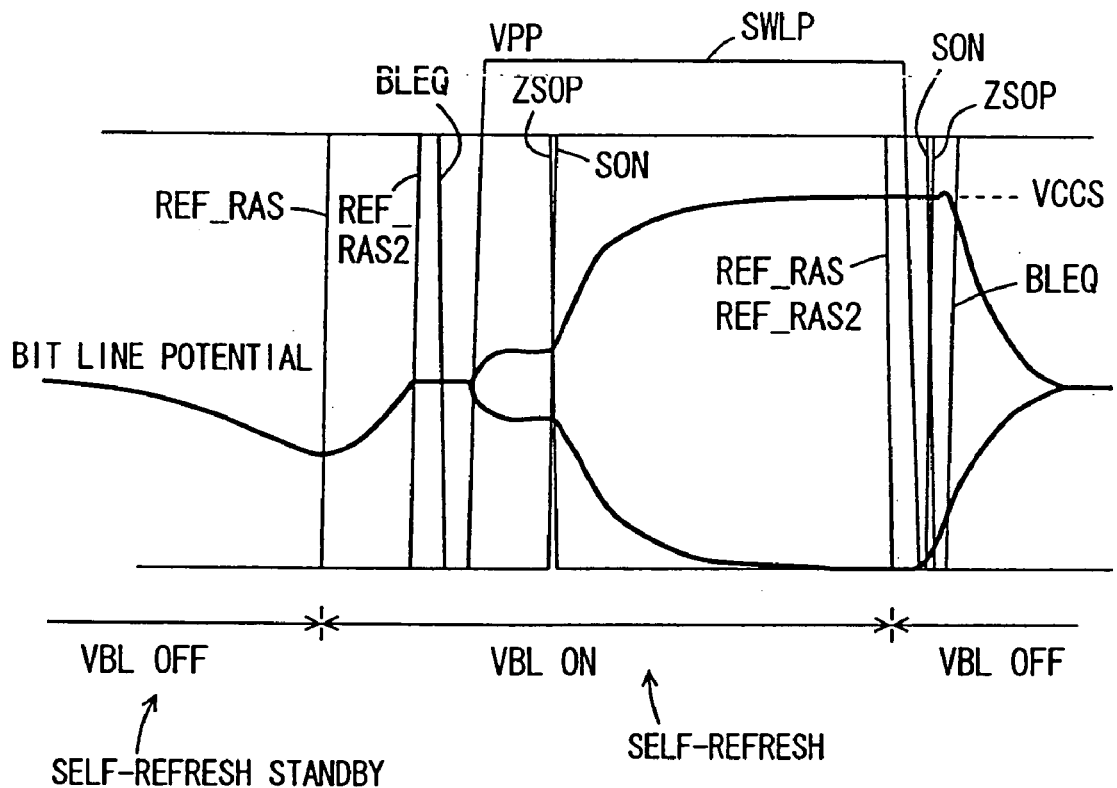
FIG. 54 is a diagram of signal waveforms representing operation of the semiconductor memory device according to a ninth embodiment of the present invention.

On the other hand, when the twin-cell write mode is completed in the sleep mode, the self-refresh mode is entered. In the self-refresh mode, the self-refresh mode instructing signal SRF from the AND circuit 104 is rendered H-level, and the selector 106 selects an output signal of the delay circuit 102 to apply the selected signal to the row-related control circuit 11. In a standby state in the self-refresh mode, the self-refresh standby instructing signal SRFS from the AND circuit 108 shown in FIG. 53 is rendered H-level, the MOS transistor 22 enters an off state and the intermediate voltage generating circuit 21 is disconnected from a power supply node. Hence, in this state, the intermediate voltage generating circuit 21 ceases an operation of generating the intermediate voltage and therefore, the intermediate voltage VBL is kept in a floating state, and the bit line potential gradually falls as shown in FIG. 54.

The self-refresh timer 9 issues refresh request signals FAY at prescribed intervals after the twin-cell write mode is completed. When a refresh request signal FAY is issued, the refresh control circuit 10 generates a refresh activating signal REF_RAS. When the refresh activating signal REF_RAS is rendered H-level, the refresh standby instructing signal SRFS from the AND circuit 108 is rendered L-level, the intermediate voltage generating circuit 21 is coupled with the power supply node to raise a voltage level of the intermediate voltage VBL.

Subsequently, the refresh activating signal REF_RAS2 from the selector 106 is rendered H-level and the row-related control circuit 11 activates the row-related control signals in a prescribed sequence. In FIG. 54, the bit line equalize instructing signal BLEQ first falls to L level in response to activation of the refresh activating signal REF_RAS2 and subsequently, a voltage level on a selected sub word line pair SWLP rises to the high voltage VPP. Then, the sense amplifier activating signal ZSOP falls to L level, while the sense amplifier activating signal SON rises to H level. Responsively, a sense operation on a selected memory cell is performed and the voltage levels of the bit lines are driven to the sense power supply voltage VCCS level and the ground voltage level in accordance with read out storage data. When a prescribed time period elapses, the refresh control circuit 10 deactivates the refresh activating signal REF_RAS. When a refresh cycle is completed, the selected sub word line pair SWLP enters an inactive state at L level, and the sense amplifier activating signals SON and ZSP are driven to L level and H level, respectively. Then, the bit line equalize instructing signal BLEQ is again driven to an active state at H level.

Hence, in the self-refresh operation, after performing a refresh operation with the refresh activating signal REF_RAS2, the intermediate voltage generating circuit 21 generates the intermediate voltage VBL to set the voltages on bit lines are set to a voltage level of the intermediate voltage level (=VCCS/2) through the bit line precharge/equalize circuit BLEQ, a row select operation can be performed, ensuring a correct sense operation.

In a case where micro-short ZR is present between the sub word line SWL and the bit line BL (or ZBL) as shown in FIG. 50, a leakage current flows from the bit line in a precharge state to the sub word line SWL in a non-selected state. The leakage current is supplied from the intermediate voltage generating circuit 21. Accordingly, in the self-refresh standby cycle, by ceasing supply of a power supply voltage to the intermediate voltage generating circuit 21, the leakage current can be restricted and a consumed current in the self-refresh mode can be reduced. Especially, when such micro-short occurs in many places, a consumed direct current (DC) in the self-refresh mode increases. However, increase in consumed current in the self-refresh mode in sleep mode can be suppressed by ceasing supply of power supply voltage to the intermediate voltage generating circuit 21.

Note that even when the refresh activating signal REF_RAS2 is utilized, a period in which a refresh operation is performed is not varied. More specifically, the refresh control circuit 10 drives the refresh activating signal REF_RAS to an inactive state a prescribed period after, when the sense amplifier activating signal SO is activated.

The row-related control circuit 11 activates the sense amplifier activating signal at a prescribed timing according to activation of the refresh activating signal REF_RAS2 and therefore, when the rise-delayed refresh activating signal REF_RAS2 is used as well, a refresh cycle period is the same. An activating period of the refresh activating signal REF_RAS is simply a little longer than in the twin-cell write mode and the normal operating mode.

Figure 55:
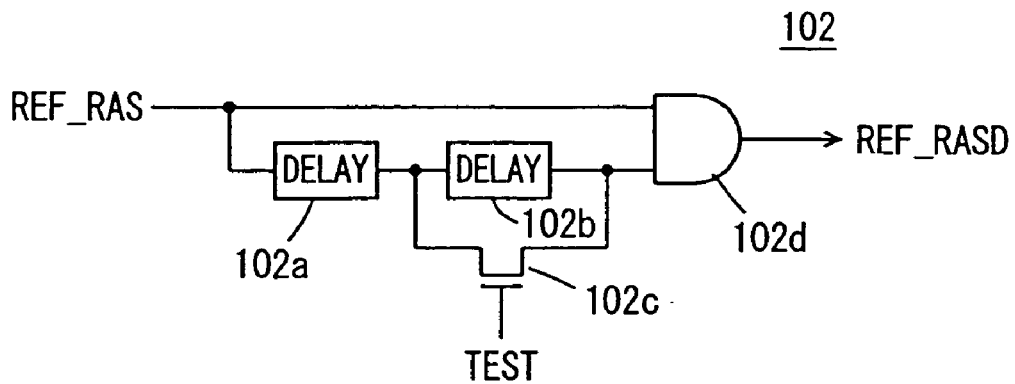
FIG. 55 is a diagram representing a configuration of a delay circuit shown in FIG. 52.
Figure 56:
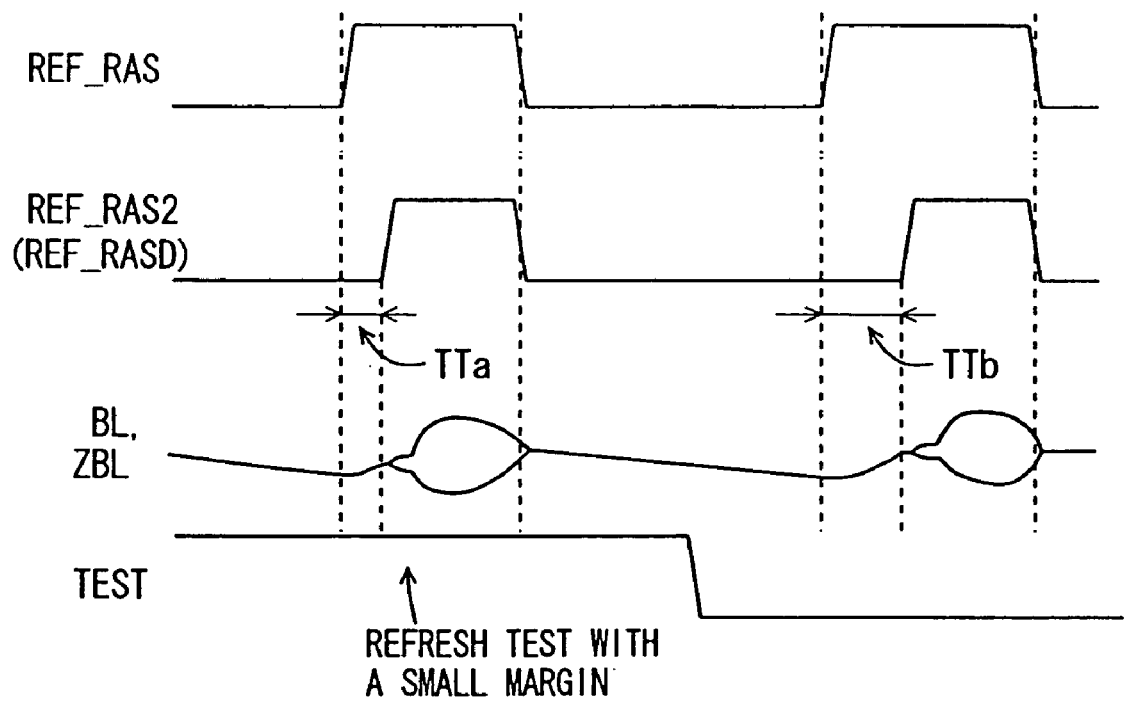
FIG. 56 is a diagram of signal waveforms representing operation of the circuit shown in FIG. 55.

FIG. 55 is a diagram representing a configuration of the delay circuit 102 shown in FIG. 52. In FIG. 55, the rise delay circuit 102 includes: delay circuits 102a and 102b each delaying a refresh activating signal REF_RAS by a prescribed time; a transfer gate 102c rendered conductive when the test mode instructing signal TEST is activated to electrically short or bypass the delay circuit 102b; and an AND circuit 102d receiving an output signal of the transfer gate 102c or the delay circuit 102b and the refresh activating signal REF_RAS. A delayed refresh activating signal REF_RASD is generated from the AND circuit 102d and supplied to the selector 106 shown in FIG. 52. Now, description will be briefly given of operation of the delay circuits shown in FIG. 55 with reference to a signal waveform diagram shown in FIG. 56.

When the test mode instructing signal TEST is at H level, the transfer gate 102c is in an on state and the delay circuit 102d is bypassed. When the refresh activating signal RES_RAS is activated, signals to both inputs of the AND circuit 102d are rendered H-level after a delay time TTa that the delay circuit 102a has elapses, and the delayed activating signal REF_RASD from the AND circuit 102d is rendered H-level. In the self-refresh mode, the delayed refresh activating signal REF RASD is selected to generate the refresh activating signal REF_RAS2. Hence, the refresh activating signal REF_RAS2 is activated according to activation of the delayed refresh activating signal REF_RASD.

In this case, a time period from when the intermediate voltage generating circuit 21 shown in FIG. 53 generates the intermediate voltage till a row select operation is performed is the time Tta, and a precharge time for the bit lines BL and ZBL is the time TTa. In this state, a refresh operation is performed. Refresh is performed under a state in which a precharge time for a bit line is short, and it is determined whether or not memory cell data are correctly refreshed. More specifically, when a bit line precharge is insufficient and a bit line precharge voltage level is lower than the intermediate voltage level, there is a possibility that a read-out margin decreases and accordingly correct sense operation may not be performed even in the twin-cell mode. In the test at a wafer level, a precharge time is reduced by a test mode instructing signal TEST and it is determined whether or not refresh is correctly performed. When refresh is performed correctly in this test, then the test mode instructing signal TEST is set to L level after completion of the test. A rise delay time in the delay circuit 102 when the correct sense operation is achieved is a delay time TTb that the delay circuits 102a and 102b have. Thus, a precharge time for the bit line is set longer than in the test operation, allowing reliable guarantee of refresh characteristics of the semiconductor memory device.

By reducing a delay time in the delay circuit 102 and performing a refresh test, a bit line precharge voltage defect, for example, due to micro-short between a sub word line and a bit line, can be screened out.

Note that the delay circuit 102 may be set to have plural, different delay times for testing in the test mode. Furthermore, the delay time of the delay circuit 102 may be set by fuse programming, for example, according to a test result. More specifically, a delay time of the delay circuit 102 may be made trimmable. When the self-refresh mode is completed, the intermediate voltage generating circuit 21 is activated and thereafter the normal operating mode is returned, performing data rearrangement.

As described above, according to the ninth embodiment of the present invention, in the self-refresh standby mode, the supply of power supply voltage to a circuit for generating a bit line precharge voltage is at a rest state, whereby a consumed current in the self-refresh mode can be reduced. Especially, a leakage current due to micro short or the like can be suppressed and thus a reduced consumed current can be achieved. Furthermore, in the self-refresh mode, after precharge of a bit line is performed, a row select operation is started. That is, the intermediate voltage generating circuit generates the intermediate voltage and a row select operation is performed after completion of bit line precharge and therefore, a bit line voltage can be prevented from lowering to ensure a correct sense operation. Besides, by performing a self-refresh test with a short bit line precharge time controlled by a test signal, a bit line potential decrease defect caused by micro short-circuit can be screened out, achieving a highly reliable semiconductor memory device.

Tenth Embodiment

Figure 57:
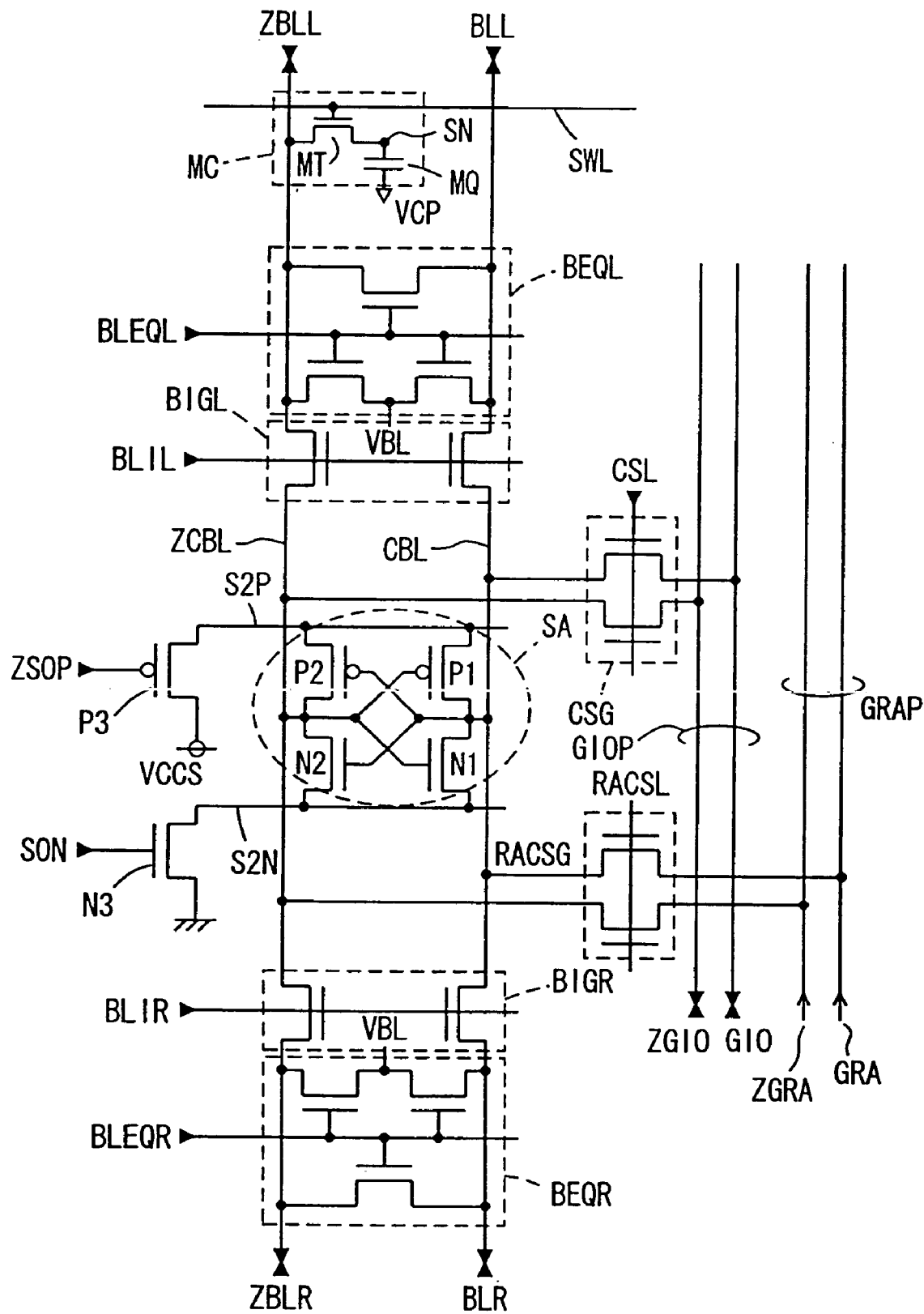
FIG. 57 is a diagram representing an array section of a semiconductor memory device according to a tenth embodiment of the present invention.

FIG. 57 is a diagram representing a configuration of a main part of a semiconductor memory device according to a tenth embodiment of the present invention. In FIG. 57, shown is the configuration of a part associated with one sense amplifier SA.

In FIG. 57, the sense amplifier SA is coupled with common bit lines CBL and ZCBL. The sense amplifier SA includes: a pair of cross-coupled P channel MOS transistors P1 and P2; and a pair of cross-coupled N channel MOS transistors N1 and N2. To the sense amplifier SA, there are provided: a sense amplifier drive transistor (a P channel MOS transistor) P3 transmitting the array power supply voltage VCCS onto the sense common power supply line S2P in response to a sense amplifier activating signal ZSOP; and a sense amplifier drive transistor (an N channel MOS transistor) N3 transmitting the ground voltage onto the sense common ground line S2N in response to activation of a sense amplifier activating signal SON.

Common bit lines CBL and ZCBL are connected to bit lines BILL and ZBLL through a bit line isolation gate BIGL and connected to bit lines BLR and ZBLR through a bit line isolation gate BIGR. The bit lines BLL and ZBLL, and the bit lines BLR and ZBLR are arranged in different memory cell blocks. The bit line isolation gate BIGL is rendered conductive/non-conductive in response to a bit line isolation instructing signal BLIL and the bit line isolation gate BIGR is rendered conductive/non-conductive in response to a bit line isolation instructing signal BLIR.

The bit line precharge/equalize circuit BEQL is provided to the bit lines BLL and ZBLL, while the bit line precharge/equalize circuit BEQR is provided to the bit lines BLR and ZBLR. The bit line precharge/equalize circuit BEQL is activated, in response to the bit line equalize instructing signal BLEQL, to supply the intermediate voltage VBL onto the bit lines BLL and ZBLL, and to equalize voltage levels on the bit lines BLL and ZBLL to the intermediate voltage VBL level. The bit line precharge/equalize circuit BEQR precharges and equalizes the bit lines BLR and ZBLR to the intermediate voltage VBL level in response to the bit line equalize instructing signal BLEQR.

A column select gate CSG and an rearrangement column select gate RACSG are coupled with the common bit lines CBL and ZCBL. The column select gate CSG is made conductive, in response to a column select signal CSL, to connect the common bit lines CBL and ZCBL to global data lines GIO and ZGIO. The rearrangement column select gate RACSG is made conductive, in response to a rearrangement column select signal RACSL, to couple the common bit lines CBL and ZCBL with rearrangement data lines GRA and ZGRA. The global data line pair GIOP and a rearrangement data line pair GRAP are placed commonly to memory cell blocks (memory cell sub arrays) included in a memory cell array (memory mat).

By utilizing the two column select gates CSG and RACSG, in transition to the sleep mode, memory cell data connected to one row (word line) are transferred into a data holding region. In transition to the sleep mode, by internally saving all data required to be held into the data holding region prior to the twin-cell write mode, there is no need to read out the data externally, and data rearrangement in the twin-cell mode is performed at high speed.

Figure 58:
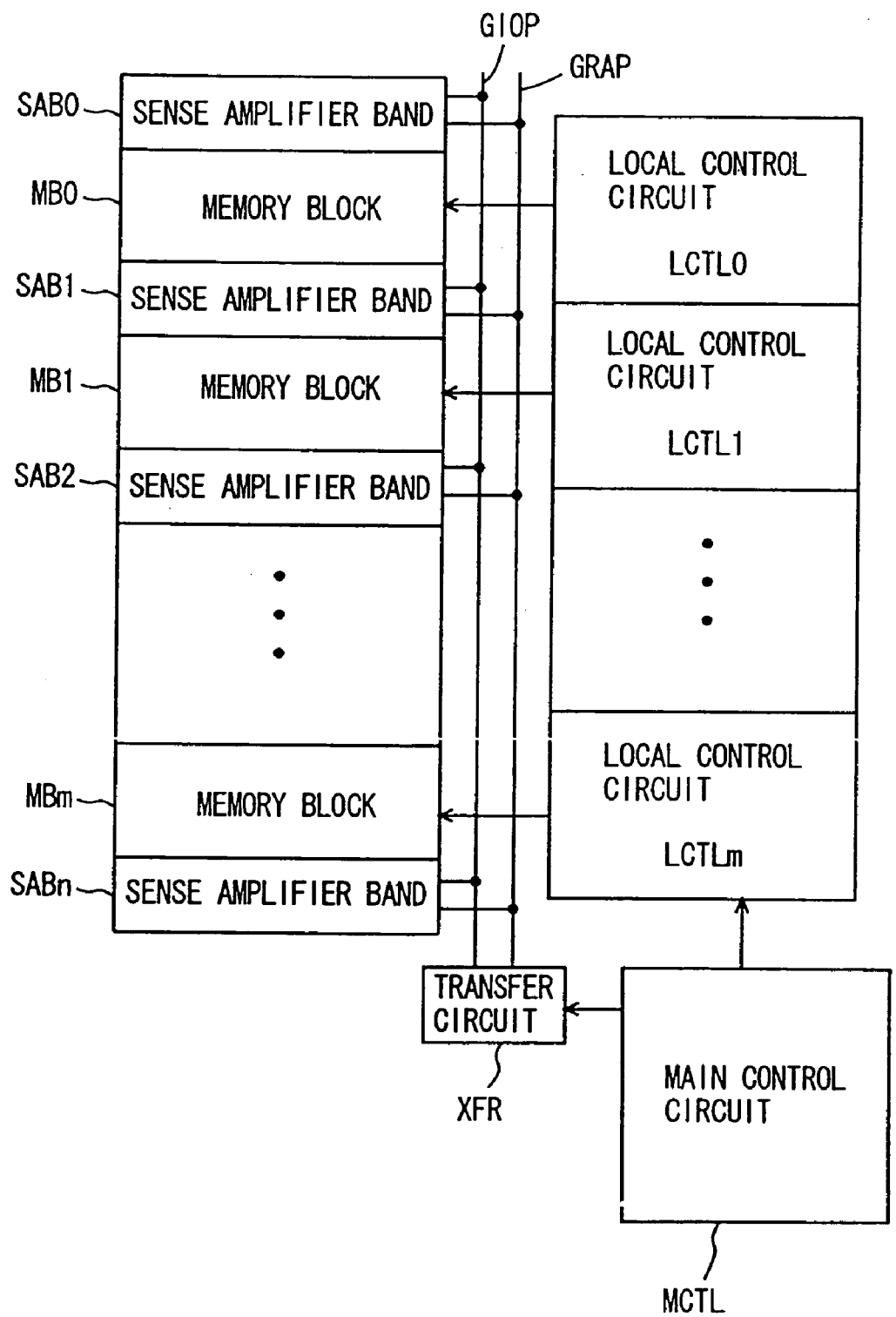
FIG. 58 is a diagram schematically showing a configuration of all of the semiconductor memory device according to a tenth embodiment of the present invention.

FIG. 58 is a diagram schematically showing a configuration of a whole of the semiconductor memory device according to a tenth embodiment of the present invention. In FIG. 58, a memory cell array is divided into a plurality of memory blocks MB0 to MBm. Sense amplifier bands SAB0 to SABn are placed between and outside the memory blocks MB0 to MBm. In the sense amplifier bands SAB0 to SABn, a sense amplifier SA shown in FIG. 57 is provided corresponding to the bit line pairs of corresponding memory blocks.

The global data line pair GIOP and the rearrangement data line pair GRAP are provided so as to be shared by the memory blocks MB0 to MBm. The global data line pair GIOP and the rearrangement line pair GRAP are coupled with a transfer circuit XFR.

Local control circuits LCTL0 to LCTLm are provided to the respective memory blocks MB0 to MBm. The local control circuits LCTL0 to LCTLm control row/column select operations on corresponding memory blocks according to row/column related control signals from a main control circuit MCTL. Furthermore, row decoders are provided corresponding to the respective memory blocks MB0 to MBm and column decoders are provided corresponding to the respective sense amplifier bands SAB0 to SABn, which are not shown in the figure for the sake of simplification.

As shown in FIG. 58, word lines are each driven into a selected state in two memory blocks of the memory blocks MB0 to MBm and memory cell data are latched by a corresponding sense amplifier band. Then, data on a memory cells on one word line (sense amplifiers) are read out onto the global data line pair GIOP and then, the read-out data is transferred onto the rearrangement line pair GRAP through the transfer circuit XFR. Subsequently, the data is transmitted onto a memory cell on a selected word line in the other memory block through the rearrangement data line pair GRAP. Therefore, in the data rearrangement, data is transferred internally to perform data rearrangement under control of the local control circuits LCTL0 to LCTLm and the main control circuit MCTL.

Note that each of the memory blocks MB0 to MBm is further divided into a plurality of memory cell sub arrays, and in the memory blocks MB0 to MBm, main word lines and sub word lines are provided. As for a memory block, word lines (sub word lines) with even-numbered row addresses are selected in a memory block in a data holding region.

Figure 59:
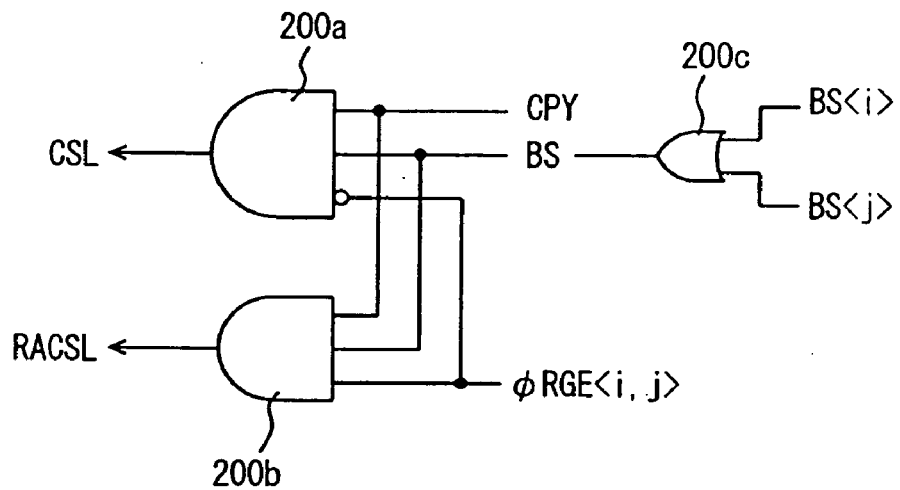
FIG. 59 is a diagram schematically showing a column decoder included in a local control circuit shown in FIG. 58.

FIG. 59 is a diagram schematically showing a column decoder provided corresponding to one sense amplifier band. In FIG. 59, an OR circuit 200c receiving block select signals BS <i> and BS <j> is provided for controlling a column decode operation.

The column decoder includes: a column decoder 200a receiving a column predecode signal CPY, a block select signal BS from the OR circuit 200c and a data rearrangement write instructing signal φRGE <i, j> to generate a column select signal CSL; and a column decoder 200b receiving the column predecode signal CPY, the block select signal BS and the data rearrangement write instructing signal φRGE <i, j> to generate a rearrangement column select signal RACSL. The column decoder 200a is activated to decode the column predecode signal CPY to generate the column select signal CSL when the block select signal BS is in a selected state and the data rearrangement write instructing signal φRGE <i, j> is in an inactive state. The column decoder 200b decodes the column predecode signal CPY to generate the rearrangement column select signal RACSL when the block select signal BS and the data rearrangement write instructing signal φRGE <i, j> are both in an active state. Here, the data rearrangement write instructing signal φRGE <i, j> is activated when a memory cell block MBi or MBj is used as a data holding region.

The data rearrangement write instructing signal φRGE (=φRGE <i, j>) is activated preferably with one memory block being a unit for a memory block or memory blocks in the data holding region in the data rearrangement operating mode, since data transfer may be performed between memory blocks in the data holding region. In the normal operating mode, the column decoder 200a is activated to generate a column select signal CSL. At this time, the column decoder 200b is in an inactive state and performs no decode operation, and the rearrangement column select signal RACSL stays in an inactive state.

In the data rearrangement operating mode, as for a memory block receiving data in the data holding region, the column decoder 200a stays in an inactive state, while the column decoder 200b is activated. The activation/inactivation of the column decoder is performed according to a block select signal BS (activated by a block address when a row active command is supplied).

One global data line pair GIOP and one rearrangement data line pair GRAP are provided corresponding to a set of the bit line pairs on 16 columns, as an example. Hence, the column decoders 200a and 200b perform a 1/16 decode operation. That is, transfer of data of memory cells on one row is completed in 16 time data transfers.

Figure 60:
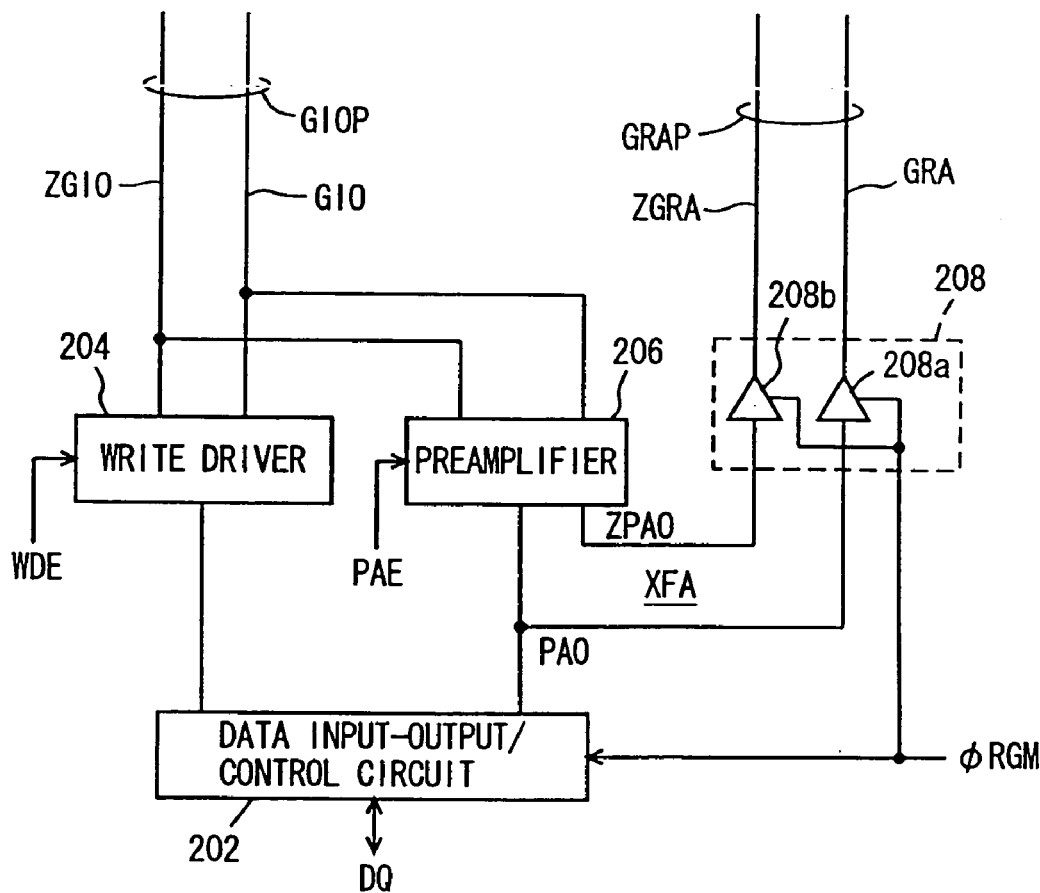
FIG. 60 is a diagram schematically showing a configuration of a transfer circuit shown in FIG. 58.

FIG. 60 is a diagram schematically showing a configuration of the transfer circuit XFR shown in FIG. 58. In FIG. 60, a write driver 204 and a preamplifier 206 are provided corresponding to the global data line pair GIOP. The write driver 204 is activated in response to a write driver enable signal WDE in data writing and generates complementary data according to internal write data supplied from a data input-output/control circuit 202, and transmits the complementary data onto the global data lines GIO and ZGIO.

The preamplifier 206 is activated in response to activation of a preamplifier activating signal PAE and generates complementary data PAO and ZPAO from the complementary data on the global data lines GIO and ZGIO. The internal read-out data PAO from the preamplifier 206 is supplied to the data input-output/control circuit 202.

The output data PAO and ZPAO of the preamplifier 206 are transferred onto the rearrangement data line pair GRAP by the transfer buffer 208 activated in response to the rearrange mode instructing signal φRGM. The transfer buffer 208 includes tristate buffer circuits 208a and 208b provided corresponding to respective rearrangement data lines GRA and ZGRA. In the data rearranging operation, the transfer buffer 208 is activated and the complementary data from the preamplifier 206 are transferred onto the rearrangement data line pair GRAP.

The data input-output/control circuit 202 includes a data input/output circuit, and an input/output control circuit. The data input-output/control circuit 202 is prohibited of data input/output operation according to the rearrangement mode instructing signal φRGM in the data rearrangement operation upon transition to the sleep mode. Therefore, the preamplifier 206 is utilized only for transferring data internally from the global data line pair GIOP to the rearrangement line pair GRAP.

Figure 61:
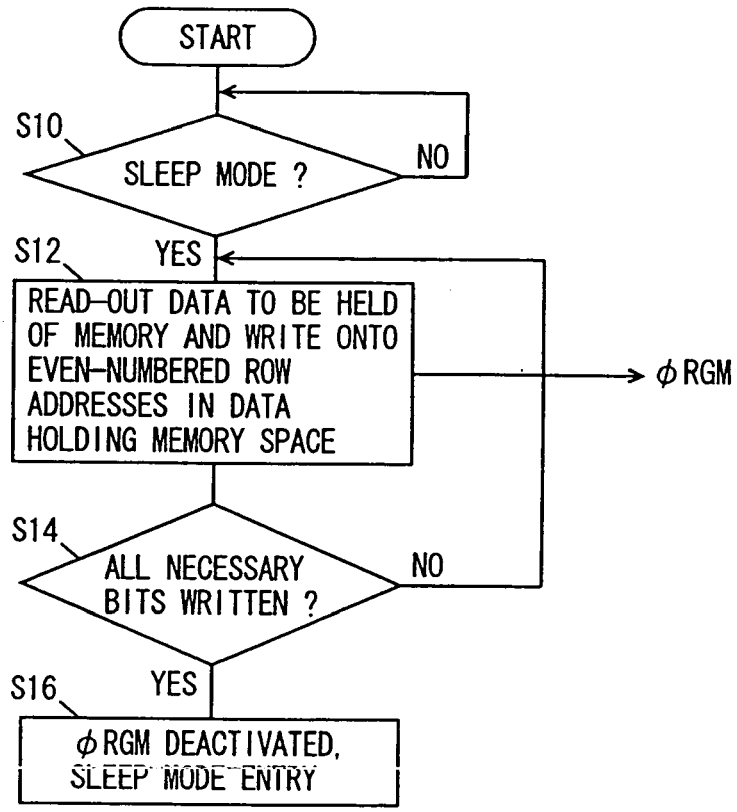
FIG. 61 is a flow chart representing a data transfer operation in the tenth embodiment of the present invention.

FIG. 61 is a flow chart representing operation of a memory controller when data rearrangement is performed in transition to the sleep mode in the tenth embodiment of the present invention. Description will be briefly given of operation of the memory controller in the transition to the sleep mode below with reference to FIG. 61.

The memory controller determines whether or not the sleep mode has to be set in a state where interruption of processing lasts for more than a prescribed period (step S10). If it is determined that the sleep mode should be entered, the memory controller first activates the rearrangement mode instructing signal φRGM to activate the transfer buffer 208 shown in FIG. 60.

Then, the memory controller supplies a row active command to select a row of memory cells storing data to be held, in order to internally read out data to be held.

Then, the memory controller drives a row with an even-numbered row address in the data holding region to a selected state. That is, word lines in two memory blocks are held in a selected state in parallel.

Under this state, the memory controller supplies a read command instructing data reading and a column address simultaneously. Inside the semiconductor memory device, column selection is performed in the two memory blocks according to the read command as well as the same column address. In one memory block, the column decoder 200a shown in FIG. 59 is activated, while in another memory block of the data holding region, the column decoder 200b is activated. Here, the data rearrangement write instructing signal φRGE is activated for the data holding region with one memory block being a unit, for example, inside the semiconductor memory device when a read command is supplied while the rearrangement mode instructing signal φRGM is active (the configuration will be described later). The preamplifier activating signal PAE is activated according to the read command and memory cell data read out on the global data line pair GIOP is transmitted onto the rearrangement data line pair GRAP through the preamplifier 206 and the transfer buffer 208 shown in FIG. 60.

The rearrangement data line pair GRAP is coupled to a selected column in the memory block of the data holding region, and data transferring is performed on the selected column. This operation is repeatedly performed according to a page mode till all the data of memory cells on one row are transferred. Since one global data line pair GIOP is provided for the bit lines on 16 columns for example, by performing this data transfer operation 16 times, transfer of all the data of memory cells on one row is completed. A series of these operations are performed on data required to be held (step S12).

After the series of operations are repeated, the memory controller monitors whether or not all necessary bits (data) are transferred by monitoring addresses in the storage region of data required to be held, by monitoring, for example, the number of times of data transfer (step S14). When all the data to be held are transferred, the memory controller enters the sleep mode. Inside the memory device, a rewrite operation is performed in the twin-cell write mode and data of the data holding region stored in the one bit/one cell mode are stored in the one bit/two cell mode.

Figure 62:
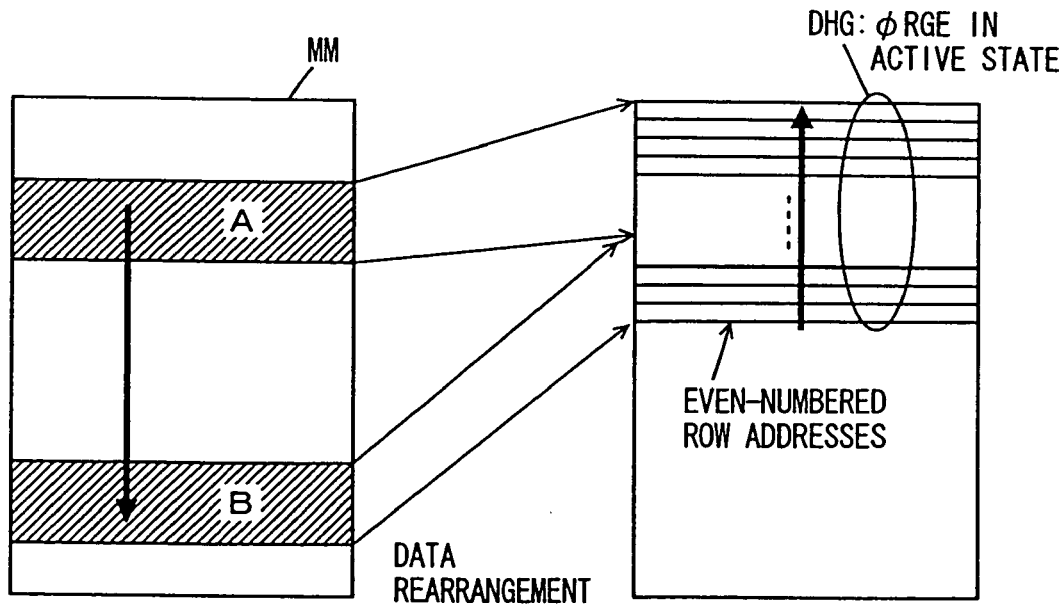
FIG. 62 is a diagram representing the data transfer operation in the tenth embodiment of the present invention.

FIG. 62 is a diagram representing a data transfer operation in the semiconductor memory device in a simplified manner. In FIG. 62, data stored in regions A and B of a memory cell array (memory mat) MM are those required to be held. The data stored in the regions A and B are transferred onto even-numbered row addresses in a data holding region DHG according to the above described transfer operation. In the data holding region DHG, the data rearrangement write instructing signal φRGE is in an active state. Hence, in the data rearrangement mode, data transfer could not be performed within the same memory block or between memory blocks sharing the same sense amplifier band. This is because a column decoder has its activation/deactivation controlled according to the data rearrangement write instructing signal φRGE and the block select signal BS.

Figure 63:
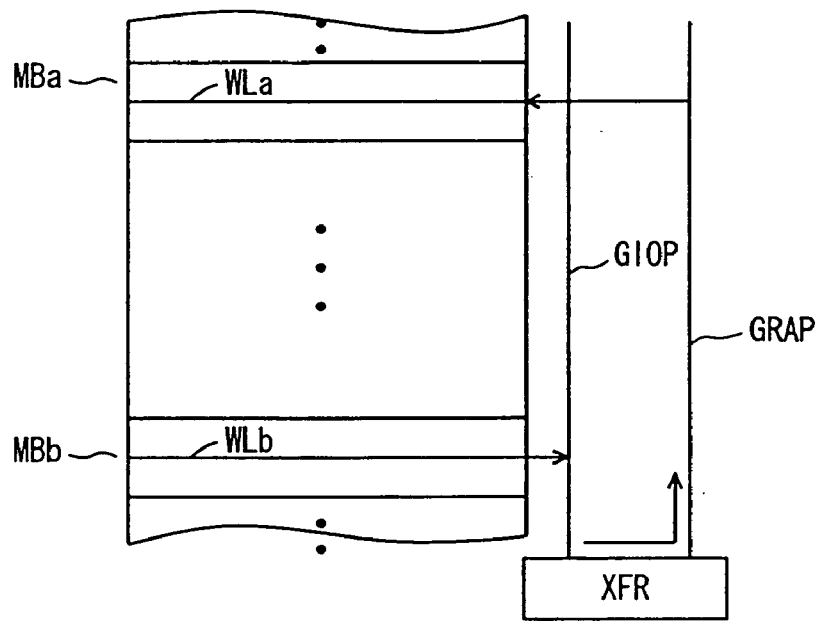
FIG. 63 is a diagram for describing a data transfer operation in the tenth embodiment of the present invention.

FIG. 63 is a diagram representing the data rearranging operation in a simplified manner. A case is now considered in which data required to be held are stored in a memory block MBb and a memory block MBa is a data holding region, as shown in FIG. 63. In the memory block MBb, a word line WLb is driven into a selected state. Subsequently, in the memory block MBa, a word line WLa is driven into a selected state. A read command is supplied and data of memory cells on the word line WLb is read out onto the global data line pair GIOP and transferred onto the rearrangement data line pair GRAP through the transfer circuit XFR. The data on the rearrangement data line pair GRAP are transferred onto memory cells connected to the word line WLa in the memory block MBa. In the memory blocks MBa and MBb, the word lines WLa and WLb are both held in a selected state and a memory cell data is held in a sense amplifier. Thus, by one time application of read command, data of a prescribed number of bits can be transferred from the word line WLb to the word line WLa.

Figure 64:
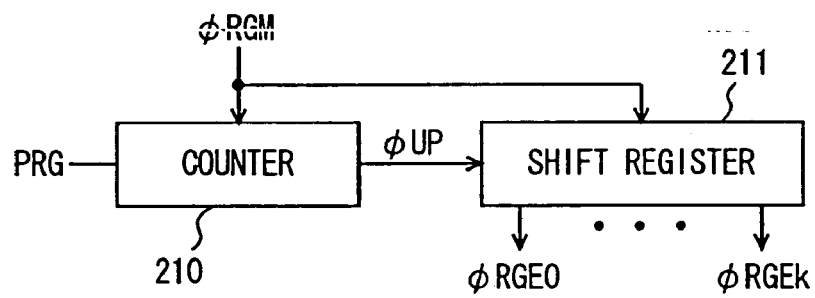
FIG. 64 is a diagram representing a configuration of a data rearrangement write instructing signal generating section.

FIG. 64 is a diagram representing a configuration of a section for generating the data rearrangement write instructing signal φRGE. In FIG. 64, the data rearrangement write instructing signal generating section includes: a counter 210 activated, in response to activation of the rearrangement mode instructing signal φRGM, to count precharge commands PRG; and a shift register 211 performing a shifting operation according to a count-up instructing signal φUP from the counter 210 and driving one of data rearrangement write instructing signals φRGE0 to φRGEk for a memory block in a data holding region DHG into an active state. Note that when the data holding region DHG is programmed (mapped) in another memory space, the shift register 211 is switched over so as to drive data rearrangement write instructing signals φRGEi to φRGEj for a memory cell block in a new data holding region DHG. This is achieved by a following configuration: the shift register 211 is configured to generate data rearrangement write instruction signals for all memory blocks, and a shift region of the shift register 211 is so adjusted according to a data holding region as to sequentially activate the data rearrangement write instructing signals for memory blocks corresponding to the data holding region.

The shift register 211 is reset into an initial state in response to activation of the rearrangement mode instructing signal φRGM and drives a data rearrangement write instructing signal φRGE0, for example, into an active state. The shift register 211 is activated to perform a shit operation while the rearrangement mode instructing signal φRGM is active. When the rearrangement mode instructing signal φRGM turns into an inactive state, the shift register 211 is deactivated to drive all the data rearrangement write instructing signals φRGE0 to φRGEk to L level of an inactive state. Data rearrangement write instructing signals for the other memory blocks are all set in an inactive state regardless of a state of the rearrangement mode instructing signal φRGM.

Figure 65:
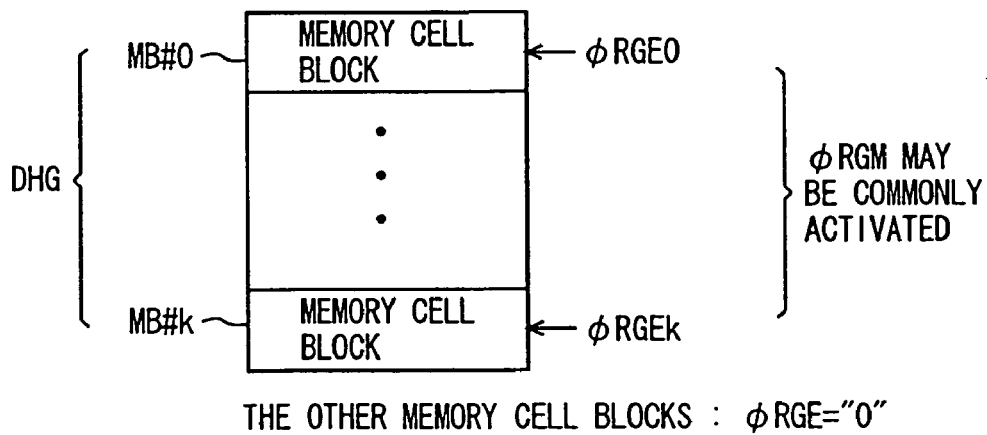
FIG. 65 is a diagram representing a correspondence between a data rearrangement write instructing signal shown in FIG. 64 and a corresponding memory cell block.

FIG. 65 is a diagram representing a correspondence between a data rearrangement write instructing signal and a memory block. As shown in FIG. 65, a data holding region DHG includes memory blocks MB#0 to MB#k. Data rearrangement write instructing signals φRGE0 to φRGEk are generated for the respective memory blocks MB#0 to MB#k. Rearrangement mode instructing signals φRGE for the other memory blocks are all held in an inactive state.

Since a sense amplifier band is shared by adjacent memory blocks, data rearrangement write instructing signals for the memory blocks sharing the same sense amplifier band are supplied to the rearrangement column decoder 200b as data rearrangement write instructing signals φRGE. In this case, an external memory controller applies a block select signal specifying a memory block of the memory blocks MB#0 to MB#k in row selection along a shifting direction of a shift operation performed by the shift register 211. A data holding region is needed to be fixedly set in advance by the memory controller. For example, when the shift register 211 drives the data rearrangement write instructing signals φRGE0 to φRGEk sequentially into an active state, the external memory controller generates block addresses specifying the memory blocks MB#0 to MB#k sequentially as row block addresses for the memory blocks of data rearrangement destinations.

The counter 210 shown in FIG. 64 activates the count-up instructing signal φUP when the number of precharge commands PRG reaches a value of ½ times the number of word lines in one memory block. This is because in a data holding region, data are written into even-numbered row addresses of a memory block, but not into odd-numbered row addresses, while in a region in which data to be held are stored, data are read out from both of even- and odd-numbered row addresses.

Note that in the configuration shown in FIG. 64, a row active command RACT may be supplied to the counter 210. In this case, when a count value of the counter 210 becomes equal to the number of word lines included in one memory block, the counter 210 activates the count-up signal φUP. This is because in one transfer cycle (in data transfer with a row being a unit), the row active command RACT is activated twice.

Modification of Data Rearrangement Instructing Signal Generating Section

Figure 66:
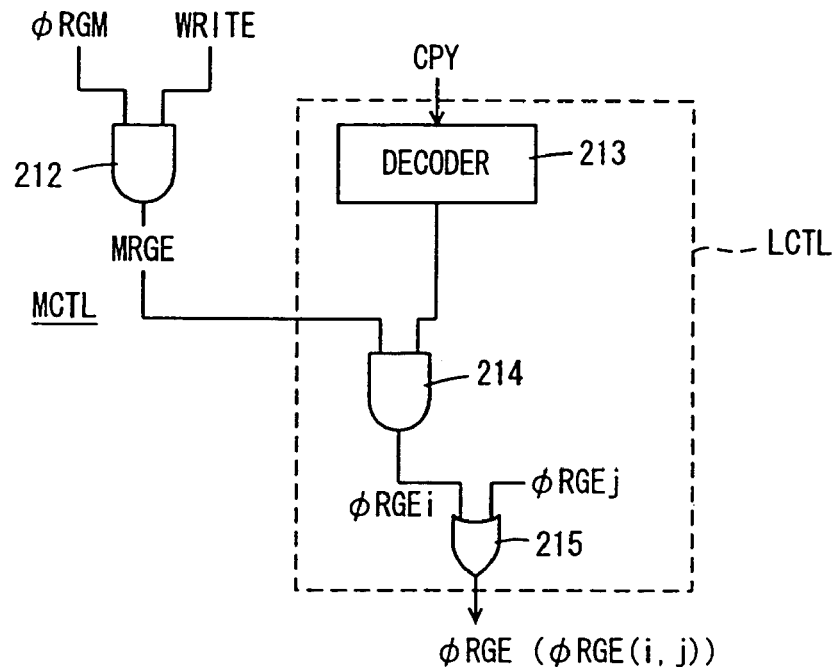
FIG. 66 is a diagram schematically showing another configuration of the data rearrangement write instructing signal generating section.

FIG. 66 is a diagram schematically showing a modification of the data rearrangement write instructing signal generating section. In FIG. 66, an AND circuit 212 is included in a main control circuit MCTL and receives a rearrangement mode instructing signal φRGM and a write command WRITE instructing data writing to generate a main rearrangement write instructing signal MRGE. A local control circuit LCTL includes: a decoder 213 for decoding a column predecode signal CPY from a column control circuit in the main control circuit MCTL; an AND circuit 214 receiving an output signal of the decoder 213 and the main rearrangement write instructing signal MRGE; and an OR circuit 215 receiving an output signal of the AND circuit 214 and a local data rearrangement write instructing signal φRGEj from the local control circuit for another memory cell block sharing a sense amplifier band. The data rearrangement write instructing signal φRGE (φRGE <i, j>) for the column decoder 200b shown in FIG. 59 is outputted from the OR circuit 215.

In the configuration shown in FIG. 66, a write command WRITE is supplied before a transfer operation is performed after rows are driven into a selected state. When the rearrangement mode instructing signal φRGM is in an active state, the main rearrangement write instructing signal MRGE is activated and supplied to the local control circuit LCTL. In the local control circuit LCTL (LCTL0 to LCTLm), the decoder 213 decodes a column predecode signal CPY generated from a column address supplied simultaneously with the write command WRITE. The column predecode signal CPY supplied this time does not specify a column, but includes a signal specifying a memory block holding data, that is, a signal specifying a memory block in a data holding region. Hence, in a data transfer operation, a data holding region can be set in an arbitrary region under control of the external memory controller.

Note that in the case of the configurations shown in FIGS. 65 and 66, the data rearrangement write instructing signal φRGE has a function of a block select signal. Hence, there is particularly no need to apply a block select signal BS to the rearrangement column decoder 200b shown in FIG. 59.

Furthermore, in a case where a data holding region is fixed, a main rearrangement write instructing signal may be applied to the fixed data holding region as a rearrangement write instructing signal φRGE. A memory block in a data holding region is specified by a block select signal BS. The block select signal BS is a signal generated from a block address applied when a row active command is applied, and is latched inside during a row active period.

Figure 67:
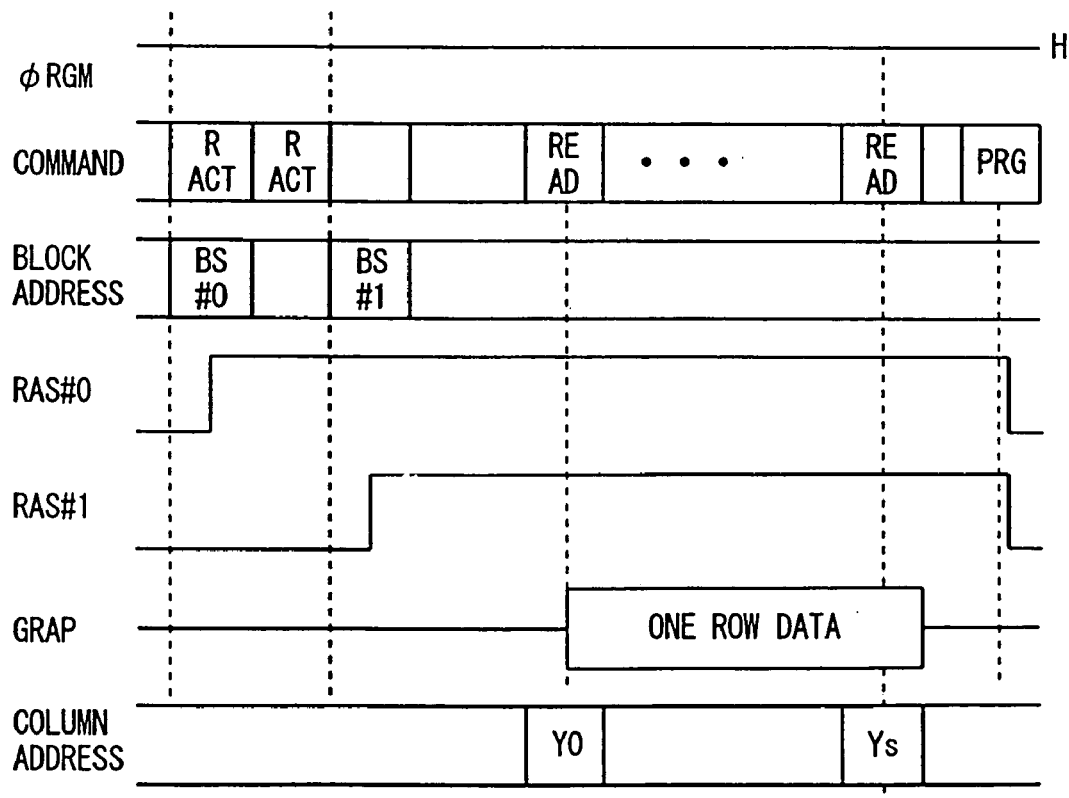
FIG. 67 is a diagram of signal waveforms representing a data transfer operation in the tenth embodiment of the present invention.

FIG. 67 is a timing chart representing an operation in one data transfer cycle. In FIG. 67, a rearrangement mode instructing signal φRGM is first set to H level. In this state, a row active command RACT instructing row selection is supplied. A block address BS#0 is supplied simultaneously with a first row active command RACT. A memory cell array activating signal RAS#0 for a memory block specified by the block address BS#0 is activated to drive a word line into a selected state.

Subsequently, a row active command RACT is again supplied and a block address BS#1 is simultaneously supplied. The block address BS#1 specifies a memory block in a data holding region. An array activating signal RAS#1 for a memory block corresponding to the block address BS#1 is activated according to the block address BS#1 to drive a word line into a selected state. Hence, word lines are held in a selected state in memory blocks specified by the respective block addresses BS#0 and BS#1.

Subsequently, a read command READ instructing data reading is supplied. A data rearrangement write instruct signal φRGE is already set in a selected state. A column select operation is performed according to a column address (not shown) supplied simultaneously with the read command. In a memory block specified by the block address BS#0, the column decoder 200a is activated, while in a memory block specified by the block address BS#1, the column decoder 200b is activated, and the respective decode operations are performed. Hence, data on a selected column of a memory block specified by the block address BS#0 is transmitted onto the rearrangement data line pair GRAP according to the read command READ through the global data line pair GIOP and a preamplifier. The data transferred onto the rearrangement data line pair GRAP is transmitted onto a selected column of a memory block specified by the block address BS#1.

The read command READ is repeatedly applied a number of times required for reading out data of one row. After all the data of one row are read out and transferred internally, a precharge command PRG is supplied to drive the array activating signals RAS#0 to RAS#1 into an inactive state. Thereby, memory blocks specified by the block addresses BS#0 and BS#1 are returned to a precharge state.

The above described page mode operation is performed on all rows in a memory block specified by the block address BS#0. Hence, when all the rows of one memory block are transferred into a data holding region, data transfer is performed on even-numbered row addresses in two memory blocks. Control of row addresses in data transfer is performed by the memory controller. Thereby, data in memory cells can be transferred between the same columns on two rows in different memory blocks.

Configuration of Row-related Control Circuit

Figure 68:
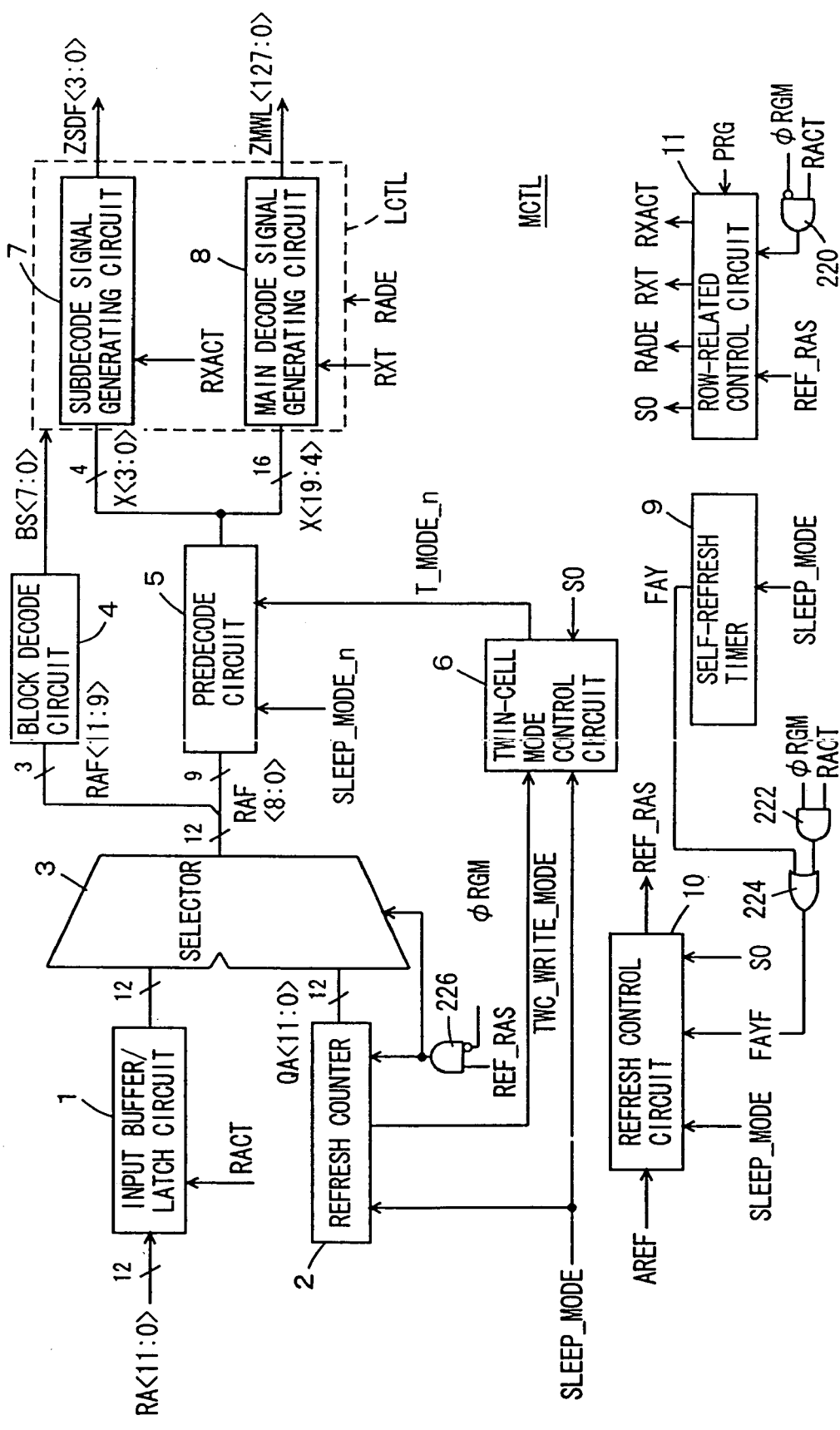
FIG. 68 is a diagram schematically showing a configuration of a main control circuit shown in FIG. 58.

FIG. 68 is a diagram schematically showing a configuration of a row-related control circuit of a main control circuit MCTL. The configuration shown in FIG. 68 corresponds to the configuration of the circuit shown in FIG. 11. In the configuration shown in FIG. 68, in addition to the configuration shown in FIG. 11 described previously, there is further provided a gate circuit 220 receiving a rearrangement mode instructing signal φRGM and a row active command RACT for the row-related control circuit 11. The gate circuit 220 disables a row active command RACT from an outside when the rearrangement mode instructing signal φRGM is in an active state at H level and applies no row active command to the row-related control circuit 11. The gate circuit 220 supplies a row active command RACT from an outside to the row-related control circuit 11 when the rearrangement mode instructing signal φRGM is at L level.

There are further provided: an AND circuit 222 receiving the rearrangement mode instructing signal φRGM and the row active command RACT; and an OR circuit 224 receiving an output signal of the AND circuit 222 and a refresh request signal FAY from the self-refresh timer 9. An output signal of the OR circuit 224 is supplied to the refresh control circuit 10 as a refresh request FAYF. That is, when a row active command RACT from an outside is supplied while the rearrangement mode instructing signal φRGM is active, the refresh request FAYF is activated and the refresh control circuit 10 activates the refresh activating signal REF_RAS. When the data rearranging operation is completed, the rearrangement mode instructing signal φRGM is rendered L-level and the row active command RACT is disabled by the AND circuit 222 and a refresh request FAYF is generated according to a self-refresh request signal FAY.

That is, when a row active command RACT is supplied in the data rearrangement operating mode, the row-related control circuit 11 activates a row-related control signal RADE and others sequentially according to a refresh activating signal REF_RAS activated for a prescribed period.

In the data arrangement, since a row of memory cells is specified according to an address signal from an outside, a gate circuit 226 receiving a rearrangement mode instructing signal φRGM and a refresh activating signal RER_RAS is provided to the refresh counter 2. The gate circuit 226 ceases a count operation of the refresh counter 2 when the rearrangement mode instructing signal φRGM is at H level. The refresh counter 2 performs a count operation according to the refresh activating signal REF_RAS when the rearrangement mode instructing signal φRGM is at L level. The count operation of the refresh counter 2 may be performed in response to the rise of an output signal of the gate circuit 226, or alternatively may be performed in response to the fall thereof.

An output signal of the gate circuit 226 is further supplied to the selector 3. When the rearrangement mode instructing signal φRGM is at H level, the selector 3 selects an address signal from the input buffer/latch circuit 1. When the rearrangement mode instructing signal φRGM is at L level, the selector 3 selects a refresh address from the refresh counter 2.

In the configuration shown in FIG. 68, the sub decode signal generating circuit 7 and the main decode signal generating circuit 8 are provided in the local control circuit LCTL. That is, predecode signals X <19:0> from the predecode circuit 5 are generated in the main control circuit and then supplied commonly to the local control circuits LCTL provided corresponding to respective memory blocks. Here, a configuration is shown, as an example, in which the number of memory blocks is 8 and in one memory block, 512 word lines (sub word lines) are provided. The memory cell array in the first embodiment described above corresponds to the memory block in the tenth embodiment.

The local control circuits are selectively activated according to block select signals BS <7:0>. The row address decode enable signal RADE is applied to the sub decode signal generating circuit 7 and the main decode signal generating circuit 8 of each local control circuit, and the local control circuits are selectively activated according to the block select signals BS <7:0> and each perform a decode operation and output a sub decode signal and a main decode signal when activated. Hence, in the input buffer/latch circuit 1, each time a row active command RACT is supplied, internal row address bits corresponding to row address bits RA <11:0> applied in parallel with the row active command RACT are supplied to the block decode circuit 4 and the predecode circuit 5 through the selector 3. The block decode circuit 4 and the predecode circuit 5 generate a block select signal and a predecode signal according to a row active command, to transmit the generated signals to the local control circuits LCTL.

Figure 69:
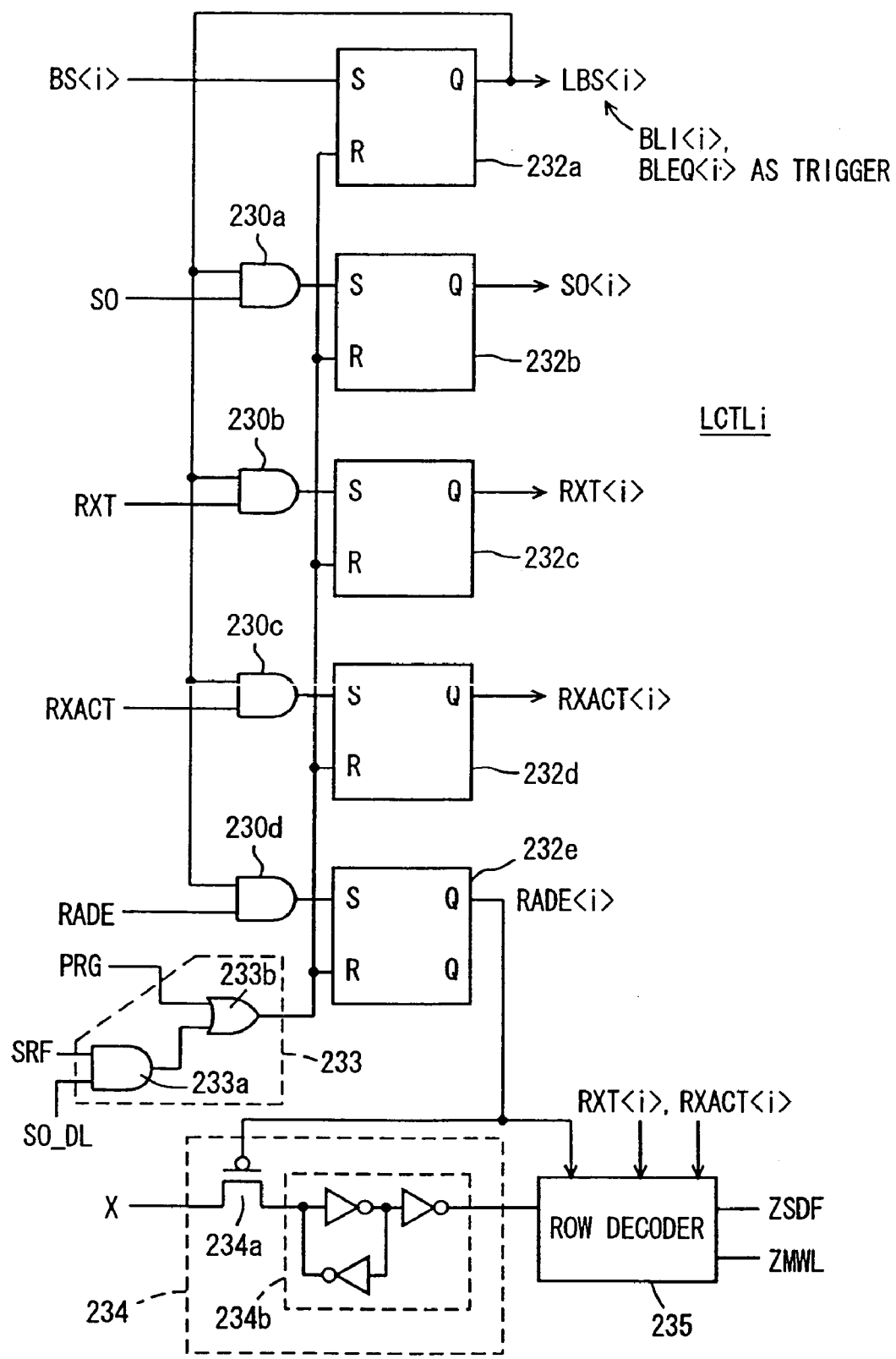
FIG. 69 is a diagram schematically showing a configuration of row-related control signal generating section of a local control circuit shown in FIG. 58.

FIG. 69 is a diagram schematically showing a configuration of a local control circuit. In FIG. 69, the local control circuit LCTLi includes: a set/reset flip flop 232a set in response to activation of a block select signal BS <i>, to generate a latched block select signal LBS <i>: an AND circuit 230a receiving the latched block select signal LBS <i> and a main sense amplifier activating signal SO; an AND circuit 230b receiving the latched block select signal LBS <i> and a (main) word line drive timing signal RXT; an AND circuit 230c receiving the latched block select signal LBS <i> and a sub word line drive timing signal (a word line activating signal) RXACT; an AND circuit 230d receiving the latched block select signal LBS <i> and a main row address decode enable signal RADE; a set/reset flip flop 232b set in response to the rise of an output signal of the AND circuit 230a, to generate a local sense amplifier activating signal SO <i>; a set/reset flip flop 232c set in response to the rise of an output signal of the AND circuit 230b, to generate a local word line drive timing signal RXT <i>; and a set/reset flip flop 232d activated in response to the rise of an output signal of the AND circuit 230c, to generate a local sub word line drive timing signal RXACT <i>.

A bit line isolation instructing signal BLI <i> and a bit line equalize instructing signal BLEQ <i> are also generated according to the latched block select signal LBS <i>. After local row-related control signals SO <i>, RXT <i>, RXACT <i> and RADE <i> are generated according to the latched block select signal LBS <i>. Therefore, when the block select signal BS <i> from an outside is set in an active state, the local sense amplifier activating signal SO <i> is correctly driven into and kept at an active state even when a sense amplifier activating signal SO is inactivated, for example. The latched block select signal LBS <i> is applied to the column decoders 200a and 200b as a block select signal BS <j>.

The local control circuit LCTLi further includes: a reset circuit 233 resetting the set/reset flip flops 232a to 232e according a self-refresh instructing signal SRF, a delayed sense amplifier activating signal SO_DL and a precharge command PRG; an address latch circuit 234 latching a predecode signal X in response to activation of a local row address decode enable signal RADE <i>; and a row decoder 235 performing a decode operation in response to activation of the local row address enable signal RADE <i>, to generate a sub decode signal ZSDF and a main word line decode signal ZMVVL according to the word line drive timing signals RXT <i> and RXACT <i>.

The reset circuit 233 includes: an AND circuit 233a receiving a self-refresh mode instructing signal SRF and a delayed sense amplifier activating signal SO_DL; and an OR circuit 233b receiving an output signal of the AND circuit 233a and a precharge command PRG. A reset signal for the set/reset flip flops 233a to 232e is generated from the OR circuit 233b. In operating modes other than the self-refresh mode, the set/reset flip flops 233a to 232e are reset according to a precharge command PRG. In the self-refresh mode, a refresh operation is performed and the set/reset flip flops 233a to 232e are reset according to a delayed sense amplifier activating signal SO_DL that is activated, a prescribed time after, when a sense amplifier activating signal SO is activated. The delayed sense amplifier activating signal SO_DL corresponds to an output signal of the delay circuit 33 of FIG. 32.

Note that if an auto-refresh command ARF is used, an output signal of the AND circuit 233a is rendered H-level in an active state when either one of the self-refresh mode instructing signal SRF and the auto-refresh command ARF is active. The configuration for the above arrangement is achieved according to such a procedure, for example, that a one-shot pulse is generated in response to the auto-refresh command ARF to be ORed with the self-refresh mode instructing signal SRF for application to the AND circuit 233a.

Figure 70:
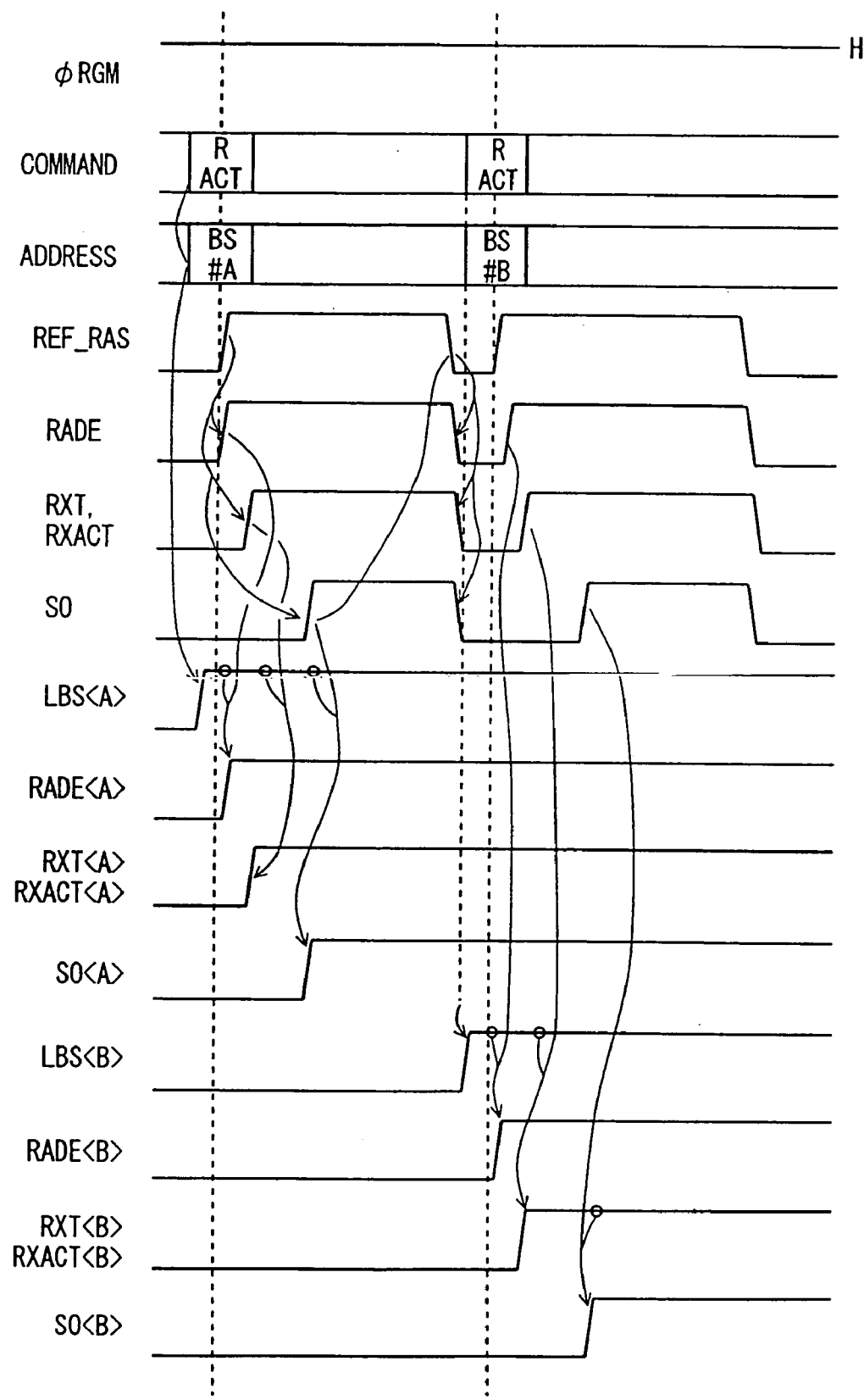
FIG. 70 is a diagram of signal waveforms representing operations of the circuits shown in FIGS. 68 and 69.

The address latch circuit 234 includes: a transfer gate 234a rendered non-conductive according to a local row address decode enable signal RADE <i>; and an inverter latch circuit 234b latching a predecode signal X received through the transfer gated 234a. In the data rearrangement operating mode, the local control circuit LCTLi maintains a latch state till a precharge command PRG is applied. When a block select signal BS <i> is selected, row selection and a sense operation are performed in the selected memory block. Now, description will be given of operation of the circuit shown in FIGS. 68 and 69 with reference to a timing chart shown in FIG. 70.

A rearrangement mode instructing signal φRGM is at H level and an output of the gate circuit 220 shown in FIG. 68 is fixed at L level. In this state, when a row active command RACT is applied, an output signal of the AND circuit 222 shown in FIG. 68 is rendered H-level, and responsively, a refresh request FAYF for the refresh control circuit 10 is activated. In response to the activation, the refresh control circuit 10 activates a refresh activating signal REF_RAS to the row-related control circuit 11.

The row-related control circuit 11 sequentially activates a main row address decode enable signal RADE, main word line drive timing signals RXT and RXACT, and a main sense amplifier activating signal SO according to the refresh activating signal REF_RAS. A latched block select signal LBS <A> is activated by a block address BS#A included in this address. Here, a block decoder performs a decode operation to generate a block select signal when a row active command RACT is applied. The predecoder 5 may perform a predecode operation in response to activation of the row active command RACT similarly to the block decoder. Alternatively, the predecoder 5 may perform a predecode operation in response to the rises of a row active command RACT and a clock signal CLK in a case of a clock synchronous semiconductor memory device.

When a latched block select signal LBS <A> rises, a row address decode enable signal RADE <A> and word line drive timing signals RXT <A> and RXACT <A> are sequentially activated according to main control signals in a memory block MB#A specified by a block address BS#A, followed by activation of a sense amplifier activating signal SO <A>. When the main sense amplifier activating signal SO <A> is activated, a refresh activating signal REF_RAS is deactivated after a prescribed time elapses (see the configuration of FIG. 32).

Even when the refresh activating signal REF_RAS is driven into an inactive state, the set/reset flip flops 232a to 232e are all in a set state as shown in FIG. 69 and all the local control signals are kept in an active state. Therefore, in the memory cell block MB#A specified by the block address BS#A, a word line is in a selected state and a sense amplifier circuit is also in an active state to latch data of a memory cell on the selected word line.

After a one-pulse width time of the refresh activating signal REF_RAS elapses, a row active command RACT is again supplied from an outside. At this time, a latched block select signal LBS <B> is activated according to a block address BS#B. When the row active command RACT is activated, row-related control signals RADE, RXT, RXACT and SO from the row-related control circuit 11 shown in FIG. 68 are sequentially activated. Responsively, in the memory block MB#B specified by the block address BS#B, a local row address decode enable signal RADE <B>, local word line drive timing signals RXT <B> and RXACT <B> and a local sense amplifier activating signal SO <B> are sequentially activated.

In the memory block MB#A specified by the block address BS#A, a latched block select signal LBS <A> is at H level and output signals of the gate circuits 230a to 230d are again rendered H-level according to second time row-related control signals. However, since the set/reset flip flops 232a to 232e are all in a set state, states of the output signals thereof do not change.

Therefore, in the data rearrangement, by supplying a row active command RACT twice, word lines can be maintained in a selected state in the two memory blocks MB#A and MB#B to hold data of memory cells in corresponding sense amplifiers. Thereafter, a column address is applied to perform column selection in the page mode for performing data transfer between the two memory blocks.

When the data transfer is completed, the selected memory blocks are forced to enter a reset state by supplying a precharge command PRG, and the address latch circuit 234 also enters a through state to wait for a new address for capturing.

Hence, in the data rearrangement, a refresh activating signal REF_RAS is utilized to sequentially activate the row-related control signals each in a pulse form internally to be latched in a specified memory block. Thus, word lines in respective two memory blocks are simultaneously maintained in a selected state even if a non-bank configuration is employed.

After the data rearrangement, the sleep mode is entered and the sleep mode instructing signal SLEEP_MODE is activated to perform the twin-cell write mode. After the twin-cell write mode is completed, the self-refresh mode is entered. When the self-refresh mode finishes and the sleep mode is completed, data rearrangement is again performed according to an operation flow reverse to the operation flow performed upon entry into the sleep mode. The data rearrangement operation upon exit from the sleep mode is as follows, for example: in a memory controller, a table including addresses in a data holding region and addresses in a original storage region of data to be held is stored; and row active commands for a region of memory cells storing the data to be held and for a data holding region are applied with reference to the table. As for the order in the application of the row active commands, any of both regions may be activated first by the row active command. A data transfer destination is determined by a data rearrangement write instructing signal φRGE. In the data rearrangement after the sleep mode is completed, a transfer destination and a transfer source are required to be reversed. In this case, a data rearrangement write instructing signal is activated by use of the configuration shown in FIG. 66. Thereby, upon entry into the sleep mode and upon exit from the sleep mode, a data transfer destination can be easily set.

If a shift register configuration is adopted for designating a data holding region, two shift registers may be provided separately for specifying a data holding region and for specifying a storage region of data required to be held, with the one for specifying a data holding region used in transition to the sleep mode, and the other for the storage region of data required to be held used in exit from the sleep mode.

As described above, according to the tenth embodiment of the present invention, upon changing from one bit/one cell mode into twin-cell mode in transition to the sleep mode, data rearrangement can be efficiently performed only by supplying a read command READ and addresses to a DRAM core, without reading data required to be held outside the DRAM core.

Eleventh Embodiment

Figure 71:
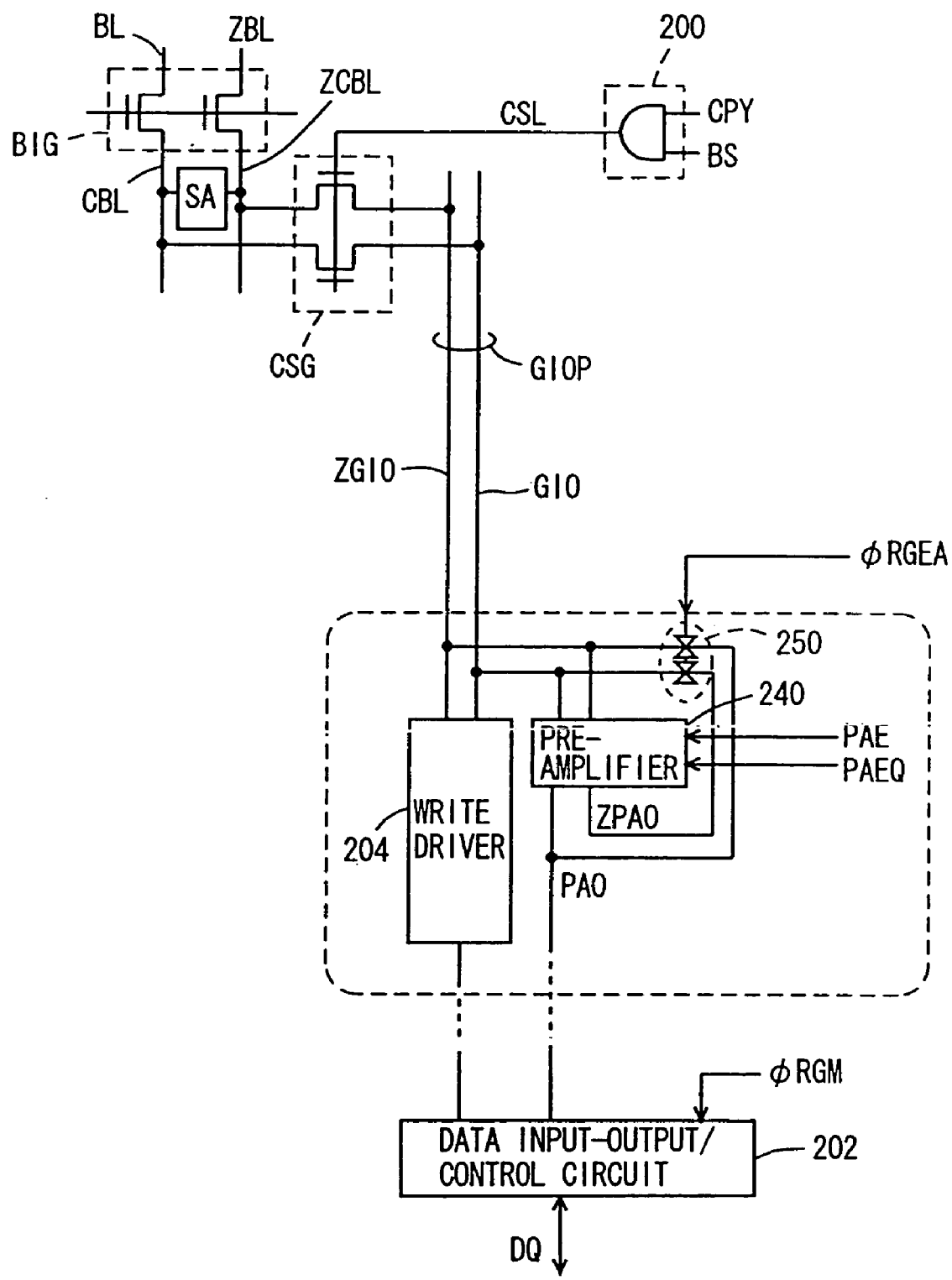
FIG. 71 is a diagram schematically showing a configuration of a main part of a semiconductor memory device according to an eleventh embodiment of the present invention.

FIG. 71 is a diagram schematically showing a configuration of a main part of a semiconductor memory device according to an eleventh embodiment of the present invention. In the configuration shown in FIG. 71, a global data line pair GIOP is provided with: a write driver 204 driving the global data line pair GIOP according to an internal write data in data writing; a preamplifier 240 amplifying and latching data appeared on the global data line pair GIOP when activated; and a transfer gate 250 rendered conductive, when a data rearrangement write instructing signal φRGEA is activated, to transmit the latch data in the preamplifier 240 onto the global data line pair GIOP.

The global data line pair GIOP is coupled with common bit lines CBL and ZCBL through a column select gate CSG. The common bit lines CBL and ZCBL are coupled with bit lines BL and ZBL through a bit line isolation gate BIG. A column select signal CSL is generated from a column decoder 200 receiving a column predecode signal CPY and a block select signal BS.

In the configuration shown in FIG. 71, a configuration of a row-related control circuit is the same as that shown in FIG. 11. A data input-output/control circuit 202 is forced into an inactive state when a rearrangement mode instructing signal φRGM is activated, and no data is inputted or outputted, similarly to the tenth embodiment described above.

Now, brief description will be given of operation of the semiconductor memory device shown in FIG. 71 with reference to a signal waveform diagram shown in FIG. 72.

The rearrangement mode instructing signal φRGM is first set to H level. When a row active command RACT is supplied in this state, an array activating signal RRAS is driven into an active state. A row select operation is performed and a word line (WLa) is driven into a selected state according to a row address RA#0 in response to activation of the array activating signal RRAS.

Subsequently, when a read command READ is supplied, an equalize instructing signal PAEQ is rendered L-level to cease an equalize operation on output nodes and internal nodes of the preamplifier 240. The column decoder 200 is activated according to the read command READ to decode a column address CA#0 for driving a column select signal CSL into a selected state. In response, a memory cell data on a selected column is read out onto the global 10 line pair GIOP. When data is read out on the global IO line pair GIOP, a preamplifier activating signal PAE is activated and the preamplifier 240 amplifies and latches data on the global IO line pair. The column select operation ceases a prescribed period after when the read command RADE is supplied. The preamplifier equalize signal PEAQ, however, stays in an inactive state at L level, and the preamplifier 240 continues to latch the amplified data.

Then, a precharge command PRG is supplied, the array activating signal RRAS is driven into an inactive state, and the selected word line (WLa) is driven into a non-selected state. In response, the sense amplifier SA also enters an inactive state.

A row active command RACT is again supplied together with an address RA#1. At this time, the data rearrangement write instructing signal φRGEA is activated. The data rearrangement write instructing signal φRGEA may be externally applied, or alternatively may be activated internally in response to a second time row active command when the rearrangement mode instructing mode φRGM is activated. The array activating signal RRAS is again activated according to the row active command RACT, and a word line (WLb) specified by the address RA#1 is driven into a selected state. The data rearrangement write instructing signal φRGEA is rendered H-level, the transfer gate 250 shown in FIG. 71 is rendered conductive and data latched by the preamplifier 240 is transmitted onto the global IO line pair. Voltage levels on the global IO line pair GIOP are driven to the power supply voltage level and the ground voltage level, according to a memory cell data read out in the preceding cycle.

A read command READ is again supplied together with a column address CA#1. That is, the column address CA#0 that specifies the same column as in the preceding cycle is applied. Thus, the column select instructing signal CSL is again driven into a selected state. Since the preamplifier activating signal PAE stays in an active state, the global IO line pair is driven through the transfer gate 250 and the data read out in the preceding cycle is written on the selected column.

When the data rewriting is completed, a precharge command PRG is supplied, the array activating signal RRAS is deactivated and the rearrangement write instructing signal φRGEA is also deactivated. In response, the preamplifier activating signal PAE is deactivated and the preamplifier equalize instructing signal PAEQ is activated. That is, in the eleventh embodiment, data transfer is performed inside one bit at a time or on a unit of the number of the global data line pairs. In this case, since data to be transferred is latched in the preamplifier 240, data rearrangement can be performed even in the same memory cell block.

Figure 72:
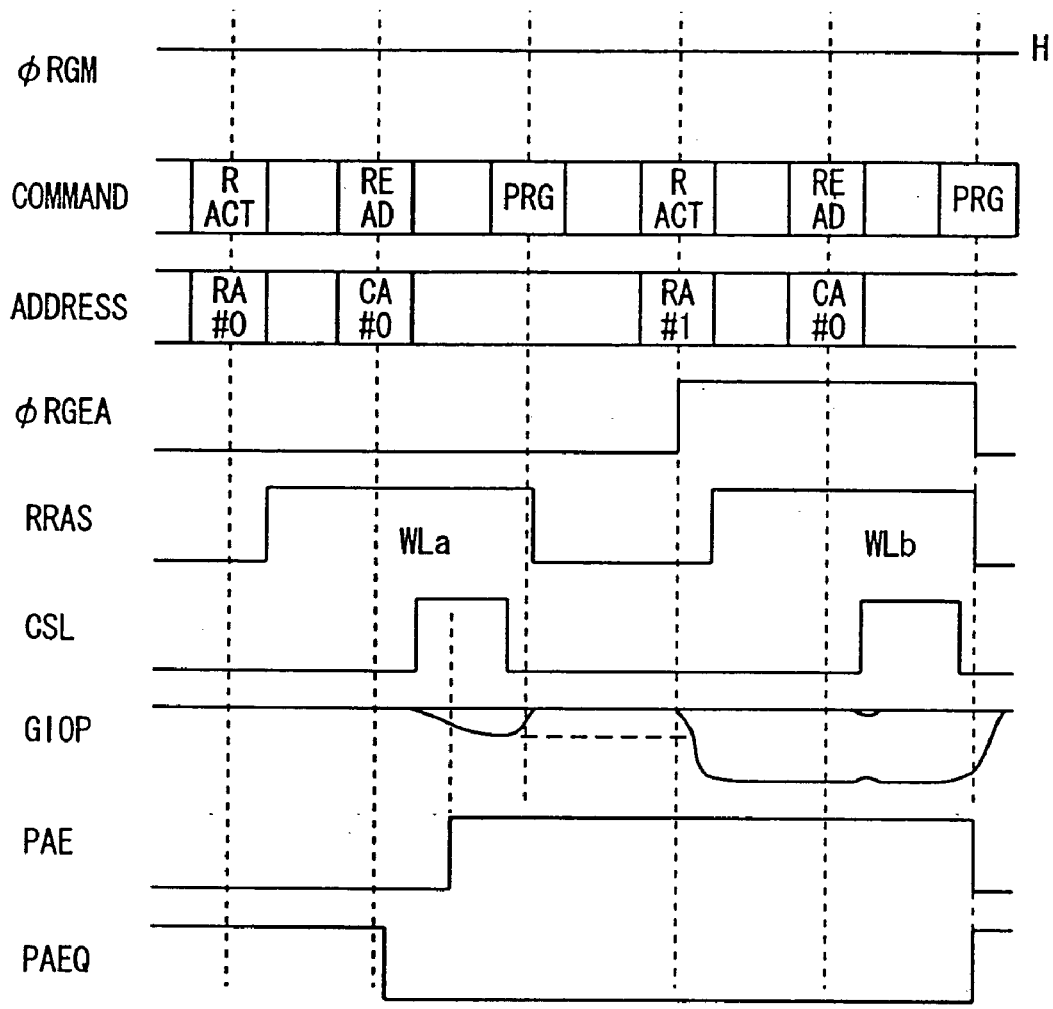
FIG. 72 is a diagram of signal waveforms representing operation of the circuit shown in FIG. 71.

In the configuration shown in FIG. 72, when a precharge command PRG is supplied, the global IO line pair may not be subject to precharge/equalize operation thereon during a period in which the preamplifier activating signal PAE is in an active state, instead of being precharged once to the power supply voltage VCC level, as shown with a broken line in FIG. 72.

Figure 73:
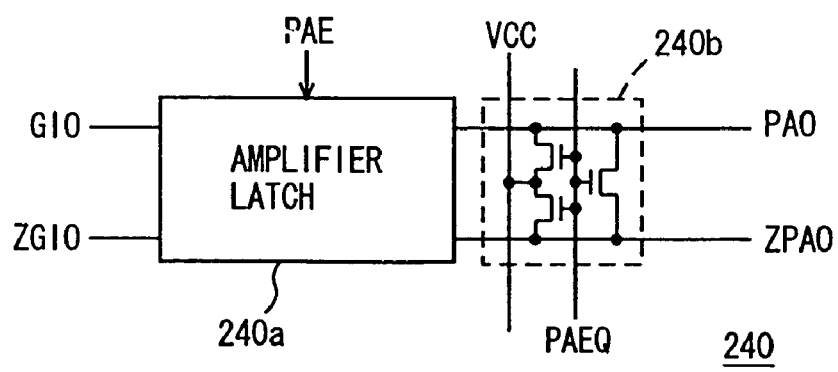
FIG. 73 is a diagram schematically showing a configuration of a preamplifier shown in FIG. 71.

FIG. 73 is a diagram representing a configuration of the preamplifier 240 shown in FIG. 71. In FIG. 73, the preamplifier 240 includes: an amplifier latch 240a activated, when the preamplifier activating signal PAE is activated, to amplify and latch signals on global data lines GIO and ZGIO; and a precharge/equalize circuit 240b activated, when the preamplifier equalize instructing signal PAEQ is activated, to precharge and equalize output nodes (PAO and ZPAO) to the power supply voltage VCC level. Furthermore, an internal node of the preamplifier 240 (amplifier latch 240a) is equalized to a prescribed voltage level when the preamplifier equalize instructing signal PAEQ is activated.

The amplifier latch 240a may be configured to include: an amplifying circuit amplifying data on the global data lines GIO and ZGIO in response to activation of the preamplifier activating signal PAE; and a latch circuit formed of a NAND latch circuit and latching an output signal of the amplifying circuit. Alternatively, the amplifier latch 240a may include: an amplifying circuit amplifying signals on the global data lines GIO and ZGIO in response to activation of the preamplifier activating signal PAE; and a latch circuit activated in response to a delayed signal of the preamplifier enable signal PAE. Either of the configurations can be adopted.

Figure 74:
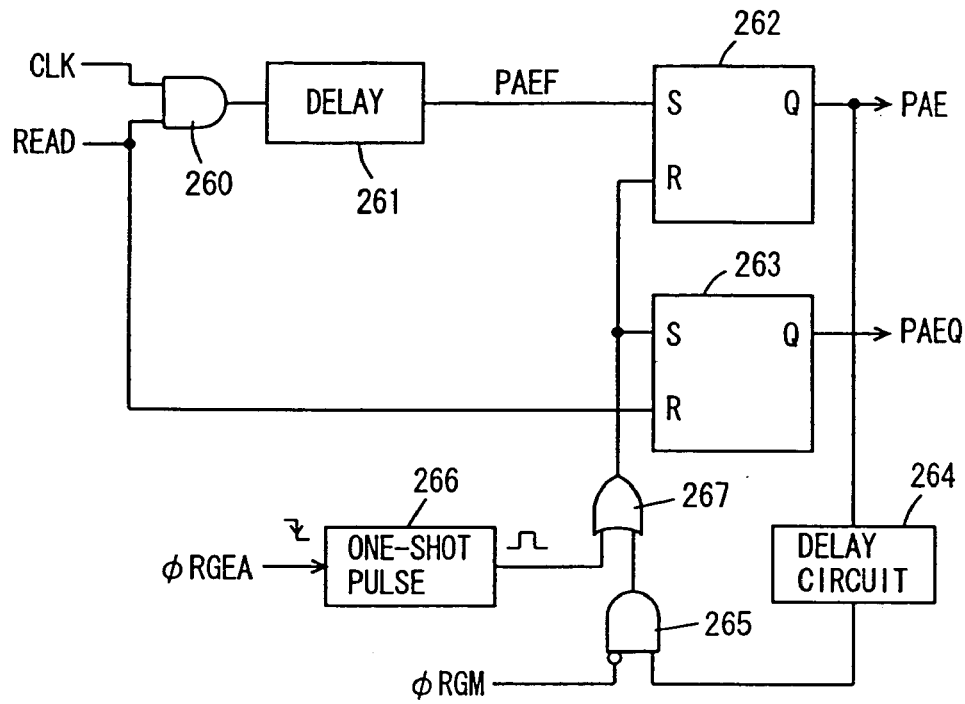
FIG. 74 is a diagram schematically showing a configuration of a preamplifier control signal generating section in the eleventh embodiment of the present invention.

FIG. 74 is a diagram schematically showing a configuration of a preamplifier control section. In FIG. 74, the preamplifier control section includes: an AND circuit 260 receiving a clock signal CLK and a read command READ; a delay circuit 261 delaying an output signal of the AND circuit 260 by a prescribed time; a set/reset flip flop 262 set, in response to activation of an output PAEF from the delay circuit 261, to activate the preamplifier activating signal PAE; a set/reset flip flop 263 reset, in response to activation of the read command READ, to deactivate the preamplifier equalize instructing signal PAEQ; a delay circuit 264 delaying the preamplifier activating signal PAE by a prescribed time; a gate circuit 265 receiving an output signal of the delay circuit 264 and a rearrangement mode instructing signal φRGM; a one-shot pulse generating circuit 266 generating a one-shot pulse signal in response to the fall of the data rearrangement write instructing signal φRGEA; and an OR circuit 267 receiving a pulse signal from the one-shot pulse generating circuit 266 and an output signal of the gate circuit 265. The set/reset flip flops 262 and 263 are reset and set, respectively, according to an output of the OR circuit 267.

In the configuration of the preamplifier control section shown in FIG. 74, a read command READ is taken in synchronization with the clock signal CLK and an internal read operation instructing signal is generated. After a time, determined considering a so-called "latency", in the delay circuit 261 elapses, an output signal PAEF of the delay circuit 261 is activated and in response, the preamplifier activating signal PAE is activated. The column select signal CAL is already driven into a selected state when the preamplifier activating signal PAE is activated.

The set/reset flip flop 263 is reset according to the read command READ and the equalize signal PAEQ for the preamplifier is driven into an inactive state.

In the normal operation, the gate circuit 265 operates as a buffer circuit and outputs a signal of an H level according to an output signal of the delay circuit 264. In the normal operation, the data rearrangement write instruction signal φRGEA is fixed at L level and therefore, when the preamplifier activating signal PAE is activated and a prescribed time nas elapsed, the set/reset flip flop 262 is reset to deactivate the preamplifier activating signal PAE. Furthermore, the set/reset flip flop 263 is set to drive the preamplifier equalize instructing signal PAEQ into an active state.

In data rearrangement mode of operation, the rearrangement mode instructing signal φRGM is at H level and an output signal of the gate circuit 265 is set to L level. Hence, the preamplifier activating signal PAE stays in an active state and latches data read out from a memory cell till the data rearrangement write instructing signal φRGEA is driven into an inactive state after the preamplifier activating signal PAE is activated according to a read command READ. On the other hand, the preamplifier equalize signal PAEQ is driven into an inactive state when the read command READ is supplied and stays in the inactive state till the data rearrangement write instructing signal φRGEA is deactivated.

The column address decode enable signal CADE is activated and predecoding of a column address is performed when a read command or a write command is supplied. The column address decode enable signal CADE may be further applied to a local control circuit and decoding of a predecode signal is performed in a column decoder in the local control circuit. That is, the column address decode enable signal CADE may be applied to a column decoder. Note that the data rearrangement write instructing signal φRGEA is commonly used in all memory cell blocks and may be applied from an outside, or may be activated according to a second time row active command RACT internally. In this case of internal activation, the data rearrangement write instructing signal φRGEA is deactivated by a precharge command PRG.

As described above, according to the eleventh embodiment of the present invention, data is fed back to a global data line pair using a preamplifier in data rearrangement, and data transfer can be performed between memory cells on different rows even in the same memory cell block.

Twelfth Embodiment

Figure 75:
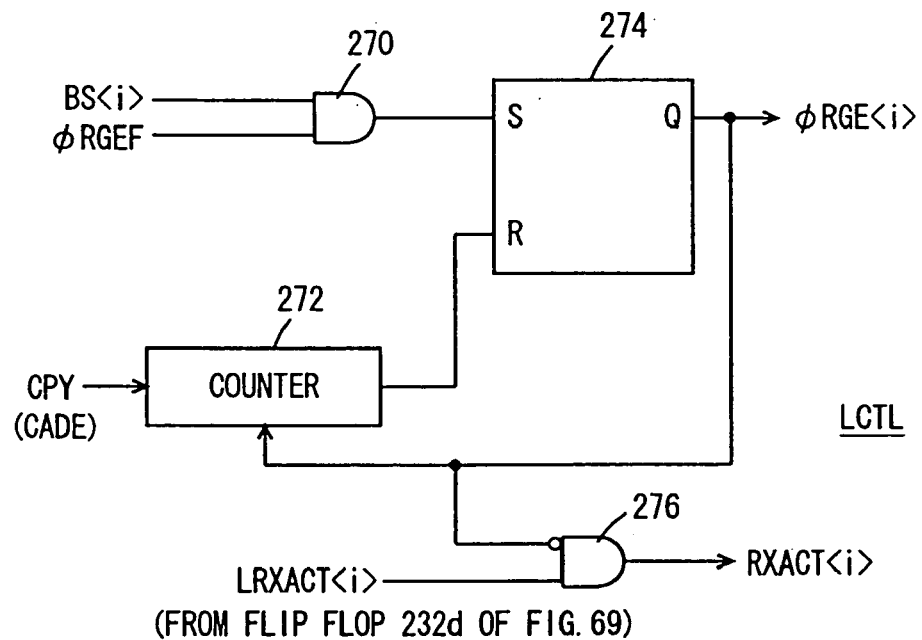
FIG. 75 is a diagram schematically showing a combined configuration of a section for generating a rearrangement write instructing signal and a sub word line drive timing signal in the eleventh embodiment of the present invention.

FIG. 75 is a diagram schematically showing a configuration of a main part of a local control circuit LCTL of a semiconductor memory device according to the twelfth embodiment of the present invention. A configuration of the local row-related control circuit is the same as that of the local row-related control circuit (see FIG. 69) used in the tenth embodiment described above and therefore, the global data line pair GIOP and the rearrangement data line pair GRAP are employed.

In FIG. 75, the local control circuit ICTL includes: an AND circuit 270 receiving a block select signal BS <i> and a rearrangement write instructing signal φRGEF provided from an outside; a set/reset flip flop 274 set, in response to activation of an output signal of the AND circuit 270, to generate a local data rearrangement write instructing signal φRGE <i>; a counter 272 counting the number of column predecode signals CPY to reset the set/reset flip flop 274 when a count value thereof reaches a prescribed value (16); and a gate circuit 276 receiving the local data rearrangement write instructing signal φRGE <i> and a latched sub word line drive timing signal LRXACT <i> from the set/reset flip flop 232d shown in FIG. 69 to generate a local sub word line drive timing signal RXACT <i>.

The gate circuit 276 maintains the sub word line drive timing signal RXACT <i> in an inactive state while the local data rearrangement write instructing signal φRGE <i> is at H level. Therefore, when row selection is performed according to a row active command in the local control circuit LCTL, a sub word line stays in a non-selected state even if a main word line is selected and a sense amplifier is activated. Now, description will be given of a data rearrangement operation of a semiconductor memory device according to the twelfth embodiment of the present invention with reference to a timing chart shown in FIG. 76.

A row active command RACT is first supplied externally. At this time, a word line WLa is driven into a selected state in a memory block specified by a row address not shown. The word line WLa includes a main word line and a sub word line SWL. Sensing and amplification of data on memory cells on a selected row are performed.

Subsequently, a row active command RACT is again supplied and a memory block of a transfer destination, which is a data holding region, is specified. In the memory block of a transfer destination, the local data rearrangement write instructing signal +RGE <i> is set to an active state according to activation of the rearrangement write instructing signal φRGEF applied simultaneously, and the sub word line drive timing signal RXACT <i> is kept in an inactive state. Hence, in the memory block of a transfer destination, a decode operation is performed and the main word line MWL is driven into a selected state, but the sub word line SWL stays in an inactive state. Then, the sense amplifier activating signal SOb is activated at a prescribed timing and a sense amplifier latches data according to operating characteristics thereof. More specifically, in a corresponding memory block of a transfer destination, data held in a sense amplifier is data according to operating characteristics of the sense amplifier when the sense amplifier activating signal SOb is active.

Subsequently, a read command READ is externally supplied, and a column select operation is performed. Hence, data of a memory cell connected to the selected word line WLa is transmitted to a memory block of a transfer destination through the preamplifier 206 and the transfer buffer 208 shown in FIG. 60 and latched by an associated sense amplifier. When a prescribed number of read commands READ are supplied and data transfer on one row is completed, the counter 272 outputs a count-up signal to reset the set/reset flip flop 274 and the local data rearrangement write instructing signal φRGE <i> is driven into an inactive state. When the local data rearrangement write instructing signal φRGE <i> is deactivated, it is indicated that data transfer on one row is completed. Sense amplifiers latch transfer data for a memory block of a transfer destination. Hence, the sub word line drive timing signal RXACT <i> from the gate circuit 276 shown in FIG. 75 is driven into an active state in response to deactivation of the local data rearrangement write instructing signal φRGE <i>, a sub word line enters a selected state, and data latched by the sense amplifiers are written onto memory cells connected to a sub word line corresponding to the selected row. Thus, data transfer onto memory cells on one row in a data holding region is performed.

Then, after a prescribed time elapses, by supplying a precharge command PRG from an outside, the selected word line and the sense amplifiers are driven into an inactive state.

Figure 76:
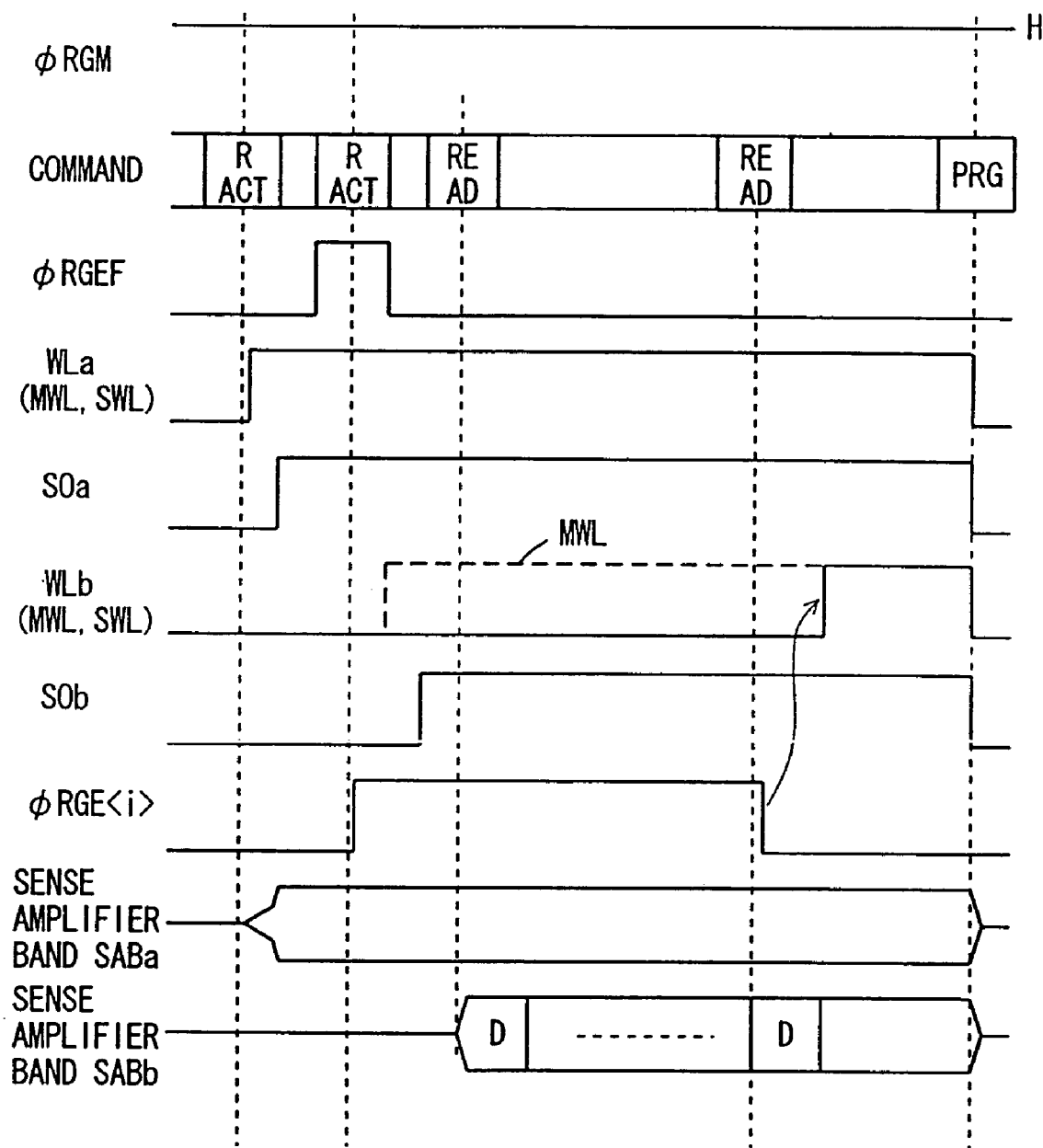
FIG. 76 is a diagram of signal waveforms representing a data transfer operation in the eleventh embodiment of the present invention.

In the configuration shown in FIG. 76, sense amplifiers of a memory block of a transfer destination (data holding region) are activated to latch transfer data. Therefore, data transfer can be performed on the same sense amplifier band. A word line (or a sub word line) is in a non-selected state in a memory block of a transfer destination and therefore, data transfer can be performed between adjacent memory cell blocks. Hence, a correspondence between a data holding region and a storage region of data required to be held can be set with more of flexibility.

In the signal waveforms shown in FIG. 76, a main word line MWL is driven into a selected state in the transfer destination. The main word line MWL, however, may be adapted so as to be activated at the same timing as a sub word line. This is easily achieved by the combination of the local data rearrangement write instructing signal φRGE <i> with the main word line drive timing signal RXT <i>.

In the twelfth embodiment of the present invention, data transfer is performed in a reverse procedure when the sleep mode is completed. In this case, data in the holding region is first read out and latched in a sense amplifier and then, a sense amplifier in a memory block of a transfer source into which data required to be held is originally stored is activated. In this case, since the rearrangement write instructing signal φRGEF from an outside is combined with a block select signal BS <i>, memory blocks of a transfer destination and a transfer source can be specified easily.

In the configuration shown in FIG. 75, the counter 272 counts the numbers of column predecode signal CPY. The predecode signal CPY includes a plurality of bits and have all the bits rendered L-level when once brought to a reset state and therefore, by counting the rises of signals of OR of all the predecode signal bits, the number of the predecode signals can be easily counted. Alternatively, in order to count the number of decoder operation times of a column decoder, the number of times of activations of the column address decode enable signals CADE or the number of read commands READ may be counted.

As described above, according to the twelfth embodiment of the present invention, inside the semiconductor memory device, data transfer is performed with a word line (a main word line/a sub word line) of a memory block of a transfer destination left in a non-selected state, and after the data transfer is completed, the word line (the main word line/the sub word line) of a memory block of the transfer destination is driven into a selected state and therefore, data transfer can be performed between adjacent memory cell blocks, resulting in more flexible correspondence between a storage region of data to be held and a data holding region.

Thirteenth Embodiment

Figure 77:
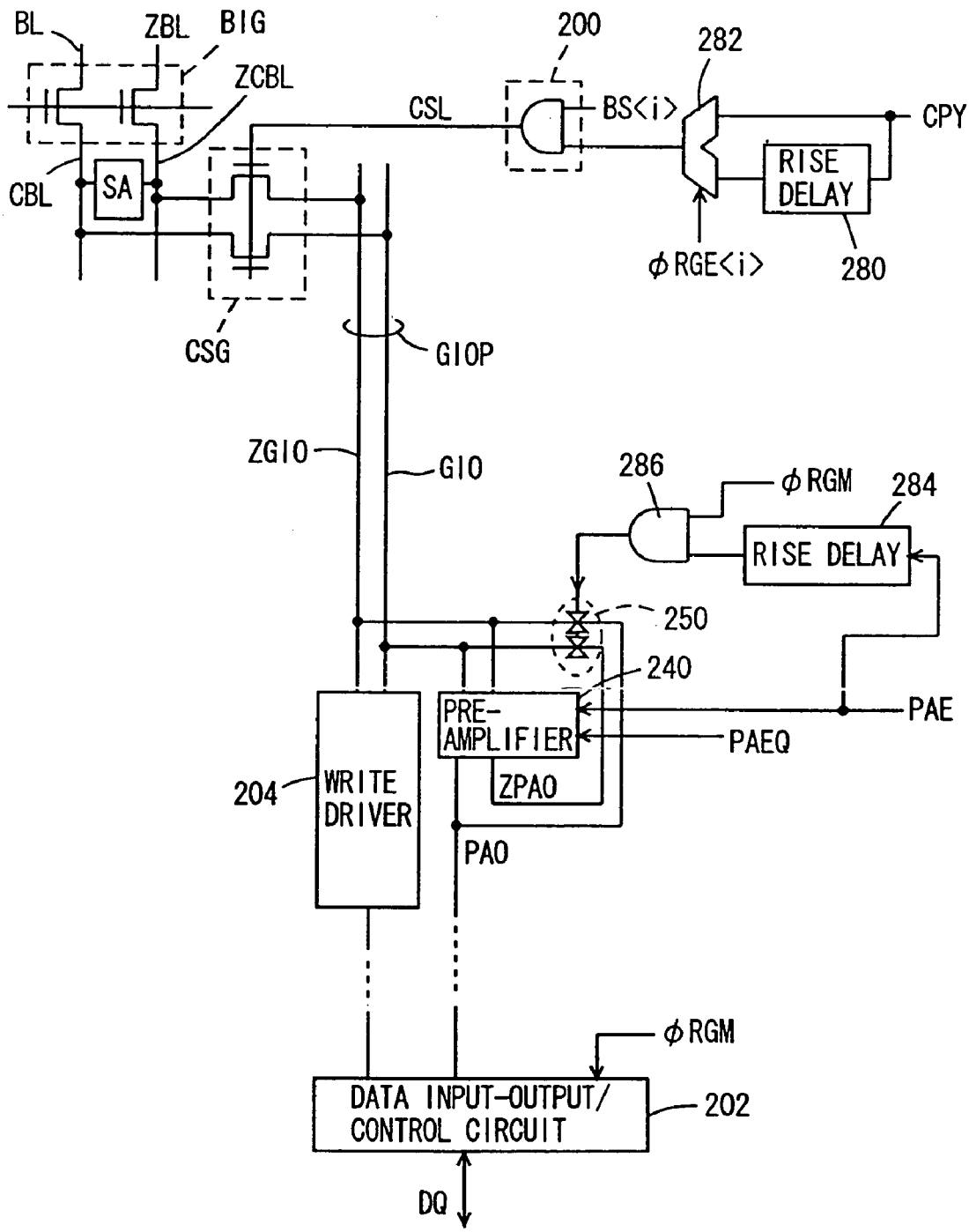
FIG. 77 is a diagram schematically showing a configuration of a main part of a semiconductor memory device according to a thirteenth embodiment of the present invention.

FIG. 77 is a diagram schematically showing a configuration of a main part of a semiconductor memory device according to a thirteenth embodiment of the present invention. In the configuration shown in FIG. 77, the following configuration is further provided in addition to the configuration shown in FIG. 71. More specifically, the column decoder 200 is provided with: a rise delay circuit 280 delaying the rise of a column predecode signal CPY; and a select circuit 282 selecting either one of a column predecode signal CPY and an output signal of the rise delay circuit 280 according to the local data rearrangement write instructing signal φRGE <i> (=φRGE <i, j>). A signal from the select circuit 282 is applied to the column decoder 200. The local data rearrangement write instructing signal φRGE <i> may be generated from the configuration shown in FIG. 64 or 66.

The select circuit 282 selects an output signal of the rise delay circuit 280 in execution of data rearrangement, while the select circuit 282 selects a column predecode signal CPY when the data rearrangement write instructing signal φRGE <i> is in a non-selected state. Hence, in a data holding region, after a column predecode signal CPY exits from the reset state to alter its state and a delay time of the delay circuit 280 elapses, the column decoder 200 performs a decode operation.

Figure 78:
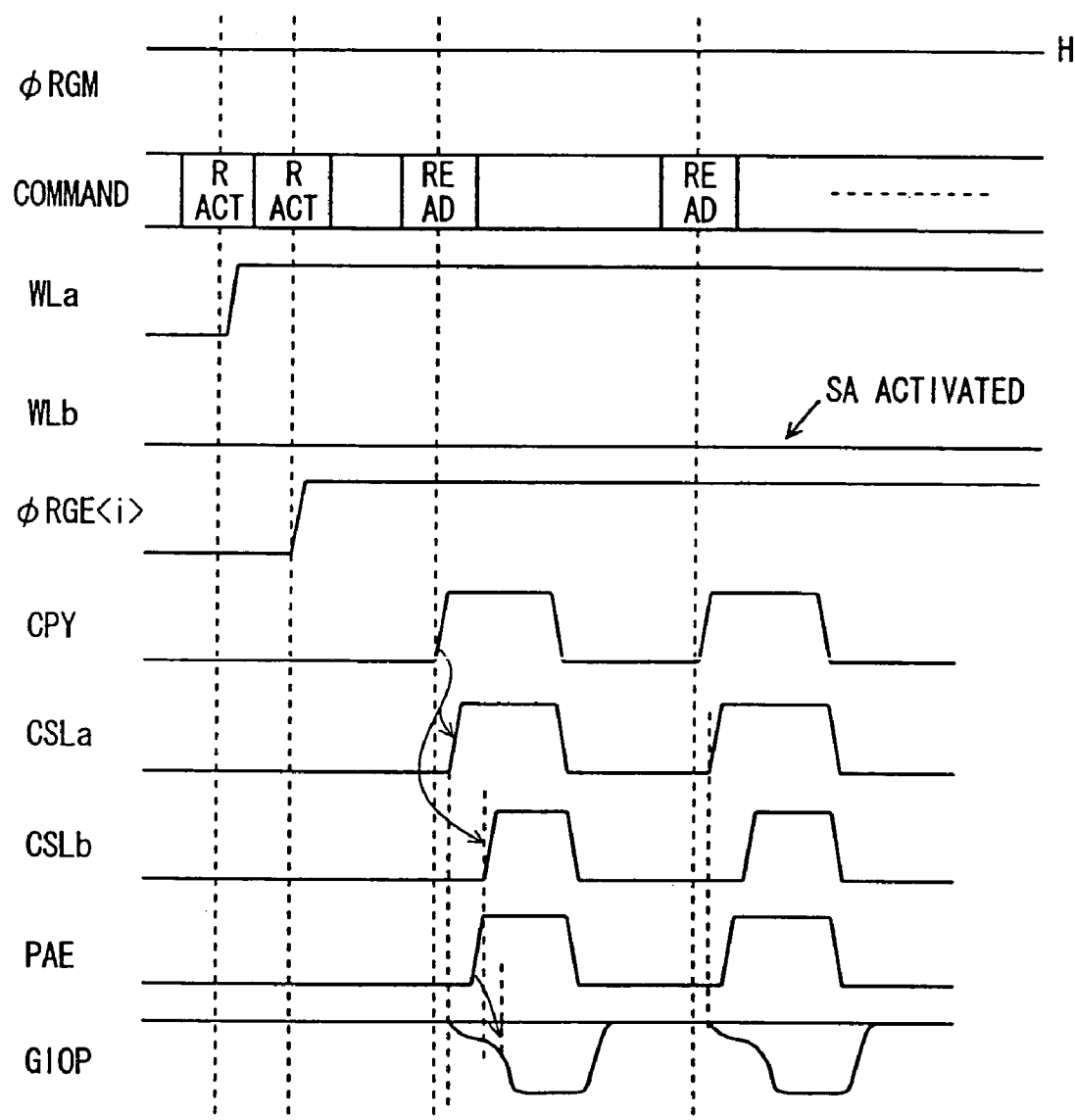
FIG. 78 is a diagram of signal waveforms representing operation of the configuration shown in FIG. 77.

The transfer gate 250 is provided with: a rise delay circuit 284 delaying the rise of the preamplifier activating signal PAE (activation) by a prescribed time; and an AND circuit 286 receiving an output of the rise delay circuit 284 and a rearrangement mode instructing signal φRGM. When an output signal of the AND circuit 286 is driven into an active state at H level, the transfer gate 250 enters a conductive state. Now, description will be given of operation in the configuration shown in FIG. 77 with reference to a signal waveform diagram shown in FIG. 78.

When a row active command RACT is supplied, a word line WLa is driven into a selected state in a memory block storing data required to be held and corresponding sense amplifiers are activated. In succession, a row command RACT is supplied. In this case, a word line WLb stays in a non-selected state, similarly to the configuration shown in FIG. 75 described above. Corresponding sense amplifiers SA are activated.

Subsequently, when a read command READ is supplied, a column predecode signal CPY is generated according to a column address at that time. The column decoder 200 performs a decode operation in a memory block including the word line WLa according to the column predecode signal CPY, and the column select signal CSLa is driven into a selected state. In response, memory cell data is read out onto the global data line pair GIOP.

Then, the preamplifier activating signal PAE is activated and the preamplifier 240 amplifies data on the global data line pair GIOP. When a delay time that the rise delay circuit 284 has elapsed, an output signal of the AND circuit 286 is rendered H-level. Responsively, the transfer gate 250 is rendered conductive, the global data line pair GIOP is again driven by data amplified and latched by the preamplifier 240, and the voltage levels thereof are developed to CMOS levels.

The select circuit 282 selects a column predecode signal CPY from the rise delay circuit 280 to apply the selected signal to the column decoder 200. In the data holding region, the column select signal CSLb is set into a select state through a decode operation by the column decoder 200, and data on the global data line pair GIOP is latched by a sense amplifier of a corresponding column. When one read cycle is completed, the column predecode signal CPY is rendered L-level to be a non-selected state, and one data transfer cycle is completed. In succession, when a read command READ is again supplied, the column select signals CSLa and CSLb are sequentially driven into a selected state and the preamplifier activating signal PAE is further activated, and data transfer is performed between the selected columns.

A delay time that the rise delay circuits 284 and 280 each have may be determined appropriately. It is desirable that after voltage levels on the global data line pair GIOP are developed to the power supply voltage VCC level and the ground voltage VSS level by data amplified and latched by the preamplifier 240, the column select signal CSLb is driven into a selected state. This is because if the global data line pair GIOP is driven in opposite directions by two sense amplifiers when a voltage difference thereof is small, conflict of data arises to destruct the transfer data. Therefore, a delay time that the rise delay circuit 284 has is preferably made shorter than that of the rise delay circuit 280.

Note that as a configuration of the row-related control circuit, the configuration shown in FIG. 75 is utilized. The necessary number of times, or the number of times of data transfers for memory cells on one row, is counted using the number of times of application of read commands or the number of column predecode signals. When data transfer on one row of memory cells is completed, the word line WLb is driven into a selected state and data latched by sense amplifiers are written onto selected memory cells. By finally supplying a precharge command PRG, a selected memory block is driven into a non-selected state.

In the configuration of thirteenth embodiment of the present invention, it is not requires to simultaneously perform column selections in two memory blocks. When column selection in a memory block of the data holding region is performed after data on the global data line pair is sufficiently expanded, data can be correctly written into the memory block of the data holding region, thereby enabling more correct data transfer. Besides, there is no need to provide a dedicated data line pair for data rearrangement, leading to reduction in interconnection occupation area.

In the tenth embodiment as well, the configuration as described above can be applied in which a word line (sub word line) is maintained in a non-selected state in a data holding region till data transfer on one row is completed and after the data transfer on one row is completed, the word line of the data transfer destination is driven into a selected state. When this configuration is applied to the tenth embodiment, data transfer can be performed even between adjacent memory blocks sharing a sense amplifier band.

Fourteenth Embodiment

Figure 79:
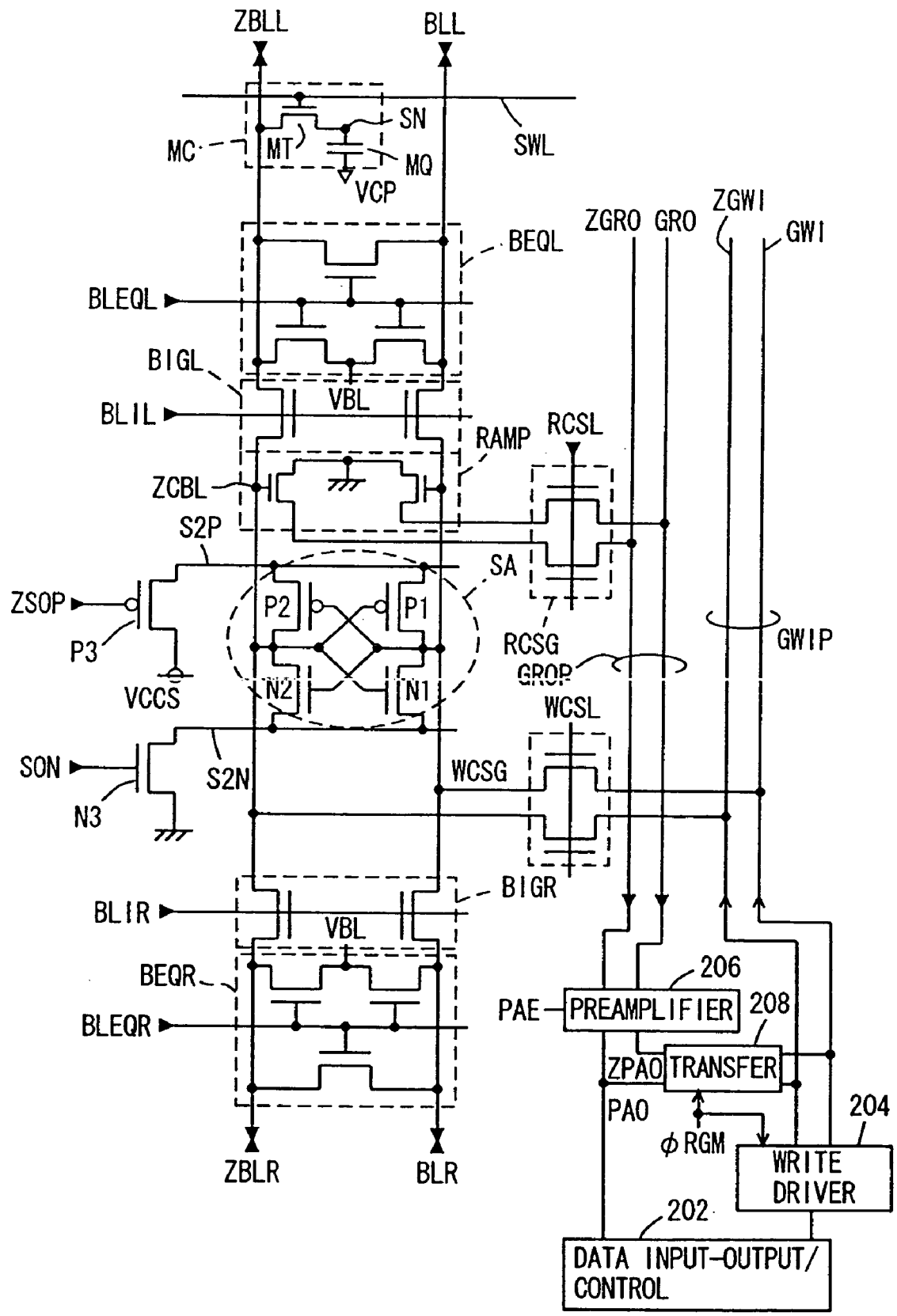
FIG. 79 is a diagram schematically showing a configuration of a main part of a semiconductor memory device according a fourteenth embodiment of the present invention.

FIG. 79 is a diagram schematically showing a configuration of an array section of a semiconductor memory device according to a fourteenth embodiment of the present invention. In the configuration shown in FIG. 79, a read column select gate RCSG and a write column select gate WCSG are connected to common bit lines CBL and ZCBL. A read amplifier RAMP is provided to the common bit lines CBL and ZCBL. The read amplifier RAMP includes: a pair of differential transistors having their gates connected to the respective common bit lines CBL and ZCBL. The drains of the differential transistors of the read amplifier are coupled with respective transfer gates of the read column select gate RCSG.

As an internal data line pair, a read data line pair GROP for transferring read data and a write data line pair GWIP for transferring write data are provided. The read data line pair GROP includes complementary data lines ZGRO and GRO, and the write data line pair GWIP includes write data lines ZGWI and GWO.

In the configuration shown in FIG. 79, data writing and data reading are performed through separate routes in the normal operating mode. Data transferring is performed internally by use of the read and write routes. A preamplifier 206 is provided to the read data line pair GROP, and a write driver 204 is provided to the write data line pair GWIP. Furthermore, there is provided a transfer circuit 208 for transferring complementary output signals PAO and ZPAO of the preamplifier 206 onto the write data line pair GWIP when the rearrangement mode instructing signal φRGM is activated. In the data holding region, data writing is performed through the write column select gate WCSL and data is read out onto the read data line pair GROP from a memory block of a transfer source through the read amplifier RAMP and the read column select gate RCSG.

Therefore, in an "separated IO" configuration, data rearrangement can be performed simply by additionally providing the transfer circuit 208.

Figure 80:
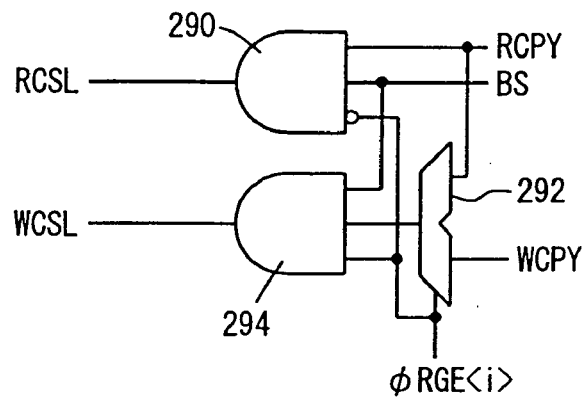
FIG. 80 is a diagram schematically showing a configuration of a column decoder according to the fourteenth embodiment of the present invention.

FIG. 80 is a diagram schematically showing a configuration of a column decoder for one sense amplifier band. In FIG. 80, the column decoder includes: a read column decoder 290 receiving a read column predecode signal RCPY, a block select signal BS and a data rearrangement write instructing signal φRGE <i> (=φRGE <i, j>); a select circuit 292 selecting either one of the read column predecode signal RCPY and a write column predecode signal WCPY according to the data rearrangement write instructing signal φRGE <i>; and a write column decoder 294 receiving the block select signal BS, a predecode signal from the select circuit 292 and the data rearrangement write instructing signal φRGE <i> to generate a write column select signal WCSL.

The block select signal BS is a signal of a logical sum of block select signals for memory blocks sharing a corresponding sense amplifier band. In FIG. 80, the data rearrangement write instructing signal φRGE <i> is shown. The data rearrangement write instructing signal φRGE <i> is naturally a logical sum of the signals for the memory blocks sharing the sense amplifier band.

Figure 81:
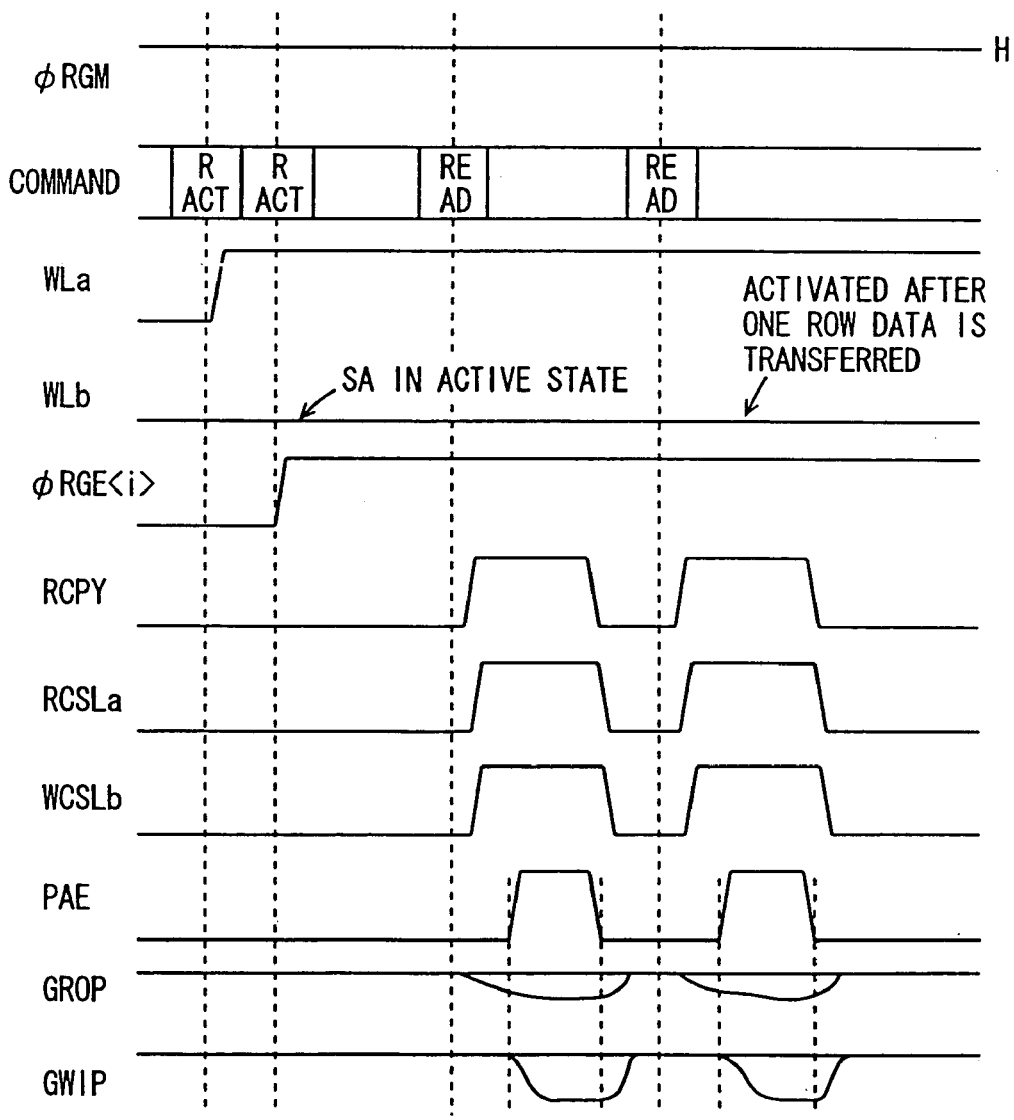
FIG. 81 is a diagram of signal waveforms representing a data transfer operation according to the fourteenth embodiment of the present invention.

In data rearrangement, the select circuit 292 selects the read column predecode signal RCPY and otherwise, the select circuit 292 selects the write column predecode signal WCY. In a data rearrangement operation, the read column decoder 290 is disabled and the read column select signal RCSL is kept in a non-selected state. That is, in a data holding region, the read column select gate RCSG stays in a non-conductive state. At this time, the write column decoder 294 operates according the read column predecode signal RCPY to drive the write column select signal WCSL into a selected state. In a region for storing data to be held, the corresponding read column decoder 290 is activated. This is because the data rearrangement write instructing signal φRGE <i> stays in a non-selected state for a memory cell block of a transfer source. Now, description will be briefly given of the operation with reference to a timing chart shown in FIG. 81.

Row active commands RACT are first supplied successively twice to drive a word line WLa in a memory block of a transfer source into a selected state. While a row address decode operation is performed in a memory block (data holding region) of a data transfer destination, a word line WLb stays in a non-selected state, but a corresponding sense amplifier SA is driven into an active state.

On second application of the row active command, the data rearrangement write instructing signal φRGE <i> is driven into an active state. In succession, when a read command READ is supplied, the read column predecode signal RCPY is driven into a selected state according to a column address. In a memory block of a data transfer source, since the data rearrangement write instructing signal φRGE is in an inactive state at L level, the read column decoder 290 performs a decode operation to drive the read column select signal RCSO into a selected state according to the read column predecode signal RCPY. In response, the read column select gate RCSG is rendered conductive, and memory cell data latched on the common bit lines CBL and ZCBL is read out onto the read data line pair GROP by a selected read amplifier RAMP. When potentials of the signals on the read data line pair are sufficiently expanded, the preamplifier activating signal PAE is activated to operate the preamplifier 206. The transfer buffer 208 transmits the complementary data PAO and ZPAO from the preamplifier 206 onto the write data line pair GWIP since the rearrangement mode instructing signal φRGM is at H level. Responsively, data on the write data line pair GWIP alters according to transferred memory data. The write driver 204 stays in an inactive state since the rearrangement mode instructing signal φRGM is in an active state at H level.

In the data holding region, the select circuit 292 selects the read column predecode signal RCPY according to the data rearrangement write instructing signal φRGE <i>. Accordingly, the write column decoder 294 operates to drive the write column select signal WCSL into a selected state since the data rearrangement write instructing signal φRGE <i> is at H level. In response, latch data in a sense amplifier SA alters according to a transferred data. Thereafter, the series of operations are repeatedly performed to complete data transfer for one row. When data transfer for one row is completed, a word line (sub word line) WLb is driven into a selected state according to indication of the completion in the data holding region. When the number of times of applications of column predecode signals or read commands is counted by the number of columns of one row, the word line (sub word line) WLb is driven into a selected state, and data of one row is rewritten into memory cells connected to the selected word line WLb in parallel.

Hence, in the case of the configuration where the read data bus and the write data bus are separately provided, data transfer can be easily performed internally without altering any of internal data line construction.

In this data transfer configuration as well, data transfer can be performed between memory blocks sharing a sense amplifier band.

Figure 82:
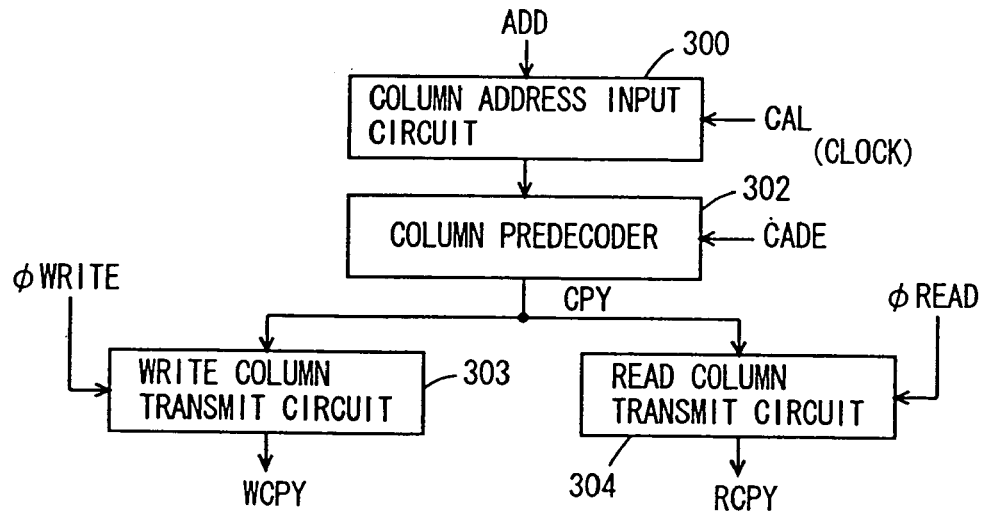
FIG. 82 is a diagram schematically showing a configuration of a section for generating a read column predecode signal and a write column predecode signal in the fourteenth embodiment of the present invention.

FIG. 82 is a diagram schematically showing a configuration of a column predecode signal generating circuit.

In FIG. 82, the column predecode signal generating circuit includes: a column address input circuit 300 taking in an address signal applied externally in synchronization with the column address latch enable signal CAL; a column predecoder 302 for predecoding an address signal from the column address input circuit 300 according to the column address decode enable signal CADE; a read column transmit circuit 304 for selecting a predecode signal from the column predecoder 302 according to a read operation instructing signal φREAD to generate a read column predecode signal RCPY; and a write column transmit circuit 303 for selecting a predecode signal from the column predecoder 302 according to a write operating mode instructing signal φWRITE to generate a write column predecode signal WCPY. The write column transmit circuit 303 and read column transmit circuit 304 select predecode signals from the column predecoder 302 when the write mode instructing signal φWRITE and the read mode instructing signal φREAD are activated, respectively.

Figure 83:
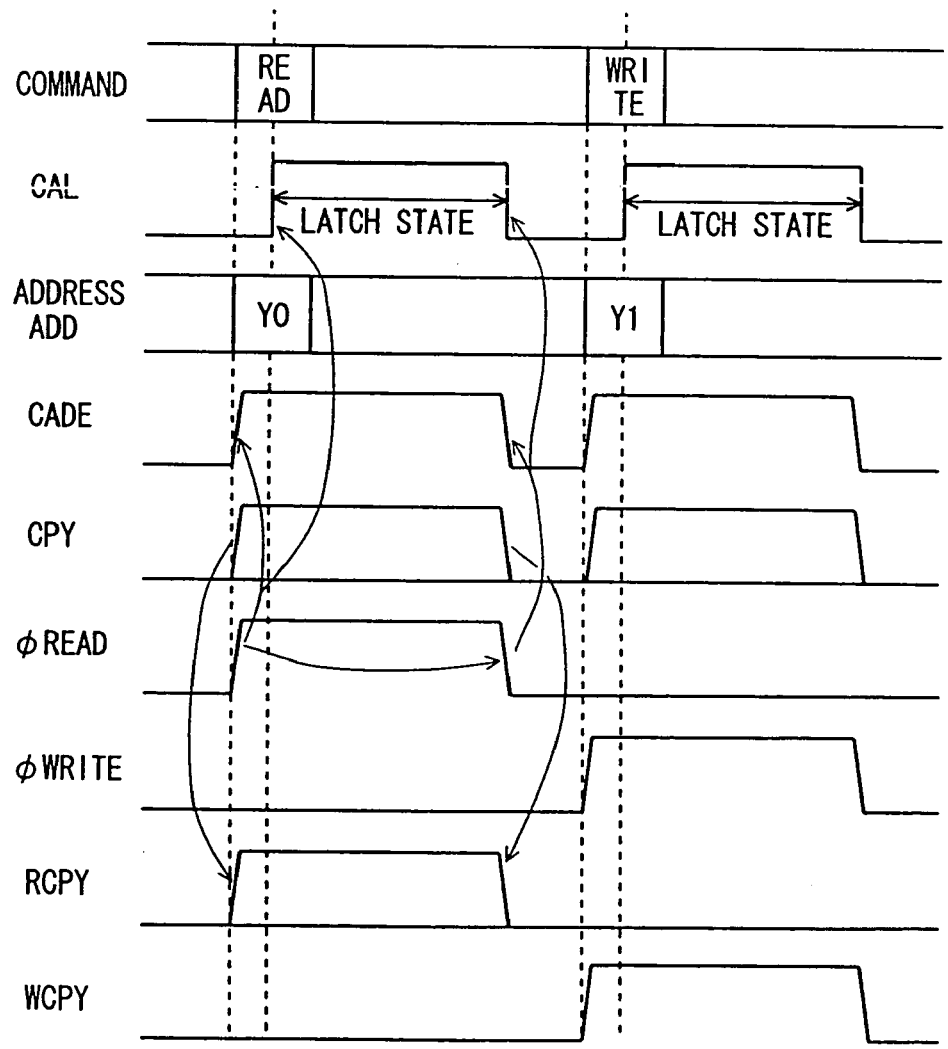
FIG. 83 is a diagram of signal waveforms representing operation of the circuit shown in FIG. 80.

The write mode instructing signal φWRITE and the read mode instructing signal φREAD are activated according to a write command WRITE and a read command READ, respectively, and are both maintained in a active state for a prescribed period. The column address latch enable signal CAL and the column address decode enable signal CADE are activated when one of a write command WRITE and a read command READ is supplied. Alternatively, a clock signal CLCCK, such as a system clock, may be applied to the column address input circuit 300 instead of the column address latch enable signal CAL, to cause the column address input circuit 300 to enter a latch state in synchronization with the rise of the clock signal CLCCK. Now, description will be given of operation of the column predecode signal generating section shown in FIG. 82 with reference to a timing chart shown in FIG. 83.

A read command READ is supplied from an outside together with an address signal ADD. The column address decode enable signal CADE is activated according the read command READ. The column address latch enable signal CAL is at L level and the column address input circuit 300 is in a through state. Thus, the column address input circuit 300 applies the address signal ADD from an outside to the column predecoder 302. The column predecoder 302 performs a predecode operation when the read command READ is supplied to generate a column predecode signal CPY.

The read operating mode instructing signal φREAD is activated according to the read command READ, and the read column transmit circuit 304 generates a read column predecode signal RCPY according to the column predecode signal CPY and applies the read column predecode signal RCPY to local control circuits. When the clock signal CLK (CLOCK) rises after the read command READ is supplied, the column address latch signal CAL is set to an active state at H level and the column address input circuit 300 enters a latch state.

The read operating mode instructing signal φREAD is driven into an inactive state at L level after a prescribed time elapses, and the column address latch signal CAL and the column address decode enable signal CADE are responsively driven into an inactive state at L level. Responsively, the predecode signal CPY is reset, and the read column predecode signal RCPY is reset as well.

When a write command WRITE is supplied, the write operating mode instructing signal φWRITE is set to an active state at H level according to the write command WRITE. In response, the column predecoder 302 predecodes an address ADD (Y1) applied from the column address input circuit 300 according to the column address decode enable signal to generates a column predecode signal CPY.

When the clock signal CLK rises, the column address latch signal CAL is rendered H-level, and the column address input circuit 300 enters a latch state. Since the write operating mode instructing signal φWRITE is at an H level, the write column transmit circuit 303 selects a column predecode signal CPY from the column predecoder 302 to generate a write column predecode signal WCPY. When the write command WRITE is applied, the write operating mode instructing signal φWRITE is rendered L-level as well after a prescribed time elapses.

In the configuration shown in FIG. 82, a column predecode signal CPY is generated prior to the rise of the clock signal CLOCK (CLK). In other words, the predecode signal is driven in an active state prior to a clock synchronous operation of an internal local control circuit in synchronization with the clock signal CLOCK (CLK). Therefore, the column select operation can be performed at a faster timing.

Figure 84:
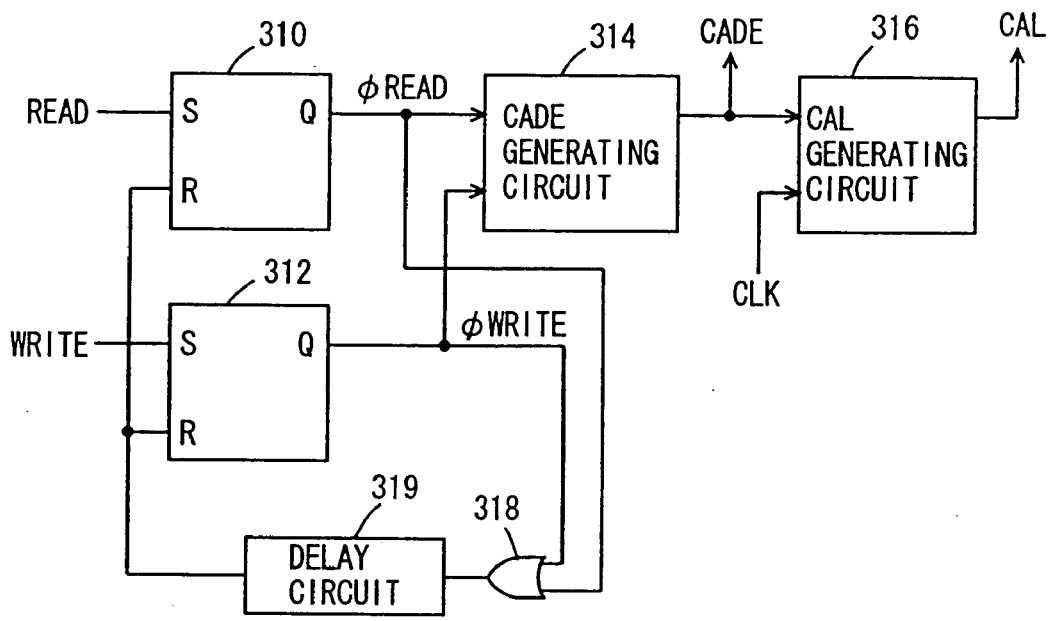
FIG. 84 is a diagram schematically showing a configuration of a column-related control signal generating section according to the fourteenth embodiment of the present invention.

FIG. 84 is a diagram schematically showing a configuration of the column-related control signal generating section. In FIG. 84, the column-related control signal generating section includes: a set/reset flip flop 310 set, in response to activation of a read command READ, to generate a read operating mode instructing signal φREAD; a set/reset flip flop 312 set, in response to activation of a write command WRITE, to generate a write operating mode instructing signal φWRITE; a CADE generating circuit 314 for generating a column address decode enable signal CADE according to activation of either one of the write operating mode instructing signal φWRITE and the read operating mode instructing signal φREAD; a CAL generating circuit 316 for generating a column address latch signal CAL when the clock signal CLK (CLOCK) and the column address decode enable signal CADE is rendered H-level; an OR circuit 318 receiving the write operating mode instructing signal φWRITE and the read operating mode instructing signal φREAD; and a delay circuit 319 for delaying an output signal of the OR circuit 318. When an output signal of the delay circuit 319 rises, the set/reset flip flops 310 and 312 are both reset. Furthermore, a column select period is determined by a delay time of the delay circuit 319.

The CADE generating circuit 314 is constituted of, for example, an OR circuit receiving the read operating mode instructing signal φREAD and the write operating mode instructing signal φWRITE. The CAL generating circuit 316 is constituted of, for example, a set/reset flip flop set when the column address decode enable signal CADE and the clock signal CLK both rendered H-level. In this construction, the CAL generating circuit 316 is reset by an output signal of the delay circuit 319.

Note that the column-related control signal generating section shown in FIG. 84 is provided in the main control circuit. The column address decode enable signal CADE may be adapted to be applied to a column decoder of the local control circuit, which in turn performs a decode operation according to the received column address decode enable signal CADE.

As described above, according to the fourteenth embodiment of the present invention, a separated IO configuration is adopted in which a data read path and data write path are provided separately from each other, and data transfer is performed internally to perform data rearrangement utilizing the write data bus and read data bus. There is no need to further add an extra configuration for data rearrangement other than a transfer circuit, enabling suppression of increase in chip area.

Fifteenth Embodiment

Figure 85:
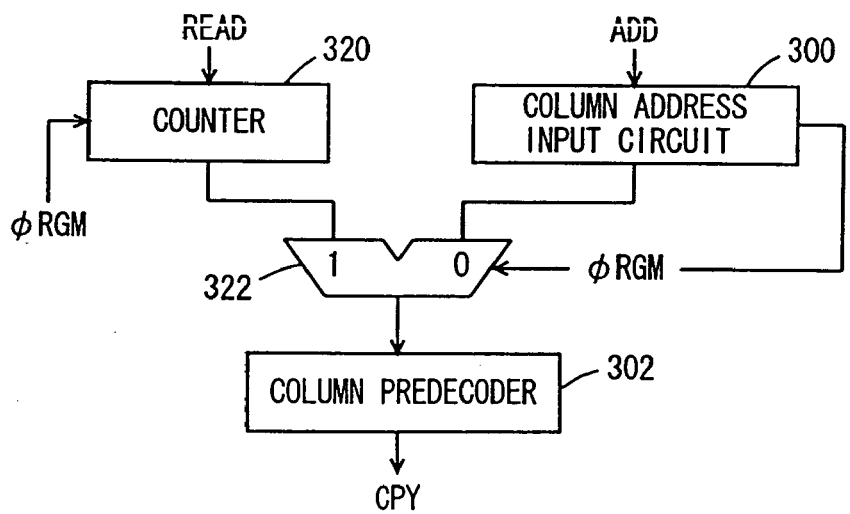
FIG. 85 is diagram schematically showing a configuration of a column predecode signal generating section of a semiconductor memory device according to a fifteenth embodiment of the present invention.

FIG. 85 is diagram schematically showing a configuration of a column predecode signal generating section according to a fifteenth embodiment of the present invention.

In FIG. 85, the column predecode signal generating section includes: a counter 320 activated, when the rearrangement mode instructing signal φRGM is activated, to count read commands READ; a select circuit 322 selecting one of an internal column address from the column address input circuit 300 and a count value of the counter 320 according to the rearrangement mode instructing signal φRGM; and a column predecoder 302 for predecoding a signal from the select circuit 322 to generate a column predecode signal CPY.

The counter 320 is reset to the initial value when a count value thereof reaches the number of column addresses on one row. For example, when 16 columns are present for one global data line pair, the number of column addresses is 16. In this case, a 4 bit counter is used as the counter 320 to count from "0000" to "1111". The count values are utilized as column addresses in data rearrangement. The column address input circuit 300 is forced to cease its operation according to the rearrangement mode instructing signal φRGM in the data rearrangement operation. Thereby, the column address input circuit 300 is prevented from entering a through state and a latch state to reduce a consumed current.

The select circuit 322 selects a count value from the counter 320 in the data rearrangement mode, while selects an internal column address from the column address input circuit 300 in other operation modes. In data rearrangement, by generating a column address internally, no column address is required to be applied from a memory controller provided outside and therefore, neither charging nor discharging of a signal line is required, resulting in reduction in consumed current. Furthermore, with a count-up signal from the counter 320 applied to a local control circuit, the present configuration can be utilized in the twelfth to fourteenth embodiments in which the timing for driving a sub word line into a selected state is delayed till data transfer for one row is completed in a data holding region.

A column predecode signal CPY from the column predecoder 302 may be applied to the local control circuit, or may alternatively be applied to the read column transmit circuit 304 and the write column transmit circuit 303 shown in FIG. 82, to generate a read column predecode signal and a write column predecode signal, as in the separated 10 configuration. Therefore, the configuration shown in FIG. 85 can be applied to any of the tenth to fourteenth embodiments described previously.

As described above, according to the fifteenth embodiment of the present invention, in the data rearrangement mode, a counter is utilized to internally generate a column address and there is no need to transmit a column address from a memory controller provided outside, thereby enabling reduction in charge/discharge current for a signal line and therefore decrease in consumed current.

Figure 86:
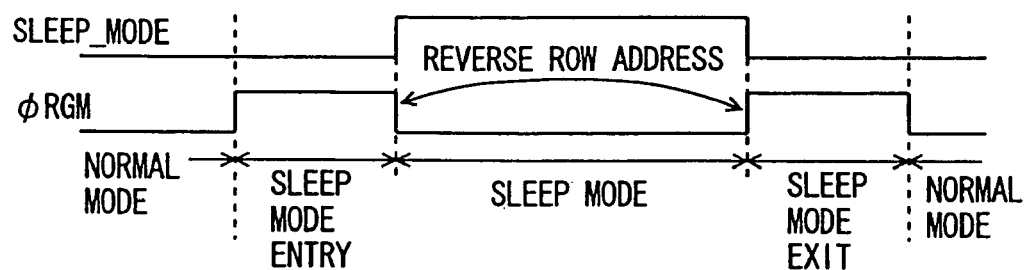
FIG. 86 is a diagram schematically representing an operating mode in the sleep mode and exit therefrom of a semiconductor memory device according to any of the tenth to the fifteenth embodiments of the present invention.

Note that in the tenth to fifteenth embodiment, when the data rearrangement mode is completed, the sleep mode is set to perform the twin-cell write mode. When the sleep mode is completed, a reverse operation of the data rearrangement is performed, or data rearrangement is again performed with row addresses of a data transfer destination and a data transfer resource replaced with each other. That is, in transition from the normal mode to the sleep mode, as shown in FIG. 86, the sleep mode entry mode operation is performed for performing data rearrangement with the rearrangement mode instructing signal φRGM in an active state. When the data rearrangement is completed, the sleep mode is set to activate the sleep mode instructing signal SLEEP_MODE. After the sleep mode is completed, the sleep mode instructing signal SLEEP_MODE is deactivated and thereafter, the rearrangement mode instructing signal φRGM is activated, and the same operation as in the sleep mode entry mode is performed with row addresses of a data transfer destination and a data transfer source replaced with each other. Thereby, the sleep mode exit mode is performed to complete the sleep mode. When the sleep mode exit mode cycle is completed, the normal mode is set in which a normal data access is performed.

Sixteenth Embodiment

As described previously referring to FIG. 20, in one memory mat, a data holding region is set with one memory cell array being a unit. As described previously referring to FIG. 50, however, when many micro-shorts exist between subword lines SWL and bit lines BL (or ZBL), there is a possibility that a current consumption in the sleep mode cannot be reduced although data access is possible in the normal operating mode. Hence, only a memory cell array (memory block) having a small standby current is utilized as a data holding region, while disabling a memory cell array in which such micro-shorts are present.

Figures 87, 88:
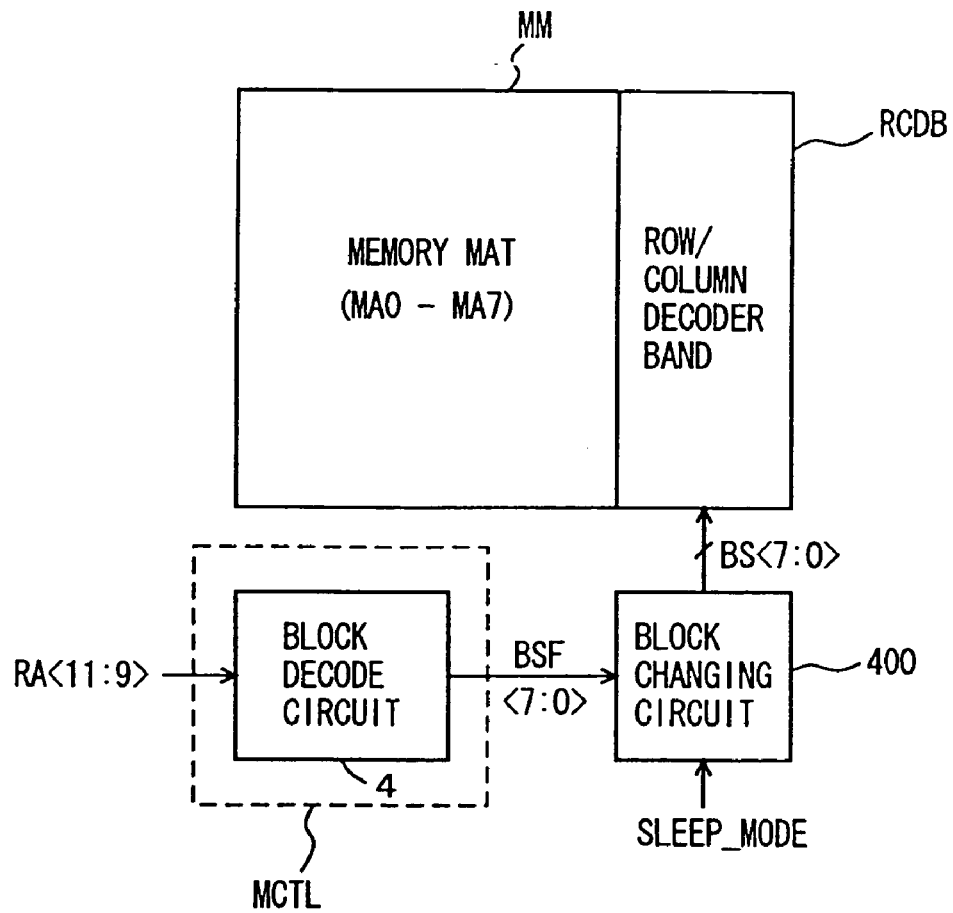
FIG. 87 is a diagram schematically showing rearrangement of memory cell arrays in a sixteenth embodiment of the present invention.
FIG. 88 is a diagram schematically showing a configuration of a main part of a semiconductor memory device according to the sixteenth embodiment of the present invention.

FIG. 87 is a diagram schematically showing a data holding region of a semiconductor memory device according to a sixteenth embodiment of the present invention. In FIG. 87, one memory mat includes 8 memory cell arrays MA0 to MA7 arranged similarly to a configuration shown in FIG. 20. A region whose row address bit RA <11> among 3 bit row address RA <3:0> is "0", that is, the memory cell arrays MA to MA3 are determined as a data holding region as a default. In this default state, the memory cell arrays MA4 to MA7 each having row address bit RA <11> of "1" are placed in the standby state when data holding is performed in the twin cell mode in the sleep mode or the like.

A case is now considered where many micro-shorts exist between subword lines and bit lines in the memory cell array MA2. Although there is no inconvenience in data storage in normal data access even in the presence of the micro-shorts ZR, a consumed current is increased in the data holding mode such as the sleep mode, because a bit line is held at an intermediate voltage level in the standby state and a leakage current flows through a micro-short since. In this case, a normal memory cell array MA5, for example, instead of a leakage-defective memory cell array MA2 is utilized as a data holding region. Hence, the memory cell arrays MA0, MA1, MA3 and MA5 are utilized as a data holding region and in the data holding mode such as the sleep mode, supply of a voltage (a bit line precharge/equalize voltage) to the memory cell array MA2 is ceased. A leakage current caused by micro-short in the memory cell array MA2 is reduced, resulting in a reduced current consumption in the data holding mode such as the sleep mode.

Designation of the data holding region is performed with a row address (a block address) included in a refresh address generated from a refresh counter included in a control circuit in the center (the main control circuit shown in FIG. 58), utilizing the configuration shown in FIG. 21.

FIG. 88 is a diagram schematically showing a configuration of a main part of a semiconductor memory device according to the sixteenth embodiment of the present invention. In FIG. 88, 8 memory cell arrays MA0 to MA7 are arranged in a memory mat MM. Adjacent to the memory mat MM, there is placed a row/column decoder band RCDB including a row decoder, a column decoder and a local control circuit.

Block select signals BSF <7:0> from a block decoder circuit 4 included in the main control circuit MCTL in the center are transmitted to the row/column decoder band RCDB through a block changing circuit 400. The block changing circuit 400 changes a correspondence between block select signals BSF <7:0> from a block decode circuit 4 and block select signals BS <7:0> transmitted to the row/column decoder band RCDB with one memory cell array being a unit when the sleep mode instructing signal SLEEP_MODE is activated, and changes a data holding region in the data holding mode such as the sleep mode.

The block changing circuit 400 transmits the block select signals BSF <7:0> from the block decode circuit 4 to the row/column decoder band RCDB as the block select signals BS <7:0> intactly when the sleep mode instructing signal SLEEP_MODE is inactive.

Figure 89:
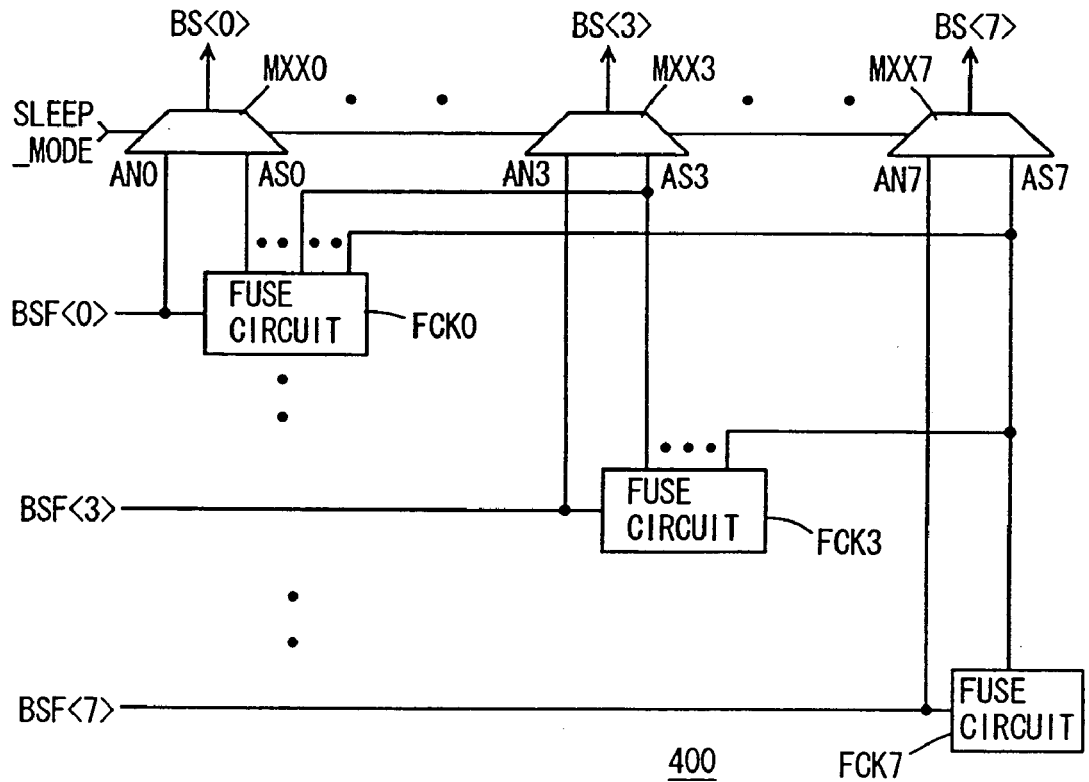
FIG. 89 is a diagram representing a configuration of a block changing circuit shown in FIG. 88.

FIG. 89 is a diagram representing a configuration of the block changing circuit 400 shown in FIG. 88. In FIG. 89, block changing circuit 400 includes: fuse circuits FCK0 to FCK7 provided corresponding to the respective block select signals BSF <7:0> from the block decode circuit 4 and determining transfer destinations of corresponding select block signals BSF <7:0> in the sleep mode; and multiplexers MXX7 to MXX0 provided corresponding to the respective block select signals BS <7:0> and selecting one of output signals of associated fuse circuits FCK7 to FCK0 and corresponding block select signals BSF <7:0> in response to the sleep mode instructing signal SLEEP_MODE to generate a block select signal BS <7:0>. In each of the fuse circuits FCK0 to FCK7, a connecting route of a corresponding block signal is determined by internal blowable link elements.

The multiplexers MXX0 to MXX7 selects block select signals BSF <0> to BSF <7> from the block decode circuit applied to inputs A0 to AN7 of the multiplexers MXX0 to MXX7, to generates block select signals BS <0> to BS <7> when the sleep mode instructing signal SLEEP_MODE is at L level. When the sleep mode instructing signal SLEEP_MODE is at H level, the multiplexers MXX0 to MXX7 selects signals applied to inputs AS0 to AS7 thereof through the fuse circuits FCK0 to FCK7, to generates block select signals BS <0> to BS <7>. A memory cell array selected by a block select signal in the sleep mode is determined by the fuse circuits FCK0 to FCK7.

Figure 90:
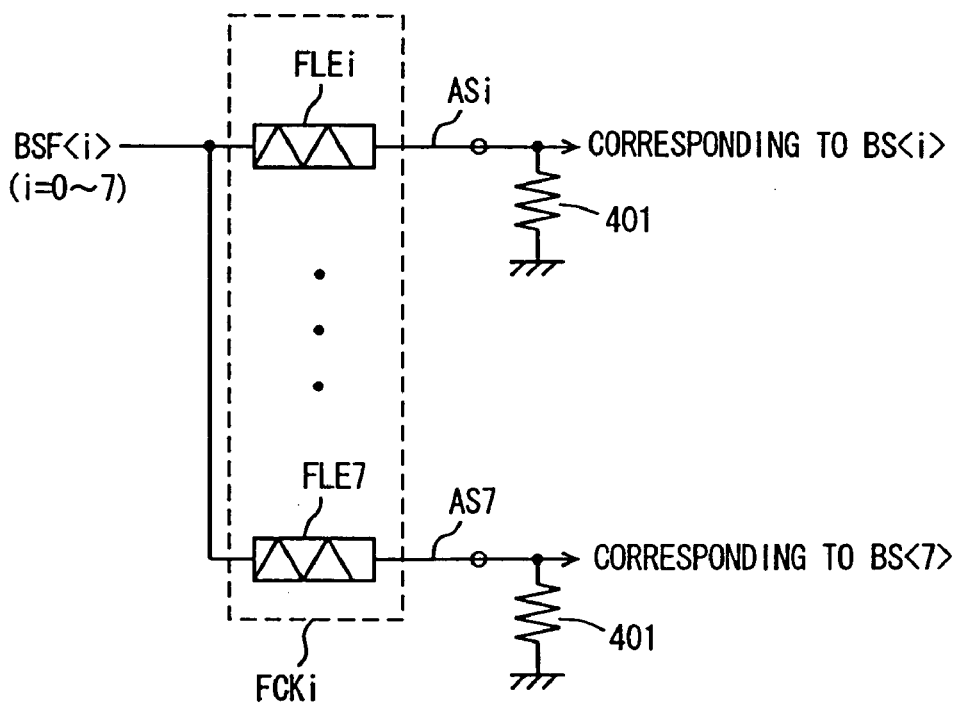
FIG. 90 is a diagram representing a configuration of ruse circuits shown in FIG. 89.

FIG. 90 is a diagram representing a configuration of the fuse circuits FCK0 to FCK7 shown in FIG. 89. In FIG. 90, there is shown a configuration of a fuse circuit FCKi provided corresponding to a block select signal BSF <i> from the block decode circuit 4, with i=1 to 7. The fuse circuit FCKi includes blowable link elements FLEi to FLE7 provided corresponding to the respective inputs AS1 to AS7 of the multiplexers MXXi to MXX7. A block select signal BSF <i> from the block decoder 4 is applied commonly to the link elements FLEI to FLE7 and one of the link elements FLEi to FLE7 is set in a conductive state, while the others are set in a blown-off or cut off state.

In a configuration of the fuse circuit FCKi shown in FIG. 90, the block select signal BSF <i> is generated as one of the block select signals BS <i> to BS <7> in the sleep mode. Hence, when the block select signals BSF <0> to BSF <7> specify the respective memory cell arrays MA0 to MA7, a memory cell array MM can be replaced with one of memory cell arrays MA(i+1) to MA7. When a memory cell array MAi is specified in the sleep mode, replacement of the memory cell array MAi is not performed if the memory cell array MAi is normal.

Pull-down resistors 401 are provided to the respective input nodes ASi to AS7 of the multiplexers MXXi to MXX7 to which output nodes of fuse circuit FCKi are coupled. When a memory cell array MAi corresponding to a fuse element FLEi, for example, is set in a non-selected state in the sleep mode, the link element FLEi is blown in a fuse circuit FCKi. In this case, since the link element FLEi in each of all the fuse circuits FCK0 to FCK7 is blown, a corresponding input node ASi of a multiplexer MXXi would enter a floating state, which is actually prevented by the arrangement of the pull-down resistor 401.

In a case where each of the multiplexers MXX0 to MXX7 is constituted of a tristate buffer circuit, a block select signal can be sufficiently transmitted to the row/column decoder band RCDB, particularly even when such pull-down resistors 401 are provided. In a case of no such tristate buffer circuits, even when a delay time of the block select signals BS <7:0> is increased due to the pull-down resistors 401, an internal start timing for selecting word line is delayed only a little. Since no high speed operability is required in the sleep mode, no problem arises.

Furthermore, since a block select signal is always transmitted to one of input nodes AS0 to AS7 of the multiplexers MXX0 to MXX7 provided corresponding to memory cell arrays used in the sleep mode, through a link element FLE. Therefore, a load of a block select signal from the block decode circuit is the same at all times, and a timing for a block select signal BS to be definite in each local control circuit is the same even in the sleep mode. Thus, refresh can be correctly performed in the sleep mode.

Figure 91:
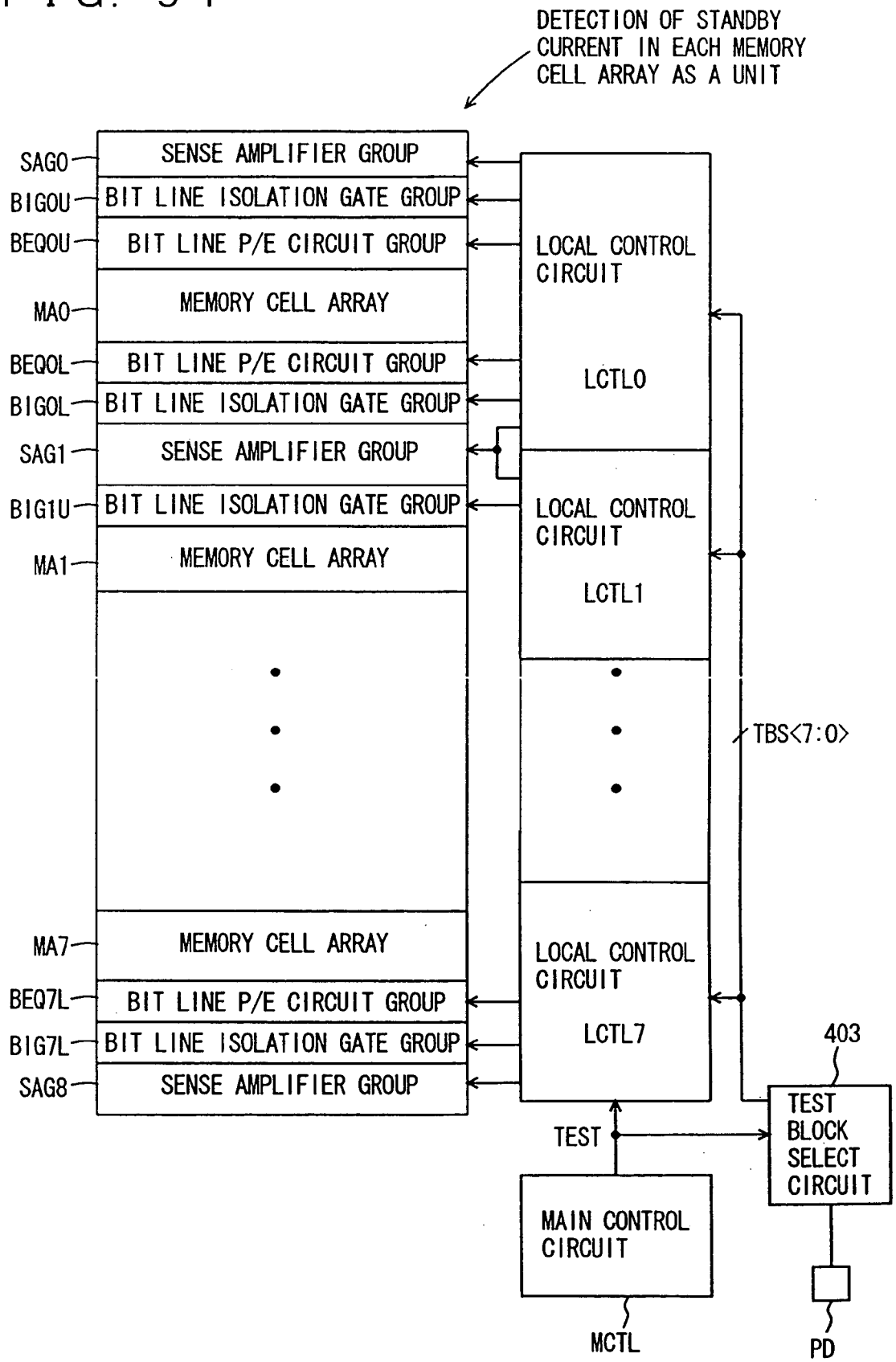
FIG. 91 is a diagram schematically showing the entire configuration of a semiconductor memory device according to the sixteenth embodiment of the present invention.

FIG. 91 is a diagram schematically showing a configuration of a main part of a semiconductor memory device according to the sixteenth embodiment of the present invention. In FIG. 91, a memory mat includes 8 memory cell arrays MA0 to MA7 arranged in alignment. Bit line precharge/equalize (P/E) circuit groups BEQiU and BEQiL are placed on both side of a memory array MAi in the column direction with i=0 to 7. The bit line precharge/equalize (P/E) circuit groups BEQiU and BEQiL are coupled to respective sense amplifier groups SAGi and SAG(i+1) through respective bit line isolation gate groups BIGiU and BIGiL.

The reason why the bit line precharge/equalize circuit groups BEQiU and BEQiL are placed on both sides of the memory cell array MAi is that bit line precharge/equalize circuits are alternately provided to columns (bit line pairs) of the memory cell array Mai in accordance with the shared sense amplifier configuration. Configurations of a memory cell array, a sense amplifier groups and a bit line isolation gate group may be the same as those shown in FIG. 88 or similar to those shown in FIG. 57.

Local control circuits LCTL0 to LCTL7 are provided corresponding to the respective memory cell arrays MA0 to MA7, and a main control circuit MCTL is provided commonly to the local circuits LCTL0 to LCTL7. The main control circuit MCTL is a central control circuit and includes a block decode circuit, a refresh address counter and others, which may have any of the configurations of the preceding embodiments.

A semiconductor memory device according to the sixteenth embodiment further includes a test block select circuit 403 applying test block select signals TBS <7:0> to the local control circuits LCTL0 to LCTL7 according to a test mode instructing signal TEST from the main control circuit MCTL. The test block select circuit 403 generates test block select signals TBS <7:0> according to a signal provided through a specific pad PD when the test mode instructing TEST is activated.

The test block select circuit 403 may include a configuration of a test circuit or may include simply a configuration of a shift register. The test block select signals TBS <7:0> are sequentially activated according a signal applied to the pad PD from a testing apparatus when the test mode instructing signal TEST is activated, and one of the memory cell arrays MA0 to MA7 is set in the precharge state with precharge voltage supplied while ceasing supply of a bit line precharge voltage to the other memory cell arrays.

More specifically, when the test mode instructing signal TEST is activated, the bit line precharge/equalize voltage is supplied to one of the memory cell arrays MA0 to MA7 by the test block select circuit 403 and a current consumed in this state is monitored. The monitoring of the consumed current may be performed by simply monitoring a current flowing a power source node or may be by externally monitoring a current flowing through an intermediate voltage line transmitting the bit line precharge/equalize voltage VBL in the test mode.

In a test of a wafer level, a leakage current in the standby state is detected for each memory array, to determine a memory cell array with the standby current of a prescribed value or higher. Programming on fuse circuits shown in FIGS. 89 and 90 is performed in a laser trimming step prepared in a final step of the test of a wafer level.

Figure 92:
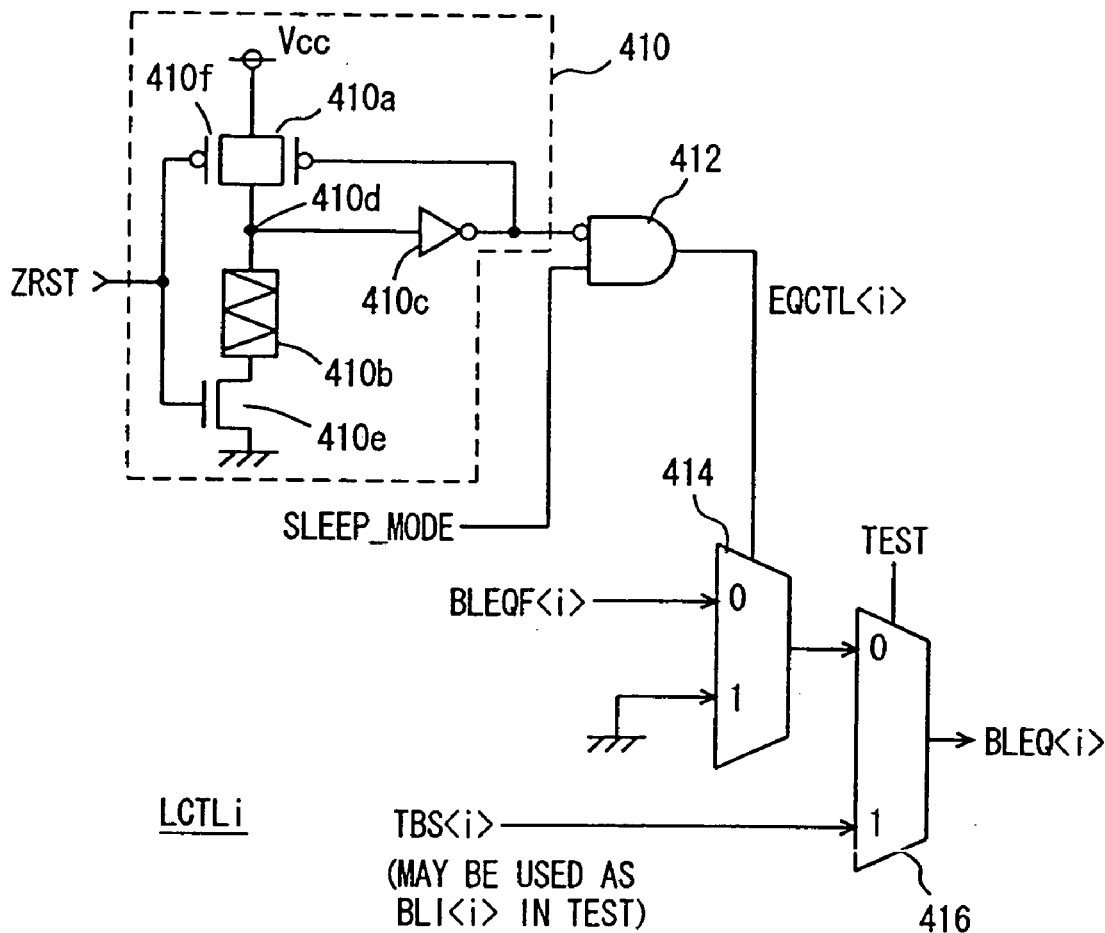
FIG. 92 is a diagram schematically showing a configuration of a local control circuit shown in FIG. 91.

FIG. 92 is a diagram schematically showing a configuration of one of the local control circuits LCTL0 to LCTL7 shown in FIG. 91. In FIG. 92, shown is a configuration of a part generating a bit line equalize instructing signal of a local control circuit LCTLi provided to a memory cell array MAi.

In FIG. 92, the local control circuit LCTLi includes; a program circuit 410 for programming whether or not a corresponding memory cell array MAi is in a leakage-defective state; a gate circuit 412 receiving an output signal of the program circuit 410 and the sleep mode instructing signal SLEEP_MODE; a multiplexer 414 selecting one of a bit line precharge/equalize instructing signal BLEQF <i> and the ground voltage according to an equalize control signal EQCTL <i> outputted form the gate circuit 412; and a multiplexer 416 selecting one of an output signal of the multiplexer 414 and a test block select signal TBS <i> according to the test mode instructing signal TEST to output a bit line precharge/equalize instructing signal BLEQ <i>.

The program circuit 410 includes: a P channel MOS transistor 410a connected between the power supply node and a node 410d; a link element 410b connected to the node 410d; an N channel MOS transistor 410e connected between the link element 410b and a ground node and receiving a reset signal ZRST at a gate thereof; a P channel MOS transistor 410f connected between the power source node and a node 410a and receiving the reset signal ZRST at a gate thereof; and an inverter circuit 410c inverting an output signal of the node 410d to apply the inverted output signal to a first input of a gate circuit 412 as well as the gate of the P channel MOS transistor 410a. The reset signal ZRST is activated (driven to L level) and kept in the activated state for a prescribed period when power is turned on or on system reset.

When the reset signal ZRST is activated to L level in initialization such as power on, the MOS transistor 410f is rendered conductive and the node 410d is precharged to H level. When the reset signal ZRST goes to H level, the MOS transistor 410e is rendered conductive and the P channel MOS transistor 410f is turned off. In this state, a voltage level of the node 410d is determined by a program state of the link element 410b.

When a standby leakage defect arises in a corresponding memory cell array MAi due to micro-short, the link element 410b is blown off in the program circuit 410. The program circuit 410 outputs a signal of L level when a corresponding memory cell array MAi is in a standby leakage defective state due to micro-short because the link element 410b is blown off. When a standby leakage current due to micro-short is at a prescribed level or lower and a corresponding memory cell array MAi is in the normal state, or when data access can normally be made to the memory cell array Mai, the program circuit 410 outputs a signal of H level because the link element 410b is in a conductive state.

The gate circuit 412 raises the equalize control signal EQCTL <i> to H level when an output signal of the program circuit 410 is at L level and when the sleep mode instructing signal SLEEP_MODE goes to H level. When an output signal of the program circuit 410 is at H level, the gate circuit 412 fixes the equalize control signal EQCTL <i> at L level regardless of a logic level of the sleep mode instructing signal SLEEP_MODE.

The multiplexer 414 selects a bit line precharge/equalize fast signal BLEQF <i> generated according an array activating signal RAS and a block select signal BS <i> when the equalize control signal EQCTL <i> is at L level, and selects the ground voltage when the equalize control signal EQCTL <i> is at H level.

The multiplexer 416 selects an output signal of the multiplexer 414, when the test mode instructing signal TEST is at L level, to generate a bit line equalize instructing signal BLEQ <i>, and selects a test block select signal TBS <i> from the test block select circuit 403 shown in FIG. 91 to generates the bit line precharge/equalize instructing signal BLEQ <i> when the test mode instructing signal TEST is at H level.

Where a standby leakage current is detected with each memory cell array being a unit, when the test mode instructing signal TEST is at H level, a bit line precharge/equalize instructing signal BLEQ <i> is generated according to the test block select signal TBS <i> from the test block select circuit 403 shown in FIG. 91. Therefore, with the bit line precharge/equalize instructing signal BLEQ <i> rendered H-level, a leakage current of the one memory cell array due to micro-short between bit line and a subword line can be measured for each one memory cell array. In this case, for the other non-selected memory cell arrays, a test block select signal TBS is maintained at L level. Therefore, the bit line precharge/equalize circuit for a memory cell array in a non selected state is in an inactive state and bit lines of a non-selected memory cell array are kept in a floating state in the test mode in which a standby leakage current is measured.

Note that in the test mode, a bit isolation instructing signal BLI may be set to H level for a selected memory cell array while maintaining a bit isolation instructing signal BLI for a non-selected memory cell array at L level. A standby current flows into micro-short through a bit isolation gate from a sense precharge voltage on a sense amplifier drive line and through the bit line precharge/equalize voltage source, and a consumed current in the sense amplifier precharge circuit and the bit line precharge/equalize voltage source are detected as a standby current.

In order to set a bit line isolation gate for a selected memory cell array in a conductive state and to set a bit line isolation gate for a non-selected memory cell array in a non-conductive state as described above, a test block select signal TBS <i> of FIG. 92 has only to be utilized as a bit line isolation instructing signal.

Alternatively, bit line isolation gates may be all set in a non-conductive state in the leakage current test mode to isolate the memory cell arrays from sense amplifiers, for detecting only a leakage current of a bit line precharge/equalize circuit for each memory cell array. In this case, bit line isolation signals BLI have only to be deactivated according to the test mode instructing signal.

According to the test result, the link elements 410b are programmed of blowing/non-blowing, and a test step for a standby current in a memory cell array at a wafer level is completed.

After the completion of the test mode, the test mode instructing signal TEST is at L level and the multiplexer 416 selects an output signal of the multiplexer 414. In the normal data access mode in which data access is made, the sleep mode instructing signal SLEEP_MODE is at L level, and an equalize control signal EQCTL <i> is at L level. Thus, a bit line precharge/equalize instructing signal BLEQ <i> is generated according to a bit line equalize fast signal BLEQF <i>.

In the sleep mode, if a corresponding memory cell array MAi is in a standby leakage-defective state, an output signal of the program circuit 410 is at L level. When the equalize control signal EQCTL <i> goes to H level in response to the sleep mode instructing signal SLEEP_MODE, the multiplexer 414 selects the ground voltage and in response, a bit line precharge/equalize instructing signal BLEQ <i> goes to L level. Accordingly, in the sleep mode, the memory cell array MAi is kept in a non-selected state and bit lines are kept in an electrically floating state and are eventually discharged to the ground voltage level. Hence, even if many of micro-shorts exist in the memory cell array MAi, no leakage current is caused since non-selected subword lines are at the ground voltage level. Since the memory cell array MAi is defective in standby leakage current and is not used as a data holding region, no problem arises even if the bit lines are kept in the electrically floating state to be eventually discharged to the ground voltage level in the sleep mode.

When a corresponding memory cell array MAi is normal in standby leakage current, an output signal of the program circuit 410 is at H level. Responsively, an equalize control signal EQCT <i> is kept at L level and a bit line precharge/equalize instructing signal BLEQ <i> is generated according to a bit line precharge/equalize fast signal BLEQF <i> in the sleep mode as well.

Figure 93:
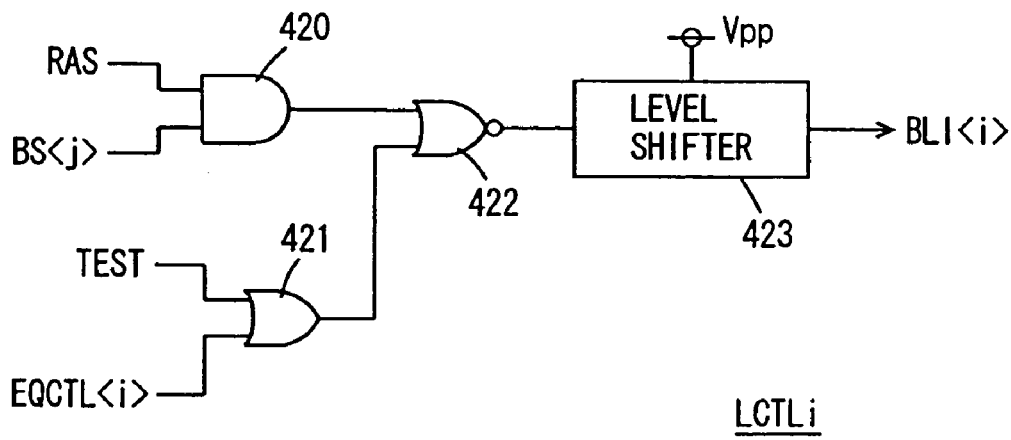
FIG. 93 is a diagram representing a configuration of a part generating a bit line isolation instructing signal of a local control circuit shown in FIG. 91.

FIG. 93 is a diagram representing a configuration of a bit line isolation control circuit included in a local control circuit LCTLi. In FIG. 93, the local control circuit LCTLi includes: a NAND circuit 420 receiving an array activating signal RAS and a block select signal BS <j> specifying an adjacent memory cell array; an OR circuit 421 receiving the test mode instructing signal TEST and an equalize control signal EQCTL <i>; a NOR circuit 422 receiving an output signal of the NAND circuit 420 and an output signal of the OR circuit 421; and a level shifter 423 for level-shifting an output signal of the NOR circuit 422 to generate a bit line isolation instructing signal BLI <i>. The bit line isolation instructing signal BLI <i> of an amplitude of a high voltage Vpp level is generated by the level shifter 423.

In the configuration of the local control circuit LCTi shown in FIG. 93, in the test mode for detecting a standby leakage current of a memory cell array, the test mode instructing signal TEST is set at H level. Accordingly an output signal of the OR circuit 421 is at H level, and in response, an output signal of the NOR circuit 422 is set to L level. Since the level shifter 423 merely performs level shifting without conversion of a logic level, and therefore, the bit line isolation instructing signal BLI <i> is set to L level, and bit line isolation gate groups shown in FIG. 91 all enter a non-conductive state, so that the memory cell arrays MA0 to MA7 are disconnected from corresponding sense amplifier groups SAG0 to SAG8. Thus, a leakage current in the standby state in the bit line precharge voltage can be correctly detected with each memory cell array being a unit.

When the test mode instructing signal TEST is at L level, a memory cell array MAi is defective in standby leakage current if a corresponding equalize control signal EQCTL <i> is at H level in the sleep mode. Hence, when the equalize control signal EQCTL <i> goes to H level in the sleep mode, the bit line isolation instructing signal BLI <i> is kept at L level, and the memory cell array MAi is disconnected from the sense amplifier group. Thus, a leakage current from a sense precharge circuit precharging a sense drive node of a sense amplifier to the intermediate voltage is prevented from flowing into the memory cell array MAi.

When the equalize control signal EQCTL <i> is at L level in the sleep mode and a standby leakage current in a corresponding memory cell array MAi is normal, the output signal of the OR circuit 421 is at L level. Hence, in this case, when the array activating signal RAS and a block select signal BS <j> specifying an adjacent memory cell array both go to H level, the bit line isolation instructing signal BLI <i> is driven to L level to disconnect the memory cell array MAi from sense amplifier group.

Note that in the configuration shown in FIG. 93, if a test block select signal TBS <i> is utilized instead of a bit line isolation instructing signal, only a memory cell array to be tested is coupled to corresponding sense amplifier groups. In a case of this configuration, the test mode instructing signal is not necessary to be particularly used. When an OR circuit receiving an output signal of the OR circuit 422 and the test block select signal TBS <i> is provided to the output of the OR circuit 422, a configuration can be obtained in which only a memory cell array of interest in test is connected to corresponding sense amplifier groups.

Figure 94:
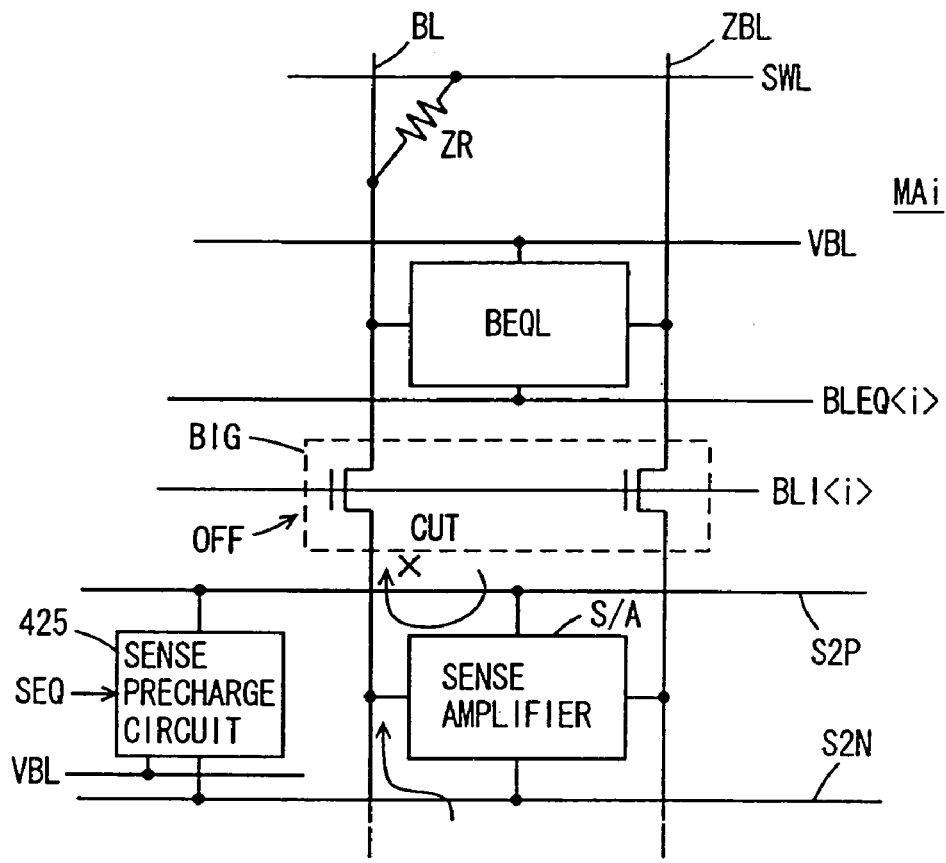
FIG. 94 is a diagram representing operations of a local control circuit shown FIGS. 92 and 93.

FIG. 94 is a diagram schematically showing a configuration associated with one column of a memory cell array. In FIG. 94, in a memory cell array MAi, bit lines BL and ZBL are coupled to a sense amplifier S/A through a bit line isolation gate BIG. In the memory cell array MAi, a bit line precharge/equalize circuit BEQL is provided and the bit line precharge/equalize circuit BEQL supplies the precharge voltage VBL to the bit lines BL and ZBL according to a bit line precharge/equalize instructing signal BLEQ <i>.

The sense amplifier S/A receives the sense power supply voltage and the sense ground voltage through sense drive lines S2P and S2N. In the standby state, the sense drive lines S2P and S2N are precharged by the sense precharge circuit 430 to the intermediate voltage VBL. The sense amplifier S/A includes no sense drive transistor but a pair of cross-coupled MOS transistors.

As shown in FIG. 94, when micro-short ZR exists between a subword line SWL and a bit line BL, a current flows into the bit line BL through an N channel MOS transistor of the sense amplifier S/A from the sense precharge circuit 425 when the voltage of the bit line BL lowers, and a leakage current in the standby state is totally increased. In order to prevent current consumption due to a leakage current from the sense precharge circuit 425, a bit line isolation gate BIG is set in a non-conductive state in the sleep mode. Thus, it is prevented that the precharge voltage VBL from the sense precharge circuit 430 is inputted to micro-short ZR through the sense amplifier S/A, thereby enabling reduction in consumed current.

Modification

Figure 95:
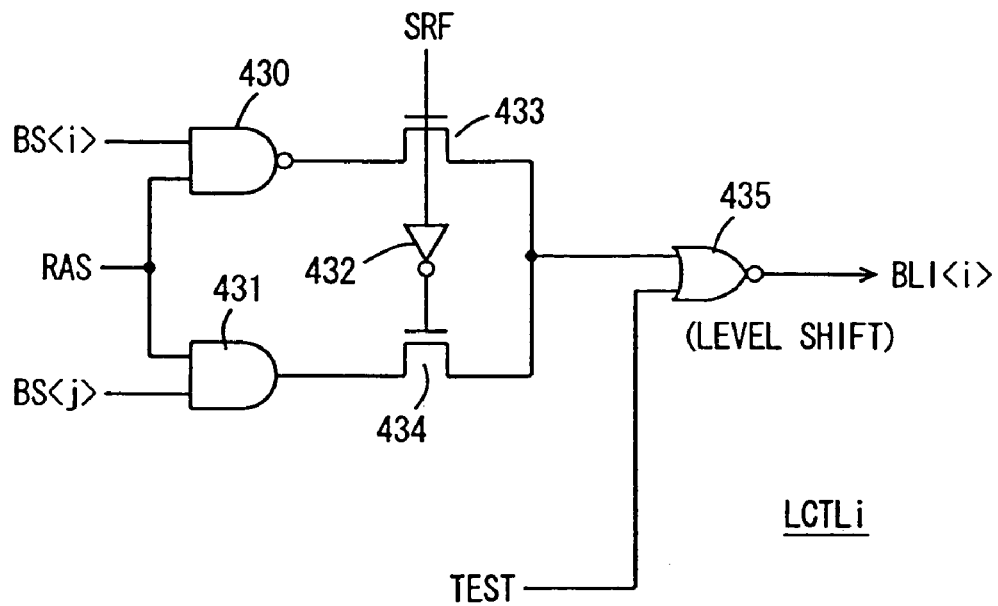
FIG. 95 is a diagram representing a configuration of a local control circuit of a modification of the sixteenth embodiment of the present invention.
Figure 96:
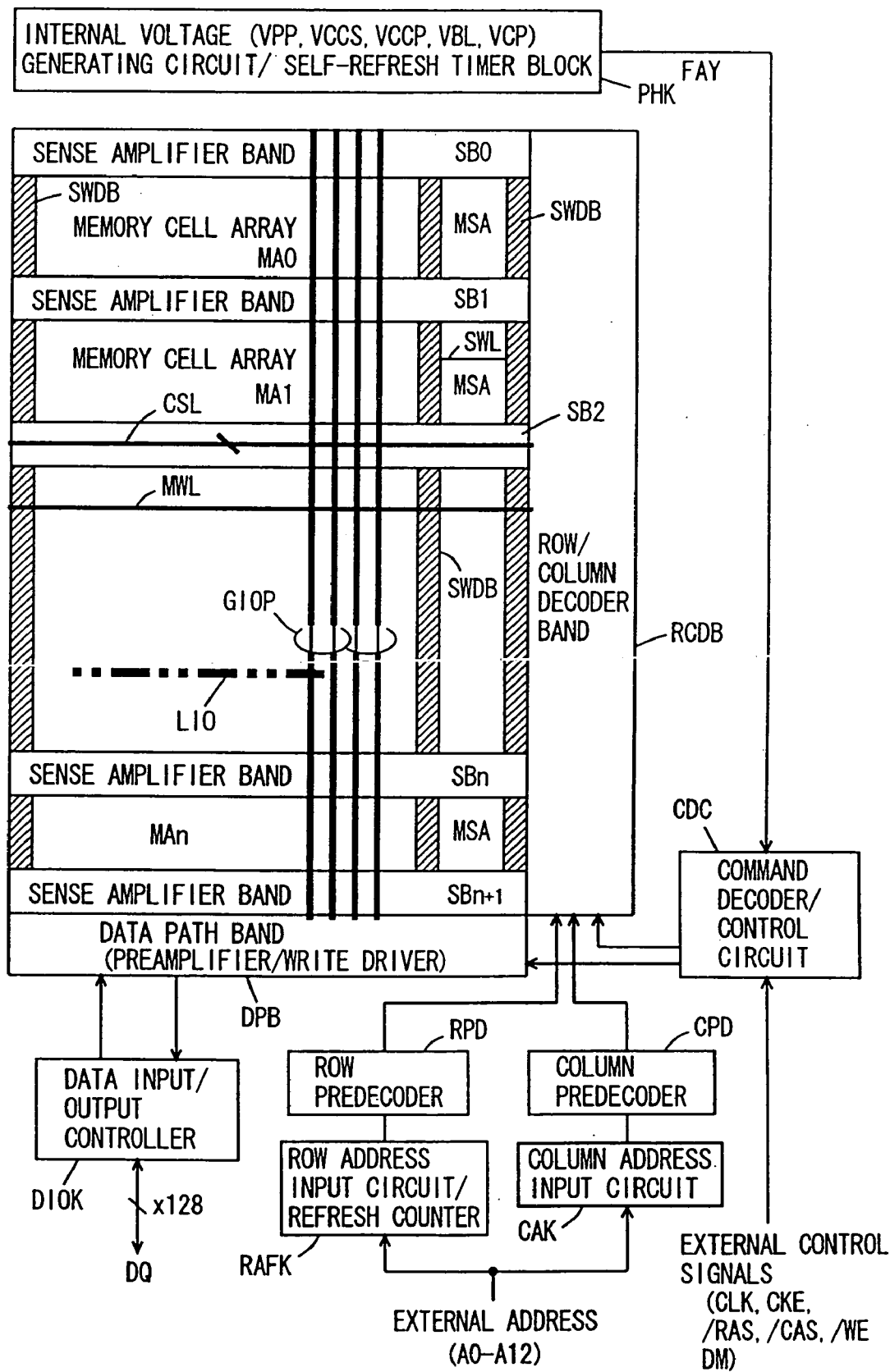
FIG. 96 is a diagram schematically showing a configuration of a conventional embedded DRAM.
Figure 97:
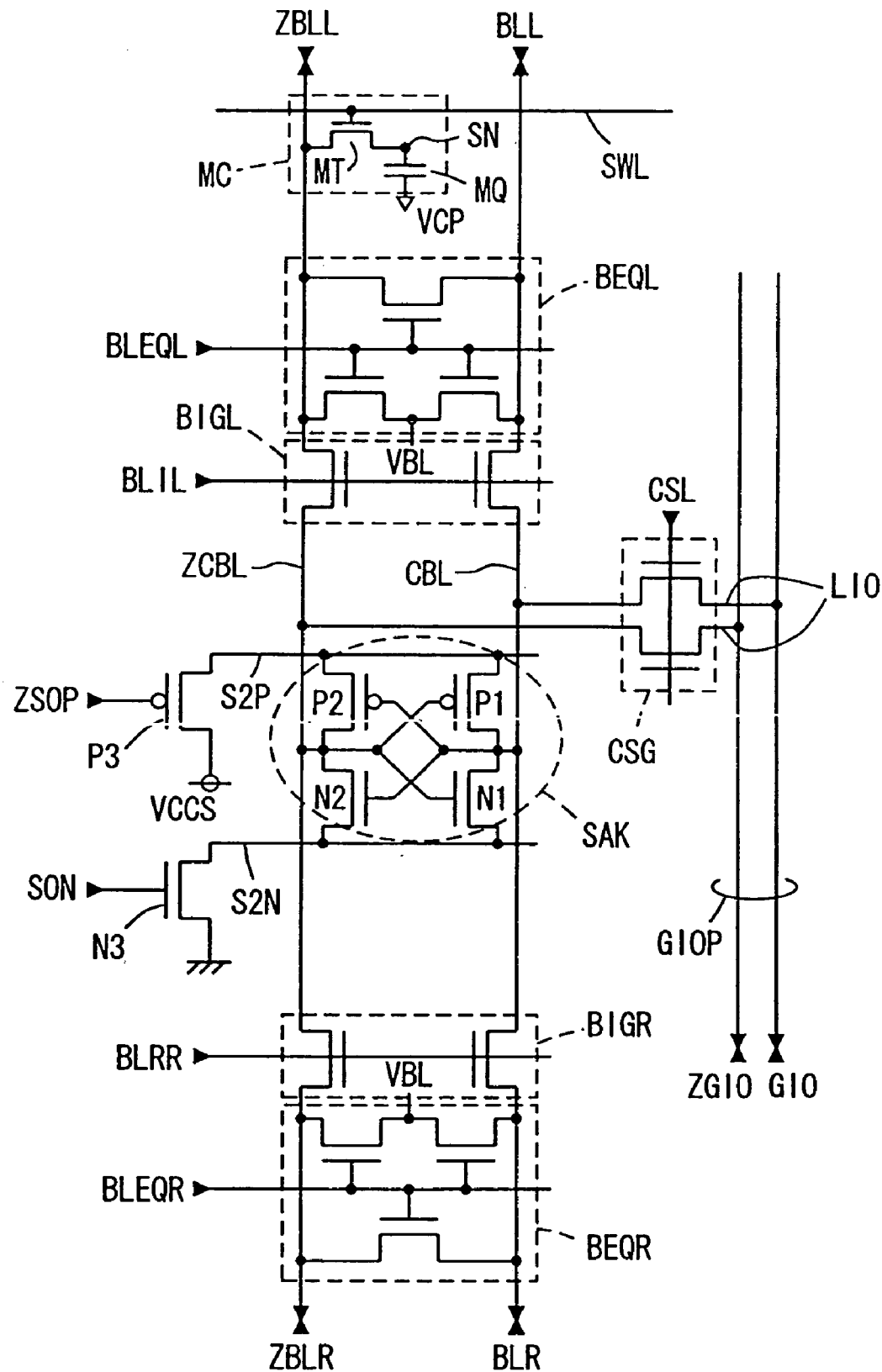
FIG. 97 is a diagram representing a configuration of a sense amplifier band of the conventional embedded DRAM.
Figure 98:
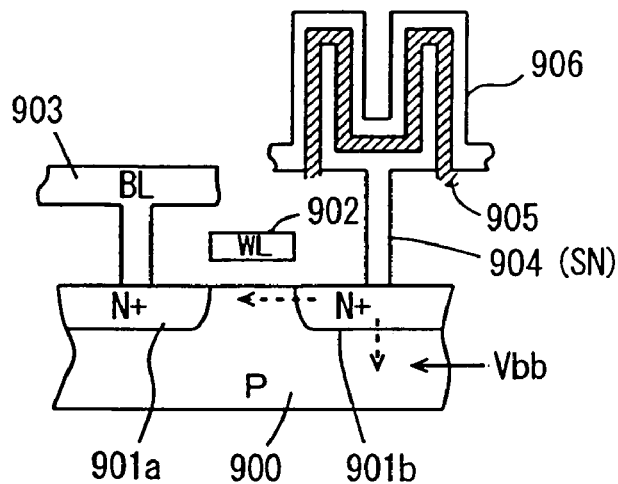
FIG. 98 is a diagram schematically showing a cross sectional structure of a memory cell of the conventional embedded DRAM.
Figure 99:
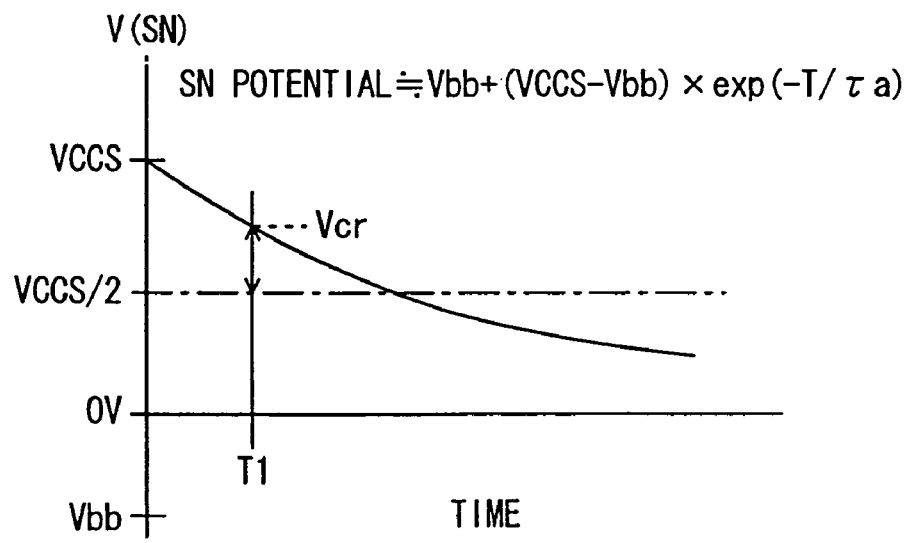
FIG. 99 is a graph representing a change in voltage of a storage node with time of the conventional embedded DRAM.

FIG. 95 is a diagram representing a configuration of a modification of the sixteenth embodiment of the present invention. In FIG. 95, there is shown a part of a local control circuit for generating a bit line isolation instructing signal BLI <i>.

In FIG. 95, the local control circuit LCTLi includes: a NAND circuit 430 receiving a block select signal BS <i> and an array activating signal RAS; an AND circuit 431 receiving the array activating signal RAS and a block select signal BS <j>; an inverter circuit 432 receiving a self-refresh instructing signal SRF; a transfer gate 433 made conductive when the self-refresh instructing signal SRF is at H level to pass an output signal of the NAND circuit 430 therethrough; and a transfer gate 434, made conductive when an output signal of the inverter circuit 432 is at H level, to transmit an output signal of the AND circuit 431. Output nodes of the transfer gates 433 and 434 are coupled together to a common output node. The self-refresh instructing signal SRF is activated after the sleep mode instructing signal SLEEP- _MODE is activated and the twin cell write mode is completed to rearrange data of memory cells.

The local control circuit LCTLi further includes a NOR circuit 435 with a level shift function receiving a test mode instructing signal TEST and an output signal of the transfer gate 433 or 434 to generate a bit line isolation instructing signal BLI <i>. The test mode instructing signal TEST is set in an active state of H level in the test mode in which a standby leakage current is measured with each memory cell array being a unit.

A block select signal BS <j> specifies a memory block (memory cell array) adjacent to the memory cell array MAi specified by the block select signal BS <i>.

When the test mode instructing signal TEST is at H level, the bit line isolation instructing signal BLI <i> goes to L level and the memory cell array is disconnected from the corresponding sense amplifier group.

When the test mode instructing signal TEST is at L level, the NOR circuit 435 operates as an inverter.

In the normal operating mode in which data access is made and in the twin cell write mode in which data rearrangement is performed, the self-refresh mode instructing signal SRF is at L level. In this state, the transfer gate 434 is conductive and an output signal of the AND circuit 431 is transmitted to the NOR circuit 435. Hence, in a case where the self-refresh instructing signal SRF is at L level, the bit line isolation instructing signal BLI <i> goes to H level and the corresponding memory cell array MAi is coupled to the corresponding sense amplifier group when one of the array activating signal RAS and the block select signal BS <j> is at L level.

On the other hand, when the array activating signal RAS and the block select signal BS <j> are both at H level, an output signal of the AND circuit 431 goes to H level. In response, the bit line isolation instructing signal BLI <i> goes to L level, and the memory cell array MAi is disconnected from the corresponding sense amplifier group.

In the self-refresh mode, the self-refresh instructing signal SRF goes to H level, the transfer gate 433 is made conductive and the transfer gate 434 enters a non-conductive state. In this state, when at least one of the array activating signal RAS and the block select signal BS <i> is at L level, the output signal of the NAND circuit 430 goes to H level. In response, the bit line isolation instructing signal BLI <i> from the NOR circuit 435 goes to L level, and the memory cell array MAi is disconnected from the corresponding sense amplifier group. On the other hand, when the block select signal BS <i> and the array activating signal RAS both go to H level, the output signal of the NAND circuit 430 goes to L level. In response, the bit line isolation instructing signal BLI <i> from the NOR circuit 435 goes to H level, and the memory cell array MAi is connected to the corresponding sense amplifier group.

In other words, in the self-refresh mode, non-selected memory cell arrays are all disconnected from corresponding sense amplifier groups. Hence, in the standby state as well, the memory cell arrays are disconnected from the corresponding sense amplifier groups. Even in a case where many micro-shorts exist in a non-selected memory cell array, a current can be prevented from flowing into a subword line through a bit line and micro-shorts from a sense amplifier.

Note that in the configuration shown in FIG. 95 as well, a bit line isolation instructing signal BLI <i> may be generated according to a test block select signal TBS <i>. The configuration for such control can be achieved readily by utilizing a test block select signal instead of the test mode instructing signal TEST. That is, the NOR circuit 435 is replaced with an OR circuit and the NAND circuit 430 and the AND circuit 431 are replaced with an AND circuit and a NAND circuit, respectively.

Furthermore, as for the configuration for replacing a memory cell array in the twin cell write mode, the previously described block changing circuit has to be applied to circuitry for generating a block select signal specifying a memory cell array of a transfer destination. However, when a refresh counter is internally utilized, a change of a memory cell array in a data holding region can be performed without any particular problem since an address of the transfer destination is internally generated and an block select signal is generated.

Moreover, as for internal transfer of data in the twin cell write mode, since both of a memory cell array of a transfer destination holding data and a memory cell array of a transfer source are specified by external addresses, a data holding region can be changed by changing a transfer destination of a block select signal according to a transfer control signal φRGE (a data rearrangement write instructing signal) that defines access period to a memory cell array of a transfer destination. For example, in the configuration shown in FIG. 89, a signal obtained by an OR operation on the self-refresh signal SRF and the transfer control signal φRGE has only to be utilized instead of the sleep mode instructing signal SLEEP_MODE.

Furthermore, in a configuration in which a bit line precharge/equalize circuit is arranged in a sense amplifier band as well, a standby current can be likewise detected by disconnecting all non-selected memory cell arrays (memory blocks) from sense amplifier bands. In the sleep mode, by disconnecting a leakage-defective memory cell array from sense amplifier bands, a consumed current can be reduced even in a configuration in which a bit line precharge/equalize circuit is arranged in a sense amplifier band. As a configuration for control in such an arrangement, the configuration of control described above can be utilized.

According to the sixteenth embodiment of the present invention, as described above, a standby leakage current is detected with each memory cell array being a unit, a memory cell array causing a standby leakage current higher than a prescribed value is excluded from a data holding region, and the defective memory cell array is replaced with another normal memory cell array. Therefore, a current consumed in the data holding mode can be further reduced.

[Other Applications]

Descriptions have been given of the embedded DRAM above. However, the present invention can be applicable generally to any type of DRAM (dynamic random access memory).

Furthermore, descriptions have been given of the sleep mode performing data holding during a period when devices such as a logic are at a rest state over a long time. However, the present invention is also applicable for a system in which allocation of memory address spaces to a DRAM can be switched over according to a operating mode, depending on a usage situation.

As described above, according to the present invention, row select circuitry is provided with a mode switch circuit for selecting a word line corresponding to a row specified according to an address signal in a first operating mode, and for selecting a first row specified by the address signal and a second row associated with the first row in a second operating mode, wherein the first row specified by the address signal and the second row associated with the first row are selected such that memory cells on the rows are connected to bit lines of a corresponding bit line pair. Therefore, a memory capacity of the semiconductor memory device can be altered depending on whether an operating mode is the first operating mode or the second operating mode. Furthermore, in the second operating mode, a voltage difference of sufficient magnitude can be generated between bit lines. Therefore, data can be stored correctly even under a low power supply voltage.

Still furthermore, by setting the second operating mode as an operating mode performing data holding, an interval between refreshes on stored data on memory cells can be made longer, thereby enabling reduction in power consumption in the data holding mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory cell array having a plurality of memory cells arranged in rows and columns;
an internal data bus for transferring data with a selected memory cell of said memory cell array;
row select circuitry, activated in response to activation of an array activation instructing signal, for selecting a row in said memory cell array when activated, said row select circuitry selecting a first row of said memory cell array according to a first address and selecting a second row of said memory cell array according to a second address;
a plurality of sense amplifiers, provided corresponding to said columns, activated in response to activation of said array activation instructing signal, for sensing, amplifying and latching data of corresponding columns;
first column select circuitry, activated when a data rearrangement write instructing signal is deactivated, for selecting a column of said memory cell array on which a memory cell on said first row is located according to a column address signal to couple a selected column with said internal data bus when activated;
rearrangement column select circuitry, activated when said data rearrangement write instructing signal is activated, for selecting a column of said memory cell array on which a memory cell on said second row is located according to said column address signal to couple a selected column with said internal data bus when activated;
rearrangement control circuitry, activated when said data rearrangement write instructing signal is activated, for counting a number of times of column select operations of said rearrangement column select circuitry, and deferring ceasing a driving operation on the second row to a select state by said row select circuitry till said count value reaches a prescribed value;
a preamplifier for amplifying the data on said internal data bus, said preamplifier latching output data thereof when a rearrangement operating mode instructing signal is activated; and
a data buffer, activated when said data rearrangement write instructing signal is activated, for transferring the data outputted by said preamplifier onto said internal data bus.

2. The semiconductor memory device according to claim 1, wherein said prescribed value of counting corresponds to the number of columns on one row.

3. A semiconductor memory device comprising:
a memory cell array having a plurality of memory cells arranged in rows and columns;
an internal data bus for transferring data with a selected memory cell of said memory cell array;
row select circuitry for selecting a row in said memory cell array, said row select circuitry selecting a first row of said memory cell array according to a first address and selecting a second row of said memory cell array according to a second address when a data rearrangement operating mode instructing signal is activated;
column select circuitry, activated in response to a column select instruction when a data rearrangement write instructing signal is deactivated, for selecting a column of said memory cell array on which a memory cell on said first row is located according to a column address signal to couple a selected column with said internal data bus when activated;
rearrangement column select circuitry, activated a prescribed time after the activation of said column select circuitry in response to said column select instruction when said data rearrangement write instructing signal is activated, for selecting a column of said memory cell array on which a memory cell on said second row is located according to said column address signal to couple a selected column with said internal data bus when activated;
a preamplifier, activated in response to a preamplifier activating signal activated in response to said column select instruction, for amplifying and latching data on said internal data bus when activated; and
a transfer buffer activated at a timing behind said preamplifier in response to activation of said preamplifier activating signal, for transferring data outputted from said preamplifier onto said internal data bus.

4. The semiconductor memory device according to claim 3, wherein said row select circuitry drives the first row specified by said first address into a selected state in response, at least, to activation of an array activation instructing signal.

5. The semiconductor memory device according to claim 4, wherein said row select circuitry drives the first row specified by said first address into a selected state in response to activation of said array activation instructing signal and deactivation of said data rearrangement write instructing signal, and drives the second row specified by said second address into a selected state after a column select operation of said rearrangement column select circuitry is completed when said array activation instructing signal and said rearrangement operating mode instructing signal are active.

6. The semiconductor memory device according to claim 5, further comprising a plurality of sense amplifiers, provided corresponding to said columns, each activated, in response to said array activation instructing signal, for sensing, amplifying and latching data on a corresponding column.

* * * * *